(12) United States Patent
Mihara et al.

(10) Patent No.: US 7,649,139 B2
(45) Date of Patent: *Jan. 19, 2010

(54) THERMOELECTRIC CONVERSION ELEMENT AND THERMOELECTRIC CONVERSION MODULE

(75) Inventors: Toshiyuki Mihara, Ikeda (JP); Ryoji Funahashi, Ikeda (JP); Jun Akedo, Tsukuba (JP); Sou Baba, Tsukuba (JP); Masashi Mikami, Ikeda (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 2 days.

This patent is subject to a terminal disclaimer.

(21) Appl. No.: 10/593,644

(22) PCT Filed: Mar. 22, 2005

(86) PCT No.: PCT/JP2005/005133

§ 371 (c)(1),
(2), (4) Date: Sep. 21, 2006

(87) PCT Pub. No.: WO2005/093864

PCT Pub. Date: Oct. 6, 2005

(65) Prior Publication Data

US 2007/0144573 A1    Jun. 28, 2007

(30) Foreign Application Priority Data

Mar. 25, 2004   (JP) .......................... 2004-088290

(51) Int. Cl.
*H01L 35/00* (2006.01)
*H01L 37/00* (2006.01)
*H01L 35/12* (2006.01)
*H01L 35/16* (2006.01)
*H01L 35/20* (2006.01)

(52) U.S. Cl. .................... 136/236.1; 136/200; 136/238; 136/239; 136/240; 136/241

(58) Field of Classification Search ................ None
See application file for complete search history.

(56) References Cited

U.S. PATENT DOCUMENTS 4,443,650 A * 4/1984 Takagi et al. ................ 136/211

(Continued)

FOREIGN PATENT DOCUMENTS

EP    1 174 933 A2    1/2002

(Continued)

OTHER PUBLICATIONS

Funahashi et al; "An Oxide Single Crystal with High Thermoelectric Performance in Air," Jpn J Appl. Phys. vol. 39 (2000) pp. L1127-29.
R. Funahashi et.al., Jpn. J. Appl. Phys. 39, L1127 (2000).

(Continued)

*Primary Examiner*—Nam X Nguyen
*Assistant Examiner*—Kourtney R Salzman
(74) *Attorney, Agent, or Firm*—Kratz, Quintos & Hanson, LLP

(57) ABSTRACT

The present invention provides a thermoelectric element in which a thin film of p-type thermoelectric material and a thin film of n-type thermoelectric material, which are formed on an electrically insulating substrate, are electrically connected, in which the p-type thermoelectric material and the n-type thermoelectric material are selected from specific complex oxides with a positive Seebeck coefficient and specific complex oxides with a negative Seebeck coefficient, respectively. The present invention also provides a thermoelectric module using the thermoelectric element(s) and a thermoelectric conversion method. In the thermoelectric element of the present invention, since a p-type thermoelectric material and an n-type thermoelectric material are formed into a thin film on an electrically insulating substrate, the thermoelectric element of the invention can be formed on substrates having various shapes, thereby providing thermoelectric elements having various shapes.

9 Claims, 5 Drawing Sheets

U.S. PATENT DOCUMENTS

| | | | | |
|---|---|---|---|---|
| 4,859,250 | A | * | 8/1989 | Buist .......................... 136/225 |
| 5,352,299 | A | * | 10/1994 | Yoshimoto et al. .......... 136/201 |
| 6,376,763 | B2 | * | 4/2002 | Funahashi et al. .......... 136/201 |

FOREIGN PATENT DOCUMENTS

| | | |
|---|---|---|
| EP | 1 492 171 A1 | 12/2004 |
| EP | 1 672 709 A1 | 6/2006 |
| JP | 3-295281 | 12/1991 |
| JP | 7-218348 | 8/1995 |
| JP | 8-186293 | 7/1996 |
| JP | 2002-76447 | 3/2002 |
| JP | 2002-335021 | 11/2002 |
| JP | 2003-8086 | 1/2003 |
| JP | 2003-133600 | 5/2003 |
| JP | 2003-282964 | 10/2003 |
| JP | 2003-306380 | 10/2003 |
| JP | 2003-306381 | 10/2003 |
| JP | 2003-324220 | 11/2003 |
| WO | WO 03/081686 | 10/2003 |

OTHER PUBLICATIONS

R. Funahashi et al.; "$Ca_{2.7}Bi_{0.3}CO_4O_9/La_{0.9}Bi_{0.1}NiO_3$ Thermoelectric Devices with High Output Power Density"; Applied Physics Letters, vol. 85, No. 6; pp. 1036-1038; Aug. 9, 2004; XP012064140.

Gaojie Xu et al.; "Thermoelectric Properties of $Bi_{2.2-x}Pb_xSr_2Co_2O_y$ System"; Journal of Applied Physics; vol. 91, No. 7; pp. 4344-4347; Apr. 1, 2002; XP012056111.

R. Funahashi et al.; "Thermoelectric Properties ofLn-Ni-0 (Ln: lanthanoid) System"; $22^{nd}$ International Conference on Thermoelectrics (2003); pp. 184-187; Aug. 17, 2003.

Ichiro Matsubara et al.; "Fabrication of an all-Oxide Thermoelectric Power Generator"; Applied Physics Letters; vol. 78, No. 23, pp. 3627-3629; Jun. 4, 2001; XP012028210.

Woosuck Shin et al.; "Fabrication of Oxide Thermoelectric Generator Element"; Japanese Journal of Applied Physics, vol. 39; Part 1, No. 3A; pp. 1254-1255; Mar. 2000; XP002461436.

Supplementary European Search Report dated Dec. 14, 2007.

R. Funahashi et al.; "$Ca_{2.7}Bi_{0.3}CO_4O_9/La_{0.9}NiO_3$ Thermoelectric Devices with High Output Power Density"; Applied Physics Letters, vol. 85, No. 6; pp. 1036-1038; Aug. 9, 2004; XP012064140.

Gaojie Xu et al.; "Thermoelectric Properties of $Bi_{2.2-x}Pb_xSr_2Co_2O_y$ System", Journal of Applied Physics; vol. 91, No. 7; pp. 4344-4347; Apr. 1, 2002; XP012056111.

R. Funahashi et al.; "Thermoeledtric Properties of Ln-Ni-O (Ln:lanthanoid) System", $22^{nd}$ International Conference on Thermoelectrics (2003); pp. 184-187; Aug. 17, 2003; XP010697214.

Ichiro Matsubara et al.; "Fabrication of an all-Oxide Thermoelectric Power Generator"; Applied Physics Letters; vol. 78, No. 23, pp. 3627-3629; Jun. 4, 2001; XP012028210.

Woosuck Shin et al.; "Fabrication of Oxide Thermoelectric Generator Element", Japanese Journal of Applied Physics, vol. 39; Part 1, No. 3A; pp. 1254-1255; Mar. 2000; XP002461436.

Supplementary European Search Report dated Dec. 14, 2007.

* cited by examiner pipe-like module contact portion of p-type thermoelectric material
and n-type thermoelectric material

THERMOELECTRIC CONVERSION ELEMENT AND THERMOELECTRIC CONVERSION MODULE

TECHNICAL FIELD

The present invention relates to a thermoelectric element, a thermoelectric module, and a thermoelectric conversion method.

BACKGROUND ART

In Japan, only about 30% of the primary energy supply is used as effective energy, with about 70% being eventually lost to the atmosphere as heat. The heat generated by combustion in industrial plants, garbage-incineration facilities and the like is lost to the atmosphere without being converted into other energy. In this way, we are wastefully discarding a vast amount of thermal energy, while acquiring only a small amount of energy by combustion of fossil fuels or other means.

To increase the proportion of energy to be utilized, the thermal energy currently lost to the atmosphere should be effectively used. For this purpose, thermoelectric conversion, which directly converts thermal energy to electrical energy, is an effective means. Thermoelectric conversion, which utilizes the Seebeck effect, is an energy conversion method for generating electricity by creating a difference in temperature between both ends of a thermoelectric material to produce a difference in electric potential.

In such a method for generating electricity utilizing thermoelectric conversion, i.e., thermoelectric generation, electricity is generated simply by setting one end of a thermoelectric material at a location heated to a high temperature by waste heat, and the other end in the atmosphere, and connecting external resistances to both ends. This method entirely eliminates the need for moving parts, such as the motors or turbines generally required for power generation. As a consequence, the method is economical and can be carried out without releasing the gases by combustion. Moreover, the method can continuously generate electricity until the thermoelectric material has deteriorated. Furthermore, thermoelectric generation enables power generation at a high power density. Therefore, it is possible to make electric power generators (modules) small and light enough to be used as mobile power supplies for cellular phones, notebook computers, etc.

Therefore, thermoelectric generation is expected to play a role in the resolution of future energy problems. To realize thermoelectric generation, a thermoelectric module comprising a thermoelectric material that has both a high thermoelectric conversion efficiency and excellent properties in terms of heat resistance, chemical durability, etc., will be required.

$CoO_2$-based layered oxides such as $Ca_3Co_4O_9$ have been reported as substances that achieve excellent thermoelectric performance in air at high temperatures, and such thermoelectric materials are currently being developed (see Non-Patent Document 1, for example).

However, the development of a thermoelectric module (electric power generator) that is needed to realize efficient thermoelectric generation using thermoelectric materials has been delayed so far.

Non-Patent Document 1: R. Funahashi et al., Jpn. J. Appl. Phys., 39, L1127 (2000)

DISCLOSURE OF THE INVENTION

Problems to be Solved by Invention

The present invention has been made to solve the above problems. A principal object of the invention is to provide a thermoelectric element and a thermoelectric module that have both a high thermoelectric conversion efficiency and excellent properties in terms of thermal stability, chemical durability, etc., that are required to realize thermoelectric generation.

Means for Solving the Problems

The present inventors conducted extensive research to achieve the above object. As a result, the inventors found that a thermoelectric element having excellent properties can be obtained by forming a thin film of p-type thermoelectric material and a thin film of n-type thermoelectric material, each thermoelectric material comprising a specific complex oxide, on an electrically insulating substrate, and electrically connecting one end portion of the p-type thermoelectric material and one end portion of the n-type thermoelectric material. The thermoelectric element thus obtained has a high thermoelectric conversion efficiency and excellent electrical conductivity as well as excellent thermal stability, chemical durability, etc., and exhibits excellent properties as a thermoelectric element.

More specifically, the present invention provides the following thermoelectric elements, thermoelectric modules, and thermoelectric conversion methods.

1. A thermoelectric element comprising:
   a thin film of p-type thermoelectric material,
   a thin film of n-type thermoelectric material, and
   an electrically insulating substrate,
   the thin film of p-type thermoelectric material and the thin film of n-type thermoelectric material being formed on the electrically insulating substrate and being electrically connected,
   (i) the p-type thermoelectric material comprising at least one complex oxide selected from the group consisting of:
   complex oxides represented by Formula (1): $Ca_a A_b^1 Co_c A_d^2 O_e$, wherein $A^1$ is one or more elements selected from the group consisting of Na, K, Li, Ti, V, Cr, Mn, Fe, Ni, Cu, Zn, Pb, Sr, Ba, Al, Bi, Y, and lanthanoids; $A^2$ is one or more elements selected from the group consisting of Ti, V, Cr, Mn, Fe, Ni, Cu, Ag, Mo, W, Nb, and Ta; $2.2 \leq a \leq 3.6$; $0 \leq b \leq 0.8$; $2.0 \leq c \leq 4.5$; $0 \leq d \leq 2.0$; and $8 \leq e \leq 10$, and
   complex oxides represented by Formula (2): $Bi_f Pb_g M_h^1 Co_i M_j^2 O_k$, wherein $M^1$ is one or more elements selected from the group consisting of Na, K, Li, Ti, V, Cr, Mn, Fe, Ni, Cu, Zn, Pb, Ca, Sr, Ba, Al, Y, and lanthanoids; $M^2$ is one or more elements selected from the group consisting of Ti, V, Cr, Mn, Fe, Ni, Cu, Ag, Mo, W, Nb, and Ta; $1.8 \leq f \leq 2.2$; $0 \leq g \leq 0.4$; $1.8 \leq h \leq 2.2$; $1.6 \leq i \leq 2.2$; $0 \leq j \leq 0.5$; and $8 \leq k \leq 10$; and
   (ii) the n-type thermoelectric material comprising at least one complex oxide selected from the group consisting of:
   complex oxides represented by Formula (3): $Ln_m R_n^1 Ni_p R_q^2 O_r$, wherein Ln is one or more elements selected from the group consisting of lanthanoids; $R^1$ is one or more elements selected from the group consisting of Na, K, Sr, Ca, and Bi; $R^2$ is one or more elements selected from the group consisting of Ti, V, Cr, Mn, Fe, Co, Cu, Mo, W, Nb, and Ta; $0.5 \leq m \leq 1.7$; $0 \leq n \leq 0.5$; $0.5 \leq p \leq 1.2$; $0 \leq q \leq 0.5$; and $2.7 \leq r \leq 3.3$;

complex oxides represented by Formula (4): $(Ln_sR_t^3)_2Ni_uR_v^4O_w$, wherein Ln is one or more elements selected from the group consisting of lanthanoids; $R^3$ is one or more elements selected from the group consisting of Na, k, Sr, Ca, and Bi; $R^4$ is one or more elements selected from the group consisting of Ti, V, Cr, Mn, Fe, Co, Cu, Mo, W, Nb, and Ta; $0.5 \leq s \leq 1.2$; $0 \leq t \leq 0.5$; $0.5 \leq u \leq 1.2$; $0 \leq v \leq 0.5$; and $3.6 \leq w \leq 4.4$;

complex oxides represented by Formula (5): $A_xZn_yO_z$, wherein A is Ga or Al; $0 \leq x \leq 0.1$; $0.9 \leq y \leq 1$; and $0.9 \leq z \leq 1.1$; and complex oxides represented by Formula (6): $Sn_{xx}In_{yy}O_{zz}$, wherein $0 \leq xx \leq 1$; $0 \leq yy \leq 2$; and $1.9 \leq zz \leq 3$.

2. The thermoelectric element according to Item 1, wherein the p-type thermoelectric material comprises at least one complex oxide selected from the group consisting of complex oxides represented by the formula: $Ca_aA_b^1Co_aO_e$, wherein $A^1$ is one or more elements selected from the group consisting of Na, K, Li, Ti, V, Cr, Mn, Fe, Ni, Cu, Zn, Pb, Sr, Ba, Al, Bi, Y, and lanthanoids; $2.2 \leq a \leq 3.6$; $0 \leq b \leq 0.8$; and $8 \leq e \leq 10$, and complex oxides represented by the formula: $Bi_fPb_gM_h^1Co_2O_k$, wherein $M^1$ is one or more elements selected from the group consisting of Sr, Ca, and Ba; $1.8 \leq f \leq 2.2$; $0 \leq g \leq 0.4$; $1.8 \leq h \leq 2.2$; and $8 \leq k \leq 10$;

the n-type thermoelectric material comprises at least one complex oxide selected from the group consisting of complex oxides represented by the formula: $Ln_mR_n^1NiO_r$, wherein Ln is lanthanoid; $R^1$ is one or more elements selected from the group consisting of Na, K, Sr, Ca, and Bi; $0.5 \leq m \leq 1.2$; $0 \leq n \leq 0.5$; and $2.7 \leq r \leq 3.3$, complex oxides represented by the formula: $(Ln_sR_t^3)_2NiO_w$, wherein Ln is lanthanoid; $R^3$ is one or more elements selected from the group consisting of Na, K, Sr, Ca, and Bi; $0.5 \leq s \leq 1.2$; $0 \leq t \leq 0.5$; and $3.6 \leq w \leq 4.4$, and complex oxides represented by the formula: $Ln_xR_y^5Ni_pR_{q'}^6O_{r'}$, wherein Ln is lanthanoid; $R^5$ is one or more elements selected from the group consisting of Na, K, Sr, Ca, Bi, and Nd; and $R^6$ is one or more elements selected from the group consisting of Ti, V, Cr, Mn, Fe, Co, and Cu; $0.5 \leq x \leq 1.2$; $0 \leq y \leq 0.5$; $0.5 \leq p \leq 1.2$; $0.01 \leq q' \leq 0.5$; and $2.8 \leq r' \leq 3.2$.

3. The thermoelectric element according to Item 1, wherein the thin film of p-type thermoelectric material and the thin film of n-type thermoelectric material are electrically connected by one of the following methods:

bringing one end portion of the thin film of p-type thermoelectric material into direct contact with one end portion of the thin film of n-type thermoelectric material;

bringing one end portion of the thin film of p-type thermoelectric material into contact with one end portion of the thin film of n-type thermoelectric material via an electrically conductive material;

bringing one end portion of the thin film of p-type thermoelectric material into direct contact with one end portion of the thin film of n-type thermoelectric material and covering the contact portion with an electrically conductive material.

4. The thermoelectric element according to Item 1, wherein the thin film of p-type thermoelectric material and the thin film of n-type thermoelectric material are formed on the same surface or on different surfaces of the electrically insulating substrate.

5. The thermoelectric element according to Item 1, wherein the electrically insulating substrate is a substrate comprising a plastic material.

6. The thermoelectric element according to Item 1, wherein thermoelectromotive force is at least 60 μV/K in a temperature range of 293 K to 1073 K.

7. The thermoelectric element according to Item 1, wherein electrical resistance is 1 KΩ or lower in a temperature range of 293 K to 1073 K.

8. A thermoelectric module comprising a plurality of the thermoelectric elements of Item 1, wherein the thermoelectric elements are electrically connected in series such that an unconnected end portion of a p-type thermoelectric material of one thermoelectric element is electrically connected to an unconnected end portion of an n-type thermoelectric material of another thermoelectric element.

9. A thermoelectric conversion method comprising positioning one end of the thermoelectric module of Item 8 at a high-temperature portion and positioning the other end of the module at a low-temperature portion.

In the thermoelectric element of the present invention, specific complex oxides are used as p-type and n-type thermoelectric materials; thin films of p-type and n-type thermoelectric materials are formed on an electrically insulating substrate; and one end portion of the thin film of p-type thermoelectric material and one end portion of the thin film of n-type thermoelectric material are electrically connected.

Combined use of such complex oxides can provide a thermoelectric element with high thermoelectric conversion efficiency and good electrical conductivity. In addition, such complex oxides, when formed into a thin film, can be formed on substrates having various shapes, thereby easily providing thermoelectric elements having various shapes, which can be used in various applications, such as mounting on an electronic circuit, use in a fine portion, etc. Moreover, the thermoelectric module needs to be formed into a fin shape when used in airflow, such as in a boiler or a car radiator so that the module does not cause pressure loss by interrupting the airflow. In this application, thin film-type thermoelectric elements are useful.

Hereinafter, p-type thermoelectric materials and n-type thermoelectric material used in the invention are described.

p-Type Thermoelectric Material

Usable as a p-type thermoelectric material is at least one oxide selected from the group consisting of complex oxides represented by Formulae (1) and (2):

complex oxides represented by Formula (1): $Ca_aA_b^1Co_cA_d^2O_e$, wherein $A^1$ is one or more elements selected from the group consisting of Na, K, Li, Ti, V, Cr, Mn, Fe, Ni, Cu, Zn, Pb, Sr, Ba, Al, Bi, Y, and lanthanoids; $A^2$ is one or more elements selected from the group consisting of Ti, V, Cr, Mn, Fe, Ni, Cu, Ag, Mo, W, Nb, and Ta; $2.2 \leq a \leq 3.6$; $0 \leq b \leq 0.8$; $2.0 \leq c \leq 4.5$; $0 \leq d \leq 2.0$; and $8 \leq e \leq 10$, and complex oxides represented by Formula (2): $Bi_fPb_gM_h^1Co_iM_j^2O_k$, wherein $M^1$ is one or more elements selected from the group consisting of Na, K, Li, Ti, V, Cr, Mn, Fe, Ni, Cu, Zn, Pb, Ca, Sr, Ba, Al, Y, and lanthanoids; $M^2$ is one or more elements selected from the group consisting of Ti, V, Cr, Mn, Fe, Ni, Cu, Ag, Mo, W, Nb, and Ta; $1.8 \leq f \leq 2.2$; $0 \leq g \leq 0.4$; $1.8 \leq h \leq 2.2$; $1.6 \leq i \leq 2.2$; $0 \leq j \leq 0.5$; and $8 \leq k \leq 10$.

In the above Formulae (1) and (2), examples of lanthanoids include La, Ce, Pr, Nd, Sm, Eu, Gd, Tb, Dy, Ho, Er, Tm, Yb, Lu, etc.

The complex oxides represented by the above formulae have a laminated structure with alternating rock-salt structure layers and $CoO_2$ layers, wherein the rock-salt structure layers have the components Ca, Co, and O in the ratio of $Ca_2CoO_3$, or the components Bi, $M^1$, and O in the ratio of $Bi_2M_2^1O_4$;

and the $CoO_2$ layers have octahedrons with octahedral coordination of six O to one Co, the octahedrons being arranged two-dimensionally such that they share one another's sides. In the former case, some of the Ca in $Ca_2CoO_3$ is substituted by $A^1$, and some of the Co of this layer and some of the Co of the $CoO_2$ layer are further substituted by $A^2$. In the latter case, some of the Bi are substituted by Pb or some of $M^1$, and some of the Co are substituted by $M^2$.

Such complex oxides have high Seebeck coefficients as p-type thermoelectric materials and excellent electrical conductivity. For example, they have a Seebeck coefficient of at least about 100 μV/K and an electrical resistivity of not more than about 50 mΩcm, preferably not more than about 30 mΩcm, at temperatures of 100 K or higher; and the Seebeck coefficient tends to increase and the electrical resistivity tends to decrease as the temperature rises.

Among the complex oxides mentioned above, mentioned as a preferable example is at least one complex oxide selected from the group consisting of complex oxides represented by the formula: $Ca_aA_b{}^1Co_4O_e$, wherein $A^1$ is one or more elements selected from the group consisting of Na, K, Li, Ti, V, Cr, Mn, Fe, Ni, Cu, Zn, Pb, Sr, Ba, Al, Bi, Y, and lanthanoids; $2.2 \leq a \leq 3.6$; $0 \leq b \leq 0.8$; and $8 \leq e \leq 10$) and complex oxides represented by the formula: $Bi_fPb_gM_h{}^1Co_2O_k$, wherein $M^1$ is one or more elements selected from the group consisting of Sr, Ca, and Ba; $1.8 \leq f \leq 2.2$; $0 \leq g \leq 0.4$; $1.8 \leq h \leq 2.2$; and $8 \leq k \leq 10$). Such complex oxides have a Seebeck coefficient of at least about 100 μV/K and an electrical resistivity of not more than about 100 mΩcm at temperatures of 100 K or higher; and the Seebeck coefficient tends to increase and the electrical resistivity tends to decrease as the temperature rises.

n-Type Thermoelectric Material

Usable as an n-type thermoelectric material is at least one oxide selected from the group consisting of complex oxides represented by Formulae (3), (4), (5), and (6):

complex oxides represented by Formula (3): $Ln_mR_n{}^1Ni_pR_q{}^2O_r$, wherein Ln is one or more elements selected from the group consisting of lanthanoids; $R^1$ is one or more elements selected from the group consisting of Na, K, Sr, Ca, and Bi; $R^2$ is one or more elements selected from the group consisting of Ti, V, Cr, Mn, Fe, Co, Cu, Mo, W, Nb, and Ta; $0.5 \leq m \leq 1.7$; $0 \leq n \leq 0.5$; $0.5 \leq p \leq 1.2$; $0 \leq q \leq 0.5$; and $2.7 \leq r \leq 3.3$;

complex oxides represented by Formula (4): $(Ln_sR_t{}^3)_2Ni_uR_v{}^4O_w$, wherein Ln is one or more elements selected from the group consisting of lanthanoids; $R^3$ is one or more elements selected from the group consisting of Na, K, Sr, Ca, and Bi; $R^4$ is one or more elements selected from the group consisting of Ti, V, Cr, Mn, Fe, Co, Cu, Mo, W, Nb, and Ta; $0.5 \leq s \leq 1.2$; $0 \leq t \leq 0.5$; $0.5 \leq u \leq 1.2$; $0 \leq v \leq 0.5$; and $3.6 \leq w \leq 4.4$;

complex oxides represented by Formula (5): $A_xZn_yO_z$, wherein A is Ga or Al; $0 \leq x \leq 0.1$; $0.9 \leq y \leq 1$; and $0.9 \leq z \leq 1.1$); and complex oxides represented by Formula (6): $SN_{xx}In_{yy}O_{zz}$, wherein $0 \leq xx \leq 1$; $0 \leq yy \leq 2$; and $1.9 \leq zz \leq 3$.

In the above formulae, examples of lanthanoids include La, Ce, Pr, Nd, Sm, Eu, Gd, Tb, Dy, Ho, Er, Tm, Lu, etc. In Formula (3), the range of m is $0.5 \leq m \leq 1.7$, and preferably $0.5 \leq m \leq 1.2$.

The complex oxides represented by the above formulae have a negative Seebeck coefficient and exhibit properties as n-type thermoelectric materials in that when a difference in temperature is created between both ends of the oxide material, the electric potential generated by the thermoelectromotive force is higher at the high-temperature side than at the low-temperature side.

More specifically, the above complex oxides represented by Formulae (3) and (4) have a negative Seebeck coefficient at temperatures of 373 K or higher. For example, they may have a Seebeck coefficient of about −1 to about −20 μV/K at temperatures of 373 K or higher. Furthermore, the above complex oxides have excellent electrical conductivity and low electrical resistivity, and, for example, may have an electrical resistivity of about 20 mΩcm or less at temperatures of 373 K or higher.

The complex oxides represented by Formula (3) have a perovskite-type crystal structure and the complex oxides represented by Formula (4) have a so-called layered perovskite-type crystal structure. The former is generally referred to as an $ABO_3$ structure and the latter as an $A_2BO_4$ structure. In these complex oxides, some of Ln are substituted by $R^1$ or $R^3$, and some of Ni are substituted by $R^2$ or $R^4$.

The complex oxides represented by Formulae (5) and (6) are known as a material for a transparent electrically conductive film. For example, they have a Seebeck coefficient of about −100 μV/K or lower at temperatures of 100 K or higher and have excellent electrical conductivity, and exhibits low electrical resistivity as low as not more than about 100 mΩcm at temperatures of 100 K or higher.

Among the above complex oxides, the complex oxides represented by Formula (5) have a hexagonal wurtz structure and the complex oxides represented by Formula (6) have a cubic rutile structure or tetragonal bcc structure.

Among the complex oxides mentioned above, preferable examples include a complex oxide selected from the group consisting of complex oxides represented by the formula: $Ln_mR_n{}^1NiO_r$, wherein Ln is one or more elements selected from the group consisting of lanthanoids; $R^1$ is one or more elements selected from the group consisting of Na, K, Sr, Ca, and Bi; $0.5 \leq m \leq 1.2$; $0 \leq n \leq 0.5$; and $2.7 \leq r \leq 3.3$; complex oxides represented by the formula: $(Ln_sR_t{}^3)_2NiO_w$, wherein Ln is one or more elements selected from the group consisting of lanthanoids; $R^3$ is one or more elements selected from the group consisting of Na, K, Sr, Ca, and Bi; $0.5 \leq s \leq 1.2$; $0 \leq t \leq 0.5$; and $3.6 \leq w \leq 4.4$; and complex oxides represented by the formula: $Ln_xR_y{}^5Ni_pR_{q'}{}^6O_{r'}$, wherein Ln is one or more elements selected from the group consisting of lanthanoids; $R^5$ is one or more elements selected from the group consisting of Na, K, Sr, Ca, Bi, and Nd; and $R^6$ is one or more elements selected from the group consisting of Ti, V, Cr, Mn, Fe, Co, and Cu; $0.5 \leq x \leq 1.2$; $0 \leq y \leq 0.5$; $0.5 \leq p \leq 1.2$; $0.01 \leq q' \leq 0.5$; and $2.8 \leq r' \leq 3.2$.

Among the above, the complex oxides represented by the formulae: $Ln_mR_n{}^1NiO_r$ and $(Ln_sR_t{}^3)_2NiO_w$, for example, have a Seebeck coefficient of −1 to −30 mV/K at temperatures of 100 K or higher and exhibits low electrical resistivity. For example, they may have electrical conductivity of not more than about 10 mΩcm at a temperature of 100 K or higher.

The complex oxides represented by the formula: $Ln_xR_y{}^5Ni_pR_{q'}{}^6O_{r'}$, have a negative Seebeck coefficient at a temperature of 100° C. or higher, and have excellent electrical conductivity and exhibit low electrical resistivity as low as not more than about 10 mΩcm at a temperature of 100° C. or higher.

Thermoelectric Element

In the thermoelectric element of the present invention, the thin film of p-type thermoelectric material and the thin film of n-type thermoelectric material are formed on an electrically insulating substrate and one end portion of the thin film of p-type thermoelectric material and one end portion of the thin film of n-type thermoelectric material are electrically connected.

(1) Electrically Insulating Substrate

There is no limitation on an electrically insulating substrate insofar as the substrate does not deteriorate at the temperature at which the substrate is subjected to a heat treatment for forming a thin oxide film. Accordingly, various types of substrates can be used, including an inexpensive substrate. Moreover, a substrate having low thermal conductivity, such as a glass substrate, ceramic substrate and the like, can be used. The use of such substrate can sharply reduce the influence of substrate temperature on the thermoelectric conversion efficiency of the thin film of complex oxide to be formed.

Various types of plastic materials, such as polyimide, etc., can also be used as a substrate insofar as the material does not deteriorate at heat-treatment temperature. When a thin film of a thermoelectric material is formed by a vapor deposition method, aerosol deposition method or the like among the thin-film formation methods described later, a thin film having an excellent thermoelectric conversion efficiency can be formed without heat treatment. Therefore, on a substrate of a plastic material having relatively low heat resistance, such as polyethylene, polypropylene, polystyrene, polyethylene terephthalate (PET) and the like, a thin film of a thermoelectric material having an excellent thermoelectric conversion efficiency can be formed. The present invention can employ various types of plastic materials as mentioned above as a substrate, and thus can be used in many applications utilizing the properties such as flexibility, plasticity and the like of the plastic materials. Moreover, since a thin film of a thermoelectric material can be formed while applying no thermal damage to, for example, an organic thin-film transistor (organic TFT) or the like, the present invention can be applied to various flexible devices.

In the invention, a substrate having low thermal conductivity of about 10 W/m·K or lower at 25° C. is preferable, one having thermal conductivity of about 5 W/m·K or lower at 25° C. is more preferable, and one having thermal conductivity of about 2 W/m·K or lower at 25° C. is even more preferable.

Various shapes of electrically insulating substrates can be used without limitation, and the shape can be suitably determined in accordance with the usage of the thermoelectric element to be obtained.

For example, in the case of a pipe-like substrate, a pipe-like thermoelectric element can be obtained by forming thin films of complex oxides on either or both sides of the pipe-like substrate. In the pipe-like thermoelectric element, thermoelectric generation can be conducted by passing a combustion gas through the pipe inside to create a temperature difference between the gas inlet side and the gas outlet side. The use of such a thermoelectric element enables electricity to be generated by using a motor vehicle exhaust gas.

When a flexible electrically insulating plastic film is used as a substrate, the shape of a thermoelectric element can be varied by winding or bending the plastic substrate even after obtaining the thermoelectric element by forming thin films of complex oxides on such substrate.

(2) Thermoelectric Material Thin Film

The film thicknesses of a thin film of p-type thermoelectric material and a thin film of n-type thermoelectric material are not limited. The film thickness of the thin films may be suitably determined in accordance with their usage to attain excellent thermoelectric conversion performance. For example, by setting the film thickness to about 100 nm or more and preferably about 300 nm or more, excellent performance can be demonstrated. For use as a thin film, the upper limit of the film thickness may generally be about 10 μm or less, preferably about 5 μm or less, and more preferably about 2 μm or less.

The shapes of a thin film of p-type thermoelectric material and a thin film of n-type thermoelectric material are not limited. The shape and size of the thin film may be suitably determined in accordance with the shape of the substrate. For example, in the case of a plate-like substrate, a thin film of p-type thermoelectric material and a thin film of n-type thermoelectric material can be formed on one surface of a substrate, or a thin film of p-type thermoelectric material can be formed on one surface of the substrate and a thin film of n-type thermoelectric material can be formed on the other surface of the substrate. Such thin films may be formed on a part of or on the entire surface of the substrate. By lengthening the long sides of a thin film of a thermoelectric material as much as possible, a temperature difference between both the ends of the thin film of a thermoelectric material can be increased to thereby raise the voltage. By shortening the long sides thereof, electrical resistance can be decreased.

Also, in the case of a pipe-like substrate, both thin films may be formed on the external surface of a pipe, or one thin film may be formed on the external surface of the pipe and the other thin film may be formed on the inside of the pipe in the same manner as described above.

(3) Thin-film Formation Method

There is no limitation to the methods for forming a thin film of p-type thermoelectric material and a thin film of n-type thermoelectric material on an electrically insulating substrate insofar as a single crystal thin film or a polycrystal thin film with the above-identified composition can be formed.

Various known methods are usable, and, examples of such known methods include thin film formation by vapor deposition; thin film formation using a raw material solution, such as dip coating, spin coating, brush coating, or spray-atomizing; aerosol deposition by spraying fine particles of a complex oxide; etc. In addition, single-crystal thin film formation methods such as a flux method using a flux and a method for melting and solidifying a raw material without using a flux may be employed.

These film formation methods can be performed under known conditions. Hereinafter, typical methods among the above methods are specifically described.

(i) Vapor Deposition:

A method for forming a thin film by vapor deposition is described in more detail.

Any raw material can be used without limitation insofar as an oxide can be formed by evaporating and depositing the raw material onto a substrate by vapor deposition. For example, usable are metals; oxides; various compounds (carbonate, etc.); and the like, all of which comprise a constituent metal element. In addition, a material comprising two or more of the constituent elements of an intended complex oxide may be used.

Such raw materials are mixed in such a manner as to yield the same metal ratio as that of an intended complex oxide and the mixture can be used as it is. In particular, such a mixture of raw materials is preferably heated. The heated material is easy to handle in the vapor deposition described later.

There is no limitation on the heating conditions for such raw materials. For example, such raw materials may be sintered at high temperatures at which a crystal of a complex oxide represented by the above-described formula is formed, or such raw materials may be calcined at relatively low temperatures to form a calcinate without forming an oxide crystal. Various heating methods, such as an electric heating furnace, a gas heating furnace, etc., can be employed without limitation. The heating atmosphere may generally be an oxidizing atmosphere such as in an oxygen stream, in air, etc. Such raw materials can also be heated in an inert gas atmosphere.

There is no limitation to the vapor deposition method insofar as an oxide thin film can be formed on a substrate using the above-mentioned raw material(s). For example, physical-vapor-deposition is preferable and specific examples thereof include pulsed laser deposition, sputtering, vacuum deposition, ion-plating, plasma-assisted-deposition, ion-assisted-deposition, reactive deposition, laser ablation, etc. Among these methods, pulsed laser deposition is preferable because composition variation is not likely to occur during the vapor deposition of a complex oxide comprising multi-elements.

A complex oxide may be deposited while heating a substrate at about 400° C. to about 600° C., or may be deposited at room temperature. When a complex oxide is deposited while heating a substrate, the complex oxide is formed on a substrate, thereby usually eliminating a heat treatment. Some complex oxides deposited on a substrate at room temperature have a very low degree of crystallization, and thus cannot exhibit good thermoelectric conversion performance. In this case, such a complex oxide can be given good thermoelectric conversion performance by heating to promote crystallization of the oxide.

The heat treatment temperature may be, for example, about 600° C. to about 740° C. Heat treatment in this temperature range can promote the crystallization of a thin film of complex oxide and thus achieve good thermoelectric performance. An excessively low heat treatment temperature fails to promote crystallization to a sufficient level, which lowers the thermoelectric conversion performance, and thus is not desirable. On the other hand, an excessively high heat treatment temperature causes another phase to appear, which also lowers the thermoelectric conversion performance, and thus is not desirable either.

The heat treatment may generally be performed in an oxidizing atmosphere, such as in air or in an atmosphere containing about 5% or higher of oxygen. The heat treatment can be performed under various pressures, such as reduced pressure, atmospheric pressure, and increased pressure. For example, the pressure may be in the range of about $10^{-3}$ Pa to about 2 MPa.

The heat treatment time varies depending on the size of the substrate, the thickness of the thin film of complex oxide, etc. The heat treatment may be performed in such a manner that the thin film of complex oxide is sufficiently crystallized, and may generally be performed for about 3 minutes to about 10 hours, and preferably about 1 hour to about 3 hours.

An intended thin film of complex oxide can be formed according to the above-described method.

(ii) Spin Coating:

Next, spin coating is described in detail as a method for forming a thin film of complex oxide using a raw material solution.

A solution containing a dissolved raw material having a constituent metal element of an intended complex oxide is usable as a raw material solution. The raw material is not limited insofar as the material can form an oxide when heated. Metals, oxides, various compounds (chlorides, carbonates, nitrates, hydroxides, alkoxide compounds, etc.) and the like are usable as raw materials.

Usable as a solvent are water; organic solvents, such as toluene, xylene, and the like; etc. The concentration of the raw material in the solution is not limited insofar as the solution contains a metal component in the same proportion as that of an intended complex oxide, and may be, for example, about 0.01 to about 1 mol/l.

Such a raw material solution is dropped in small portions onto a substrate rotating at high rotation rates. The solution uniformly spreads onto the substrate due to the centrifugal force caused by the rotation. The solvent is then evaporated, forming a precursor of a thin film of the intended complex oxide. The rotation rate of the substrate is not limited, and may be determined suitably depending on the solution viscosity or the thickness of the film to be formed.

Subsequently, this precursor is heat-treated in air to form a thin film of complex oxide. The heat treatment conditions are not limited insofar as an intended complex oxide is formed. In general, a solvent is removed by heating the precursor at about 300° C. to about 500° C. for about 1 to about 10 hours, and then further heating the result at about 500° C. to about 1000° C. for about 1 to about 20 hours, thereby forming a polycrystalline thin film of an intended complex oxide.

(iii) Aerosol Deposition:

In the case of aerosol deposition, a coating film of a complex oxide can be formed by spraying fine-particles of an intended complex oxide with a carrier gas onto a substrate.

Fine particles of a complex oxide can be obtained by mixing the raw material of a complex oxide in such a manner as to yield the same metal ratio as that of the intended complex oxide, sintering the mixture in an oxygen-containing atmosphere, and, as required, pulverizing the result. The average particle diameter of a complex oxide may be about 0.5 μm to about 5 μm.

Examples of carrier gas include nitrogen gas, helium (He) gas, etc. A coating film of complex oxide can be formed by spraying a complex oxide powder onto a substrate using such a carrier gas at a gas flow of about 5 to about 10 L/minute and at a distance between a nozzle and a substrate of about 10 to about 30 mm within a reduced pressure chamber having a pressure of about 10 Pa to about 8 kPa. During this process, the substrate is not necessarily heated, but, when heated at about 200 to about 600° C., the adhesion between the coating film to be formed and the substrate can be increased.

After being formed, a coating film is not necessarily heated, but, as required, when heated at about 200 to about 700° C. for about 10 minuets to about 4 hours in an oxygen-containing atmosphere, the crystallinity of the coating film to be formed can be further increased.

(iv) Single Crystal Thin-film Formation Method

Next, a method for forming a single crystal thin film of complex oxide is described.

According to this method, raw materials are mixed in such a manner as to have the same element ratio as that of the intended complex oxide, the mixture is melted on a substrate by heating, and the melt is cooled gradually, providing a single-crystal thin film. Any raw material can be used without limitation insofar as a mixture of the raw materials can form a homogeneous melt when heated. For example, metals, oxides, various compounds (carbonates, etc.), and the like can be used. A compound containing two or more constituent elements of an intended complex oxide is also usable.

More specifically, a single-crystal thin film can be formed by heating a raw material mixture to form a melt in a uniform solution state, and cooling the melt. The heating time is not limited, and the heating treatment may be performed until a uniform solution state is attained. There is no limitation on the heating method and an electric heating furnace, gas heating furnace and the like can be used. The raw material may be melted in an oxidizing atmosphere, such as in an oxygen stream, in air or the like. A raw material, when containing a sufficient amount of oxygen, can be melted in, for example, an inert gas atmosphere.

The cooling method is not limited. For example, a raw material in a solution state may be cooled as a whole, or a cooled substrate may be immersed in a container containing a molten raw material, to thereby grow a single crystal thereon.

The cooling rate is not limited, but slow cooling is preferable in order to form a single-crystal thin film. This is because as the cooling rate is increased, a large number of crystals are grown on the substrate to form a so-called polycrystalline thin film. For example, a cooling rate of about 50° C./h or lower may be employed.

Instead of directly melting a raw material mixture, another ingredient may be added to a raw material mixture so as to adjust the melting point for forming a melt, and then the mixture is melted by heating. The method of adding an additive (a flux component) other than materials containing metal elements of a complex oxide and melting the mixture is referred to as a so-called "flux method". In flux methods, a flux component contained in a raw material mixture is partially melted by heating, and the whole raw material mixture is dissolved to form a solution due to chemical change, dissolution effect and the like of the molten component. Thus, the raw material mixture can be melted at lower temperatures compared with a method for directly cooling the raw material mixture. By cooling the raw material in a solution state at a suitably controlled cooling rate, an intended single crystal can be grown due to supersaturation accompanied by cooling. During this cooling process, grown is a single crystal complex oxide with a solid phase composition in phase equilibrium with a solution phase that is formed when the raw material is melted. Therefore, based on the relationship between the solution phase composition and the solid phase (single crystal) composition, which are in an equilibrium state, a proportion of each raw material in a raw material mixture can be determined according to the composition of the complex oxide to be formed.

In this method, the flux component contained in the raw material remains as a solvent component, and is not contained in the single crystal to be grown.

Such a flux component may be selected from substances which have a lower melting point compared with the raw material of the thin film, and which have the capability of sufficiently dissolving a raw material in the melt to be formed and which do not adversely affect the properties of an intended complex oxide. For example, alkali metal compounds, boron-containing compounds and the like can be used.

Specific examples of alkali metal compounds include alkali metal chlorides, such as lithium chloride (LiCl), sodium chloride (NaCl), and potassium chloride (KCl), and hydrates thereof; alkali metal carbonates, such as lithium carbonate ($Li_2CO_3$), sodium carbonate ($Na_2CO_3$), and potassium carbonate ($K_2CO_3$), etc.; and the like. A specific example of boron-containing compounds is boric acid ($B_2O_3$), etc. These additives can be used singly or as a mixture of two or more thereof.

The content of such a flux component is not limited, and can be determined depending on the heating temperature considering the solubility of the raw material in the melt to be formed in such a manner that the melt will contain the raw material in as high a concentration as possible.

There is no limitation on the method for melting a raw material mixture, and the raw material mixture may be heated to form a melt in a uniform solution state on a substrate. The heating temperature varies depending on the flux component used. For example, the raw material mixture may be melted by heating at temperatures of about 800 to about 1000° C. for about 20 to about 40 hours.

There is no limitation on the heating method and an electric heating furnace, gas heating furnace and the like can be used. The raw material may be melted in an oxidizing atmosphere, such as in an oxygen stream, in air or the like. A raw material, when containing a sufficient amount of oxygen, can be melted in, for example, an inert gas atmosphere.

Although the cooling rate is not limited, a polycrystalline thin film may be formed at a high cooling rate and a single-crystal thin film may be easy to form at a low cooling rate. For example, a single crystal thin film can be formed at a cooling rate of about 50° C./h or lower.

The size, yield and the like of the single-crystal thin film of complex oxide to be formed varies depending on the type and composition of the raw material, the composition of the molten components, the cooling rate, etc. For example, when the molten mixture is cooled at a cooling rate of about 50° C./h or lower until it is solidified, needlelike or plate-like single crystals with a width of about 0.5 mm or more, a thickness of about 0.5 mm or more, and a length of about 5 mm or more can be obtained.

Subsequently, components other than the intended single crystal complex oxide are removed from solidified product formed by cooling, thereby forming a single crystal thin film of the target complex oxide as it adheres to a substrate.

Components other the complex oxide can be removed as follows. For example, a water-soluble component, e.g., chloride, adhering to a single-crystal complex oxide, can be removed by repeated washing with distilled water and filtration, and, as required, washing with ethanol.

(4) Thermoelectric Element:

A thermoelectric element of the present invention is obtained by electrically connecting one end of a thin film of p-type thermoelectric material and one end of a thin film of n-type thermoelectric material, which are formed on a substrate.

It is preferable to use the thermoelectric materials in combination such that the sum of the absolute values of the thermoelectromotive forces of the p-type thermoelectric material and the n-type thermoelectric material is, for example, at least about 60 µV/K, and preferably at least about 100 µV/K, at all temperatures in the range of 293 to 1073 K (absolute temperature). It is also preferable that each of these thermoelectric materials has an electrical resistivity of not more than about 100 mΩcm, preferably not more than about 50 mΩcm, and more preferably not more than about 10 mΩcm, at all temperatures in the range of 293 to 1073 K (absolute temperature).

There is no limitation to methods for electrically connecting the thin films. For example, one end of a thin film of p-type thermoelectric material and one end of a thin film of n-type thermoelectric material may be brought into direct contact with each other, or one end of a thin film of p-type thermoelectric material and one end of a thin film of n-type thermoelectric material may be brought into contact via an electrically conductive material.

Specific methods for electrically connecting one end of a thin film of p-type thermoelectric material and one end of a thin film of n-type thermoelectric material are not limited. Preferable is a method for connecting the materials in such a manner that a thermoelectromotive force of at least 60 µV/K and an electrical resistance of 1 KΩ or lower can be maintained for the thermoelectric element at all temperatures in the range of 293 to 1073K (absolute temperature).

The electrical resistance caused by connecting thermoelectric materials depends on the connection method, area of the connected portion, type and size of electrically conductive material used, etc. In general, it is preferable to determine connecting conditions so that the resistance of the connected portion relative to that of the entire thermoelectric element is about 50% or less, preferably about 10% or less, and more preferably about 5% or less.

Hereinafter, a specific example of a method for electrically connecting thermoelectric materials is described with reference to the drawings. Each drawing shows a front view and a plan view of a thermoelectric element in which one end of a thin film of p-type thermoelectric material and one end of a thin film of n-type thermoelectric material are electrically connected on a substrate.

FIGS. 1(a) to (c) show a thermoelectric element in which one end of a thin film of p-type thermoelectric material 2 and one end of a thin film of n-type thermoelectric material 3, which are formed on the same surface of a substrate 1, are brought into direct contact with each other.

FIGS. 1(d) and (e) show a thermoelectric element in which one thermoelectric material is brought into direct contact with the other material while partially covering the other material at the contact portion of the thin films. A thermoelectric element having this structure can obtain more excellent electrical connection.

FIGS. 2(a) to (c) show a thermoelectric element in which one end of a thin film of p-type thermoelectric material 2 and one end of a thin film of n-type thermoelectric material 3, which are formed on a substrate 1, are connected via an electrically conductive material 4.

Any electrically conductive material can be used insofar as an electrical resistance of the connected portion of a p-type thermoelectric material and an n-type thermoelectric material can be held low. For example, metal paste, solder, electrically conductive ceramics, and the like can be used. In particular, electrically conductive ceramics, a paste containing a noble metal, such as gold, silver, platinum, and the like are preferable because such material does not melt, and maintains its chemical stability and low resistance at temperatures as high as about 1073 K. A thin film of such an electrically conductive material may be formed by vapor deposition, such as sputtering, etc.

FIG. 3 shows the structure of a thermoelectric element in which one end of a thin film of p-type thermoelectric material 2 and one end of a thin film of n-type thermoelectric material 3, which are formed on a substrate 1, are brought into direct contact with each other and the contact portion is covered with an electrically conductive material 4. In an element thus structured, the thin films can ensure more excellent electrical connection at the contact portion thereof.

FIGS. 4(a) to (c) show a thermoelectric element in which a thin film of p-type thermoelectric material 2 and a thin film of n-type thermoelectric material 3 are formed on the same surface of a substrate without being in contact, and both the thin films are electrically connected with each other on a side surface of the substrate. In FIGS. 4(a) to (c), FIG. 4(a) shows a thermoelectric element in which both the thin films are directly connected with each other on a side surface of the substrate. FIG. 4(b) shows a thermoelectric element in which both the thin films are connected via an electrically conductive material 4 on a side surface of the substrate. FIG. 4(c) shows a thermoelectric element in which a thin film of p-type thermoelectric material 2 and a thin film of n-type thermoelectric material 3 are brought into contact with, at a corner of the substrate, a thin film of an electrically conductive material 4 formed on a side surface of the substrate to thereby establish an electrical connection between the thin films. In this case, a metal paste, solder, electrically conductive ceramics, etc., can be used as the electrically conductive material 4 as in the thermoelectric element shown in FIG. 2, and an electrically conductive film formed by vapor deposition may also be used. In this case, as an electrically conductive material formed on a side surface of the substrate, a thin film of p-type thermoelectric material or a thin film of n-type thermoelectric material may be used, and, in addition, a thin film in which a thin film of p-type thermoelectric material and a thin film of n-type thermoelectric material are completely or partially laminated are also usable.

In the thermoelectric element shown in FIG. 4(a) in which thermoelectric materials are electrically connected on a side surface of the substrate, a better electrical connection can be ensured by bringing both the thin films into direct contact and covering the contact portion with an electrically conductive material, or by partially or completely laminating both the thermoelectric materials on a side surface of the substrate.

The thermal conductivity of each of the thermoelectric elements shown in FIGS. 1 to 4 can be reduced over the element by using a substrate with a cut formed as shown in FIG. 5 and separately forming a thin film of p-type thermoelectric material and a thin film of n-type thermoelectric material on either side of the cut portion formed in the substrate.

Thermoelectric Module

The thermoelectric module of the invention comprises a plurality of the above-described thermoelectric elements, wherein the thermoelectric elements are connected in series such that an unconnected end portion of a p-type thermoelectric material of one thermoelectric element is connected to an unconnected end portion of an n-type thermoelectric material of another thermoelectric element.

There is no limitation to the methods for connecting thermoelectric elements, and, for example, the above-described methods for connecting thermoelectric materials to form a thermoelectric element can be similarly applied.

FIG. 6 schematically shows one embodiment of a thermoelectric module. The thermoelectric module uses thermoelectric elements in each of which one end of a thin film of p-type thermoelectric material 2 and one end of a thin film of n-type thermoelectric material 3 are brought into direct contact on the same surface as shown in FIG. 1(a), and the thermoelectric module is formed by connecting a plurality of such thermoelectric elements in series by connecting an unconnected end portion of the p-type thermoelectric material 2 and an unconnected end portion of the n-type thermoelectric material 3 via an electrically conductive material 5. The number of thermoelectric elements used in one module is not limited, and can be suitably determined depending on the required electric power.

Similarly in the case of producing a thermoelectric element as shown in FIG. 2, a noble metal paste, solder, or electrically conductive ceramics can be used as the electrically conductive material 5 for connecting thermoelectric elements. As the electrically conductive ceramics, the same complex oxides as in the p-type thermoelectric material or n-type thermoelectric material can also be used.

In addition to a method for connecting unconnected end portions of a plurality of thermoelectric elements formed on different substrates, a method for electrically connecting unconnected end portions of a plurality of thermoelectric elements formed on the same substrate can be employed.

According to the latter method, a thermoelectric module can be easily obtained by forming a required number of thin films of p-type thermoelectric material and thin films of n-type thermoelectric material on the same substrate to form thermoelectric elements through the application of the above-described method for forming a thin film of a thermoelectric material, and then connecting an end portion of each element.

The thermoelectric module of the invention can produce an electrical potential difference by positioning one end thereof at a high-temperature side and the other end thereof at a low-temperature side. For example, in the module of FIG. 6, a portion where a thin film of p-type thermoelectric material and a thin film of n-type thermoelectric material are brought into direct contact may be disposed at a high-temperature side and the other end portion may be disposed at a low-temperature side.

Moreover, as shown in the perspective view of FIG. 7, usable is a pipe-like thermoelectric module which is obtained by forming a thin film of p-type thermoelectric material 2 and a thin film of n-type thermoelectric material 3 on either or both surfaces of a pipe-like substrate 1 in parallel with the longitudinal direction of the substrate. The p-type thermoelectric material and the n-type thermoelectric material are electrically connected at one opening side to form a thermoelectric element on the pipe-like substrate. A plurality of such thermoelectric elements are then formed on the pipe-like substrate, and an unconnected end portion of each thermoelectric element is connected with each other, providing a pipe-like thermoelectric module. According to such a pipe-like thermoelectric module, thermoelectric generation can be carried out by positioning one opening side of the thermoelectric module at a high-temperature side and positioning the other opening side at a low-temperature side. Moreover, thermoelectric generation can also be carried out by passing a high-temperature gas through the pipe to create a temperature difference between a gas inlet portion and a gas outlet portion of the pipe.

Examples of heat sources for the high-temperature side include high-temperature heat of about 473K or higher generated in automobile engines, industrial plants, thermal power stations, atomic power stations, garbage-incineration facilities, microturbines, boilers, and the like; and low-temperature heat of about 293K to about 473K, such as solar heat, boiling water, body temperature, etc.

EFFECT OF THE INVENTION

In the thermoelectric element of the invention, a thin film of p-type thermoelectric material and a thin film of n-type thermoelectric material are formed on an electrically insulating substrate. Thus, the thermoelectric element of the invention can be formed on various forms of substrates, providing various forms of thermoelectric elements. Therefore, the thermoelectric element of the invention can be used in various applications, and, for example, can be installed in an electronic circuit, used in a minute portion, etc. Since a plastic substrate can also be used, the thermoelectric element of the invention can also be applied to various flexible devices.

The thermoelectric element of the invention comprises a combination of a p-type thermoelectric material and an n-type thermoelectric material, each of which comprise a specific complex oxide, and have a high thermoelectric conversion efficiency and good electrical conductivity. Such a thermoelectric element is formed by the thermoelectric materials with high thermoelectric conversion efficiency as well as excellent thermal stability, chemical durability, etc., and exhibits excellent performance.

The thermoelectric module of the invention employing such a thermoelectric element is given excellent thermal resistance, and therefore it is not damaged and its electricity generating properties are not easily deteriorated even when the high-temperature side is rapidly cooled to room temperature from a high temperature of about 1000K.

Since the thermoelectric module of the invention can be small in size and has a high output density and also has excellent thermal shock resistance as described above, the thermoelectric module of the invention can be applied to not only industrial plants, garbage-incineration facilities, thermal power stations, and atomic power stations but also automobile engines with rapidly changing temperatures.

Moreover, since the thermoelectric module can generate electricity from heat energy having a temperature of about 473 K or lower and can also achieve a high integration of thermoelectric elements, the thermoelectric module, when provided with a heat source, can be used as a power supply which does not require recharging, for use in portable equipment such as mobile phones, laptop computers, etc.

Figure 1:
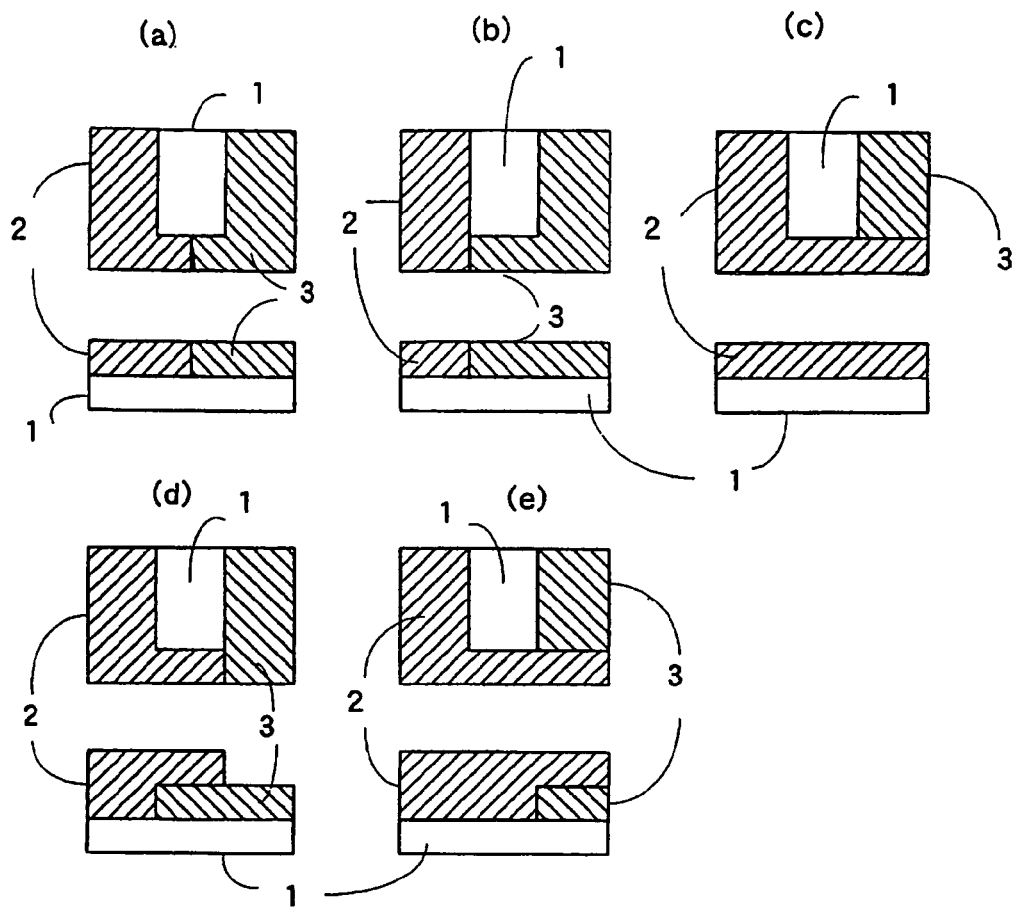
FIGS. 1(*a*) to (*e*) are plan views and front views showing five embodiments of a thermoelectric element.

DESCRIPTION OF REFERENCE NUMERALS 1. substrate
2. p-type thermoelectric material
3. n-type thermoelectric material
4,5. electrically conductive substrate

BEST MODE FOR CARRYING OUT THE INVENTION

Hereinafter, the present invention will be described in more detail with reference to Examples.

Example 1

After a target material (sintered body) for use in pulsed laser deposition was produced according to the following method, a thermoelectric element was produced by pulsed laser deposition.

(1) Preparation of a Target Material (i) Target Material for Producing a p-type Thermoelectric Material Using bismuth oxide ($Bi_2O_3$), strontium carbonate ($SrCO_3$) and cobalt oxide ($Co_3O_4$) as a raw material, these materials were mixed in such a manner as to yield the atomic ratio of Bi:Sr:Co of 2:2:2. The mixture was calcined at 800° C. in air for 10 hours using an electric furnace, molded under pressure and heated at 850° C. for 20 hours, giving a target material for producing a p-type thermoelectric material in the form of a disk-like sintered body with a diameter of 2 cm and a thickness of 3 mm.

(ii) Target Material for Producing an n-type Thermoelectric Material

Using lanthanum nitrate ($La_2(NO_3)_3 \cdot 6H_2O$) as a source of La, bismuth nitrate ($Bi(NO_3)_3 \cdot 6H_2O$) as a source of Bi, and nickel nitrate ($Ni(NO_3)_2 \cdot 6H_2O$) as a source of Ni, these materials were completely dissolved in distilled water in such a manner as to yield the atomic ratio of La:Bi:Ni of 0.9:0.1:1.0. The solution was thoroughly mixed while stirring in a crucible of alumina, and solidified by evaporating the water. The solidified product was calcined at 600° C. in air for 10 hours to decompose the nitrate. The obtained calcinate was crushed, and then molded under pressure. The molded body was heated at 1000° C. in a 300 ml/min oxygen stream for 20 hours, thereby producing a target material for an n-type thermoelectric material in the form of a disk-like sintered body with a diameter of 2 cm and a thickness of 3 mm.

(2) Production of Thermoelectric Elements

Using each target material, a thin film of p-type thermoelectric material and a thin film of n-type thermoelectric material were successively deposited on an 8 mm×8 mm×1 mm quartz glass plate as a substrate by pulsed laser deposition using an argon fluoride (ArF) excimer laser. The p-type thermoelectric material and n-type thermoelectric material were deposited using a mask with an L-shaped opening in such a manner as to overlap each other at the short leg of the L shape. The L-shaped opening of the mask had a length of 8 mm and a width of 3 mm on condition that the opening had a width of 5 mm at the portion having 2 mm width at one end in the longitudinal direction. Each thin film was formed at room temperature without heating the substrate. Specific film formation conditions were as follows.

Laser: ArF excimer laser
Laser output: 150 mJ
Repetition frequency: 5 Hz
Pressure: $5 \times 10^{-5}$ Torr
Distance between a target and a substrate: 3 cm
Substrate: quartz glass
Substrate temperature: room temperature The thin film of p-type thermoelectric material and the thin film of n-type thermoelectric material were formed by the above-described method. The thin films were then heated at 650° C. for 2 hours in air, producing a thermoelectric element.

Figure 8:
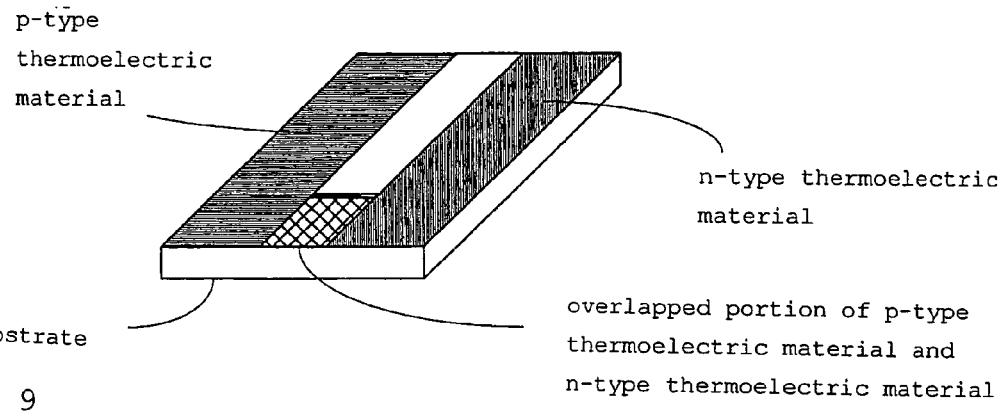
FIG. 8 is a view schematically showing the thermoelectric element of Example 1.

The thermoelectric element obtained had the same shape as the thermoelectric element shown in FIG. 1(d). The thin film of p-type thermoelectric material and the thin film of n-type thermoelectric material were formed at an interval of 2 mm, each film having a length of 8 mm, a width of 3 mm and a film thickness of 1 to 2 μm. A 2 mm width end portion of each thin film was overlapped with each other, thereby establishing an electrical connection. The thermoelectric element thus obtained is schematically shown in FIG. 8.

Examples 2 to 8

The same procedure as in Example 1 was performed except that a thin film of p-type thermoelectric material and a thin film of n-type thermoelectric material with the compositions shown in Table 1 were formed, producing thermoelectric elements of Examples 2 to 8. In Tables 1 to 3, the value of e is in the range of 8 to 10, k is in the range of 8 to 10, r is in the range of 2.7 to 3.3, w is in the range of 3.6 to 4.4 and r' is in the range of 2.8 to 3.2.

Examples 9 to 16

Thermoelectric materials with the compositions as shown in Table 1 are used. A thin film of platinum with a length of 8 mm and a thickness of 0.5 μm was formed by sputtering on a portion having 1 mm width from one side of the 8 mm×8 mm surface of an 8 mm×8 mm×1 mm quartz glass plate as a substrate. The platinum thin film was formed at room temperature in vacuo using argon as a sputtering gas.

Next, a thin film of p-type thermoelectric material with a length of 8 mm was deposited on a portion having 3 mm width from one side perpendicular to the band-like platinum thin film formed, and a thin film of n-type thermoelectric material was further deposited on a portion having 3 mm width from the side opposite to the portion where the thin film of p-type thermoelectric material was deposited. Each thin film was deposited by pulsed laser deposition under the same conditions as in Example 1. Subsequently, a heat treatment was performed under the same conditions as in Example 1, producing a thermoelectric element.

Figure 2:
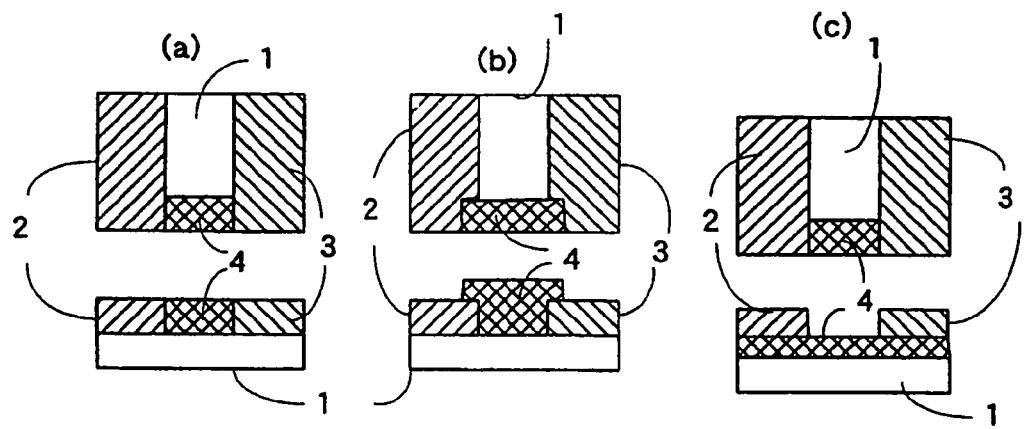
FIGS. 2(*a*) to (*c*) are plan views and front views showing other embodiments of a thermoelectric element.
Figure 3:
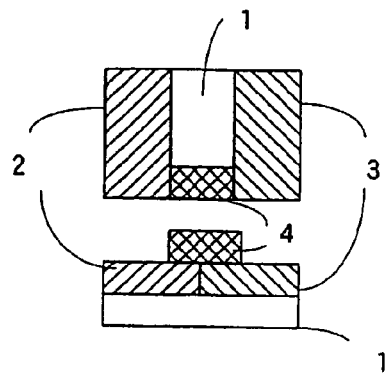
FIG. 3 is a plan view and a front view of another embodiment of a thermoelectric element.
Figure 9:
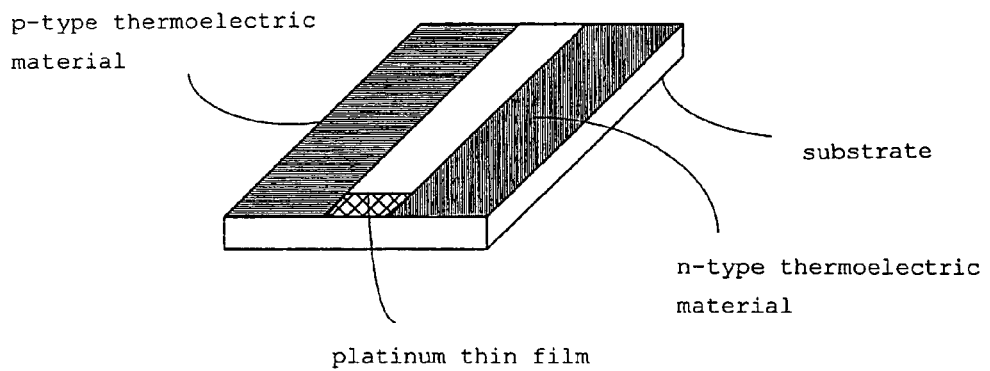
FIG. 9 is a view schematically showing the thermoelectric element of each of Examples 9 to 16.

The thermoelectric element thus obtained had the same shape as the element shown in FIG. 2(c). The thin film of p-type thermoelectric material and the thin film of n-type thermoelectric material were formed at an interval of 2 mm, each film having a width of 3 mm, a length of 8 mm and a thickness of 1 to 2 μm. Each thin film partially overlapped with the platinum thin film, thereby establishing an electrical connection. The thermoelectric element is schematically shown in FIG. 9.

Examples 17 to 24

Using a mask with an L-shaped opening, a thin film of p-type thermoelectric material and a thin film of n-type thermoelectric material were deposited on an 8 mm×8 mm×1 mm quartz glass substrate. The L-shaped opening of the mask had a width of 3 mm and a length of 8 mm on condition that the opening had a width of 4 mm at the portion having 2 mm width at one end in the longitudinal direction. The p-type thermoelectric material and the n-type thermoelectric material were deposited in such a manner that the end portion of the short leg of each L-shaped deposit was brought into contact with each other at the halfway portion of the glass substrate. The p-type thermoelectric material and the n-type thermoelectric material used in Examples 17 to 24 had the compositions shown in Table 1 and were deposited by pulsed laser deposition in the same manner as in Example 1. Subsequently, a heat treatment was performed under the same conditions as in Example 1, producing a thermoelectric element.

Figure 10:
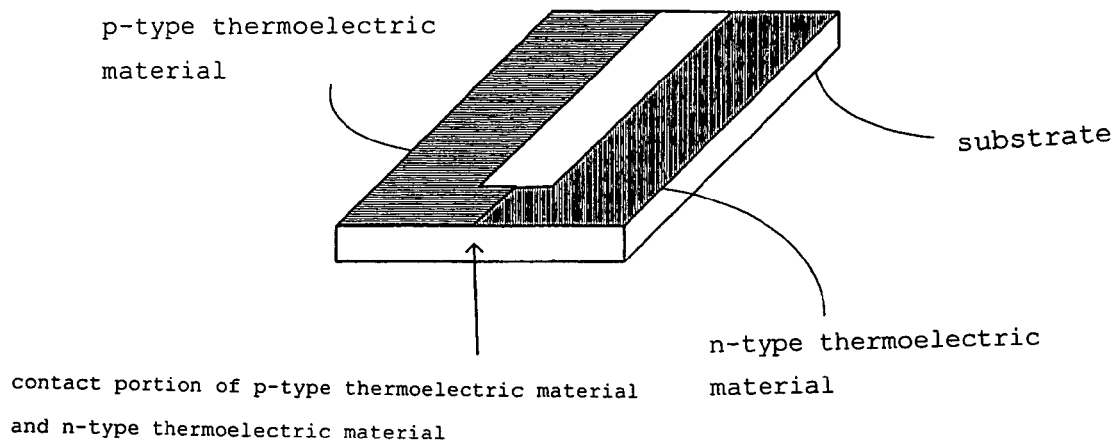
FIG. 10 is a view schematically showing the thermoelectric element of each of Examples 17 to 24.

The thermoelectric element thus obtained had the same shape as the element shown in FIG. 1(a). The thin film of p-type thermoelectric material and the thin film of n-type thermoelectric material were formed at an interval of 2 mm, each film having a width of 3 mm, a length of 8 mm and a thickness of 1 to 2 μm. The thin films had a linear contact with each other at the end portion of the short leg of the L shape, thereby establishing an electrical connection. The thermoelectric element thus obtained is schematically shown in FIG. 10.

Examples 25 to 32

A p-type thermoelectric material was deposited on one side surface (8 mm×1 mm surface) of an 8 mm×8 mm×1 mm quartz glass substrate, and then an n-type thermoelectric material was deposited thereon.

Next, an 8 mm long thin film of p-type thermoelectric material was deposited on a portion having a 3 mm width from one side of the 8 mm×8 mm surface of the quartz glass substrate. Subsequently, an 8 mm long thin film of n-type thermoelectric material was further deposited on a portion having a 3 mm width from the side opposite to the portion where the thin film of p-type thermoelectric material was deposited. The thin film of p-type thermoelectric material and the thin film of n-type thermoelectric material were deposited in such a manner that the 3 mm long side of each thin film was in contact with a thermoelectric material formed on a side surface of the substrate. The p-type thermoelectric material and the n-type thermoelectric material used in Examples 25 to 32 had the compositions shown in Table 2 and were deposited by pulsed laser deposition in the same manner as in Example 1. Subsequently, a heat treatment was performed under the same conditions as in Example 1, producing a thermoelectric element.

Figure 4:
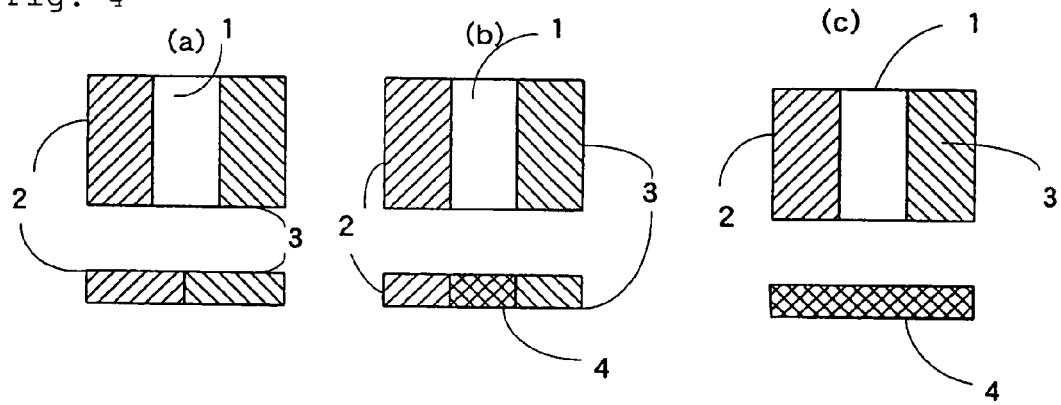
FIGS. 4(*a*) to (*c*) are plan views and front views showing other embodiments of a thermoelectric element.
Figure 5:
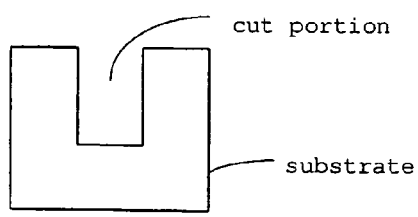
FIG. 5 is a plan view of a substrate for a thermoelectric element having a cut portion.
Figure 6:
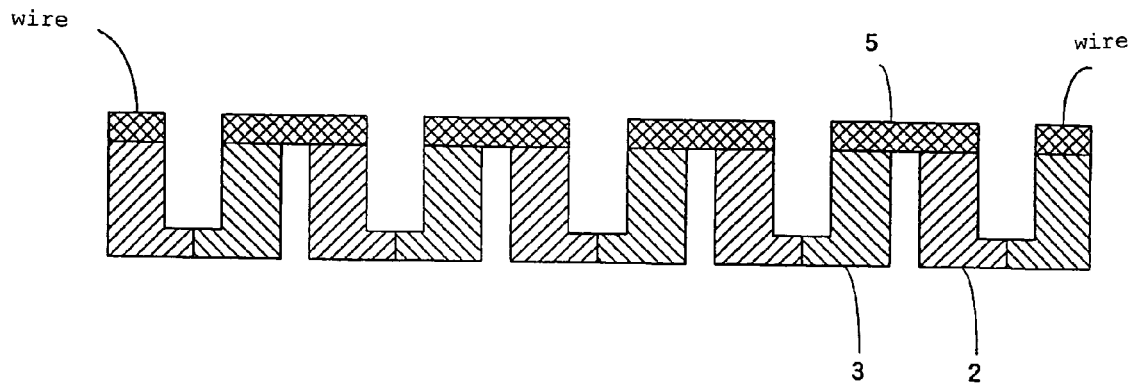
FIG. 6 is a perspective view showing a thermoelectric module formed on a pipe-like substrate.
Figure 7:
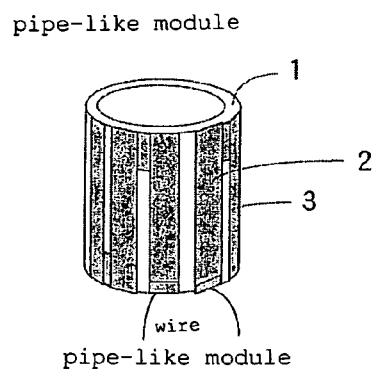
FIG. 7 is a plan view showing one embodiment of a thermoelectric module.
Figure 11:
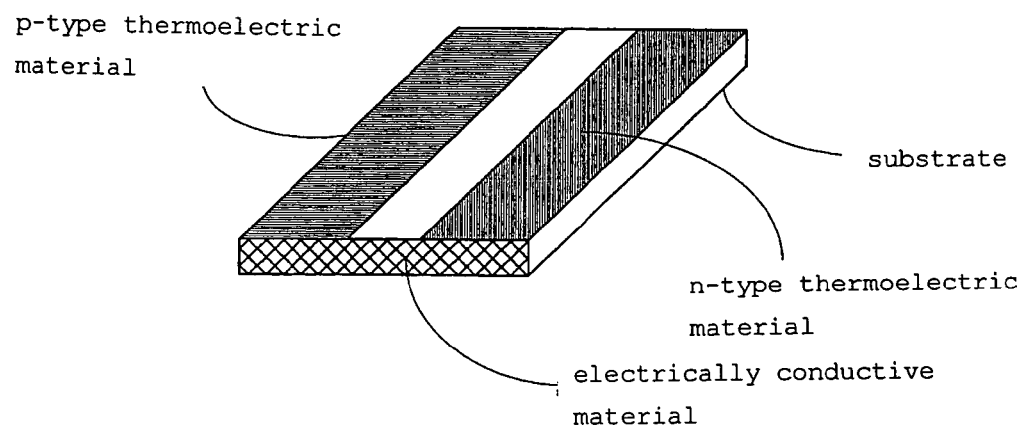
FIG. 11 is a view schematically showing the thermoelectric element of each of Examples 25 to 40.

The thermoelectric element thus obtained had the same shape as the element shown in FIG. 4(*c*). The thin film of p-type thermoelectric material and the thin film of n-type thermoelectric material were formed at an interval of 2 mm, each film having a width of 3 mm, a length of 8 mm and a thickness of 1 to 2 μm. The thin films were in contact with, at a corner of the substrate, the electrically conductive film which was formed on the side surface of the substrate and which was composed of thermoelectric materials (a laminate film of a p-type thermoelectric material and an n-type thermoelectric material), thereby establishing an electrical connection. The thermoelectric element thus obtained is schematically shown in FIG. 11.

Examples 33 to 40

A platinum was deposited on one side surface (8 mm×1 mm surface) of an 8 mm×8 mm×1 mm quartz glass substrate in the same manner as in Examples 9 to 16.

Next, an 8 mm long thin film of p-type thermoelectric material was deposited on a portion having a 3 mm width from one side of the 8 mm×8 mm surface of the quartz glass substrate. Subsequently, an 8 mm long thin film of n-type thermoelectric material was further deposited on a portion having a 3 mm width from the side opposite to the portion where the thin film of p-type thermoelectric material was deposited. The thin film of p-type thermoelectric material and the thin film of n-type thermoelectric material were deposited in such a manner that the 3 mm long side of each thin film was in contact with a platinum thin film formed on a side surface of the substrate. The p-type thermoelectric material and the n-type thermoelectric material used in Examples 33 to 40 had the compositions shown in Table 2 and were deposited by pulsed laser deposition in the same manner as in Example 1. Subsequently, a heat treatment was performed under the same conditions as in Example 1, producing a thermoelectric element.

The thermoelectric element thus obtained had the same shape as the element shown in FIG. 4(*c*). The thin film of p-type thermoelectric material and the thin film of n-type thermoelectric material were formed at an interval of 2 mm, each film having a width of 3 mm, a length of 8 mm and a thickness of 1 to 2 μm. The thin films were in contact with, at a corner of the substrate, the electrically conductive film which was the platinum thin film and was formed on the side surface of the substrate, thereby establishing an electrical connection. The thermoelectric element thus obtained is schematically shown in FIG. 11.

Examples 41 to 48

A p-type thermoelectric material was deposited in such a manner as to have a length of 4 mm from one side of one side surface (8 mm×1 mm surface) of an 8 mm×8 mm×1 mm quartz glass substrate. Subsequently, an n-type thermoelectric material was further deposited in such a manner as to have a length of 4 mm from the opposite side of the same side surface. The thin film of p-type thermoelectric material and the thin film of n-type thermoelectric material had a linear contact with each other at the 1 mm long side.

Next, an 8 mm long thin film of p-type thermoelectric material was deposited on a portion having a 3 mm width from one side of the 8 mm×8 mm surface of the quartz glass substrate. Subsequently, an 8 mm long thin film of n-type thermoelectric material was further deposited on a portion having a 3 mm width from the side opposite to the portion where the thin film of p-type thermoelectric material was deposited. The thin film of p-type thermoelectric material was deposited in such a manner that the 3 mm long side was in contact with the p-type thermoelectric material formed on one side surface of the substrate at a corner of the substrate. The thin film of n-type thermoelectric material was deposited in such a manner that the 3 mm long side was in contact with the n-type thermoelectric material formed on one side surface of the substrate at a corner of the substrate. The p-type thermoelectric material and the n-type thermoelectric material used in Examples 41 to 48 had the compositions shown in Table 2 and were deposited by pulsed laser deposition in the same manner as in Example 1. Subsequently, a heat treatment was performed under the same conditions as in Example 1, producing a thermoelectric element.

Figure 12:
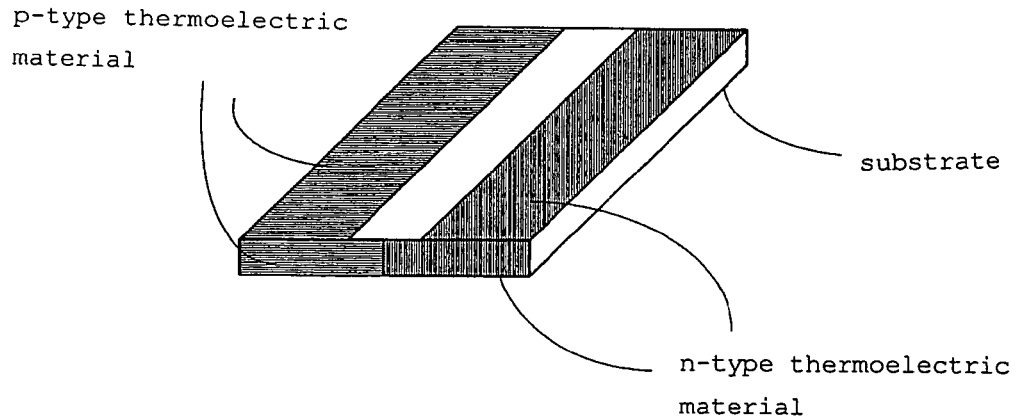
FIG. 12 is a view schematically showing the thermoelectric element of each of Examples 41 to 48.

The thermoelectric element thus obtained had the same shape as the element shown in FIG. 4(*a*). The thin film of p-type thermoelectric material and the thin film of n-type thermoelectric material were formed at an interval of 2 mm, each film having a width of 3 mm, a length of 8 mm and a thickness of 1 to 2 μm. The thin film of the thermoelectric material was in contact with, at a corner of the substrate, the thin film of the thermoelectric material formed on the side surface of the substrate, thereby establishing an electrical connection. The thermoelectric element thus obtained is schematically shown in FIG. 12.

Examples 49 to 51

On one side surface of a shorter side (3 mm×1 mm surface) of a quartz glass substrate with a length of 8 mm, width of 3 mm and a thickness of 1 mm, an electrically conductive film comprising a thin film of platinum, $Ca_{2.7}Bi_{0.3}Co_4O_e$ or $La_{0.9}Bi_{0.1}NiO_r$ was deposited. Platinum was deposited in the same manner as in Examples 9 to 15, and $Ca_{2.7}Bi_{0.3}Co_4O_e$ or $La_{0.9}Bi_{0.1}NiO_r$, was deposited in the same manner as in Example 1.

Subsequently, a p-type thermoelectric material with a composition represented by $Ca_{2.7}Bi_{0.3}Co_4O_e$ was deposited on one 8 mm×3 mm surface of the glass substrate and an n-type thermoelectric material with a composition represented by $La_{0.9}Bi_{0.1}NiO_r$, was deposited on the other 8 mm×3 mm surface thereof. Each thin film was deposited in the same manner as in Example 1. Subsequently, a heat treatment was performed under the same conditions as in Example 1, producing a thermoelectric element.

Figure 13:
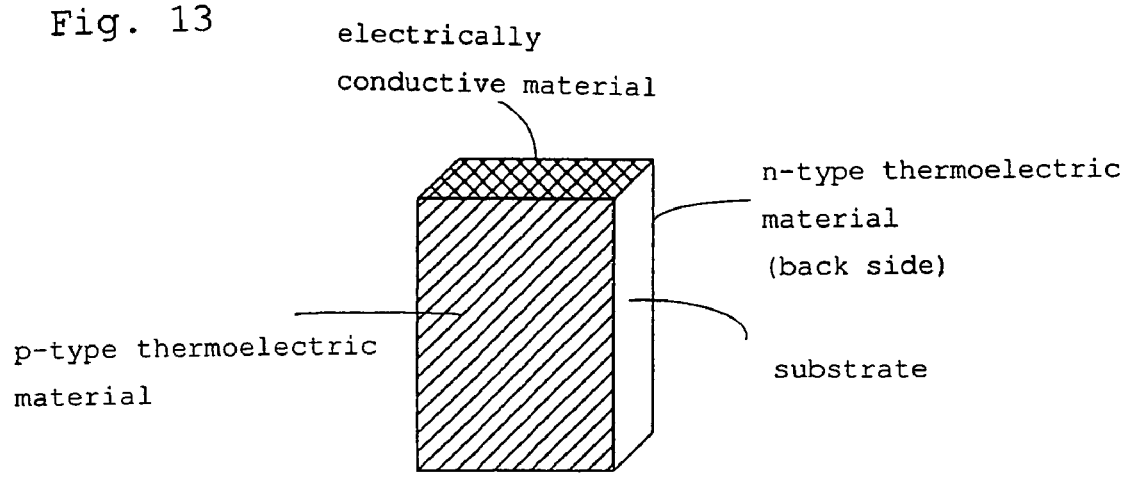
FIG. 13 is a view schematically showing the thermoelectric element of each of Examples 49 to 51.

In the thermoelectric element thus obtained, the thin film of p-type thermoelectric material and the thin film of n-type thermoelectric material were in contact with the electrically conductive film comprising platinum, $Ca_{2.7}Bi_{0.3}Co_4O_e$ or $La_{0.9}Bi_{0.1}NiO_r$, at a corner of the substrate, thereby establishing an electrical connection. The thermoelectric element thus obtained is schematically shown in FIG. 13.

Property Test Example 1

Seebeck coefficients of the p-type thermoelectric material and the n-type thermoelectric material of the thermoelectric element obtained in Example 1 were measured at room temperature by the method described below.

First, a heater was wound around one of two K-type thermocouples and heated. One thermocouple was brought into contact with one end of the thermoelectric material and the other thermocouple was brought into contact with the other end of the thermoelectric material. The temperature and generated voltage were measured. This generated voltage was divided by the temperature difference between the two thermocouples to determine the Seebeck coefficient of each thermoelectric material. As a result, the Seebeck coefficient of the p-type thermoelectric material part was 85 µV/K and the Seebeck coefficient of the n-type thermoelectric material part was −13 µV/K.

The Seebeck coefficients of the thermoelectric elements obtained in Examples were measured in the same manner as described above, which showed that the Seebeck coefficient of the p-type thermoelectric material part of each Example was in the range of 60 to 120 µV/K and the Seebeck coefficient of the n-type thermoelectric material part of each Example was in the range of −5 to −25 µV/K.

In each thermoelectric element, a platinum wire was adhered by applying silver paste to each end opposite to the end where the p-type thermoelectric material and the n-type thermoelectric material were electrically connected. The platinum wires were connected to a voltmeter, and the element was placed in an electric furnace and heated to 500° C. The one end portion of the thermoelectric element, to which the platinum wires were adhered, was air-cooled using an air pump, thereby creating a temperature difference of 30 to 40° C. between the low-temperature portion and the high-temperature portion. The generated voltage (open circuit voltage) at this time was measured.

The thermoelectric element obtained in Example 1 had a generated voltage (open circuit voltage) of 3.4 mV. The generated voltages (open circuit voltages) of the thermoelectric elements obtained in the Examples are shown in Tables 1 to 3.

Figure 14:
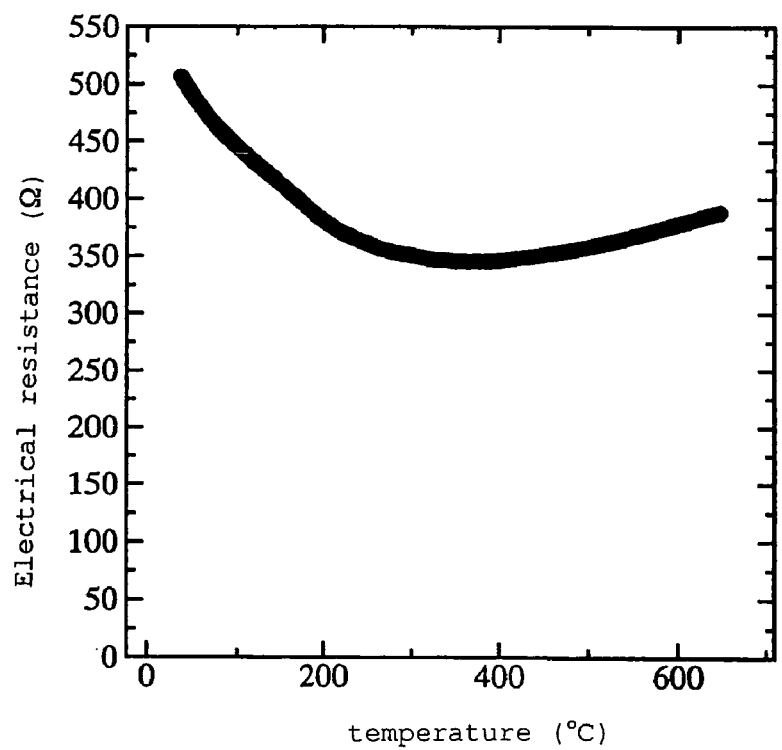
FIG. 14 is a graph showing the temperature dependency of electrical resistance with regard to the thermoelectric element of Example 1.

FIG. 14 is a graph showing the temperature dependency of the electrical resistance of the thermoelectric element obtained in Example 1. The electrical resistance was in the range of 350 to 1000Ω at temperatures from room temperature to 650° C.

As the high-temperature portion, the end where the p-type thermoelectric material and the n-type thermoelectric material were electrically connected was heated to 500° C. The other end was then air-cooled, to create a temperature difference of 38° C. At this time, the thermoelectric element obtained in Example 1 had output of power generation of 8.3 nW. Tables 1 to 3 also show the output of power generation measured in the same manner as described above with reference to the thermoelectric elements obtained in the Examples.

TABLE 1

| Examples | p-type thermoelectric material/ n-type thermoelectric material | Open circuit voltage (mV) High temperature portion 500° C. Temperature difference 30 to 40° C. | Electrical resistance (Ω) 500° C. | Output (nW) High temperature portion 500° C. Temperature difference 30 to 40° C. |
| --- | --- | --- | --- | --- |
| 1 | $Bi_2Sr_2Co_2O_k/La_{0.9}Bi_{0.1}NiO_r$ | 3.4 | 350 | 8.3 |
| 2 | $Bi_{2.2}Sr_{2.2}Co_2O_k/LaNiO_r$ | 3.2 | 360 | 7.1 |
| 3 | $Bi_{1.8}Pb_{0.4}Sr_{1.8}Ca_{0.4}Co_2O_k/LaNi_{0.9}Cu_{0.1}O_r$ | 3.1 | 365 | 6.6 |
| 4 | $Bi_2Ba_2Co_2O_k/La_{1.8}Bi_{0.2}NiO_w$ | 3.3 | 355 | 7.7 |
| 5 | $Ca_{2.7}Bi_{0.3}Co_4O_e/La_{0.9}Bi_{0.1}NiO_r$ | 2.9 | 490 | 4.3 |
| 6 | $Ca_3Co_4O_e/LaNiO_r$ | 2.6 | 510 | 3.3 |
| 7 | $Ca_{3.3}Na_{0.3}Co_4O_e/LaNi_{0.9}Cu_{0.1}O_r$ | 2.7 | 520 | 3.5 |
| 8 | $Ca_{2.7}Bi_{0.3}Co_4O_e/La_{1.8}Bi_{0.2}NiO_w$ | 2.9 | 530 | 4.0 |
| 9 | $Bi_{1.2}Sr_2Co_2O_k/La_{0.9}Bi_{0.1}NiO_r$ | 3.1 | 370 | 6.5 |
| 10 | $Bi_{2.2}Sr_{2.2}Co_2O_k/LaNiO_r$ | 3.2 | 375 | 6.8 |
| 11 | $Bi_{1.8}Pb_{0.4}Sr_{1.8}Ca_{0.4}Co_2O_k/LaNi_{0.9}Cu_{0.1}O_r$ | 3.0 | 380 | 5.9 |
| 12 | $Bi_2Ba_2Co_2O_k/La_{1.8}Bi_{0.2}NiO_w$ | 3.2 | 375 | 6.8 |
| 13 | $Ca_{2.7}Bi_{0.3}Co_4O_e/La_{0.9}Bi_{0.1}NiOr$ | 2.8 | 530 | 3.7 |
| 14 | $Ca_3Co_4O_e/LaNiO_r$ | 2.8 | 550 | 3.6 |
| 15 | $Ca_{3.3}Na_{0.3}Co_4O_e/LaNi_{0.9}Cu_{0.1}O_r$ | 2.7 | 530 | 3.4 |
| 16 | $Ca_{2.7}Bi_{0.3}Co_4O_e/La_{1.8}Bi_{0.2}NiO_w$ | 2.9 | 540 | 3.9 |
| 17 | $Bi_2Sr_2Co_2O_k/La_{0.9}Bi_{0.1}NiO_r$ | 3.1 | 370 | 6.5 |
| 18 | $Bi_{2.2}Sr_{2.2}Co_2O_k/LaNiO_r$ | 3.3 | 370 | 7.4 |
| 19 | $Bi_{1.8}Pb_{0.4}Sr_{1.8}Ca_{0.4}Co_2O_k/LaNi_{0.9}Cu_{0.1}O_r$ | 3.0 | 360 | 6.3 |

TABLE 1-continued

| Examples | p-type thermoelectric material/ n-type thermoelectric material | Open circuit voltage (mV) High temperature portion 500° C. Temperature difference 30 to 40° C. | Electrical resistance (Ω) 500° C. | Output (nW) High temperature portion 500° C. Temperature difference 30 to 40° C. |
|---|---|---|---|---|
| 20 | $Bi_2Ba_2Co_2O_k/La_{1.8}Bi_{0.2}NiO_w$ | 3.1 | 380 | 6.3 |
| 21 | $Ca_{2.7}Bi_{0.3}Co_4O_e/La_{0.9}Bi_{0.1}NiO_r$ | 3.0 | 510 | 4.4 |
| 22 | $Ca_3Co_4O_e/LaNiO_r$ | 2.9 | 520 | 4.0 |
| 23 | $Ca_{3.3}Na_{0.3}Co_4O_e/LaNi_{0.9}Cu_{0.1}O_{r'}$ | 2.9 | 500 | 4.2 |
| 24 | $Ca_{2.7}Bi_{0.3}Co_4O_e/La_{1.8}Bi_{0.2}NiO_w$ | 2.7 | 530 | 3.4 |

TABLE 2

| Examples | p-type thermoelectric material/ n-type thermoelectric material | Open circuit voltage (mV) High temperature portion 500° C. Temperature difference 30 to 40° C. | Electrical resistance (Ω) 500° C. | Output (nW) High temperature portion 500° C. Temperature difference 30 to 40° C. |
|---|---|---|---|---|
| 25 | $Bi_2Sr_2Co_2O_k/La_{0.9}Bi_{0.1}NiO_r$ | 2.9 | 390 | 5.4 |
| 26 | $Bi_{2.2}Sr_{2.2}Co_2O_k/LaNiO_r$ | 3.0 | 370 | 6.1 |
| 27 | $Bi_{1.8}Pb_{0.4}Sr_{1.8}Ca_{0.4}Co_2O_k/LaNi_{0.9}Cu_{0.1}O_{r'}$ | 3.2 | 385 | 6.6 |
| 28 | $Bi_2Ba_2Co_2O_k/La_{1.8}Bi_{0.2}NiO_w$ | 3.1 | 390 | 6.2 |
| 29 | $Ca_{2.7}Bi_{0.3}Co_4O_e/La_{0.9}Bi_{0.1}NiO_r$ | 2.9 | 560 | 3.8 |
| 30 | $Ca_3Co_4O_e/LaNiO_r$ | 2.7 | 550 | 3.3 |
| 31 | $Ca_{3.3}Na_{0.3}Co_4O_e/LaNi_{0.9}Cu_{0.1}O_{r'}$ | 2.8 | 550 | 3.6 |
| 32 | $Ca_{2.7}Bi_{0.3}Co_4O_e/La_{1.8}Bi_{0.2}NiOw$ | 2.8 | 540 | 3.6 |
| 33 | $Bi_2Sr_2Co_2O_k/La_{0.9}Bi_{0.1}NiO_r$ | 3.1 | 375 | 6.4 |
| 34 | $Bi_{2.2}Sr_{2.2}Co_2O_k/LaNiO_r$ | 3.3 | 390 | 7.0 |
| 35 | $Bi_{1.8}Pb_{0.4}Sr_{1.8}Ca_{0.4}Co_2O_k/LaNi_{0.9}Cu_{0.1}O_{r'}$ | 3.0 | 380 | 5.9 |
| 36 | $Bi_2Ba_2Co_2O_k/La_{1.8}Bi_{0.2}NiO_w$ | 3.1 | 375 | 6.4 |
| 37 | $Ca_{2.7}Bi_{0.3}Co_4O_e/La_{0.9}Bi_{0.1}NiO_r$ | 2.9 | 520 | 4.0 |
| 38 | $Ca_3Co_4O_e/LaNiO_r$ | 2.8 | 550 | 3.6 |
| 39 | $Ca_{3.3}Na_{0.3}Co_4O_e/LaNi_{0.9}Cu_{0.1}O_{r'}$ | 2.9 | 570 | 3.7 |
| 40 | $Ca_{2.7}Bi_{0.3}Co_4O_e/La_{1.8}Bi_{0.2}NiO_w$ | 2.7 | 555 | 3.3 |
| 41 | $Bi_2Sr_2Co_2O_k/La_{0.9}Bi_{0.1}NiO_r$ | 2.9 | 400 | 5.3 |
| 42 | $Bi_{2.2}Sr_{2.2}Co_2O_k/LaNiO_r$ | 3.1 | 405 | 5.9 |
| 43 | $Bi_{1.8}Pb_{0.4}Sr_{1.8}Ca_{0.4}Co_2O_k/LaNi_{0.9}Cu_{0.1}O_{r'}$ | 3.2 | 390 | 6.6 |
| 44 | $Bi_2Ba_2Co_2O_k/La_{1.8}Bi_{0.2}NiO_w$ | 3.0 | 385 | 5.8 |
| 45 | $Ca_{2.7}Bi_{0.3}Co_4O_e/La_{0.9}Bi_{0.1}NiO_r$ | 3.1 | 530 | 4.5 |
| 46 | $Ca_3Co_4O_e/LaNiO_r$ | 2.9 | 520 | 4.0 |
| 47 | $Ca_{3.3}Na_{0.3}Co_4O_e/LaNi_{0.9}Cu_{0.1}O_{r'}$ | 2.7 | 525 | 3.5 |
| 48 | $Ca_{2.7}Bi_{0.3}Co_4O_e/La_{1.8}Bi_{0.2}NiO_w$ | 2.8 | 560 | 3.5 |

TABLE 3

| Examples | Electrically conductive film | p-type thermoelectric material/ n-type thermoelectric matetial | Open circuit voltage (mV) High temperature portion 500° C. Temperature difference 30 to 40° C. | Electrical resistance (Ω) 500° C. | Output (nW) High temperature portion 500° C. Temperature difference 30 to 40° C. |
|---|---|---|---|---|---|
| 49 | Pt | $Ca_{2.7}Bi_{0.3}Co_4O_e/La_{0.9}Bi_{0.1}NiO_r$ | 2.8 | 490 | 4.0 |
| 50 | $Ca_{2.7}Bi_{0.3}Co_4O_e$ | $Ca_{2.7}Bi_{0.3}Co_4O_e/La_{0.9}Bi_{0.1}NiO_r$ | 3.2 | 540 | 4.7 |
| 51 | $La_{0.9}Bi_{0.1}NiO_r$ | $Ca_{2.7}Bi_{0.3}Co_4O_e/La_{0.9}Bi_{0.1}NiO_r$ | 3.5 | 500 | 4.5 |

Example 52

After a sputtering target was produced by the following method, a thermoelectric element was produced by sputtering.

(1) Preparation of a Target (i) Target Material for Producing a p-type Thermoelectric Material Using bismuth oxide ($Bi_2O_3$), strontium carbonate ($SrCO_3$) and cobalt oxide ($Co_3O_4$) as a raw material, these materials were mixed in such a manner as to yield the atomic ratio of Bi:Sr:Co of 2:2:2. The mixture was calcined at 800° C. in air for 10 hours using an electric furnace, molded under pressure and heated at 850° C. for 20 hours. A copper plate was covered with the obtained powder in such a manner that a diameter is 10 cm and a thickness is 2 mm, giving a target material for producing a p-type thermoelectric material.

(ii) Target Material for Producing an n-type Thermoelectric Material

Using lanthanum nitrate ($La_2(NO_3)_3 \cdot 6H_2O$) as a source of La, bismuth nitrate ($Bi(NO_3)_3 \cdot 6H_2O$) as a source of Bi, and nickel nitrate ($Ni(NO_3)_2 \cdot 6H_2O$) as a source of Ni, these materials were completely dissolved in distilled water in such a manner as to yield the atomic ratio of La:Bi:Ni of 0.9:0.1:1.0. The solution was thoroughly mixed while stirring in a crucible of alumina, and solidified by evaporating the water. The solidified product was calcined at 600° C. in air for 10 hours to decompose the nitrates. The obtained calcinate was crushed, and then molded under pressure. The molded body was heated at 1000° C. in a 300 ml/min oxygen stream for 20 hours. A copper plate was covered with the obtained powder in such a manner that a diameter is 10 cm and a thickness is 2 mm, giving a target material for producing an n-type thermoelectric material.

(2) Production of Thermoelectric Elements

Using each target material, a thin film of p-type thermoelectric material and a thin film of n-type thermoelectric material were successively deposited on an 8 mm×8 mm×1 mm polyimide film as a substrate by RF sputtering. The p-type thermoelectric material and n-type thermoelectric material were deposited using a mask with an L-shaped opening in such a manner as to overlap each other at the short leg of the L shape. The L-shaped opening of the mask had a length of 8 mm and a width of 3 mm on condition that the opening had a width of 5 mm at the portion having 2 mm width at one end in the longitudinal direction. The substrate was not heated and the temperature increase due to plasma was adjusted to 260° C. or lower. Specific film formation conditions were as follows.

Sputtering gas: Ar
RF power: 50 to 200 W
Substrate: polyimide film

A thin film of p-type thermoelectric material and a thin film of n-type thermoelectric material were formed by the above-described method.

The thermoelectric element thus obtained had the same shape as the element shown in FIG. 1(d). The thin film of p-type thermoelectric material and the thin film of n-type thermoelectric material were formed at an interval of 2 mm, each film having a length of 8 mm, a width of 3 mm, and a thickness of 1 to 2 μm. A 2 mm width end portion of each thin film was overlapped with each other, thereby establishing an electrical connection. The thermoelectric element thus obtained is schematically shown in FIG. 8.

Examples 53 to 59

The same procedure as in Example 52 was performed except that a thin film of p-type thermoelectric material and a thin film of n-type thermoelectric material with the compositions shown in Table 4 were formed, thereby producing thermoelectric elements of Examples 53 to 59. The heating temperature during the production of a raw material powder varied in the range of 700 to 1100° C. depending on the specific composition.

In Table 4, the value of e is in the range of 8 to 10, k is in the range of 8 to 10, r is in the range of 2.7 to 3.3, w is in the range of 3.6 to 4.4 and r' is in the range of 2.8 to 3.2.

The thermoelectric elements obtained in Examples 52 to 59 were measured for the generated voltage (open circuit voltage), electrical resistance and power generation output in the same manner as in Example 1. Table 4 shows the measurement results.

TABLE 4

| Examples | p-type thermoelectric material/ n-type thermoelectric material | Open circuit voltage (mV) High temperature portion 100° C. Temperature difference 30 to 40° C. | Electrical resistance (Ω) 100° C. | Output (nW) High temperature portion 100° C. Temperature difference 30 to 40° C. |
|---|---|---|---|---|
| 52 | $Bi_2Sr_2Co_2O_k/La_{0.9}Bi_{0.1}NiO_r$ | 1.5 | 670 | 0.84 |
| 53 | $Bi_{2.2}Sr_{2.2}Co_2O_k/LaNiO_r$ | 1.3 | 680 | 0.62 |
| 54 | $Bi_{1.8}Pb_{0.4}Sr_{1.8}Ca_{0.4}Co_2O_k/LaNi_{0.9}Cu_{0.1}O_{r'}$ | 1.2 | 685 | 0.52 |
| 55 | $Bi_2Ba_2Co_2O_k/La_{1.8}Bi_{0.2}NiO_w$ | 1.4 | 675 | 0.72 |
| 56 | $Ca_{3.7}Bi_{0.3}Co_4O_e/La_{0.9}Bi_{0.1}NiO_r$ | 1.1 | 710 | 0.42 |
| 57 | $Ca_3Co_4O_e/LaNiO_r$ | 0.9 | 720 | 0.28 |
| 58 | $Ca_{3.3}Na_{0.3}Co_4O_e/LaNi_{0.9}Cu_{0.1}O_{r'}$ | 1.0 | 730 | 0.34 |
| 59 | $Ca_{2.7}Bi_{0.3}Co_4O_e/La_{1.8}Bi_{0.2}NiO_w$ | 1.1 | 740 | 0.41 |

Example 60

After a raw material powder for aerosol deposition was prepared by the following method, a thermoelectric element was produced by aerosol deposition using a sheet of polyimide resin (tradename: Capton) as a substrate.

(1) Production of a Raw Material Powder (i) p-type Thermoelectric Material Powder Using calcium carbonate ($CaCO_3$), bismuth oxide ($Bi_2O_3$) and cobalt oxide ($Co_3O_4$) as a raw material, these materials were mixed in such a manner as to yield the atomic ratio of Ca:Bi:Co of 2.7:0.3:4. The mixture was calcined at 800° C. in air for 10 hours using an electric furnace, molded under pressure and sintered at 850° C. for 20 hours. The sintered body was crushed using a ball mill, yielding a raw material powder with an average particle diameter of 4 µm for a p-type thermoelectric material represented by the formula: $Ca_{2.7}Bi_{0.3}CO_4O_e$.

(ii) n-type Thermoelectric Material Powder

Using lanthanum nitrate $(La_2(NO_3)_3.6H_2O)$ as a source of La, bismuth nitrate $(Bi(NO_3)_3.6H_2O)$ as a source of Bi, and nickel nitrate $(Ni(NO_3)_2.6H_2O)$ as a source of Ni, these materials were completely dissolved in distilled water in such a manner as to yield the atomic ratio of La:Bi:Ni of 0.9:0.1:1.0. The solution was thoroughly mixed while stirring in a crucible of alumina, and solidified by evaporating the water. The solidified product was calcined at 600° C. in air for 10 hours to decompose the nitrates. The obtained calcinate was crushed, and then molded under pressure. The molded body was heated at 1000° C. in a 300 ml/min oxygen stream for 20 hours. The sintered body was then crushed using a ball mill, yielding a raw material powder with an average particle diameter of 4 µm for an n-type thermoelectric material represented by the formula: $La_{0.9}Bi_{0.1}NiO_r$.

(2) Production of Thermoelectric Elements

A thin film of p-type thermoelectric material and a thin film of n-type thermoelectric material were successively deposited onto an 8 mm×8 mm×0.05 mm polyimide (tradename: Capton) sheet as a substrate in a reduced chamber having a pressure of 1 KPa, producing a thermoelectric element. The p-type thermoelectric material and n-type thermoelectric material were deposited using a mask with an L-shaped opening in such a manner as to overlap each other at the short leg of the L shape. The L-shaped opening of the mask had a length of 8 mm and a width of 3 mm on condition that the opening had a width of 5 mm at the portion having 2 mm width at one end in the longitudinal direction. Each film was formed at room temperature without heating the substrate.

Specific film formation conditions were as follows. Helium (He) was used as a carrier gas, the raw material powder for p-type thermoelectric material and the raw material powder for n-type thermoelectric material were successively sprayed at a gas flow rate of 7 L/minute and at a distance between a nozzle and a substrate of 15 mm, providing a thermoelectric element on which a thin film of p-type thermoelectric material and a thin film of n-type thermoelectric material were formed, each film having a thickness of about 50 µm. After the formation of the thin films, no heating was performed.

The thermoelectric element thus obtained had the same shape as the element shown in FIG. 1(d). The thin film of p-type thermoelectric material and the thin film of n-type thermoelectric material were formed at an interval of 2 mm, each film having a length of 8 mm and a width of 3 mm. A 2 mm width end portion of each thin film was overlapped with each other, thereby establishing an electrical connection. When the high-temperature portion of the element was heated by an electric heater to 150° C. and the low-temperature portion was adjusted to 120° C., a power of 4.7 nW was generated.

Examples 61 to 67

The same procedure as in Example 60 was performed except that a thin film of p-type thermoelectric material and a thin film of n-type thermoelectric material with the compositions shown in Table 5 were formed, thereby producing the thermoelectric elements of Examples 61 to 67. The heating temperature during the production of a raw material powder varied in the range of 700 to 1100° C. depending on the specific composition.

In Table 5, the value of e is in the range of 8 to 10, k is in the range of 8 to 10, r is in the range of 2.7 to 3.3 and w is in the range of 3.6 to 4.4.

The thermoelectric elements obtained in Examples 60 to 67 were measured for generated voltage (open circuit voltage), electrical resistance and power generation output in the same manner as in Example 1. Table 5 shows the measurement results.

TABLE 5

| Examples | p-type thermoelectric material/ n-type thermoelectric material | Open circuit voltage (mV) High temperature portion 100° C. Temperature difference 30 to 40° C. | Electrical resistance (Ω) 100° C. | Output (nW) High temperature portion 100° C. Temperature difference 30 to 40° C. |
|---|---|---|---|---|
| 60 | $Ca_{2.7}Bi_{0.3}Co_4O_e/La_{0.9}Bi_{0.1}NiO_r$ | 1.5 | 330 | 1.7 |
| 61 | $Ca_3Co_4O_e/LaNiO_r$ | 1.2 | 360 | 1.0 |
| 62 | $Ca_{2.7}Bi_{0.3}Co_4O_e/La_{1.8}Bi_{0.2}NiO_w$ | 1.4 | 365 | 1.3 |
| 63 | $Ca_3Co_4O_e/La_2Ni_{0.9}Cu_{0.1}O_w$ | 1.3 | 355 | 1.2 |
| 64 | $Bi_2Sr_2Co_2O_k/La_{0.9}Bi_{0.1}NiO_r$ | 0.9 | 490 | 0.4 |
| 65 | $Bi_{2.2}Sr_{2.2}Co_2O_k/LaNiO_r$ | 1.1 | 510 | 0.6 |
| 66 | $Bi_{1.8}Pb_{0.2}Ca_2Co_2O_k/La_{1.8}Bi_{0.2}NiO_w$ | 1.1 | 480 | 0.6 |
| 67 | $Bi_{2.1}Ca_{0.4}Sr_{1.7}Co_2O_k/La_2Ni0.9Co_{0.1}O_w$ | 1.0 | 490 | 0.5 |

Example 68

After a sputtering target was produced by the following method, a thermoelectric element was produced by sputtering.

(1) Preparation of a Target (i) Target Material for Producing a p-type Thermoelectric Material Using bismuth oxide $(Bi_2O_3)$, strontium carbonate $(SrCO_3)$ and cobalt oxide $(Co_3O_4)$ as a raw material, these materials were mixed in such a manner as to yield the atomic ratio of Bi:Sr:Co of 2:2:2. The mixture was calcined at 800° C. in air for 10 hours using an electric furnace, molded under pressure and heated at 850° C. for 20 hours. A copper plate was covered with the obtained powder in such a manner that a diameter is 10 cm and a thickness is 2 mm, giving a target material for producing a p-type thermoelectric material.

(ii) Target Material for Producing an n-type Thermoelectric Material 5 wt % of gallium oxide ($Ga_2O_3$) was added to zinc oxide (ZnO), and the mixture was sintered, producing a disk-like sintered target 10 cm in diameter and 3 mm in thickness.

(2) Production of a Thermoelectric Element

Using each target material, a thin film of p-type thermoelectric material and a thin film of n-type thermoelectric material were successively deposited on an 8 mm×8 mm×0.5 mm polyimide film as a substrate by RF sputtering. The p-type thermoelectric material and n-type thermoelectric material were deposited using a mask with an L-shaped opening in such a manner as to overlap each other at the short leg of the L shape. The L-shaped opening of the mask had a length of 8 mm and a width of 3 mm on condition that the opening had a width of 5 mm at the portion having 2 mm width at one end in the longitudinal direction. The substrate was not heated and the temperature increase due to plasma was adjusted to 260° C. or lower. Specific film formation conditions were as follows.

Sputtering gas: Ar, $O_2$

RF power: 50 to 200 W

Substrate: polyimide film

A thin film of p-type thermoelectric material and a thin film of n-type thermoelectric material were formed by the above-described method.

The thermoelectric element thus obtained had the same shape as the element shown in FIG. 1(d). The thin film of p-type thermoelectric material and the thin film of n-type thermoelectric material were formed at an interval of 2 mm, each film having a length of 8 mm, a width of 3 mm and a thickness of 1 to 2 μm. A 2 mm width end portion of each thin film was overlapped with each other, thereby establishing an electrical connection. The thermoelectric element thus obtained is schematically shown in FIG. 8.

Examples 69 to 75

The same procedure as in Example 68 was performed except that a thin film of p-type thermoelectric material and a thin film of n-type thermoelectric material with the compositions shown in Table 6 were formed, thereby producing the thermoelectric elements of Examples 69 to 75. The heating temperature for producing the raw material powder varied in the range of 700 to 1100° C. depending on the specific composition.

In Table 6, the value of e is in the range of 8 to 10, k is in the range of 8 to 10, z is in the range of 0.9 to 1.1 and zz is in the range of 1.9 to 3.

The thermoelectric elements obtained in Examples 68 to 75 were measured for generated voltage (open circuit voltage), electrical resistance and power generation output in the same manner as in Example 1. Table 6 shows the measurement results.

TABLE 6

| Examples | p-type thermoelectric material/ n-type thermoelectric material | Open circuit voltage (mV) High temperature portion 100° C. Temperature difference 30 to 40° C. | Electrical resistance (Ω) 100° C. | Output (nW) High temperature portion 100° C. Temperature difference 30 to 40° C. |
|---|---|---|---|---|
| 68 | $Bi_2Sr_2Co_2O_k/Ga_{0.1}Zn_{0.9}O_z$ | 2.9 | 570 | 3.69 |
| 69 | $Bi_{2.2}Sr_{2.2}Co_2O_k/Al_{0.1}Zn_{0.9}O_z$ | 2.6 | 590 | 2.86 |
| 70 | $Bi_{1.8}Pb_{0.4}Sr_{1.8}Ca_{0.4}Co_2O_k/$ $In_{0.1}Zn_{0.9}O_z$ | 2.7 | 610 | 2.99 |
| 71 | $Bi_2Ba_2Co_2O_k/Sn_{0.1}In_{1.9}O_{zz}$ | 2.5 | 585 | 2.67 |
| 72 | $Ca_{3.7}Bi_{0.3}Co_4O_e/Ga_{0.1}Zn_{0.9}O_z$ | 2.6 | 610 | 2.77 |
| 73 | $Ca_3Co_4O_e/Al_{0.1}Zn_{0.9}O_z$ | 2.8 | 600 | 3.27 |
| 74 | $Ca_{3.3}Na_{0.3}Co_4O_e/In_{0.1}Zn_{0.9}O_z$ | 2.4 | 605 | 2.38 |
| 75 | $Ca_{2.7}Bi_{0.3}Co_4O_e/Sn_{0.1}In_{1.9}O_{zz}$ | 2.2 | 595 | 2.03 |

Hereinafter, as Reference Examples, the various property values are given for various thermoelectric materials each comprising a complex oxide with a specific composition.

Reference Example 1

A complex oxide having properties of the p-type thermoelectric material represented by the formula $Ca_aA_b^1Co_cA_d^2O_e$ or $Bi_fPb_gM_h^1Co_iM_j^2O_k$ was prepared by the following method.

Using carbonate or oxide comprising an element of an intended complex oxide as starting materials, these starting materials were mixed in such a manner as to yield the same element ratio as that of the complex oxides represented by the formula shown in Tables 7 to 74. The mixture was calcined at 1073 K for 10 hours in air to yield a calcinate. The calcinate was crushed and molded under pressure, and the molded body was heated in a 300 mL/min oxygen stream for 20 hours. The result was crushed and molded under pressure, and the molded body was hot-press sintered in air under uniaxial pressure of 10 MPa for 20 hours, thereby producing complex oxides for a p-type thermoelectric material. The heating temperature for producing each complex oxide varied in the range of 1073 to 1273 K depending on the specific composition. The hot-press temperature during the production of each complex oxide varied in the range of 1123 to 1173 K depending on the specific composition.

The complex oxides obtained were measured for the Seebeck coefficient at 700° C., electrical resistivity at 700° C. and thermal conductivity at 700° C. Tables 7 to 74 show the measurement results.

TABLE 7 p-type

| Composition $Ca_aA^1_bCo_cA^2_dO_e$ | Seebeck Coefficient μV/K (700° C.) | Electrical Resistivity mΩcm (700° C.) | Thermal Conductivity W/mk (700° C.) |
|---|---|---|---|
| $Ca_3Co_4O_9$ | 205 | 5.5 | 2.5 |
| $Ca_{2.7}Na_{0.3}Co_4O_9$ | 198 | 4.2 | 2.2 |
| $Ca_{2.7}K_{0.3}Co_4O_9$ | 195 | 6 | 2.2 |
| $Ca_{2.7}Li_{0.3}Co_4O_9$ | 200 | 7.2 | 2.4 |
| $Ca_{2.7}Ti_{0.3}Co_4O_9$ | 205 | 6.8 | 2.6 |
| $Ca_{2.7}V_{0.3}Co_4O_9$ | 198 | 5.7 | 2.5 |
| $Ca_{2.7}Cr_{0.3}Co_4O_9$ | 199 | 6.2 | 3 |
| $Ca_{2.7}Mn_{0.3}Co_4O_9$ | 210 | 6.8 | 2.6 |
| $Ca_{2.7}Fe_{0.3}Co_4O_9$ | 202 | 8 | 2.9 |
| $Ca_{2.7}Ni_{0.3}Co_4O_9$ | 204 | 7.9 | 1.9 |
| $Ca_{2.7}Cu_{0.3}Co_4O_9$ | 197 | 6.9 | 2.2 |
| $Ca_{2.7}Zn_{0.3}Co_4O_9$ | 205 | 5.9 | 2.6 |
| $Ca_{2.7}Pb_{0.3}Co_4O_9$ | 201 | 7.8 | 2.5 |
| $Ca_{2.7}Sr_{0.3}Co_4O_9$ | 196 | 6.3 | 3 |
| $Ca_{2.7}Ba_{0.3}Co_4O_9$ | 202 | 6.5 | 1.9 |
| $Ca_{2.7}Al_{0.3}Co_4O_9$ | 203 | 6.4 | 2 |
| $Ca_{2.7}Bi_{0.3}Co_4O_9$ | 208 | 8.2 | 2.2 |
| $Ca_{2.7}Y_{0.3}Co_4O_9$ | 198 | 7.5 | 2.3 |
| $Ca_{2.7}La_{0.3}Co_4O_9$ | 199 | 6.9 | 1.9 |
| $Ca_{2.7}Ce_{0.3}Co_4O_9$ | 201 | 8.1 | 3.1 |
| $Ca_{2.7}Pr_{0.3}Co_4O_9$ | 207 | 7.6 | 2.6 |
| $Ca_{2.7}Nd_{0.3}Co_4O_9$ | 190 | 5.9 | 2.7 |
| $Ca_{2.7}Sm_{0.3}Co_4O_9$ | 198 | 5.8 | 2.4 |
| $Ca_{2.7}Eu_{0.3}Co_4O_9$ | 199 | 7.2 | 1.9 |
| $Ca_{2.7}Gd_{0.3}Co_4O_9$ | 201 | 8.2 | 3 |
| $Ca_{2.7}Dy_{0.3}Co_4O_9$ | 200 | 7.1 | 2.1 |
| $Ca_{2.7}Ho_{0.3}Co_4O_9$ | 206 | 6.5 | 2.2 |
| $Ca_{2.7}Er_{0.3}Co_4O_9$ | 205 | 6.9 | 2.6 |
| $Ca_{2.7}Yb_{0.3}Co_4O_9$ | 198 | 7 | 2.7 |
| $Ca_3Co_{3.8}Ti_{0.2}O_9$ | 200 | 6.8 | 1.9 |
| $Ca_3Co_{3.8}V_{0.2}O_9$ | 203 | 7.2 | 2.9 |
| $Ca_3Co_{3.8}Cr_{0.2}O_9$ | 201 | 5.9 | 2.4 |

TABLE 8

| | | | |
|---|---|---|---|
| $Ca_3Co_{3.8}Mn_{0.2}O_9$ | 208 | 8.1 | 2.6 |
| $Ca_3Co_{3.8}Fe_{0.2}O_9$ | 198 | 7.2 | 2.7 |
| $Ca_3Co_{3.8}Ni_{0.2}O_9$ | 199 | 6.4 | 1.9 |
| $Ca_3Co_{3.8}Cu_{0.2}O_9$ | 207 | 5.9 | 3 |
| $Ca_3Co_{3.9}Ag_{0.1}O_9$ | 198 | 6 | 2.7 |
| $Ca_3Co_{3.9}Mo_{0.1}O_9$ | 196 | 5.9 | 2.7 |
| $Ca_3Co_{3.9}W_{0.1}O_9$ | 200 | 7.2 | 2.8 |
| $Ca_3Co_{3.9}Nb_{0.1}O_9$ | 198 | 8.1 | 2.2 |
| $Ca_3Co_{3.9}Ta_{0.1}O_9$ | 205 | 6.9 | 2.5 |
| $Ca_{2.7}Na_{0.3}Co_{3.8}Ti_{0.2}O_9$ | 205 | 6.2 | 2.6 |
| $Ca_{2.7}Na_{0.3}Co_{3.8}V_{0.2}O_9$ | 198 | 6.8 | 2 |
| $Ca_{2.7}Na_{0.3}Co_{3.8}Cr_{0.2}O_9$ | 195 | 8 | 1.9 |
| $Ca_{2.7}Na_{0.3}Co_{3.8}Mn_{0.2}O_9$ | 200 | 7.9 | 2.3 |
| $Ca_{2.7}Na_{0.3}Co_{3.8}Fe_{0.2}O_9$ | 205 | 6.9 | 2.5 |
| $Ca_{2.7}Na_{0.3}Co_{3.8}Ni_{0.2}O_9$ | 198 | 5.9 | 2.7 |
| $Ca_{2.7}Na_{0.3}Co_{3.8}Cu_{0.2}O_9$ | 199 | 7.8 | 2.5 |
| $Ca_{2.7}Na_{0.3}Co_{3.9}Ag_{0.1}O_9$ | 210 | 6.3 | 2.6 |
| $Ca_{2.7}Na_{0.3}Co_{3.9}Mo_{0.1}O_9$ | 202 | 6.5 | 2.4 |
| $Ca_{2.7}Na_{0.3}Co_{3.9}W_{0.1}O_9$ | 207 | 6.4 | 2.3 |
| $Ca_{2.7}Na_{0.3}Co_{3.9}Nb_{0.1}O_9$ | 198 | 8.2 | 2.2 |
| $Ca_{2.7}Na_{0.3}Co_{3.9}Ta_{0.1}O_9$ | 196 | 7.5 | 2.1 |
| $Ca_{2.7}K_{0.3}Co_{3.8}Ti_{0.2}O_9$ | 198 | 8.1 | 1.8 |
| $Ca_{2.7}K_{0.3}Co_{3.8}V_{0.2}O_9$ | 205 | 7.6 | 2.7 |
| $Ca_{2.7}K_{0.3}Co_{3.8}Cr_{0.2}O_9$ | 196 | 5.9 | 2.6 |
| $Ca_{2.7}K_{0.3}Co_{3.8}Mn_{0.2}O_9$ | 205 | 5.8 | 2.5 |
| $Ca_{2.7}K_{0.3}Co_{3.8}Fe_{0.2}O_9$ | 198 | 7.2 | 2.1 |
| $Ca_{2.7}K_{0.3}Co_{3.8}Ni_{0.2}O_9$ | 198 | 8.2 | 2.3 |
| $Ca_{2.7}K_{0.3}Co_{3.8}Cu_{0.2}O_9$ | 195 | 7.1 | 2.7 |
| $Ca_{2.7}K_{0.3}Co_{3.9}Ag_{0.1}O_9$ | 200 | 6.5 | 2.8 |
| $Ca_{2.7}K_{0.3}Co_{3.9}Mo_{0.1}O_9$ | 203 | 6.9 | 2.5 |
| $Ca_{2.7}K_{0.3}Co_{3.9}W_{0.1}O_9$ | 201 | 7 | 2.4 |
| $Ca_{2.7}K_{0.3}Co_{3.9}Nb_{0.1}O_9$ | 208 | 7.2 | 2.8 |
| $Ca_{2.7}K_{0.3}Co_{3.9}Ta_{0.1}O_9$ | 198 | 6.8 | 3 |
| $Ca_{2.7}Li_{0.3}Co_{3.8}Ti_{0.2}O_9$ | 207 | 5.9 | 1.9 |

TABLE 9

| | | | |
|---|---|---|---|
| $Ca_{2.7}Li_{0.3}Co_{3.8}V_{0.2}O_9$ | 198 | 8.1 | 2.6 |
| $Ca_{2.7}Li_{0.3}Co_{3.8}Cr_{0.2}O_9$ | 199 | 7.2 | 2.5 |
| $Ca_{2.7}Li_{0.3}Co_{3.8}Mn_{0.2}O_9$ | 210 | 6.4 | 3 |
| $Ca_{2.7}Li_{0.3}Co_{3.8}Fe_{0.2}O_9$ | 202 | 5.9 | 1.9 |
| $Ca_{2.7}Li_{0.3}Co_{3.8}Ni_{0.2}O_9$ | 204 | 6 | 2 |
| $Ca_{2.7}Li_{0.3}Co_{3.8}Cu_{0.2}O_9$ | 197 | 5.9 | 2.2 |
| $Ca_{2.7}Li_{0.3}Co_{3.9}Ag_{0.1}O_9$ | 205 | 7.2 | 2.3 |
| $Ca_{2.7}Li_{0.3}Co_{3.9}Mo_{0.1}O_9$ | 201 | 8.1 | 1.9 |
| $Ca_{2.7}Li_{0.3}Co_{3.9}W_{0.1}O_9$ | 196 | 6.9 | 3.1 |
| $Ca_{2.7}Li_{0.3}Co_{3.9}Nb_{0.1}O_9$ | 202 | 5.7 | 2.6 |
| $Ca_{2.7}Li_{0.3}Co_{3.9}Ta_{0.1}O_9$ | 203 | 6.2 | 2.7 |
| $Ca_{2.7}Ti_{0.3}Co_{3.8}Ti_{0.2}O_9$ | 198 | 8 | 1.9 |
| $Ca_{2.7}Ti_{0.3}Co_{3.8}V_{0.2}O_9$ | 199 | 7.9 | 3 |
| $Ca_{2.7}Ti_{0.3}Co_{3.8}Cr_{0.2}O_9$ | 201 | 6.9 | 2.1 |
| $Ca_{2.7}Ti_{0.3}Co_{3.8}Mn_{0.2}O_9$ | 207 | 5.9 | 2.2 |
| $Ca_{2.7}Ti_{0.3}Co_{3.8}Fe_{0.2}O_9$ | 190 | 7.8 | 2.6 |
| $Ca_{2.7}Ti_{0.3}Co_{3.8}Ni_{0.2}O_9$ | 198 | 6.3 | 2.7 |
| $Ca_{2.7}Ti_{0.3}Co_{3.8}Cu_{0.2}O_9$ | 199 | 6.5 | 2.5 |
| $Ca_{2.7}Ti_{0.3}Co_{3.9}Ag_{0.1}O_9$ | 201 | 6.4 | 1.9 |
| $Ca_{2.7}Ti_{0.3}Co_{3.9}Mo_{0.1}O_9$ | 200 | 5.8 | 2.9 |
| $Ca_{2.7}Ti_{0.3}Co_{3.9}W_{0.1}O_9$ | 206 | 7.2 | 2.4 |
| $Ca_{2.7}Ti_{0.3}Co_{3.9}Nb_{0.1}O_9$ | 205 | 8.2 | 2.6 |
| $Ca_{2.7}Ti_{0.3}Co_{3.9}Ta_{0.1}O_9$ | 198 | 7.1 | 2.7 |
| $Ca_{2.7}V_{0.3}Co_{3.8}Ti_{0.2}O_9$ | 196 | 6.9 | 3 |
| $Ca_{2.7}V_{0.3}Co_{3.8}V_{0.2}O_9$ | 202 | 7 | 2.7 |
| $Ca_{2.7}V_{0.3}Co_{3.8}Cr_{0.2}O_9$ | 203 | 7.2 | 2.7 |
| $Ca_{2.7}V_{0.3}Co_{3.8}Mn_{0.2}O_9$ | 208 | 6.8 | 2.8 |
| $Ca_{2.7}V_{0.3}Co_{3.8}Fe_{0.2}O_9$ | 198 | 7.2 | 2.2 |
| $Ca_{2.7}V_{0.3}Co_{3.8}Ni_{0.2}O_9$ | 199 | 5.9 | 2.5 |
| $Ca_{2.7}V_{0.3}Co_{3.8}Cu_{0.2}O_9$ | 201 | 8.1 | 2.7 |
| $Ca_{2.7}V_{0.3}Co_{3.9}Ag_{0.1}O_9$ | 207 | 7.2 | 2.6 |
| $Ca_{2.7}V_{0.3}Co_{3.9}Mo_{0.1}O_9$ | 190 | 6.4 | 2 |
| $Ca_{2.7}V_{0.3}Co_{3.9}W_{0.1}O_9$ | 198 | 5.9 | 1.9 |
| $Ca_{2.7}V_{0.3}Co_{3.9}Nb_{0.1}O_9$ | 199 | 6 | 2.3 |
| $Ca_{2.7}V_{0.3}Co_{3.9}Ta_{0.1}O_9$ | 201 | 5.9 | 2.5 |

TABLE 10

| | | | |
|---|---|---|---|
| $Ca_{2.7}Cr_{0.3}Co_{3.8}Ti_{0.2}O_9$ | 206 | 8.1 | 2.5 |
| $Ca_{2.7}Cr_{0.3}Co_{3.8}V_{0.2}O_9$ | 207 | 6.9 | 2.6 |
| $Ca_{2.7}Cr_{0.3}Co_{3.8}Cr_{0.2}O_9$ | 198 | 5.7 | 2.4 |
| $Ca_{2.7}Cr_{0.3}Co_{3.8}Mn_{0.2}O_9$ | 199 | 6.2 | 2.3 |
| $Ca_{2.7}Cr_{0.3}Co_{3.8}Fe_{0.2}O_9$ | 210 | 6.8 | 2.2 |
| $Ca_{2.7}Cr_{0.3}Co_{3.8}Ni_{0.2}O_9$ | 202 | 8 | 2.2 |
| $Ca_{2.7}Cr_{0.3}Co_{3.8}Cu_{0.2}O_9$ | 204 | 7.9 | 2.4 |
| $Ca_{2.7}Cr_{0.3}Co_{3.9}Ag_{0.1}O_9$ | 197 | 6.9 | 2.6 |
| $Ca_{2.7}Cr_{0.3}Co_{3.9}Mo_{0.1}O_9$ | 205 | 5.9 | 2.5 |
| $Ca_{2.7}Cr_{0.3}Co_{3.9}W_{0.1}O_9$ | 201 | 7.8 | 3 |
| $Ca_{2.7}Cr_{0.3}Co_{3.9}Nb_{0.1}O_9$ | 196 | 6.3 | 2.6 |
| $Ca_{2.7}Cr_{0.3}Co_{3.9}Ta_{0.1}O_9$ | 202 | 6.5 | 2.9 |
| $Ca_{2.7}Mn_{0.3}Co_{3.8}Ti_{0.2}O_9$ | 208 | 8.2 | 2.2 |
| $Ca_{2.7}Mn_{0.3}Co_{3.8}V_{0.2}O_9$ | 198 | 7.5 | 2.6 |
| $Ca_{2.7}Mn_{0.3}Co_{3.8}Cr_{0.2}O_9$ | 199 | 6.9 | 2.5 |
| $Ca_{2.7}Mn_{0.3}Co_{3.8}Mn_{0.2}O_9$ | 201 | 8.1 | 3 |
| $Ca_{2.7}Mn_{0.3}Co_{3.8}Fe_{0.2}O_9$ | 207 | 7.6 | 1.9 |
| $Ca_{2.7}Mn_{0.3}Co_{3.8}Ni_{0.2}O_9$ | 190 | 5.9 | 2 |
| $Ca_{2.7}Mn_{0.3}Co_{3.8}Cu_{0.2}O_9$ | 198 | 5.8 | 2.2 |
| $Ca_{2.7}Mn_{0.3}Co_{3.9}Ag_{0.1}O_9$ | 199 | 7.2 | 2.3 |
| $Ca_{2.7}Mn_{0.3}Co_{3.9}Mo_{0.1}O_9$ | 201 | 8.2 | 1.9 |
| $Ca_{2.7}Mn_{0.3}Co_{3.9}W_{0.1}O_9$ | 200 | 7.1 | 3.1 |
| $Ca_{2.7}Mn_{0.3}Co_{3.9}Nb_{0.1}O_9$ | 206 | 6.5 | 2.6 |
| $Ca_{2.7}Mn_{0.3}Co_{3.9}Ta_{0.1}O_9$ | 205 | 6.9 | 2.7 |
| $Ca_{2.7}Fe_{0.3}Co_{3.8}Ti_{0.2}O_9$ | 201 | 7.2 | 1.9 |
| $Ca_{2.7}Fe_{0.3}Co_{3.8}V_{0.2}O_9$ | 196 | 6.8 | 3 |
| $Ca_{2.7}Fe_{0.3}Co_{3.8}Cr_{0.2}O_9$ | 202 | 6.4 | 2.1 |
| $Ca_{2.7}Fe_{0.3}Co_{3.8}Mn_{0.2}O_9$ | 203 | 8.2 | 2.2 |
| $Ca_{2.7}Fe_{0.3}Co_{3.8}Fe_{0.2}O_9$ | 205 | 7.5 | 2.6 |
| $Ca_{2.7}Fe_{0.3}Co_{3.8}Ni_{0.2}O_9$ | 198 | 6.9 | 2.7 |
| $Ca_{2.7}Fe_{0.3}Co_{3.8}Cu_{0.2}O_9$ | 195 | 8.1 | 2.5 |
| $Ca_{2.7}Fe_{0.3}Co_{3.9}Ag_{0.1}O_9$ | 200 | 7.6 | 1.9 |
| $Ca_{2.7}Fe_{0.3}Co_{3.9}Mo_{0.1}O_9$ | 205 | 5.9 | 2.9 |
| $Ca_{2.7}Fe_{0.3}Co_{3.9}W_{0.1}O_9$ | 198 | 5.8 | 2.4 |

TABLE 11

| | | | |
|---|---|---|---|
| $Ca_{2.7}Fe_{0.3}Co_{3.9}Nb_{0.1}O_9$ | 199 | 7.2 | 2.6 |
| $Ca_{2.7}Fe_{0.3}Co_{3.9}Ta_{0.1}O_9$ | 210 | 8.2 | 2.7 |
| $Ca_{2.7}Ni_{0.3}Co_{3.8}Ti_{0.2}O_9$ | 204 | 6.5 | 3 |
| $Ca_{2.7}Ni_{0.3}Co_{3.8}V_{0.2}O_9$ | 197 | 6.9 | 2.7 |
| $Ca_{2.7}Ni_{0.3}Co_{3.8}Cr_{0.2}O_9$ | 205 | 7 | 2.7 |
| $Ca_{2.7}Ni_{0.3}Co_{3.8}Mn_{0.2}O_9$ | 201 | 7.2 | 2.8 |
| $Ca_{2.7}Ni_{0.3}Co_{3.8}Fe_{0.2}O_9$ | 196 | 6.8 | 2.2 |
| $Ca_{2.7}Ni_{0.3}Co_{3.8}Ni_{0.2}O_9$ | 202 | 4.2 | 2.5 |
| $Ca_{2.7}Ni_{0.3}Co_{3.8}Cu_{0.2}O_9$ | 203 | 6 | 2.7 |
| $Ca_{2.7}Ni_{0.3}Co_{3.9}Ag_{0.1}O_9$ | 208 | 7.2 | 2.6 |
| $Ca_{2.7}Ni_{0.3}Co_{3.9}Mo_{0.1}O_9$ | 198 | 6.8 | 2 |
| $Ca_{2.7}Ni_{0.3}Co_{3.9}W_{0.1}O_9$ | 199 | 5.7 | 1.9 |
| $Ca_{2.7}Ni_{0.3}Co_{3.9}Nb_{0.1}O_9$ | 199 | 6.2 | 2.3 |
| $Ca_{2.7}Ni_{0.3}Co_{3.9}Ta_{0.1}O_9$ | 210 | 6.8 | 2.5 |
| $Ca_{2.7}Cu_{0.3}Co_{3.8}Ti_{0.2}O_9$ | 204 | 7.9 | 2.5 |
| $Ca_{2.7}Cu_{0.3}Co_{3.8}V_{0.2}O_9$ | 197 | 6.9 | 2.6 |
| $Ca_{2.7}Cu_{0.3}Co_{3.8}Cr_{0.2}O_9$ | 205 | 5.9 | 2.4 |
| $Ca_{2.7}Cu_{0.3}Co_{3.8}Mn_{0.2}O_9$ | 201 | 7.8 | 2.3 |
| $Ca_{2.7}Cu_{0.3}Co_{3.8}Fe_{0.2}O_9$ | 196 | 6.3 | 2.2 |
| $Ca_{2.7}Cu_{0.3}Co_{3.8}Ni_{0.2}O_9$ | 202 | 6.5 | 2.7 |
| $Ca_{2.7}Cu_{0.3}Co_{3.8}Cu_{0.2}O_9$ | 203 | 6.4 | 2.6 |
| $Ca_{2.7}Cu_{0.3}Co_{3.9}Ag_{0.1}O_9$ | 208 | 8.2 | 2 |
| $Ca_{2.7}Cu_{0.3}Co_{3.9}Mo_{0.1}O_9$ | 198 | 7.5 | 1.9 |
| $Ca_{2.7}Cu_{0.3}Co_{3.9}W_{0.1}O_9$ | 199 | 6.9 | 2.3 |
| $Ca_{2.7}Cu_{0.3}Co_{3.9}Nb_{0.1}O_9$ | 201 | 8.1 | 2.5 |
| $Ca_{2.7}Cu_{0.3}Co_{3.9}Ta_{0.1}O_9$ | 207 | 7.6 | 2.7 |
| $Ca_{2.7}Zn_{0.3}Co_{3.8}Ti_{0.2}O_9$ | 198 | 5.8 | 1.9 |
| $Ca_{2.7}Zn_{0.3}Co_{3.8}V_{0.2}O_9$ | 199 | 7.2 | 2.3 |
| $Ca_{2.7}Zn_{0.3}Co_{3.8}Cr_{0.2}O_9$ | 201 | 8.2 | 2.5 |
| $Ca_{2.7}Zn_{0.3}Co_{3.8}Mn_{0.2}O_9$ | 200 | 7.1 | 2.7 |
| $Ca_{2.7}Zn_{0.3}Co_{3.8}Fe_{0.2}O_9$ | 206 | 6.5 | 2.5 |
| $Ca_{2.7}Zn_{0.3}Co_{3.8}Ni_{0.2}O_9$ | 205 | 6.9 | 2.6 |
| $Ca_{2.7}Zn_{0.3}Co_{3.8}Cu_{0.2}O_9$ | 198 | 7 | 2.4 |
| $Ca_{2.7}Zn_{0.3}Co_{3.9}Ag_{0.1}O_9$ | 201 | 8.2 | 2.3 |

TABLE 12

| | | | |
|---|---|---|---|
| $Ca_{2.7}Zn_{0.3}Co_{3.9}Mo_{0.1}O_9$ | 201 | 7.5 | 2.2 |
| $Ca_{2.7}Zn_{0.3}Co_{3.9}W_{0.1}O_9$ | 196 | 6.9 | 2.2 |
| $Ca_{2.7}Zn_{0.3}Co_{3.9}Nb_{0.1}O_9$ | 202 | 8.1 | 2.4 |
| $Ca_{2.7}Zn_{0.3}Co_{3.9}Ta_{0.1}O_9$ | 203 | 7.6 | 2.6 |
| $Ca_{2.7}Pb_{0.3}Co_{3.8}Ti_{0.2}O_9$ | 198 | 5.8 | 3 |
| $Ca_{2.7}Pb_{0.3}Co_{3.8}V_{0.2}O_9$ | 199 | 7.2 | 2.6 |
| $Ca_{2.7}Pb_{0.3}Co_{3.8}Cr_{0.2}O_9$ | 201 | 8.2 | 2.9 |
| $Ca_{2.7}Pb_{0.3}Co_{3.8}Mn_{0.2}O_9$ | 207 | 7.1 | 1.9 |
| $Ca_{2.7}Pb_{0.3}Co_{3.8}Fe_{0.2}O_9$ | 190 | 6.5 | 2.2 |
| $Ca_{2.7}Pb_{0.3}Co_{3.8}Ni_{0.2}O_9$ | 198 | 6.9 | 2.6 |
| $Ca_{2.7}Pb_{0.3}Co_{3.8}Cu_{0.2}O_9$ | 199 | 7.2 | 2.5 |
| $Ca_{2.7}Pb_{0.3}Co_{3.9}Ag_{0.1}O_9$ | 201 | 8.1 | 3 |
| $Ca_{2.7}Pb_{0.3}Co_{3.9}Mo_{0.1}O_9$ | 200 | 6.9 | 1.9 |
| $Ca_{2.7}Pb_{0.3}Co_{3.9}W_{0.1}O_9$ | 206 | 5.7 | 2 |
| $Ca_{2.7}Pb_{0.3}Co_{3.9}Nb_{0.1}O_9$ | 207 | 6.2 | 2.2 |
| $Ca_{2.7}Pb_{0.3}Co_{3.9}Ta_{0.1}O_9$ | 198 | 6.8 | 2.3 |
| $Ca_{2.7}Sr_{0.3}Co_{3.8}Ti_{0.2}O_9$ | 210 | 7.9 | 3.1 |
| $Ca_{2.7}Sr_{0.3}Co_{3.8}V_{0.2}O_9$ | 202 | 6.9 | 2.6 |
| $Ca_{2.7}Sr_{0.3}Co_{3.8}Cr_{0.2}O_9$ | 204 | 5.9 | 2.7 |
| $Ca_{2.7}Sr_{0.3}Co_{3.8}Mn_{0.2}O_9$ | 197 | 7.8 | 2.4 |
| $Ca_{2.7}Sr_{0.3}Co_{3.8}Fe_{0.2}O_9$ | 205 | 6.3 | 1.9 |
| $Ca_{2.7}Sr_{0.3}Co_{3.8}Ni_{0.2}O_9$ | 201 | 6.5 | 3 |
| $Ca_{2.7}Sr_{0.3}Co_{3.8}Cu_{0.2}O_9$ | 196 | 6.4 | 2.1 |
| $Ca_{2.7}Sr_{0.3}Co_{3.9}Ag_{0.1}O_9$ | 202 | 8.2 | 2.2 |
| $Ca_{2.7}Sr_{0.3}Co_{3.9}Mo_{0.1}O_9$ | 203 | 7.5 | 2.6 |
| $Ca_{2.7}Sr_{0.3}Co_{3.9}W_{0.1}O_9$ | 208 | 6.9 | 2.7 |
| $Ca_{2.7}Sr_{0.3}Co_{3.9}Nb_{0.1}O_9$ | 198 | 8.1 | 2.5 |
| $Ca_{2.7}Sr_{0.3}Co_{3.9}Ta_{0.1}O_9$ | 199 | 7.6 | 1.9 |
| $Ca_{2.7}Ba_{0.3}Co_{3.8}Ti_{0.2}O_9$ | 201 | 5.9 | 2.9 |
| $Ca_{2.7}Ba_{0.3}Co_{3.8}V_{0.2}O_9$ | 207 | 5.8 | 2.4 |
| $Ca_{2.7}Ba_{0.3}Co_{3.8}Cr_{0.2}O_9$ | 190 | 7.2 | 2.6 |
| $Ca_{2.7}Ba_{0.3}Co_{3.8}Mn_{0.2}O_9$ | 198 | 8.2 | 2.7 |
| $Ca_{2.7}Ba_{0.3}Co_{3.8}Fe_{0.2}O_9$ | 199 | 7.1 | 1.9 |
| $Ca_{2.7}Ba_{0.3}Co_{3.8}Ni_{0.2}O_9$ | 201 | 6.5 | 3 |
| $Ca_{2.7}Ba_{0.3}Co_{3.8}Cu_{0.2}O_9$ | 200 | 6.9 | 2.7 |

TABLE 13

| | | | |
|---|---|---|---|
| $Ca_{2.7}Ba_{0.3}Co_{3.9}Ag_{0.1}O_9$ | 206 | 7 | 2.7 |
| $Ca_{2.7}Ba_{0.3}Co_{3.9}Mo_{0.1}O_9$ | 205 | 7.2 | 2.8 |
| $Ca_{2.7}Ba_{0.3}Co_{3.9}W_{0.1}O_9$ | 198 | 6.8 | 2.2 |
| $Ca_{2.7}Ba_{0.3}Co_{3.9}Nb_{0.1}O_9$ | 201 | 6.4 | 2.5 |
| $Ca_{2.7}Ba_{0.3}Co_{3.9}Ta_{0.1}O_9$ | 196 | 8.2 | 2.7 |
| $Ca_{2.7}Al_{0.3}Co_{3.8}Ti_{0.2}O_9$ | 203 | 6.9 | 2 |
| $Ca_{2.7}Al_{0.3}Co_{3.8}V_{0.2}O_9$ | 205 | 8.1 | 1.9 |
| $Ca_{2.7}Al_{0.3}Co_{3.8}Cr_{0.2}O_9$ | 198 | 7.6 | 2.3 |
| $Ca_{2.7}Al_{0.3}Co_{3.8}Mn_{0.2}O_9$ | 195 | 5.9 | 2.5 |
| $Ca_{2.7}Al_{0.3}Co_{3.8}Fe_{0.2}O_9$ | 200 | 5.8 | 2.7 |
| $Ca_{2.7}Al_{0.3}Co_{3.8}Ni_{0.2}O_9$ | 205 | 7.2 | 2.5 |
| $Ca_{2.7}Al_{0.3}Co_{3.8}Cu_{0.2}O_9$ | 198 | 8.2 | 2.6 |
| $Ca_{2.7}Al_{0.3}Co_{3.9}Ag_{0.1}O_9$ | 199 | 7.1 | 2.5 |
| $Ca_{2.7}Al_{0.3}Co_{3.9}Mo_{0.1}O_9$ | 210 | 6.5 | 2.7 |
| $Ca_{2.7}Al_{0.3}Co_{3.9}W_{0.1}O_9$ | 202 | 6.9 | 2.5 |
| $Ca_{2.7}Al_{0.3}Co_{3.9}Nb_{0.1}O_9$ | 204 | 7 | 2.6 |
| $Ca_{2.7}Al_{0.3}Co_{3.9}Ta_{0.1}O_9$ | 197 | 7.2 | 2.4 |
| $Ca_{2.7}Bi_{0.3}Co_{3.8}Ti_{0.2}O_9$ | 201 | 4.2 | 2.2 |
| $Ca_{2.7}Bi_{0.3}Co_{3.8}V_{0.2}O_9$ | 196 | 6 | 2.2 |
| $Ca_{2.7}Bi_{0.3}Co_{3.8}Cr_{0.2}O_9$ | 202 | 7.2 | 2.4 |
| $Ca_{2.7}Bi_{0.3}Co_{3.8}Mn_{0.2}O_9$ | 203 | 6.8 | 2.6 |
| $Ca_{2.7}Bi_{0.3}Co_{3.8}Fe_{0.2}O_9$ | 208 | 5.7 | 2.5 |
| $Ca_{2.7}Bi_{0.3}Co_{3.8}Ni_{0.2}O_9$ | 198 | 6.2 | 3 |
| $Ca_{2.7}Bi_{0.3}Co_{3.8}Cu_{0.2}O_9$ | 199 | 6.8 | 2.6 |
| $Ca_{2.7}Bi_{0.3}Co_{3.9}Ag_{0.1}O_9$ | 201 | 8 | 2.9 |
| $Ca_{2.7}Bi_{0.3}Co_{3.9}Mo_{0.1}O_9$ | 207 | 7.9 | 1.9 |
| $Ca_{2.7}Bi_{0.3}Co_{3.9}W_{0.1}O_9$ | 190 | 6.9 | 2.2 |
| $Ca_{2.7}Bi_{0.3}Co_{3.9}Nb_{0.1}O_9$ | 198 | 5.9 | 2.6 |
| $Ca_{2.7}Bi_{0.3}Co_{3.9}Ta_{0.1}O_9$ | 199 | 7.8 | 2.5 |
| $Ca_{2.7}Y_{0.3}Co_{3.8}Ti_{0.2}O_9$ | 200 | 6.9 | 1.9 |
| $Ca_{2.7}Y_{0.3}Co_{3.8}V_{0.2}O_9$ | 206 | 7.2 | 2 |
| $Ca_{2.7}Y_{0.3}Co_{3.8}Cr_{0.2}O_9$ | 205 | 8.1 | 2.2 |
| $Ca_{2.7}Y_{0.3}Co_{3.8}Mn_{0.2}O_9$ | 198 | 6.9 | 2.3 |
| $Ca_{2.7}Y_{0.3}Co_{3.8}Fe_{0.2}O_9$ | 201 | 5.7 | 1.9 |

TABLE 14

| | | | |
|---|---|---|---|
| $Ca_{2.7}Y_{0.3}Co_{3.8}Ni_{0.2}O_9$ | 196 | 6.2 | 3.1 |
| $Ca_{2.7}Y_{0.3}Co_{3.8}Cu_{0.2}O_9$ | 202 | 6.8 | 2.6 |
| $Ca_{2.7}Y_{0.3}Co_{3.9}Ag_{0.1}O_9$ | 203 | 8 | 2.7 |
| $Ca_{2.7}Y_{0.3}Co_{3.9}Mo_{0.1}O_9$ | 205 | 7.9 | 2.4 |
| $Ca_{2.7}Y_{0.3}Co_{3.9}W_{0.1}O_9$ | 198 | 6.9 | 1.9 |
| $Ca_{2.7}Y_{0.3}Co_{3.9}Nb_{0.1}O_9$ | 195 | 5.9 | 3 |
| $Ca_{2.7}Y_{0.3}Co_{3.9}Ta_{0.1}O_9$ | 200 | 7.8 | 2.1 |
| $Ca_{2.7}La_{0.3}Co_{3.8}Ti_{0.2}O_9$ | 198 | 6.5 | 2.6 |
| $Ca_{2.7}La_{0.3}Co_{3.8}V_{0.2}O_9$ | 199 | 6.4 | 2.7 |
| $Ca_{2.7}La_{0.3}Co_{3.8}Cr_{0.2}O_9$ | 210 | 8.2 | 2.5 |
| $Ca_{2.7}La_{0.3}Co_{3.8}Mn_{0.2}O_9$ | 202 | 7.5 | 1.9 |
| $Ca_{2.7}La_{0.3}Co_{3.8}Fe_{0.2}O_9$ | 204 | 6.9 | 2.6 |
| $Ca_{2.7}La_{0.3}Co_{3.8}Ni_{0.2}O_9$ | 197 | 8.1 | 2.4 |
| $Ca_{2.7}La_{0.3}Co_{3.8}Cu_{0.2}O_9$ | 205 | 7.6 | 2.3 |
| $Ca_{2.7}La_{0.3}Co_{3.9}Ag_{0.1}O_9$ | 201 | 5.9 | 2.2 |
| $Ca_{2.7}La_{0.3}Co_{3.9}Mo_{0.1}O_9$ | 196 | 5.8 | 2.7 |
| $Ca_{2.7}La_{0.3}Co_{3.9}W_{0.1}O_9$ | 202 | 7.2 | 2.6 |
| $Ca_{2.7}La_{0.3}Co_{3.9}Nb_{0.1}O_9$ | 203 | 8.2 | 2 |
| $Ca_{2.7}La_{0.3}Co_{3.9}Ta_{0.1}O_9$ | 208 | 7.1 | 1.9 |
| $Ca_{2.7}Ce_{0.3}Co_{3.8}Ti_{0.2}O_9$ | 199 | 6.9 | 2.5 |
| $Ca_{2.7}Ce_{0.3}Co_{3.8}V_{0.2}O_9$ | 199 | 7 | 2.7 |
| $Ca_{2.7}Ce_{0.3}Co_{3.8}Cr_{0.2}O_9$ | 210 | 7.2 | 2.5 |
| $Ca_{2.7}Ce_{0.3}Co_{3.8}Mn_{0.2}O_9$ | 202 | 6.8 | 1.9 |
| $Ca_{2.7}Ce_{0.3}Co_{3.8}Fe_{0.2}O_9$ | 204 | 6.4 | 2.3 |
| $Ca_{2.7}Ce_{0.3}Co_{3.8}Ni_{0.2}O_9$ | 197 | 8.2 | 2.5 |
| $Ca_{2.7}Ce_{0.3}Co_{3.8}Cu_{0.2}O_9$ | 205 | 7.5 | 2.7 |
| $Ca_{2.7}Ce_{0.3}Co_{3.9}Ag_{0.1}O_9$ | 201 | 6.9 | 2.5 |
| $Ca_{2.7}Ce_{0.3}Co_{3.9}Mo_{0.1}O_9$ | 196 | 8.1 | 2.6 |
| $Ca_{2.7}Ce_{0.3}Co_{3.9}W_{0.1}O_9$ | 202 | 7.6 | 2.4 |
| $Ca_{2.7}Ce_{0.3}Co_{3.9}Nb_{0.1}O_9$ | 203 | 5.9 | 2.3 |
| $Ca_{2.7}Ce_{0.3}Co_{3.9}Ta_{0.1}O_9$ | 208 | 5.8 | 2.2 |
| $Ca_{2.7}Pr_{0.3}Co_{3.8}Ti_{0.2}O_9$ | 199 | 8.2 | 2.4 |
| $Ca_{2.7}Pr_{0.3}Co_{3.8}V_{0.2}O_9$ | 201 | 7.1 | 2.3 |
| $Ca_{2.7}Pr_{0.3}Co_{3.8}Cr_{0.2}O_9$ | 207 | 6.5 | 2.2 |

TABLE 15

| | | | |
|---|---|---|---|
| Ca$_{2.7}$Pr$_{0.3}$Co$_{3.8}$Mn$_{0.2}$O$_9$ | 190 | 6.9 | 2.2 |
| Ca$_{2.7}$Pr$_{0.3}$Co$_{3.8}$Fe$_{0.2}$O$_9$ | 198 | 7 | 2.4 |
| Ca$_{2.7}$Pr$_{0.3}$Co$_{3.8}$Ni$_{0.2}$O$_9$ | 199 | 6.9 | 2.6 |
| Ca$_{2.7}$Pr$_{0.3}$Co$_{3.8}$Cu$_{0.2}$O$_9$ | 201 | 8.1 | 2.5 |
| Ca$_{2.7}$Pr$_{0.3}$Co$_{3.9}$Ag$_{0.1}$O$_9$ | 207 | 7.6 | 3 |
| Ca$_{2.7}$Pr$_{0.3}$Co$_{3.9}$Mo$_{0.1}$O$_9$ | 190 | 5.9 | 2.6 |
| Ca$_{2.7}$Pr$_{0.3}$Co$_{3.9}$W$_{0.1}$O$_9$ | 198 | 5.8 | 2.9 |
| Ca$_{2.7}$Pr$_{0.3}$Co$_{3.9}$Nb$_{0.1}$O$_9$ | 199 | 7.2 | 1.9 |
| Ca$_{2.7}$Pr$_{0.3}$Co$_{3.9}$Ta$_{0.1}$O$_9$ | 201 | 8.2 | 2.2 |
| Ca$_{2.7}$Nd$_{0.3}$Co$_{3.8}$Ti$_{0.2}$O$_9$ | 206 | 6.5 | 2.5 |
| Ca$_{2.7}$Nd$_{0.3}$Co$_{3.8}$V$_{0.2}$O$_9$ | 205 | 6.9 | 3 |
| Ca$_{2.7}$Nd$_{0.3}$Co$_{3.8}$Cr$_{0.2}$O$_9$ | 198 | 7 | 1.9 |
| Ca$_{2.7}$Nd$_{0.3}$Co$_{3.8}$Mn$_{0.2}$O$_9$ | 195 | 7.2 | 2 |
| Ca$_{2.7}$Nd$_{0.3}$Co$_{3.8}$Fe$_{0.2}$O$_9$ | 200 | 6.8 | 2.2 |
| Ca$_{2.7}$Nd$_{0.3}$Co$_{3.8}$Ni$_{0.2}$O$_9$ | 203 | 6.4 | 2.3 |
| Ca$_{2.7}$Nd$_{0.3}$Co$_{3.8}$Cu$_{0.2}$O$_9$ | 201 | 8.2 | 1.9 |
| Ca$_{2.7}$Nd$_{0.3}$Co$_{3.9}$Ag$_{0.1}$O$_9$ | 208 | 7.5 | 3.1 |
| Ca$_{2.7}$Nd$_{0.3}$Co$_{3.9}$Mo$_{0.1}$O$_9$ | 198 | 6.9 | 2.6 |
| Ca$_{2.7}$Nd$_{0.3}$Co$_{3.9}$W$_{0.1}$O$_9$ | 199 | 8.1 | 2.7 |
| Ca$_{2.7}$Nd$_{0.3}$Co$_{3.9}$Nb$_{0.1}$O$_9$ | 207 | 7.6 | 2.4 |
| Ca$_{2.7}$Nd$_{0.3}$Co$_{3.9}$Ta$_{0.1}$O$_9$ | 198 | 5.9 | 1.9 |
| Ca$_{2.7}$Sm$_{0.3}$Co$_{3.8}$Ti$_{0.2}$O$_9$ | 200 | 7.2 | 2.1 |
| Ca$_{2.7}$Sm$_{0.3}$Co$_{3.8}$V$_{0.2}$O$_9$ | 198 | 8.2 | 2.2 |
| Ca$_{2.7}$Sm$_{0.3}$Co$_{3.8}$Cr$_{0.2}$O$_9$ | 205 | 7.1 | 2.6 |
| Ca$_{2.7}$Sm$_{0.3}$Co$_{3.8}$Mn$_{0.2}$O$_9$ | 196 | 6.5 | 2.7 |
| Ca$_{2.7}$Sm$_{0.3}$Co$_{3.8}$Fe$_{0.2}$O$_9$ | 205 | 6.9 | 2.5 |
| Ca$_{2.7}$Sm$_{0.3}$Co$_{3.8}$Ni$_{0.2}$O$_9$ | 198 | 6.8 | 1.9 |
| Ca$_{2.7}$Sm$_{0.3}$Co$_{3.8}$Cu$_{0.2}$O$_9$ | 195 | 7.2 | 2.6 |
| Ca$_{2.7}$Sm$_{0.3}$Co$_{3.9}$Ag$_{0.1}$O$_9$ | 200 | 5.9 | 2.4 |
| Ca$_{2.7}$Sm$_{0.3}$Co$_{3.9}$Mo$_{0.1}$O$_9$ | 205 | 8.1 | 2.3 |
| Ca$_{2.7}$Sm$_{0.3}$Co$_{3.9}$W$_{0.1}$O$_9$ | 198 | 7.2 | 2.2 |
| Ca$_{2.7}$Sm$_{0.3}$Co$_{3.9}$Nb$_{0.1}$O$_9$ | 199 | 6.4 | 2.7 |
| Ca$_{2.7}$Sm$_{0.3}$Co$_{3.9}$Ta$_{0.1}$O$_9$ | 210 | 5.9 | 2.6 |
| Ca$_{2.7}$Eu$_{0.3}$Co$_{3.8}$Ti$_{0.2}$O$_9$ | 207 | 5.9 | 1.9 |

TABLE 16

| | | | |
|---|---|---|---|
| Ca$_{2.7}$Eu$_{0.3}$Co$_{3.8}$V$_{0.2}$O$_9$ | 198 | 7.2 | 2.3 |
| Ca$_{2.7}$Eu$_{0.3}$Co$_{3.8}$Cr$_{0.2}$O$_9$ | 196 | 8.1 | 2.5 |
| Ca$_{2.7}$Eu$_{0.3}$Co$_{3.8}$Mn$_{0.2}$O$_9$ | 200 | 6.9 | 2.6 |
| Ca$_{2.7}$Eu$_{0.3}$Co$_{3.8}$Fe$_{0.2}$O$_9$ | 198 | 5.7 | 2.9 |
| Ca$_{2.7}$Eu$_{0.3}$Co$_{3.8}$Ni$_{0.2}$O$_9$ | 205 | 6.2 | 1.9 |
| Ca$_{2.7}$Eu$_{0.3}$Co$_{3.8}$Cu$_{0.2}$O$_9$ | 196 | 6.8 | 2.2 |
| Ca$_{2.7}$Eu$_{0.3}$Co$_{3.9}$Ag$_{0.1}$O$_9$ | 205 | 8 | 2.6 |
| Ca$_{2.7}$Eu$_{0.3}$Co$_{3.9}$Mo$_{0.1}$O$_9$ | 198 | 7.9 | 2.5 |
| Ca$_{2.7}$Eu$_{0.3}$Co$_{3.9}$W$_{0.1}$O$_9$ | 198 | 6.9 | 3 |
| Ca$_{2.7}$Eu$_{0.3}$Co$_{3.9}$Nb$_{0.1}$O$_9$ | 195 | 5.9 | 1.9 |
| Ca$_{2.7}$Eu$_{0.3}$Co$_{3.9}$Ta$_{0.1}$O$_9$ | 200 | 7.8 | 2 |
| Ca$_{2.7}$Gd$_{0.3}$Co$_{3.8}$Ti$_{0.2}$O$_9$ | 201 | 6.5 | 2.3 |
| Ca$_{2.7}$Gd$_{0.3}$Co$_{3.8}$V$_{0.2}$O$_9$ | 208 | 6.4 | 1.9 |
| Ca$_{2.7}$Gd$_{0.3}$Co$_{3.8}$Cr$_{0.2}$O$_9$ | 198 | 8.2 | 3.1 |
| Ca$_{2.7}$Gd$_{0.3}$Co$_{3.8}$Mn$_{0.2}$O$_9$ | 199 | 7.5 | 2.6 |
| Ca$_{2.7}$Gd$_{0.3}$Co$_{3.8}$Fe$_{0.2}$O$_9$ | 207 | 6.9 | 2.7 |
| Ca$_{2.7}$Gd$_{0.3}$Co$_{3.8}$Ni$_{0.2}$O$_9$ | 198 | 8.1 | 2.4 |
| Ca$_{2.7}$Gd$_{0.3}$Co$_{3.8}$Cu$_{0.2}$O$_9$ | 199 | 7.6 | 1.9 |
| Ca$_{2.7}$Gd$_{0.3}$Co$_{3.9}$Ag$_{0.1}$O$_9$ | 210 | 5.9 | 3 |
| Ca$_{2.7}$Gd$_{0.3}$Co$_{3.9}$Mo$_{0.1}$O$_9$ | 202 | 5.8 | 2.1 |
| Ca$_{2.7}$Gd$_{0.3}$Co$_{3.9}$W$_{0.1}$O$_9$ | 204 | 7.2 | 2.2 |
| Ca$_{2.7}$Gd$_{0.3}$Co$_{3.9}$Nb$_{0.1}$O$_9$ | 197 | 8.2 | 2.4 |
| Ca$_{2.7}$Gd$_{0.3}$Co$_{3.9}$Ta$_{0.1}$O$_9$ | 205 | 7.1 | 2.6 |
| Ca$_{2.7}$Dy$_{0.3}$Co$_{3.8}$Ti$_{0.2}$O$_9$ | 196 | 6.9 | 3 |
| Ca$_{2.7}$Dy$_{0.3}$Co$_{3.8}$V$_{0.2}$O$_9$ | 202 | 7 | 2.6 |
| Ca$_{2.7}$Dy$_{0.3}$Co$_{3.8}$Cr$_{0.2}$O$_9$ | 203 | 7.2 | 2.9 |
| Ca$_{2.7}$Dy$_{0.3}$Co$_{3.8}$Mn$_{0.2}$O$_9$ | 208 | 6.8 | 1.9 |
| Ca$_{2.7}$Dy$_{0.3}$Co$_{3.8}$Fe$_{0.2}$O$_9$ | 198 | 7.2 | 2.2 |
| Ca$_{2.7}$Dy$_{0.3}$Co$_{3.8}$Ni$_{0.2}$O$_9$ | 199 | 5.9 | 2.6 |
| Ca$_{2.7}$Dy$_{0.3}$Co$_{3.8}$Cu$_{0.2}$O$_9$ | 201 | 6.2 | 2.5 |
| Ca$_{2.7}$Dy$_{0.3}$Co$_{3.9}$Ag$_{0.1}$O$_9$ | 207 | 6.8 | 3 |
| Ca$_{2.7}$Dy$_{0.3}$Co$_{3.9}$Mo$_{0.1}$O$_9$ | 190 | 8 | 1.9 |
| Ca$_{2.7}$Dy$_{0.3}$Co$_{3.9}$W$_{0.1}$O$_9$ | 198 | 7.9 | 2 |
| Ca$_{2.7}$Dy$_{0.3}$Co$_{3.9}$Nb$_{0.1}$O$_9$ | 199 | 6.9 | 2.2 |
| Ca$_{2.7}$Dy$_{0.3}$Co$_{3.9}$Ta$_{0.1}$O$_9$ | 201 | 5.9 | 2.3 |

TABLE 17

| | | | |
|---|---|---|---|
| Ca$_{2.7}$Ho$_{0.3}$Co$_{3.8}$Ti$_{0.2}$O$_9$ | 206 | 7.8 | 1.9 |
| Ca$_{2.7}$Ho$_{0.3}$Co$_{3.8}$V$_{0.2}$O$_9$ | 205 | 6.3 | 3.1 |
| Ca$_{2.7}$Ho$_{0.3}$Co$_{3.8}$Cr$_{0.2}$O$_9$ | 198 | 6.5 | 2.6 |
| Ca$_{2.7}$Ho$_{0.3}$Co$_{3.8}$Mn$_{0.2}$O$_9$ | 201 | 6.4 | 2.7 |
| Ca$_{2.7}$Ho$_{0.3}$Co$_{3.8}$Fe$_{0.2}$O$_9$ | 196 | 8.2 | 2.4 |
| Ca$_{2.7}$Ho$_{0.3}$Co$_{3.8}$Ni$_{0.2}$O$_9$ | 202 | 7.5 | 1.9 |
| Ca$_{2.7}$Ho$_{0.3}$Co$_{3.8}$Cu$_{0.2}$O$_9$ | 203 | 6.9 | 3 |
| Ca$_{2.7}$Ho$_{0.3}$Co$_{3.9}$Ag$_{0.1}$O$_9$ | 208 | 8.1 | 2.1 |
| Ca$_{2.7}$Ho$_{0.3}$Co$_{3.9}$Mo$_{0.1}$O$_9$ | 198 | 7.6 | 2.2 |
| Ca$_{2.7}$Ho$_{0.3}$Co$_{3.9}$W$_{0.1}$O$_9$ | 199 | 5.9 | 2.6 |
| Ca$_{2.7}$Ho$_{0.3}$Co$_{3.9}$Nb$_{0.1}$O$_9$ | 201 | 5.8 | 2.7 |
| Ca$_{2.7}$Ho$_{0.3}$Co$_{3.9}$Ta$_{0.1}$O$_9$ | 207 | 7 | 2.5 |
| Ca$_{2.7}$Er$_{0.3}$Co$_{3.8}$Ti$_{0.2}$O$_9$ | 205 | 6.8 | 2.6 |
| Ca$_{2.7}$Er$_{0.3}$Co$_{3.8}$V$_{0.2}$O$_9$ | 198 | 6.4 | 2.4 |
| Ca$_{2.7}$Er$_{0.3}$Co$_{3.8}$Cr$_{0.2}$O$_9$ | 195 | 8.2 | 2.3 |
| Ca$_{2.7}$Er$_{0.3}$Co$_{3.8}$Mn$_{0.2}$O$_9$ | 200 | 7.5 | 2.2 |
| Ca$_{2.7}$Er$_{0.3}$Co$_{3.8}$Fe$_{0.2}$O$_9$ | 205 | 6.9 | 2.7 |
| Ca$_{2.7}$Er$_{0.3}$Co$_{3.8}$Ni$_{0.2}$O$_9$ | 198 | 8.1 | 2.6 |
| Ca$_{2.7}$Er$_{0.3}$Co$_{3.8}$Cu$_{0.2}$O$_9$ | 199 | 7.6 | 2 |
| Ca$_{2.7}$Er$_{0.3}$Co$_{3.9}$Ag$_{0.1}$O$_9$ | 210 | 5.9 | 1.9 |
| Ca$_{2.7}$Er$_{0.3}$Co$_{3.9}$Mo$_{0.1}$O$_9$ | 202 | 5.8 | 2.3 |
| Ca$_{2.7}$Er$_{0.3}$Co$_{3.9}$W$_{0.1}$O$_9$ | 198 | 7.2 | 2.6 |
| Ca$_{2.7}$Er$_{0.3}$Co$_{3.9}$Nb$_{0.1}$O$_9$ | 201 | 8.2 | 2.9 |
| Ca$_{2.7}$Er$_{0.3}$Co$_{3.9}$Ta$_{0.1}$O$_9$ | 196 | 7.1 | 1.9 |
| Ca$_{2.7}$Yb$_{0.3}$Co$_{3.8}$Ti$_{0.2}$O$_9$ | 203 | 6.9 | 2.6 |
| Ca$_{2.7}$Yb$_{0.3}$Co$_{3.8}$V$_{0.2}$O$_9$ | 208 | 7 | 2.5 |
| Ca$_{2.7}$Yb$_{0.3}$Co$_{3.8}$Cr$_{0.2}$O$_9$ | 198 | 7.2 | 3 |
| Ca$_{2.7}$Yb$_{0.3}$Co$_{3.8}$Mn$_{0.2}$O$_9$ | 199 | 6.8 | 1.9 |
| Ca$_{2.7}$Yb$_{0.3}$Co$_{3.8}$Fe$_{0.2}$O$_9$ | 201 | 4.2 | 2 |
| Ca$_{2.7}$Yb$_{0.3}$Co$_{3.8}$Ni$_{0.2}$O$_9$ | 207 | 6 | 2.6 |
| Ca$_{2.7}$Yb$_{0.3}$Co$_{3.8}$Cu$_{0.2}$O$_9$ | 203 | 7.2 | 2.7 |
| Ca$_{2.7}$Yb$_{0.3}$Co$_{3.9}$Ag$_{0.1}$O$_9$ | 205 | 6.8 | 2.4 |
| Ca$_{2.7}$Yb$_{0.3}$Co$_{3.9}$Mo$_{0.1}$O$_9$ | 198 | 5.7 | 1.9 |
| Ca$_{2.7}$Yb$_{0.3}$Co$_{3.9}$W$_{0.1}$O$_9$ | 201 | 6.2 | 3 |
| Ca$_{2.7}$Yb$_{0.3}$Co$_{3.9}$Nb$_{0.1}$O$_9$ | 196 | 6.8 | 2.1 |
| Ca$_{2.7}$Yb$_{0.3}$Co$_{3.9}$Ta$_{0.1}$O$_9$ | 202 | 8.0 | 2.2 |

TABLE 18

| Composition $Bi_jPb_gM^1_hCo_iM^2_jO_k$ | Seebeck Coefficient μV/K (700° C.) | Electrical Resistivity mΩcm (700° C.) | Thermal Conductivity W/mK (700° C.) |
|---|---|---|---|
| Bi$_2$Sr$_2$Co$_2$O$_9$ | 210 | 6.2 | 1.2 |
| Bi$_2$Sr$_{1.8}$Na$_{0.2}$Co$_2$O$_9$ | 205 | 5.9 | 1 |
| Bi$_2$Sr$_{1.8}$K$_{0.2}$Co$_2$O$_9$ | 195 | 6.7 | 1.3 |
| Bi$_2$Sr$_{1.8}$Li$_{0.2}$Co$_2$O$_9$ | 208 | 8 | 1 |
| Bi$_2$Sr$_{1.8}$Ti$_{0.2}$Co$_2$O$_9$ | 220 | 8.1 | 0.9 |
| Bi$_2$Sr$_{1.8}$V$_{0.2}$Co$_2$O$_9$ | 198 | 8 | 1.1 |
| Bi$_2$Sr$_{1.8}$Cr$_{0.2}$Co$_2$O$_9$ | 201 | 7.8 | 1 |
| Bi$_2$Sr$_{1.8}$Mn$_{0.2}$Co$_2$O$_9$ | 207 | 7.2 | 1.2 |
| Bi$_2$Sr$_{1.8}$Fe$_{0.2}$Co$_2$O$_9$ | 190 | 9 | 1.1 |
| Bi$_2$Sr$_{1.8}$Ni$_{0.2}$Co$_2$O$_9$ | 198 | 7.8 | 0.9 |
| Bi$_2$Sr$_{1.8}$Cu$_{0.2}$Co$_2$O$_9$ | 199 | 7.5 | 0.8 |
| Bi$_2$Sr$_{1.8}$Zn$_{0.2}$Co$_2$O$_9$ | 201 | 8.6 | 1 |
| Bi$_2$Sr$_{1.8}$Pb$_{0.2}$Co$_2$O$_9$ | 200 | 8.2 | 1.3 |
| Bi$_2$Sr$_{1.8}$Ca$_{0.2}$Co$_2$O$_9$ | 206 | 7.9 | 1.2 |
| Bi$_2$Sr$_{1.8}$Ba$_{0.2}$Co$_2$O$_9$ | 205 | 6.9 | 0.7 |
| Bi$_2$Sr$_{1.8}$Al$_{0.2}$Co$_2$O$_9$ | 198 | 8.1 | 1.3 |
| Bi$_2$Sr$_{1.8}$Y$_{0.2}$Co$_2$O$_9$ | 201 | 9 | 1.4 |
| Bi$_2$Sr$_{1.8}$La$_{0.2}$Co$_2$O$_9$ | 196 | 8.2 | 1.1 |
| Bi$_2$Sr$_{1.8}$Ce$_{0.2}$Co$_2$O$_9$ | 202 | 7.9 | 1 |
| Bi$_2$Sr$_{1.8}$Pr$_{0.2}$Co$_2$O$_9$ | 203 | 8.6 | 1.3 |
| Bi$_2$Sr$_{1.8}$Nd$_{0.2}$Co$_2$O$_9$ | 205 | 9.1 | 0.9 |
| Bi$_2$Sr$_{1.8}$Sm$_{0.2}$Co$_2$O$_9$ | 198 | 6.9 | 1.1 |
| Bi$_2$Sr$_{1.8}$Eu$_{0.2}$Co$_2$O$_9$ | 195 | 7.4 | 1.4 |
| Bi$_2$Sr$_{1.8}$Gd$_{0.2}$Co$_2$O$_9$ | 200 | 7.8 | 1.2 |
| Bi$_2$Sr$_{1.8}$Dy$_{0.2}$Co$_2$O$_9$ | 205 | 7.7 | 0.9 |
| Bi$_2$Sr$_{1.8}$Ho$_{0.2}$Co$_2$O$_9$ | 198 | 8 | 1.1 |
| Bi$_2$Sr$_{1.8}$Er$_{0.2}$Co$_2$O$_9$ | 199 | 8.2 | 1.2 |
| Bi$_2$Sr$_{1.8}$Yb$_{0.2}$Co$_2$O$_9$ | 210 | 7.9 | 0.9 |
| Bi$_2$Pb$_{0.2}$Sr$_2$Co$_2$O$_9$ | 204 | 8.4 | 1.2 |
| Bi$_2$Pb$_{0.2}$Sr$_{1.8}$Na$_{0.2}$Co$_2$O$_9$ | 197 | 8.6 | 1.4 |
| Bi$_2$Pb$_{0.2}$Sr$_{1.8}$K$_{0.2}$Co$_2$O$_9$ | 190 | 7.8 | 0.8 |
| Bi$_2$Pb$_{0.2}$Sr$_{1.8}$Li$_{0.2}$Co$_2$O$_9$ | 198 | 9 | 1.3 |

TABLE 18-continued

| Composition $Bi_iPb_gM^1_hCo_iM^2_jO_k$ | Seebeck Coefficient μV/K (700° C.) | Electrical Resistivity mΩcm (700° C.) | Thermal Conductivity W/mK (700° C.) |
|---|---|---|---|
| $Bi_2Pb_{0.2}Sr_{1.8}Ti_{0.2}Co_2O_9$ | 199 | 8.2 | 1.2 |
| $Bi_2Pb_{0.2}Sr_{1.8}V_{0.2}Co_2O_9$ | 201 | 8.3 | 1.1 |

TABLE 19

| | | | |
|---|---|---|---|
| $Bi_2Pb_{0.2}Sr_{1.8}Cr_{0.2}Co_2O_9$ | 207 | 8.6 | 0.8 |
| $Bi_2Pb_{0.2}Sr_{1.8}Mn_{0.2}Co_2O_9$ | 190 | 8.7 | 1.3 |
| $Bi_2Pb_{0.2}Sr_{1.8}Fe_{0.2}Co_2O_9$ | 198 | 8.3 | 1.4 |
| $Bi_2Pb_{0.2}Sr_{1.8}Ni_{0.2}Co_2O_9$ | 199 | 9 | 1.1 |
| $Bi_2Pb_{0.2}Sr_{1.8}Cu_{0.2}Co_2O_9$ | 201 | 7.9 | 1 |
| $Bi_2Pb_{0.2}Sr_{1.8}Zn_{0.2}Co_2O_9$ | 210 | 8.1 | 1.3 |
| $Bi_2Pb_{0.2}Sr_{1.8}Pb_{0.2}Co_2O_9$ | 206 | 8 | 0.9 |
| $Bi_2Pb_{0.2}Sr_{1.8}Ca_{0.2}Co_2O_9$ | 205 | 7.8 | 1.1 |
| $Bi_2Pb_{0.2}Sr_{1.8}Ba_{0.2}Co_2O_9$ | 198 | 7.2 | 1.4 |
| $Bi_2Pb_{0.2}Sr_{1.8}Al_{0.2}Co_2O_9$ | 195 | 9 | 1.2 |
| $Bi_2Pb_{0.2}Sr_{1.8}Y_{0.2}Co_2O_9$ | 200 | 7.8 | 0.9 |
| $Bi_2Pb_{0.2}Sr_{1.8}La_{0.2}Co_2O_9$ | 203 | 7.5 | 1.1 |
| $Bi_2Pb_{0.2}Sr_{1.8}Ce_{0.2}Co_2O_9$ | 201 | 8.6 | 1.2 |
| $Bi_2Pb_{0.2}Sr_{1.8}Pr_{0.2}Co_2O_9$ | 208 | 8.2 | 0.9 |
| $Bi_2Pb_{0.2}Sr_{1.8}Nd_{0.2}Co_2O_9$ | 198 | 7.9 | 1.1 |
| $Bi_2Pb_{0.2}Sr_{1.8}Sm_{0.2}Co_2O_9$ | 199 | 6.9 | 1.2 |
| $Bi_2Pb_{0.2}Sr_{1.8}Eu_{0.2}Co_2O_9$ | 207 | 8.1 | 1.4 |
| $Bi_2Pb_{0.2}Sr_{1.8}Gd_{0.2}Co_2O_9$ | 198 | 9 | 0.8 |
| $Bi_2Pb_{0.2}Sr_{1.8}Dy_{0.2}Co_2O_9$ | 201 | 8.2 | 1.3 |
| $Bi_2Pb_{0.2}Sr_{1.8}Ho_{0.2}Co_2O_9$ | 200 | 7.9 | 1.2 |
| $Bi_2Pb_{0.2}Sr_{1.8}Er_{0.2}Co_2O_9$ | 198 | 8.6 | 1.1 |
| $Bi_2Pb_{0.2}Sr_{1.8}Yb_{0.2}Co_2O_9$ | 205 | 9.1 | 1 |
| $Bi_2Ca_2Co_2O_9$ | 205 | 7.4 | 1.1 |
| $Bi_2Ca_{1.8}Na_{0.2}Co_2O_9$ | 198 | 7.8 | 0.9 |
| $Bi_2Ca_{1.8}K_{0.2}Co_2O_9$ | 195 | 7.7 | 0.8 |
| $Bi_2Ca_{1.8}Li_{0.2}Co_2O_9$ | 200 | 8 | 1 |
| $Bi_2Ca_{1.8}Ti_{0.2}Co_2O_9$ | 205 | 8.2 | 1.3 |
| $Bi_2Ca_{1.8}V_{0.2}Co_2O_9$ | 198 | 7.9 | 1.2 |
| $Bi_2Ca_{1.8}Cr_{0.2}Co_2O_9$ | 199 | 9.1 | 0.7 |
| $Bi_2Ca_{1.8}Mn_{0.2}Co_2O_9$ | 210 | 8.4 | 1.3 |
| $Bi_2Ca_{1.8}Fe_{0.2}Co_2O_9$ | 200 | 8.6 | 1.4 |
| $Bi_2Ca_{1.8}Ni_{0.2}Co_2O_9$ | 207 | 8.2 | 1.1 |
| $Bi_2Ca_{1.8}Cu_{0.2}Co_2O_9$ | 198 | 7.9 | 1 |
| $Bi_2Ca_{1.8}Zn_{0.2}Co_2O_9$ | 196 | 8.6 | 1.3 |
| $Bi_2Ca_{1.8}Pb_{0.2}Co_2O_9$ | 200 | 9.1 | 0.9 |
| $Bi_2Ca_{1.8}Sr_{0.2}Co_2O_9$ | 198 | 6.9 | 1.1 |

TABLE 20

| | | | |
|---|---|---|---|
| $Bi_2Ca_{1.8}Ba_{0.2}Co_2O_9$ | 205 | 7.4 | 1.4 |
| $Bi_2Ca_{1.8}Al_{0.2}Co_2O_9$ | 196 | 7.8 | 1.2 |
| $Bi_2Ca_{1.8}Y_{0.2}Co_2O_9$ | 205 | 7.7 | 0.9 |
| $Bi_2Ca_{1.8}La_{0.2}Co_2O_9$ | 198 | 8 | 1.1 |
| $Bi_2Ca_{1.8}Ce_{0.2}Co_2O_9$ | 198 | 8.2 | 1.2 |
| $Bi_2Ca_{1.8}Pr_{0.2}Co_2O_9$ | 195 | 7.9 | 0.9 |
| $Bi_2Ca_{1.8}Nd_{0.2}Co_2O_9$ | 200 | 9.1 | 1.1 |
| $Bi_2Ca_{1.8}Sm_{0.2}Co_2O_9$ | 210 | 8.4 | 1.2 |
| $Bi_2Ca_{1.8}Eu_{0.2}Co_2O_9$ | 201 | 8.6 | 1.4 |
| $Bi_2Ca_{1.8}Gd_{0.2}Co_2O_9$ | 208 | 7.8 | 0.8 |
| $Bi_2Ca_{1.8}Dy_{0.2}Co_2O_9$ | 198 | 9 | 1.3 |
| $Bi_2Ca_{1.8}Ho_{0.2}Co_2O_9$ | 199 | 8.2 | 1.2 |
| $Bi_2Ca_{1.8}Er_{0.2}Co_2O_9$ | 207 | 8.3 | 1.1 |
| $Bi_2Ca_{1.8}Yb_{0.2}Co_2O_9$ | 198 | 8.6 | 0.8 |
| $Bi_2Pb_{0.2}Ca_2Co_2O_9$ | 210 | 8.3 | 1.4 |
| $Bi_2Pb_{0.2}Ca_{1.8}Na_{0.2}Co_2O_9$ | 202 | 9 | 1.1 |
| $Bi_2Pb_{0.2}Ca_{1.8}K_{0.2}Co_2O_9$ | 204 | 7.9 | 1 |
| $Bi_2Pb_{0.2}Ca_{1.8}Li_{0.2}Co_2O_9$ | 197 | 8.1 | 1.3 |
| $Bi_2Pb_{0.2}Ca_{1.8}Ti_{0.2}Co_2O_9$ | 205 | 8 | 0.9 |
| $Bi_2Pb_{0.2}Ca_{1.8}V_{0.2}Co_2O_9$ | 208 | 7.8 | 1.1 |
| $Bi_2Pb_{0.2}Ca_{1.8}Cr_{0.2}Co_2O_9$ | 196 | 7.2 | 1.4 |
| $Bi_2Pb_{0.2}Ca_{1.8}Mn_{0.2}Co_2O_9$ | 202 | 9 | 1.2 |
| $Bi_2Pb_{0.2}Ca_{1.8}Fe_{0.2}Co_2O_9$ | 203 | 7.8 | 0.9 |
| $Bi_2Pb_{0.2}Ca_{1.8}Ni_{0.2}Co_2O_9$ | 208 | 7.5 | 1.1 |
| $Bi_2Pb_{0.2}Ca_{1.8}Cu_{0.2}Co_2O_9$ | 198 | 8.6 | 1.2 |

TABLE 20-continued

| $Bi_2Pb_{0.2}Ca_{1.8}Zn_{0.2}Co_2O_9$ | 199 | 8.2 | 0.9 |
|---|---|---|---|
| $Bi_2Pb_{0.2}Ca_{1.8}Pb_{0.2}Co_2O_9$ | 201 | 7.9 | 1.1 |
| $Bi_2Pb_{0.2}Ca_{1.8}Sr_{0.2}Co_2O_9$ | 207 | 6.9 | 1.2 |
| $Bi_2Pb_{0.2}Ca_{1.8}Ba_{0.2}Co_2O_9$ | 190 | 8.1 | 1 |
| $Bi_2Pb_{0.2}Ca_{1.8}Al_{0.2}Co_2O_9$ | 198 | 9 | 1.3 |
| $Bi_2Pb_{0.2}Ca_{1.8}Y_{0.2}Co_2O_9$ | 199 | 8.2 | 1 |
| $Bi_2Pb_{0.2}Ca_{1.8}La_{0.2}Co_2O_9$ | 201 | 7.9 | 0.9 |
| $Bi_2Pb_{0.2}Ca_{1.8}Ce_{0.2}Co_2O_9$ | 190 | 8.6 | 1.1 |
| $Bi_2Pb_{0.2}Ca_{1.8}Pr_{0.2}Co_2O_9$ | 198 | 9.1 | 1 |
| $Bi_2Pb_{0.2}Ca_{1.8}Nd_{0.2}Co_2O_9$ | 199 | 8 | 1.2 |
| $Bi_2Pb_{0.2}Ca_{1.8}Sm_{0.2}Co_2O_9$ | 201 | 8.2 | 1.1 |

TABLE 21

| $Bi_2Pb_{0.2}Ca_{1.8}Eu_{0.2}Co_2O_9$ | 200 | 7.9 | 0.9 |
|---|---|---|---|
| $Bi_2Pb_{0.2}Ca_{1.8}Gd_{0.2}Co_2O_9$ | 206 | 9.1 | 0.8 |
| $Bi_2Pb_{0.2}Ca_{1.8}Dy_{0.2}Co_2O_9$ | 205 | 8.4 | 1 |
| $Bi_2Pb_{0.2}Ca_{1.8}Ho_{0.2}Co_2O_9$ | 198 | 8.6 | 1.3 |
| $Bi_2Pb_{0.2}Ca_{1.8}Er_{0.2}Co_2O_9$ | 201 | 7.8 | 1.2 |
| $Bi_2Pb_{0.2}Ca_{1.8}Yb_{0.2}Co_2O_9$ | 196 | 9 | 0.7 |
| $Bi_2Ba_2Co_2O_9$ | 203 | 8.3 | 1.4 |
| $Bi_2Ba_{1.8}Na_{0.2}Co_2O_9$ | 205 | 8.6 | 1.1 |
| $Bi_2Ba_{1.8}K_{0.2}Co_2O_9$ | 198 | 8.7 | 1 |
| $Bi_2Ba_{1.8}Li_{0.2}Co_2O_9$ | 195 | 8.3 | 1.3 |
| $Bi_2Ba_{1.8}Ti_{0.2}Co_2O_9$ | 200 | 9 | 0.9 |
| $Bi_2Ba_{1.8}V_{0.2}Co_2O_9$ | 205 | 7.9 | 1.1 |
| $Bi_2Ba_{1.8}Cr_{0.2}Co_2O_9$ | 198 | 8.1 | 1.4 |
| $Bi_2Ba_{1.8}Mn_{0.2}Co_2O_9$ | 199 | 8 | 1.2 |
| $Bi_2Ba_{1.8}Fe_{0.2}Co_2O_9$ | 210 | 7.8 | 0.9 |
| $Bi_2Ba_{1.8}Ni_{0.2}Co_2O_9$ | 202 | 7.2 | 1.1 |
| $Bi_2Ba_{1.8}Cu_{0.2}Co_2O_9$ | 204 | 9 | 1.2 |
| $Bi_2Ba_{1.8}Zn_{0.2}Co_2O_9$ | 197 | 7.8 | 0.9 |
| $Bi_2Ba_{1.8}Pb_{0.2}Co_2O_9$ | 190 | 7.5 | 1.1 |
| $Bi_2Ba_{1.8}Ca_{0.2}Co_2O_9$ | 198 | 8.6 | 1.2 |
| $Bi_2Ba_{1.8}Sr_{0.2}Co_2O_9$ | 199 | 8.2 | 1.4 |
| $Bi_2Ba_{1.8}Al_{0.2}Co_2O_9$ | 201 | 7.9 | 0.8 |
| $Bi_2Ba_{1.8}Y_{0.2}Co_2O_9$ | 207 | 6.9 | 1.3 |
| $Bi_2Ba_{1.8}La_{0.2}Co_2O_9$ | 190 | 8.1 | 1.2 |
| $Bi_2Ba_{1.8}Ce_{0.2}Co_2O_9$ | 198 | 9 | 1.1 |
| $Bi_2Ba_{1.8}Pr_{0.2}Co_2O_9$ | 199 | 8.2 | 0.8 |
| $Bi_2Ba_{1.8}Nd_{0.2}Co_2O_9$ | 201 | 7.9 | 1.3 |
| $Bi_2Ba_{1.8}Sm_{0.2}Co_2O_9$ | 210 | 8.6 | 1.4 |
| $Bi_2Ba_{1.8}Eu_{0.2}Co_2O_9$ | 206 | 9.1 | 1.1 |
| $Bi_2Ba_{1.8}Gd_{0.2}Co_2O_9$ | 205 | 6.9 | 1 |
| $Bi_2Ba_{1.8}Dy_{0.2}Co_2O_9$ | 198 | 7.4 | 1.3 |
| $Bi_2Ba_{1.8}Ho_{0.2}Co_2O_9$ | 195 | 7.8 | 0.9 |
| $Bi_2Ba_{1.8}Er_{0.2}Co_2O_9$ | 200 | 7.7 | 1.1 |
| $Bi_2Ba_{1.8}Yb_{0.2}Co_2O_9$ | 203 | 8.0 | 1.4 |
| $Bi_2Pb_{0.2}Ba_2Co_2O_9$ | 208 | 7.9 | 0.9 |

TABLE 22

| $Bi_2Pb_{0.2}Ba_{1.8}Na_{0.2}Co_2O_9$ | 198 | 8.0 | 1.1 |
|---|---|---|---|
| $Bi_2Pb_{0.2}Ba_{1.8}K_{0.2}Co_2O_9$ | 199 | 8.1 | 1.2 |
| $Bi_2Pb_{0.2}Ba_{1.8}Li_{0.2}Co_2O_9$ | 200 | 8 | 0.9 |
| $Bi_2Pb_{0.2}Ba_{1.8}Ti_{0.2}Co_2O_9$ | 206 | 7.8 | 1.1 |
| $Bi_2Pb_{0.2}Ba_{1.8}V_{0.2}Co_2O_9$ | 205 | 7.2 | 1.2 |
| $Bi_2Pb_{0.2}Ba_{1.8}Cr_{0.2}Co_2O_9$ | 198 | 9 | 1.4 |
| $Bi_2Pb_{0.2}Ba_{1.8}Mn_{0.2}Co_2O_9$ | 201 | 7.8 | 0.8 |
| $Bi_2Pb_{0.2}Ba_{1.8}Fe_{0.2}Co_2O_9$ | 196 | 7.5 | 1.3 |
| $Bi_2Pb_{0.2}Ba_{1.8}Ni_{0.2}Co_2O_9$ | 202 | 8.6 | 1.2 |
| $Bi_2Pb_{0.2}Ba_{1.8}Cu_{0.2}Co_2O_9$ | 203 | 8.2 | 1.1 |
| $Bi_2Pb_{0.2}Ba_{1.8}Zn_{0.2}Co_2O_9$ | 205 | 7.9 | 0.8 |
| $Bi_2Pb_{0.2}Ba_{1.8}Pb_{0.2}Co_2O_9$ | 198 | 6.9 | 1 |
| $Bi_2Pb_{0.2}Ba_{1.8}Ca_{0.2}Co_2O_9$ | 195 | 8.1 | 1.3 |
| $Bi_2Pb_{0.2}Ba_{1.8}Sr_{0.2}Co_2O_9$ | 200 | 9 | 1.2 |
| $Bi_2Pb_{0.2}Ba_{1.8}Al_{0.2}Co_2O_9$ | 205 | 8.2 | 0.7 |
| $Bi_2Pb_{0.2}Ba_{1.8}Y_{0.2}Co_2O_9$ | 198 | 7.9 | 1.3 |
| $Bi_2Pb_{0.2}Ba_{1.8}La_{0.2}Co_2O_9$ | 199 | 8.6 | 1.4 |
| $Bi_2Pb_{0.2}Ba_{1.8}Ce_{0.2}Co_2O_9$ | 210 | 9.1 | 1.1 |
| $Bi_2Pb_{0.2}Ba_{1.8}Pr_{0.2}Co_2O_9$ | 202 | 6.9 | 1 |
| $Bi_2Pb_{0.2}Ba_{1.8}Nd_{0.2}Co_2O_9$ | 207 | 7.4 | 1.3 |
| $Bi_2Pb_{0.2}Ba_{1.8}Sm_{0.2}Co_2O_9$ | 198 | 7.8 | 0.9 |
| $Bi_2Pb_{0.2}Ba_{1.8}Eu_{0.2}Co_2O_9$ | 199 | 7.7 | 1.1 |

TABLE 22-continued

| | | | |
|---|---|---|---|
| $Bi_2Pb_{0.2}Ba_{1.8}Gd_{0.2}Co_2O_9$ | 210 | 8 | 1.4 |
| $Bi_2Pb_{0.2}Ba_{1.8}Dy_{0.2}Co_2O_9$ | 202 | 8.2 | 1.2 |
| $Bi_2Pb_{0.2}Ba_{1.8}Ho_{0.2}Co_2O_9$ | 204 | 7.9 | 0.9 |
| $Bi_2Pb_{0.2}Ba_{1.8}Er_{0.2}Co_2O_9$ | 197 | 9.1 | 1.1 |
| $Bi_2Pb_{0.2}Ba_{1.8}Yb_{0.2}Co_2O_9$ | 205 | 8.4 | 1.2 |
| $Bi_2Sr_2Co_{1.9}Ti_{0.1}O_9$ | 196 | 7.8 | 1.1 |
| $Bi_2Sr_{1.8}Na_{0.2}Co_{1.9}Ti_{0.1}O_9$ | 202 | 9 | 1.2 |
| $Bi_2Sr_{1.8}K_{0.2}Co_{1.9}Ti_{0.1}O_9$ | 203 | 8.2 | 1.4 |
| $Bi_2Sr_{1.8}Li_{0.2}Co_{1.9}Ti_{0.1}O_9$ | 208 | 8.3 | 0.8 |
| $Bi_2Sr_{1.8}Ti_{0.2}Co_{1.9}Ti_{0.1}O_9$ | 198 | 8.6 | 1.3 |
| $Bi_2Sr_{1.8}V_{0.2}Co_{1.9}Ti_{0.1}O_9$ | 199 | 8.7 | 1.2 |
| $Bi_2Sr_{1.8}Cr_{0.2}Co_{1.9}Ti_{0.1}O_9$ | 201 | 8.3 | 1.1 |
| $Bi_2Sr_{1.8}Mn_{0.2}Co_{1.9}Ti_{0.1}O_9$ | 207 | 9 | 0.8 |
| $Bi_2Sr_{1.8}Fe_{0.2}Co_{1.9}Ti_{0.1}O_9$ | 190 | 7.9 | 1.3 |

TABLE 23

| | | | |
|---|---|---|---|
| $Bi_2Sr_{1.8}Ni_{0.2}Co_{1.9}Ti_{0.1}O_9$ | 198 | 8.1 | 1.4 |
| $Bi_2Sr_{1.8}Cu_{0.2}Co_{1.9}Ti_{0.1}O_9$ | 199 | 8 | 1.1 |
| $Bi_2Sr_{1.8}Zn_{0.2}Co_{1.9}Ti_{0.1}O_9$ | 201 | 7.8 | 1 |
| $Bi_2Sr_{1.8}Pb_{0.2}Co_{1.9}Ti_{0.1}O_9$ | 190 | 7.2 | 1.3 |
| $Bi_2Sr_{1.8}Ca_{0.2}Co_{1.9}Ti_{0.1}O_9$ | 198 | 9 | 0.9 |
| $Bi_2Sr_{1.8}Ba_{0.2}Co_{1.9}Ti_{0.1}O_9$ | 199 | 7.8 | 1.1 |
| $Bi_2Sr_{1.8}Al_{0.2}Co_{1.9}Ti_{0.1}O_9$ | 201 | 7.5 | 1.4 |
| $Bi_2Sr_{1.8}Y_{0.2}Co_{1.9}Ti_{0.1}O_9$ | 200 | 8.6 | 1.2 |
| $Bi_2Sr_{1.8}La_{0.2}Co_{1.9}Ti_{0.1}O_9$ | 206 | 8.2 | 0.9 |
| $Bi_2Sr_{1.8}Ce_{0.2}Co_{1.9}Ti_{0.1}O_9$ | 205 | 7.9 | 1.1 |
| $Bi_2Sr_{1.8}Pr_{0.2}Co_{1.9}Ti_{0.1}O_9$ | 198 | 6.9 | 1.2 |
| $Bi_2Sr_{1.8}Nd_{0.2}Co_{1.9}Ti_{0.1}O_9$ | 201 | 8.1 | 0.9 |
| $Bi_2Sr_{1.8}Sm_{0.2}Co_{1.9}Ti_{0.1}O_9$ | 196 | 9 | 1.1 |
| $Bi_2Sr_{1.8}Eu_{0.2}Co_{1.9}Ti_{0.1}O_9$ | 202 | 8.2 | 1.2 |
| $Bi_2Sr_{1.8}Gd_{0.2}Co_{1.9}Ti_{0.1}O_9$ | 203 | 7.9 | 1.4 |
| $Bi_2Sr_{1.8}Dy_{0.2}Co_{1.9}Ti_{0.1}O_9$ | 205 | 8.6 | 0.8 |
| $Bi_2Sr_{1.8}Ho_{0.2}Co_{1.9}Ti_{0.1}O_9$ | 198 | 9.1 | 1.3 |
| $Bi_2Sr_{1.8}Er_{0.2}Co_{1.9}Ti_{0.1}O_9$ | 195 | 6.9 | 1.2 |
| $Bi_2Sr_{1.8}Yb_{0.2}Co_{1.9}Ti_{0.1}O_9$ | 200 | 7.4 | 1.1 |
| $Bi_2Pb_{0.2}Sr_2Co_{1.9}Ti_{0.1}O_9$ | 198 | 7.7 | 1.2 |
| $Bi_2Pb_{0.2}Sr_{1.8}Na_{0.2}Co_{1.9}Ti_{0.1}O_9$ | 199 | 8 | 0.9 |
| $Bi_2Pb_{0.2}Sr_{1.8}K_{0.2}Co_{1.9}Ti_{0.1}O_9$ | 210 | 8.2 | 1.1 |
| $Bi_2Pb_{0.2}Sr_{1.8}Li_{0.2}Co_{1.9}Ti_{0.1}O_9$ | 202 | 7.9 | 1.2 |
| $Bi_2Pb_{0.2}Sr_{1.8}Ti_{0.2}Co_{1.9}Ti_{0.1}O_9$ | 204 | 9.1 | 0.9 |
| $Bi_2Pb_{0.2}Sr_{1.8}V_{0.2}Co_{1.9}Ti_{0.1}O_9$ | 197 | 8.4 | 1.1 |
| $Bi_2Pb_{0.2}Sr_{1.8}Cr_{0.2}Co_{1.9}Ti_{0.1}O_9$ | 190 | 8.6 | 1.2 |
| $Bi_2Pb_{0.2}Sr_{1.8}Mn_{0.2}Co_{1.9}Ti_{0.1}O_9$ | 198 | 8.2 | 1.4 |
| $Bi_2Pb_{0.2}Sr_{1.8}Fe_{0.2}Co_{1.9}Ti_{0.1}O_9$ | 199 | 7.9 | 0.8 |
| $Bi_2Pb_{0.2}Sr_{1.8}Ni_{0.2}Co_{1.9}Ti_{0.1}O_9$ | 201 | 8.6 | 1.3 |
| $Bi_2Pb_{0.2}Sr_{1.8}Cu_{0.2}Co_{1.9}Ti_{0.1}O_9$ | 207 | 9.1 | 1.2 |
| $Bi_2Pb_{0.2}Sr_{1.8}Zn_{0.2}Co_{1.9}Ti_{0.1}O_9$ | 190 | 6.9 | 1.1 |
| $Bi_2Pb_{0.2}Sr_{1.8}Pb_{0.2}Co_{1.9}Ti_{0.1}O_9$ | 198 | 7.4 | 0.8 |
| $Bi_2Pb_{0.2}Sr_{1.8}Ca_{0.2}Co_{1.9}Ti_{0.1}O_9$ | 199 | 7.8 | 1.3 |
| $Bi_2Pb_{0.2}Sr_{1.8}Ba_{0.2}Co_{1.9}Ti_{0.1}O_9$ | 201 | 7.7 | 1.4 |
| $Bi_2Pb_{0.2}Sr_{1.8}Al_{0.2}Co_{1.9}Ti_{0.1}O_9$ | 210 | 8 | 1.1 |
| $Bi_2Pb_{0.2}Sr_{1.8}Y_{0.2}Co_{1.9}Ti_{0.1}O_9$ | 206 | 8.2 | 1 |

TABLE 24

| | | | |
|---|---|---|---|
| $Bi_2Pb_{0.2}Sr_{1.8}La_{0.2}Co_{1.9}Ti_{0.1}O_9$ | 205 | 7.9 | 1.3 |
| $Bi_2Pb_{0.2}Sr_{1.8}Ce_{0.2}Co_{1.9}Ti_{0.1}O_9$ | 198 | 9.1 | 0.9 |
| $Bi_2Pb_{0.2}Sr_{1.8}Pr_{0.2}Co_{1.9}Ti_{0.1}O_9$ | 195 | 8.4 | 1.1 |
| $Bi_2Pb_{0.2}Sr_{1.8}Nd_{0.2}Co_{1.9}Ti_{0.1}O_9$ | 200 | 8.6 | 1.4 |
| $Bi_2Pb_{0.2}Sr_{1.8}Sm_{0.2}Co_{1.9}Ti_{0.1}O_9$ | 203 | 7.8 | 1.2 |
| $Bi_2Pb_{0.2}Sr_{1.8}Eu_{0.2}Co_{1.9}Ti_{0.1}O_9$ | 201 | 9 | 0.9 |
| $Bi_2Pb_{0.2}Sr_{1.8}Gd_{0.2}Co_{1.9}Ti_{0.1}O_9$ | 208 | 8.2 | 1.1 |
| $Bi_2Pb_{0.2}Sr_{1.8}Dy_{0.2}Co_{1.9}Ti_{0.1}O_9$ | 201 | 8.3 | 1.2 |
| $Bi_2Pb_{0.2}Sr_{1.8}Ho_{0.2}Co_{1.9}Ti_{0.1}O_9$ | 190 | 8.6 | 0.9 |
| $Bi_2Pb_{0.2}Sr_{1.8}Er_{0.2}Co_{1.9}Ti_{0.1}O_9$ | 198 | 8.7 | 1.1 |
| $Bi_2Pb_{0.2}Sr_{1.8}Yb_{0.2}Co_{1.9}Ti_{0.1}O_9$ | 199 | 8.3 | 1.2 |
| $Bi_2Ca_2Co_{1.9}Ti_{0.1}O_9$ | 200 | 7.9 | 1.3 |
| $Bi_2Ca_{1.8}Na_{0.2}Co_{1.9}Ti_{0.1}O_9$ | 206 | 8.1 | 1 |
| $Bi_2Ca_{1.8}K_{0.2}Co_{1.9}Ti_{0.1}O_9$ | 205 | 8 | 0.9 |
| $Bi_2Ca_{1.8}Li_{0.2}Co_{1.9}Ti_{0.1}O_9$ | 198 | 7.8 | 1.1 |
| $Bi_2Ca_{1.8}Ti_{0.2}Co_{1.9}Ti_{0.1}O_9$ | 201 | 7.2 | 1 |
| $Bi_2Ca_{1.8}V_{0.2}Co_{1.9}Ti_{0.1}O_9$ | 196 | 9 | 1.2 |
| $Bi_2Ca_{1.8}Cr_{0.2}Co_{1.9}Ti_{0.1}O_9$ | 202 | 7.8 | 1.1 |

TABLE 24-continued

| | | | |
|---|---|---|---|
| $Bi_2Ca_{1.8}Mn_{0.2}Co_{1.9}Ti_{0.1}O_9$ | 203 | 7.5 | 0.9 |
| $Bi_2Ca_{1.8}Fe_{0.2}Co_{1.9}Ti_{0.1}O_9$ | 205 | 8.6 | 0.8 |
| $Bi_2Ca_{1.8}Ni_{0.2}Co_{1.9}Ti_{0.1}O_9$ | 198 | 8.2 | 1 |
| $Bi_2Ca_{1.8}Cu_{0.2}Co_{1.9}Ti_{0.1}O_9$ | 195 | 7.9 | 1.3 |
| $Bi_2Ca_{1.8}Zn_{0.2}Co_{1.9}Ti_{0.1}O_9$ | 200 | 6.9 | 1.2 |
| $Bi_2Ca_{1.8}Pb_{0.2}Co_{1.9}Ti_{0.1}O_9$ | 205 | 8.1 | 0.7 |
| $Bi_2Ca_{1.8}Sr_{0.2}Co_{1.9}Ti_{0.1}O_9$ | 198 | 7.5 | 1.3 |
| $Bi_2Ca_{1.8}Ba_{0.2}Co_{1.9}Ti_{0.1}O_9$ | 199 | 8.6 | 1.4 |
| $Bi_2Ca_{1.8}Al_{0.2}Co_{1.9}Ti_{0.1}O_9$ | 210 | 8.2 | 1.1 |
| $Bi_2Ca_{1.8}Y_{0.2}Co_{1.9}Ti_{0.1}O_9$ | 202 | 7.9 | 1 |
| $Bi_2Ca_{1.8}La_{0.2}Co_{1.9}Ti_{0.1}O_9$ | 204 | 6.9 | 1.3 |
| $Bi_2Ca_{1.8}Ce_{0.2}Co_{1.9}Ti_{0.1}O_9$ | 197 | 8.1 | 0.9 |
| $Bi_2Ca_{1.8}Pr_{0.2}Co_{1.9}Ti_{0.1}O_9$ | 190 | 9 | 1.1 |
| $Bi_2Ca_{1.8}Nd_{0.2}Co_{1.9}Ti_{0.1}O_9$ | 198 | 8.2 | 1.4 |
| $Bi_2Ca_{1.8}Sm_{0.2}Co_{1.9}Ti_{0.1}O_9$ | 199 | 7.9 | 1.2 |
| $Bi_2Ca_{1.8}Eu_{0.2}Co_{1.9}Ti_{0.1}O_9$ | 201 | 8.6 | 0.9 |
| $Bi_2Ca_{1.8}Gd_{0.2}Co_{1.9}Ti_{0.1}O_9$ | 207 | 9.1 | 1.1 |
| $Bi_2Ca_{1.8}Dy_{0.2}Co_{1.9}Ti_{0.1}O_9$ | 190 | 6.9 | 1.2 |

TABLE 25

| | | | |
|---|---|---|---|
| $Bi_2Ca_{1.8}Ho_{0.2}Co_{1.9}Ti_{0.1}O_9$ | 198 | 7.4 | 0.9 |
| $Bi_2Ca_{1.8}Er_{0.2}Co_{1.9}Ti_{0.1}O_9$ | 199 | 7.8 | 1.1 |
| $Bi_2Ca_{1.8}Yb_{0.2}Co_{1.9}Ti_{0.1}O_9$ | 201 | 7.7 | 1.2 |
| $Bi_2Pb_{0.2}Ca_2Co_{1.9}Ti_{0.1}O_9$ | 206 | 8.2 | 0.8 |
| $Bi_2Pb_{0.2}Ca_{1.8}Na_{0.2}Co_{1.9}Ti_{0.1}O_9$ | 205 | 7.9 | 1.3 |
| $Bi_2Pb_{0.2}Ca_{1.8}K_{0.2}Co_{1.9}Ti_{0.1}O_9$ | 198 | 8 | 1.2 |
| $Bi_2Pb_{0.2}Ca_{1.8}Li_{0.2}Co_{1.9}Ti_{0.1}O_9$ | 195 | 8.1 | 1.1 |
| $Bi_2Pb_{0.2}Ca_{1.8}Ti_{0.2}Co_{1.9}Ti_{0.1}O_9$ | 200 | 7.5 | 0.8 |
| $Bi_2Pb_{0.2}Ca_{1.8}V_{0.2}Co_{1.9}Ti_{0.1}O_9$ | 203 | 8.6 | 1.3 |
| $Bi_2Pb_{0.2}Ca_{1.8}Cr_{0.2}Co_{1.9}Ti_{0.1}O_9$ | 201 | 8.2 | 1.4 |
| $Bi_2Pb_{0.2}Ca_{1.8}Mn_{0.2}Co_{1.9}Ti_{0.1}O_9$ | 208 | 7.9 | 1.1 |
| $Bi_2Pb_{0.2}Ca_{1.8}Fe_{0.2}Co_{1.9}Ti_{0.1}O_9$ | 198 | 6.9 | 1 |
| $Bi_2Pb_{0.2}Ca_{1.8}Ni_{0.2}Co_{1.9}Ti_{0.1}O_9$ | 199 | 8.1 | 1.3 |
| $Bi_2Pb_{0.2}Ca_{1.8}Cu_{0.2}Co_{1.9}Ti_{0.1}O_9$ | 200 | 9 | 0.9 |
| $Bi_2Pb_{0.2}Ca_{1.8}Zn_{0.2}Co_{1.9}Ti_{0.1}O_9$ | 206 | 8.2 | 1.1 |
| $Bi_2Pb_{0.2}Ca_{1.8}Pb_{0.2}Co_{1.9}Ti_{0.1}O_9$ | 205 | 7.9 | 1.4 |
| $Bi_2Pb_{0.2}Ca_{1.8}Sr_{0.2}Co_{1.9}Ti_{0.1}O_9$ | 198 | 8.6 | 1.2 |
| $Bi_2Pb_{0.2}Ca_{1.8}Ba_{0.2}Co_{1.9}Ti_{0.1}O_9$ | 201 | 9.1 | 0.9 |
| $Bi_2Pb_{0.2}Ca_{1.8}Al_{0.2}Co_{1.9}Ti_{0.1}O_9$ | 196 | 6.9 | 1.1 |
| $Bi_2Pb_{0.2}Ca_{1.8}Y_{0.2}Co_{1.9}Ti_{0.1}O_9$ | 202 | 7.4 | 1.2 |
| $Bi_2Pb_{0.2}Ca_{1.8}La_{0.2}Co_{1.9}Ti_{0.1}O_9$ | 203 | 7.8 | 0.9 |
| $Bi_2Pb_{0.2}Ca_{1.8}Ce_{0.2}Co_{1.9}Ti_{0.1}O_9$ | 202 | 7.7 | 1.1 |
| $Bi_2Pb_{0.2}Ca_{1.8}Pr_{0.2}Co_{1.9}Ti_{0.1}O_9$ | 203 | 8 | 1.2 |
| $Bi_2Pb_{0.2}Ca_{1.8}Nd_{0.2}Co_{1.9}Ti_{0.1}O_9$ | 208 | 8.2 | 1.4 |
| $Bi_2Pb_{0.2}Ca_{1.8}Sm_{0.2}Co_{1.9}Ti_{0.1}O_9$ | 198 | 7.9 | 0.8 |
| $Bi_2Pb_{0.2}Ca_{1.8}Eu_{0.2}Co_{1.9}Ti_{0.1}O_9$ | 199 | 9.1 | 1.3 |
| $Bi_2Pb_{0.2}Ca_{1.8}Gd_{0.2}Co_{1.9}Ti_{0.1}O_9$ | 201 | 8.4 | 1.2 |
| $Bi_2Pb_{0.2}Ca_{1.8}Dy_{0.2}Co_{1.9}Ti_{0.1}O_9$ | 207 | 8.6 | 1.1 |
| $Bi_2Pb_{0.2}Ca_{1.8}Ho_{0.2}Co_{1.9}Ti_{0.1}O_9$ | 190 | 7.8 | 0.8 |
| $Bi_2Pb_{0.2}Ca_{1.8}Er_{0.2}Co_{1.9}Ti_{0.1}O_9$ | 198 | 9 | 0.7 |
| $Bi_2Pb_{0.2}Ca_{1.8}Yb_{0.2}Co_{1.9}Ti_{0.1}O_9$ | 199 | 8.2 | 1.3 |
| $Bi_2Ba_2Co_{1.9}Ti_{0.1}O_9$ | 190 | 8.6 | 1.1 |
| $Bi_2Ba_{1.8}Na_{0.2}Co_{1.9}Ti_{0.1}O_9$ | 198 | 8.7 | 1 |
| $Bi_2Ba_{1.8}K_{0.2}Co_{1.9}Ti_{0.1}O_9$ | 199 | 8.3 | 1.3 |
| $Bi_2Ba_{1.8}Li_{0.2}Co_{1.9}Ti_{0.1}O_9$ | 201 | 9 | 0.9 |

TABLE 26

| | | | |
|---|---|---|---|
| $Bi_2Ba_{1.8}Ti_{0.2}Co_{1.9}Ti_{0.1}O_9$ | 200 | 7.9 | 1.1 |
| $Bi_2Ba_{1.8}V_{0.2}Co_{1.9}Ti_{0.1}O_9$ | 206 | 8.1 | 1.4 |
| $Bi_2Ba_{1.8}Cr_{0.2}Co_{1.9}Ti_{0.1}O_9$ | 205 | 8 | 1.2 |
| $Bi_2Ba_{1.8}Mn_{0.2}Co_{1.9}Ti_{0.1}O_9$ | 198 | 7.8 | 0.9 |
| $Bi_2Ba_{1.8}Fe_{0.2}Co_{1.9}Ti_{0.1}O_9$ | 201 | 7.2 | 1.1 |
| $Bi_2Ba_{1.8}Ni_{0.2}Co_{1.9}Ti_{0.1}O_9$ | 196 | 9 | 1.2 |
| $Bi_2Ba_{1.8}Cu_{0.2}Co_{1.9}Ti_{0.1}O_9$ | 202 | 7.8 | 1 |
| $Bi_2Ba_{1.8}Zn_{0.2}Co_{1.9}Ti_{0.1}O_9$ | 203 | 7.5 | 1.1 |
| $Bi_2Ba_{1.8}Pb_{0.2}Co_{1.9}Ti_{0.1}O_9$ | 205 | 8.6 | 1.2 |
| $Bi_2Ba_{1.8}Ca_{0.2}Co_{1.9}Ti_{0.1}O_9$ | 198 | 8.2 | 1.4 |
| $Bi_2Ba_{1.8}Sr_{0.2}Co_{1.9}Ti_{0.1}O_9$ | 195 | 7.9 | 0.8 |
| $Bi_2Ba_{1.8}Al_{0.2}Co_{1.9}Ti_{0.1}O_9$ | 200 | 6.9 | 1.3 |
| $Bi_2Ba_{1.8}Y_{0.2}Co_{1.9}Ti_{0.1}O_9$ | 205 | 8.1 | 1.2 |
| $Bi_2Ba_{1.8}La_{0.2}Co_{1.9}Ti_{0.1}O_9$ | 198 | 9 | 1.1 |
| $Bi_2Ba_{1.8}Ce_{0.2}Co_{1.9}Ti_{0.1}O_9$ | 199 | 8.2 | 0.8 |

TABLE 26-continued

| | | | |
|---|---|---|---|
| $Bi_2Ba_{1.8}Pr_{0.2}Co_{1.9}Ti_{0.1}O_9$ | 210 | 7.9 | 1.3 |
| $Bi_2Ba_{1.8}Nd_{0.2}Co_{1.9}Ti_{0.1}O_9$ | 202 | 8.6 | 1.4 |
| $Bi_2Ba_{1.8}Sm_{0.2}Co_{1.9}Ti_{0.1}O_9$ | 204 | 9.1 | 1.1 |
| $Bi_2Ba_{1.8}Eu_{0.2}Co_{1.9}Ti_{0.1}O_9$ | 197 | 6.9 | 1 |
| $Bi_2Ba_{1.8}Gd_{0.2}Co_{1.9}Ti_{0.1}O_9$ | 190 | 7.4 | 1.3 |
| $Bi_2Ba_{1.8}Dy_{0.2}Co_{1.9}Ti_{0.1}O_9$ | 198 | 7.8 | 0.9 |
| $Bi_2Ba_{1.8}Ho_{0.2}Co_{1.9}Ti_{0.1}O_9$ | 199 | 7.7 | 1.1 |
| $Bi_2Ba_{1.8}Er_{0.2}Co_{1.9}Ti_{0.1}O_9$ | 201 | 8 | 1.4 |
| $Bi_2Ba_{1.8}Yb_{0.2}Co_{1.9}Ti_{0.1}O_9$ | 207 | 8.2 | 1.2 |
| $Bi_2Pb_{0.2}Ba_2Co_{1.9}Ti_{0.1}O_9$ | 198 | 9.1 | 1.1 |
| $Bi_2Pb_{0.2}Ba_{1.8}Na_{0.2}Co_{1.9}Ti_{0.1}O_9$ | 199 | 8.4 | 1.2 |
| $Bi_2Pb_{0.2}Ba_{1.8}K_{0.2}Co_{1.9}Ti_{0.1}O_9$ | 201 | 8.6 | 0.9 |
| $Bi_2Pb_{0.2}Ba_{1.8}Li_{0.2}Co_{1.9}Ti_{0.1}O_9$ | 210 | 8.2 | 1.1 |
| $Bi_2Pb_{0.2}Ba_{1.8}Ti_{0.2}Co_{1.9}Ti_{0.1}O_9$ | 206 | 7.9 | 1.2 |
| $Bi_2Pb_{0.2}Ba_{1.8}V_{0.2}Co_{1.9}Ti_{0.1}O_9$ | 205 | 8.6 | 1.4 |
| $Bi_2Pb_{0.2}Ba_{1.8}Cr_{0.2}Co_{1.9}Ti_{0.1}O_9$ | 198 | 9.1 | 0.8 |
| $Bi_2Pb_{0.2}Ba_{1.8}Mn_{0.2}Co_{1.9}Ti_{0.1}O_9$ | 195 | 6.9 | 1.3 |
| $Bi_2Pb_{0.2}Ba_{1.8}Fe_{0.2}Co_{1.9}Ti_{0.1}O_9$ | 200 | 7.4 | 1.2 |
| $Bi_2Pb_{0.2}Ba_{1.8}Ni_{0.2}Co_{1.9}Ti_{0.1}O_9$ | 203 | 7.8 | 1.1 |
| $Bi_2Pb_{0.2}Ba_{1.8}Cu_{0.2}Co_{1.9}Ti_{0.1}O_9$ | 201 | 7.7 | 1.4 |
| $Bi_2Pb_{0.2}Ba_{1.8}Zn_{0.2}Co_{1.9}Ti_{0.1}O_9$ | 208 | 8 | 1.2 |

TABLE 27

| | | | |
|---|---|---|---|
| $Bi_2Pb_{0.2}Ba_{1.8}Pb_{0.2}Co_{1.9}Ti_{0.1}O_9$ | 205 | 8.2 | 0.9 |
| $Bi_2Pb_{0.2}Ba_{1.8}Ca_{0.2}Co_{1.9}Ti_{0.1}O_9$ | 198 | 7.9 | 1.1 |
| $Bi_2Pb_{0.2}Ba_{1.8}Sr_{0.2}Co_{1.9}Ti_{0.1}O_9$ | 201 | 9.1 | 1.2 |
| $Bi_2Pb_{0.2}Ba_{1.8}Al_{0.2}Co_{1.9}Ti_{0.1}O_9$ | 196 | 8.4 | 0.9 |
| $Bi_2Pb_{0.2}Ba_{1.8}Y_{0.2}Co_{1.9}Ti_{0.1}O_9$ | 202 | 8.6 | 1.1 |
| $Bi_2Pb_{0.2}Ba_{1.8}La_{0.2}Co_{1.9}Ti_{0.1}O_9$ | 203 | 7.8 | 1.2 |
| $Bi_2Pb_{0.2}Ba_{1.8}Ce_{0.2}Co_{1.9}Ti_{0.1}O_9$ | 205 | 9 | 1.4 |
| $Bi_2Pb_{0.2}Ba_{1.8}Pr_{0.2}Co_{1.9}Ti_{0.1}O_9$ | 198 | 8.2 | 0.8 |
| $Bi_2Pb_{0.2}Ba_{1.8}Nd_{0.2}Co_{1.9}Ti_{0.1}O_9$ | 195 | 8.3 | 1.3 |
| $Bi_2Pb_{0.2}Ba_{1.8}Sm_{0.2}Co_{1.9}Ti_{0.1}O_9$ | 200 | 8.6 | 1.2 |
| $Bi_2Pb_{0.2}Ba_{1.8}Eu_{0.2}Co_{1.9}Ti_{0.1}O_9$ | 205 | 8.7 | 1.1 |
| $Bi_2Pb_{0.2}Ba_{1.8}Gd_{0.2}Co_{1.9}Ti_{0.1}O_9$ | 198 | 8.3 | 0.8 |
| $Bi_2Pb_{0.2}Ba_{1.8}Dy_{0.2}Co_{1.9}Ti_{0.1}O_9$ | 199 | 9 | 1.3 |
| $Bi_2Pb_{0.2}Ba_{1.8}Ho_{0.2}Co_{1.9}Ti_{0.1}O_9$ | 210 | 7.9 | 1.4 |
| $Bi_2Pb_{0.2}Ba_{1.8}Er_{0.2}Co_{1.9}Ti_{0.1}O_9$ | 202 | 8.1 | 1.1 |
| $Bi_2Pb_{0.2}Ba_{1.8}Yb_{0.2}Co_{1.9}Ti_{0.1}O_9$ | 204 | 8 | 1 |
| $Bi_2Sr_2Co_{1.9}V_{0.1}O_9$ | 190 | 7.2 | 0.9 |
| $Bi_2Sr_{1.8}Na_{0.2}Co_{1.9}V_{0.1}O_9$ | 198 | 9 | 1.1 |
| $Bi_2Sr_{1.8}K_{0.2}Co_{1.9}V_{0.1}O_9$ | 199 | 7.8 | 1.4 |
| $Bi_2Sr_{1.8}Li_{0.2}Co_{1.9}V_{0.1}O_9$ | 201 | 7.5 | 1.2 |
| $Bi_2Sr_{1.8}Ti_{0.2}Co_{1.9}V_{0.1}O_9$ | 207 | 8.6 | 0.9 |
| $Bi_2Sr_{1.8}V_{0.2}Co_{1.9}V_{0.1}O_9$ | 190 | 8.2 | 1.1 |
| $Bi_2Sr_{1.8}Cr_{0.2}Co_{1.9}V_{0.1}O_9$ | 198 | 7.9 | 1.2 |
| $Bi_2Sr_{1.8}Mn_{0.2}Co_{1.9}V_{0.1}O_9$ | 199 | 6.9 | 0.9 |
| $Bi_2Sr_{1.8}Fe_{0.2}Co_{1.9}V_{0.1}O_9$ | 201 | 8.1 | 1.1 |
| $Bi_2Sr_{1.8}Ni_{0.2}Co_{1.9}V_{0.1}O_9$ | 210 | 6.9 | 1.2 |
| $Bi_2Sr_{1.8}Cu_{0.2}Co_{1.9}V_{0.1}O_9$ | 206 | 7.4 | 1 |
| $Bi_2Sr_{1.8}Zn_{0.2}Co_{1.9}V_{0.1}O_9$ | 205 | 7.8 | 1.3 |
| $Bi_2Sr_{1.8}Pb_{0.2}Co_{1.9}V_{0.1}O_9$ | 198 | 7.7 | 1 |
| $Bi_2Sr_{1.8}Ca_{0.2}Co_{1.9}V_{0.1}O_9$ | 195 | 8 | 0.9 |
| $Bi_2Sr_{1.8}Ba_{0.2}Co_{1.9}V_{0.1}O_9$ | 200 | 8.2 | 1.1 |
| $Bi_2Sr_{1.8}Al_{0.2}Co_{1.9}V_{0.1}O_9$ | 203 | 7.9 | 1 |
| $Bi_2Sr_{1.8}Y_{0.2}Co_{1.9}V_{0.1}O_9$ | 201 | 9.1 | 1.2 |
| $Bi_2Sr_{1.8}La_{0.2}Co_{1.9}V_{0.1}O_9$ | 208 | 8.4 | 1.1 |
| $Bi_2Sr_{1.8}Ce_{0.2}Co_{1.9}V_{0.1}O_9$ | 201 | 8.6 | 0.9 |
| $Bi_2Sr_{1.8}Pr_{0.2}Co_{1.9}V_{0.1}O_9$ | 190 | 8.2 | 0.8 |

TABLE 28

| | | | |
|---|---|---|---|
| $Bi_2Sr_{1.8}Nd_{0.2}Co_{1.9}V_{0.1}O_9$ | 198 | 7.9 | 1 |
| $Bi_2Sr_{1.8}Sm_{0.2}Co_{1.9}V_{0.1}O_9$ | 199 | 8.6 | 1.3 |
| $Bi_2Sr_{1.8}Eu_{0.2}Co_{1.9}V_{0.1}O_9$ | 201 | 9.1 | 1.2 |
| $Bi_2Sr_{1.8}Gd_{0.2}Co_{1.9}V_{0.1}O_9$ | 200 | 6.9 | 1.3 |
| $Bi_2Sr_{1.8}Dy_{0.2}Co_{1.9}V_{0.1}O_9$ | 206 | 7.4 | 0.9 |
| $Bi_2Sr_{1.8}Ho_{0.2}Co_{1.9}V_{0.1}O_9$ | 205 | 7.8 | 1.1 |
| $Bi_2Sr_{1.8}Er_{0.2}Co_{1.9}V_{0.1}O_9$ | 198 | 7.7 | 1.4 |
| $Bi_2Sr_{1.8}Yb_{0.2}Co_{1.9}V_{0.1}O_9$ | 201 | 8 | 1.2 |
| $Bi_2Pb_{0.2}Sr_2Co_{1.9}V_{0.1}O_9$ | 202 | 7.9 | 1.1 |
| $Bi_2Pb_{0.2}Sr_{1.8}Na_{0.2}Co_{1.9}V_{0.1}O_9$ | 203 | 9.1 | 1.2 |
| $Bi_2Pb_{0.2}Sr_{1.8}K_{0.2}Co_{1.9}V_{0.1}O_9$ | 205 | 8.4 | 0.9 |

TABLE 28-continued

| | | | |
|---|---|---|---|
| $Bi_2Pb_{0.2}Sr_{1.8}Li_{0.2}Co_{1.9}V_{0.1}O_9$ | 198 | 8.6 | 1.1 |
| $Bi_2Pb_{0.2}Sr_{1.8}Ti_{0.2}Co_{1.9}V_{0.1}O_9$ | 195 | 7.8 | 1.2 |
| $Bi_2Pb_{0.2}Sr_{1.8}V_{0.2}Co_{1.9}V_{0.1}O_9$ | 200 | 9 | 1 |
| $Bi_2Pb_{0.2}Sr_{1.8}Cr_{0.2}Co_{1.9}V_{0.1}O_9$ | 205 | 8.2 | 1.3 |
| $Bi_2Pb_{0.2}Sr_{1.8}Mn_{0.2}Co_{1.9}V_{0.1}O_9$ | 198 | 8.3 | 1 |
| $Bi_2Pb_{0.2}Sr_{1.8}Fe_{0.2}Co_{1.9}V_{0.1}O_9$ | 199 | 8.6 | 0.9 |
| $Bi_2Pb_{0.2}Sr_{1.8}Ni_{0.2}Co_{1.9}V_{0.1}O_9$ | 210 | 8.7 | 1.1 |
| $Bi_2Pb_{0.2}Sr_{1.8}Cu_{0.2}Co_{1.9}V_{0.1}O_9$ | 202 | 8.3 | 1 |
| $Bi_2Pb_{0.2}Sr_{1.8}Zn_{0.2}Co_{1.9}V_{0.1}O_9$ | 204 | 9 | 1.2 |
| $Bi_2Pb_{0.2}Sr_{1.8}Pb_{0.2}Co_{1.9}V_{0.1}O_9$ | 197 | 7.9 | 1.1 |
| $Bi_2Pb_{0.2}Sr_{1.8}Ca_{0.2}Co_{1.9}V_{0.1}O_9$ | 190 | 8.1 | 0.9 |
| $Bi_2Pb_{0.2}Sr_{1.8}Ba_{0.2}Co_{1.9}V_{0.1}O_9$ | 198 | 8 | 0.8 |
| $Bi_2Pb_{0.2}Sr_{1.8}Al_{0.2}Co_{1.9}V_{0.1}O_9$ | 199 | 7.8 | 1 |
| $Bi_2Pb_{0.2}Sr_{1.8}Y_{0.2}Co_{1.9}V_{0.1}O_9$ | 201 | 7.2 | 1.3 |
| $Bi_2Pb_{0.2}Sr_{1.8}La_{0.2}Co_{1.9}V_{0.1}O_9$ | 207 | 9 | 1.2 |
| $Bi_2Pb_{0.2}Sr_{1.8}Ce_{0.2}Co_{1.9}V_{0.1}O_9$ | 190 | 7.8 | 0.7 |
| $Bi_2Pb_{0.2}Sr_{1.8}Pr_{0.2}Co_{1.9}V_{0.1}O_9$ | 198 | 7.5 | 1.3 |
| $Bi_2Pb_{0.2}Sr_{1.8}Nd_{0.2}Co_{1.9}V_{0.1}O_9$ | 199 | 8.6 | 1.4 |
| $Bi_2Pb_{0.2}Sr_{1.8}Sm_{0.2}Co_{1.9}V_{0.1}O_9$ | 201 | 8.2 | 1.1 |
| $Bi_2Pb_{0.2}Sr_{1.8}Eu_{0.2}Co_{1.9}V_{0.1}O_9$ | 210 | 7.9 | 1 |
| $Bi_2Pb_{0.2}Sr_{1.8}Gd_{0.2}Co_{1.9}V_{0.1}O_9$ | 206 | 6.9 | 1.3 |
| $Bi_2Pb_{0.2}Sr_{1.8}Dy_{0.2}Co_{1.9}V_{0.1}O_9$ | 205 | 8.1 | 0.9 |
| $Bi_2Pb_{0.2}Sr_{1.8}Ho_{0.2}Co_{1.9}V_{0.1}O_9$ | 198 | 7.5 | 1.1 |
| $Bi_2Pb_{0.2}Sr_{1.8}Er_{0.2}Co_{1.9}V_{0.1}O_9$ | 195 | 8.6 | 1.4 |
| $Bi_2Pb_{0.2}Sr_{1.8}Yb_{0.2}Co_{1.9}V_{0.1}O_9$ | 200 | 8.2 | 1.2 |

TABLE 29

| | | | |
|---|---|---|---|
| $Bi_2Ca_2Co_{1.9}V_{0.1}O_9$ | 203 | 7.9 | 0.9 |
| $Bi_2Ca_{1.8}Na_{0.2}Co_{1.9}V_{0.1}O_9$ | 201 | 6.9 | 1.1 |
| $Bi_2Ca_{1.8}K_{0.2}Co_{1.9}V_{0.1}O_9$ | 208 | 8.1 | 1.2 |
| $Bi_2Ca_{1.8}Li_{0.2}Co_{1.9}V_{0.1}O_9$ | 198 | 9 | 0.9 |
| $Bi_2Ca_{1.8}Ti_{0.2}Co_{1.9}V_{0.1}O_9$ | 199 | 8.2 | 1.1 |
| $Bi_2Ca_{1.8}V_{0.2}Co_{1.9}V_{0.1}O_9$ | 200 | 7.9 | 1.2 |
| $Bi_2Ca_{1.8}Cr_{0.2}Co_{1.9}V_{0.1}O_9$ | 206 | 8.6 | 1.4 |
| $Bi_2Ca_{1.8}Mn_{0.2}Co_{1.9}V_{0.1}O_9$ | 205 | 9.1 | 0.8 |
| $Bi_2Ca_{1.8}Fe_{0.2}Co_{1.9}V_{0.1}O_9$ | 198 | 6.9 | 1.3 |
| $Bi_2Ca_{1.8}Ni_{0.2}Co_{1.9}V_{0.1}O_9$ | 206 | 7.4 | 1.2 |
| $Bi_2Ca_{1.8}Cu_{0.2}Co_{1.9}V_{0.1}O_9$ | 205 | 7.8 | 1.1 |
| $Bi_2Ca_{1.8}Zn_{0.2}Co_{1.9}V_{0.1}O_9$ | 198 | 7.7 | 0.8 |
| $Bi_2Ca_{1.8}Pb_{0.2}Co_{1.9}V_{0.1}O_9$ | 195 | 8 | 1.3 |
| $Bi_2Ca_{1.8}Sr_{0.2}Co_{1.9}V_{0.1}O_9$ | 200 | 8.2 | 1.4 |
| $Bi_2Ca_{1.8}Ba_{0.2}Co_{1.9}V_{0.1}O_9$ | 203 | 8 | 1.1 |
| $Bi_2Ca_{1.8}Al_{0.2}Co_{1.9}V_{0.1}O_9$ | 201 | 7.4 | 1 |
| $Bi_2Ca_{1.8}Y_{0.2}Co_{1.9}V_{0.1}O_9$ | 208 | 7.8 | 1.3 |
| $Bi_2Ca_{1.8}La_{0.2}Co_{1.9}V_{0.1}O_9$ | 201 | 7.7 | 0.9 |
| $Bi_2Ca_{1.8}Ce_{0.2}Co_{1.9}V_{0.1}O_9$ | 190 | 8 | 1.1 |
| $Bi_2Ca_{1.8}Pr_{0.2}Co_{1.9}V_{0.1}O_9$ | 198 | 8.2 | 1.4 |
| $Bi_2Ca_{1.8}Nd_{0.2}Co_{1.9}V_{0.1}O_9$ | 199 | 7.9 | 1.2 |
| $Bi_2Ca_{1.8}Sm_{0.2}Co_{1.9}V_{0.1}O_9$ | 201 | 9.1 | 0.9 |
| $Bi_2Ca_{1.8}Eu_{0.2}Co_{1.9}V_{0.1}O_9$ | 200 | 8.4 | 1.1 |
| $Bi_2Ca_{1.8}Gd_{0.2}Co_{1.9}V_{0.1}O_9$ | 206 | 8.6 | 1.2 |
| $Bi_2Ca_{1.8}Dy_{0.2}Co_{1.9}V_{0.1}O_9$ | 205 | 8.2 | 0.9 |
| $Bi_2Ca_{1.8}Ho_{0.2}Co_{1.9}V_{0.1}O_9$ | 198 | 7.9 | 1.1 |
| $Bi_2Ca_{1.8}Er_{0.2}Co_{1.9}V_{0.1}O_9$ | 201 | 8.6 | 1.2 |
| $Bi_2Ca_{1.8}Yb_{0.2}Co_{1.9}V_{0.1}O_9$ | 196 | 9.1 | 1.4 |
| $Bi_2Pb_{0.2}Ca_2Co_{1.9}V_{0.1}O_9$ | 203 | 7.4 | 1.3 |
| $Bi_2Pb_{0.2}Ca_{1.8}Na_{0.2}Co_{1.9}V_{0.1}O_9$ | 205 | 7.8 | 1.2 |
| $Bi_2Pb_{0.2}Ca_{1.8}K_{0.2}Co_{1.9}V_{0.1}O_9$ | 198 | 7.7 | 1.1 |
| $Bi_2Pb_{0.2}Ca_{1.8}Li_{0.2}Co_{1.9}V_{0.1}O_9$ | 195 | 8.3 | 0.8 |
| $Bi_2Pb_{0.2}Ca_{1.8}Ti_{0.2}Co_{1.9}V_{0.1}O_9$ | 200 | 8.6 | 0.7 |
| $Bi_2Pb_{0.2}Ca_{1.8}V_{0.2}Co_{1.9}V_{0.1}O_9$ | 205 | 8.7 | 1.3 |
| $Bi_2Pb_{0.2}Ca_{1.8}Cr_{0.2}Co_{1.9}V_{0.1}O_9$ | 198 | 8.3 | 0.8 |
| $Bi_2Pb_{0.2}Ca_{1.8}Mn_{0.2}Co_{1.9}V_{0.1}O_9$ | 199 | 9 | 1.3 |

TABLE 30

| | | | |
|---|---|---|---|
| $Bi_2Pb_{0.2}Ca_{1.8}Fe_{0.2}Co_{1.9}V_{0.1}O_9$ | 210 | 7.9 | 1.2 |
| $Bi_2Pb_{0.2}Ca_{1.8}Ni_{0.2}Co_{1.9}V_{0.1}O_9$ | 202 | 8.1 | 1.1 |
| $Bi_2Pb_{0.2}Ca_{1.8}Cu_{0.2}Co_{1.9}V_{0.1}O_9$ | 204 | 8 | 0.8 |
| $Bi_2Pb_{0.2}Ca_{1.8}Zn_{0.2}Co_{1.9}V_{0.1}O_9$ | 197 | 7.8 | 1.3 |
| $Bi_2Pb_{0.2}Ca_{1.8}Pb_{0.2}Co_{1.9}V_{0.1}O_9$ | 190 | 7.2 | 1.4 |
| $Bi_2Pb_{0.2}Ca_{1.8}Sr_{0.2}Co_{1.9}V_{0.1}O_9$ | 198 | 9 | 1.1 |
| $Bi_2Pb_{0.2}Ca_{1.8}Ba_{0.2}Co_{1.9}V_{0.1}O_9$ | 199 | 7.8 | 1 |

TABLE 30-continued

| Formula | | | |
|---|---|---|---|
| $Bi_2Pb_{0.2}Ca_{1.8}Al_{0.2}Co_{1.9}V_{0.1}O_9$ | 201 | 7.5 | 1.3 |
| $Bi_2Pb_{0.2}Ca_{1.8}Y_{0.2}Co_{1.9}V_{0.1}O_9$ | 207 | 8.6 | 0.9 |
| $Bi_2Pb_{0.2}Ca_{1.8}La_{0.2}Co_{1.9}V_{0.1}O_9$ | 190 | 8.2 | 1.1 |
| $Bi_2Pb_{0.2}Ca_{1.8}Ce_{0.2}Co_{1.9}V_{0.1}O_9$ | 198 | 7.9 | 1.4 |
| $Bi_2Pb_{0.2}Ca_{1.8}Pr_{0.2}Co_{1.9}V_{0.1}O_9$ | 199 | 6.9 | 1.2 |
| $Bi_2Pb_{0.2}Ca_{1.8}Nd_{0.2}Co_{1.9}V_{0.1}O_9$ | 201 | 8.1 | 0.9 |
| $Bi_2Pb_{0.2}Ca_{1.8}Sm_{0.2}Co_{1.9}V_{0.1}O_9$ | 210 | 9 | 1.1 |
| $Bi_2Pb_{0.2}Ca_{1.8}Eu_{0.2}Co_{1.9}V_{0.1}O_9$ | 206 | 8.2 | 1.2 |
| $Bi_2Pb_{0.2}Ca_{1.8}Gd_{0.2}Co_{1.9}V_{0.1}O_9$ | 205 | 7.9 | 0.9 |
| $Bi_2Pb_{0.2}Ca_{1.8}Dy_{0.2}Co_{1.9}V_{0.1}O_9$ | 198 | 8.6 | 1.1 |
| $Bi_2Pb_{0.2}Ca_{1.8}Ho_{0.2}Co_{1.9}V_{0.1}O_9$ | 195 | 9.1 | 1.2 |
| $Bi_2Pb_{0.2}Ca_{1.8}Er_{0.2}Co_{1.9}V_{0.1}O_9$ | 200 | 6.9 | 1.4 |
| $Bi_2Pb_{0.2}Ca_{1.8}Yb_{0.2}Co_{1.9}V_{0.1}O_9$ | 203 | 7.4 | 0.8 |
| $Bi_2Ba_2Co_{1.9}V_{0.1}O_9$ | 208 | 7.7 | 1.2 |
| $Bi_2Ba_{1.8}Na_{0.2}Co_{1.9}V_{0.1}O_9$ | 198 | 8 | 1.1 |
| $Bi_2Ba_{1.8}K_{0.2}Co_{1.9}V_{0.1}O_9$ | 199 | 8.2 | 1.4 |
| $Bi_2Ba_{1.8}Li_{0.2}Co_{1.9}V_{0.1}O_9$ | 200 | 7.9 | 1.2 |
| $Bi_2Ba_{1.8}Ti_{0.2}Co_{1.9}V_{0.1}O_9$ | 199 | 9.1 | 0.9 |
| $Bi_2Ba_{1.8}V_{0.2}Co_{1.9}V_{0.1}O_9$ | 210 | 8.4 | 1.1 |
| $Bi_2Ba_{1.8}Cr_{0.2}Co_{1.9}V_{0.1}O_9$ | 202 | 8.6 | 1.2 |
| $Bi_2Ba_{1.8}Mn_{0.2}Co_{1.9}V_{0.1}O_9$ | 204 | 8.2 | 0.9 |
| $Bi_2Ba_{1.8}Fe_{0.2}Co_{1.9}V_{0.1}O_9$ | 197 | 7.9 | 1.1 |
| $Bi_2Ba_{1.8}Ni_{0.2}Co_{1.9}V_{0.1}O_9$ | 190 | 8.6 | 1.2 |
| $Bi_2Ba_{1.8}Cu_{0.2}Co_{1.9}V_{0.1}O_9$ | 198 | 9.1 | 1.4 |
| $Bi_2Ba_{1.8}Zn_{0.2}Co_{1.9}V_{0.1}O_9$ | 199 | 6.9 | 0.8 |
| $Bi_2Ba_{1.8}Pb_{0.2}Co_{1.9}V_{0.1}O_9$ | 201 | 7.4 | 1.3 |
| $Bi_2Ba_{1.8}Ca_{0.2}Co_{1.9}V_{0.1}O_9$ | 207 | 7.8 | 1.2 |
| $Bi_2Ba_{1.8}Sr_{0.2}Co_{1.9}V_{0.1}O_9$ | 190 | 7.7 | 1.1 |
| $Bi_2Ba_{1.8}Al_{0.2}Co_{1.9}V_{0.1}O_9$ | 198 | 8 | 0.8 |

TABLE 31

| Formula | | | |
|---|---|---|---|
| $Bi_2Ba_{1.8}Y_{0.2}Co_{1.9}V_{0.1}O_9$ | 199 | 8.2 | 1.3 |
| $Bi_2Ba_{1.8}La_{0.2}Co_{1.9}V_{0.1}O_9$ | 201 | 7.9 | 1.4 |
| $Bi_2Ba_{1.8}Ce_{0.2}Co_{1.9}V_{0.1}O_9$ | 210 | 9.1 | 1.1 |
| $Bi_2Ba_{1.8}Pr_{0.2}Co_{1.9}V_{0.1}O_9$ | 206 | 8.4 | 1 |
| $Bi_2Ba_{1.8}Nd_{0.2}Co_{1.9}V_{0.1}O_9$ | 205 | 8.6 | 1.3 |
| $Bi_2Ba_{1.8}Sm_{0.2}Co_{1.9}V_{0.1}O_9$ | 198 | 7.8 | 0.9 |
| $Bi_2Ba_{1.8}Eu_{0.2}Co_{1.9}V_{0.1}O_9$ | 195 | 9 | 1.1 |
| $Bi_2Ba_{1.8}Gd_{0.2}Co_{1.9}V_{0.1}O_9$ | 200 | 8.2 | 1.4 |
| $Bi_2Ba_{1.8}Dy_{0.2}Co_{1.9}V_{0.1}O_9$ | 203 | 8.3 | 1.2 |
| $Bi_2Ba_{1.8}Ho_{0.2}Co_{1.9}V_{0.1}O_9$ | 201 | 8.6 | 0.9 |
| $Bi_2Ba_{1.8}Er_{0.2}Co_{1.9}V_{0.1}O_9$ | 208 | 8.7 | 1.1 |
| $Bi_2Ba_{1.8}Yb_{0.2}Co_{1.9}V_{0.1}O_9$ | 201 | 8.3 | 1.2 |
| $Bi_2Pb_{0.2}Ba_2Co_{1.9}V_{0.1}O_9$ | 198 | 7.9 | 1.1 |
| $Bi_2Pb_{0.2}Ba_{1.8}Na_{0.2}Co_{1.9}V_{0.1}O_9$ | 199 | 8.1 | 1.2 |
| $Bi_2Pb_{0.2}Ba_{1.8}K_{0.2}Co_{1.9}V_{0.1}O_9$ | 201 | 8 | 1 |
| $Bi_2Pb_{0.2}Ba_{1.8}Li_{0.2}Co_{1.9}V_{0.1}O_9$ | 200 | 7.8 | 1.3 |
| $Bi_2Pb_{0.2}Ba_{1.8}Ti_{0.2}Co_{1.9}V_{0.1}O_9$ | 206 | 7.2 | 1 |
| $Bi_2Pb_{0.2}Ba_{1.8}V_{0.2}Co_{1.9}V_{0.1}O_9$ | 205 | 9 | 0.9 |
| $Bi_2Pb_{0.2}Ba_{1.8}Cr_{0.2}Co_{1.9}V_{0.1}O_9$ | 198 | 7.8 | 1.1 |
| $Bi_2Pb_{0.2}Ba_{1.8}Mn_{0.2}Co_{1.9}V_{0.1}O_9$ | 201 | 7.5 | 1 |
| $Bi_2Pb_{0.2}Ba_{1.8}Fe_{0.2}Co_{1.9}V_{0.1}O_9$ | 196 | 8.6 | 1.2 |
| $Bi_2Pb_{0.2}Ba_{1.8}Ni_{0.2}Co_{1.9}V_{0.1}O_9$ | 202 | 8.2 | 1.1 |
| $Bi_2Pb_{0.2}Ba_{1.8}Cu_{0.2}Co_{1.9}V_{0.1}O_9$ | 203 | 7.9 | 0.9 |
| $Bi_2Pb_{0.2}Ba_{1.8}Zn_{0.2}Co_{1.9}V_{0.1}O_9$ | 205 | 6.9 | 0.8 |
| $Bi_2Pb_{0.2}Ba_{1.8}Pb_{0.2}Co_{1.9}V_{0.1}O_9$ | 198 | 8.1 | 1 |
| $Bi_2Pb_{0.2}Ba_{1.8}Ca_{0.2}Co_{1.9}V_{0.1}O_9$ | 195 | 6.9 | 1.3 |
| $Bi_2Pb_{0.2}Ba_{1.8}Sr_{0.2}Co_{1.9}V_{0.1}O_9$ | 200 | 7.4 | 1.2 |
| $Bi_2Pb_{0.2}Ba_{1.8}Al_{0.2}Co_{1.9}V_{0.1}O_9$ | 205 | 7.8 | 1.3 |
| $Bi_2Pb_{0.2}Ba_{1.8}Y_{0.2}Co_{1.9}V_{0.1}O_9$ | 198 | 7.7 | 1 |
| $Bi_2Pb_{0.2}Ba_{1.8}La_{0.2}Co_{1.9}V_{0.1}O_9$ | 199 | 8 | 1.3 |
| $Bi_2Pb_{0.2}Ba_{1.8}Ce_{0.2}Co_{1.9}V_{0.1}O_9$ | 210 | 8.2 | 0.9 |
| $Bi_2Pb_{0.2}Ba_{1.8}Pr_{0.2}Co_{1.9}V_{0.1}O_9$ | 202 | 7.9 | 1.1 |
| $Bi_2Pb_{0.2}Ba_{1.8}Nd_{0.2}Co_{1.9}V_{0.1}O_9$ | 204 | 9.1 | 1.4 |
| $Bi_2Pb_{0.2}Ba_{1.8}Sm_{0.2}Co_{1.9}V_{0.1}O_9$ | 197 | 8.4 | 1.2 |
| $Bi_2Pb_{0.2}Ba_{1.8}Eu_{0.2}Co_{1.9}V_{0.1}O_9$ | 190 | 8.6 | 0.9 |
| $Bi_2Pb_{0.2}Ba_{1.8}Gd_{0.2}Co_{1.9}V_{0.1}O_9$ | 198 | 8.2 | 1.1 |

TABLE 32

| Formula | | | |
|---|---|---|---|
| $Bi_2Pb_{0.2}Ba_{1.8}Dy_{0.2}Co_{1.9}V_{0.1}O_9$ | 199 | 7.9 | 1.2 |
| $Bi_2Pb_{0.2}Ba_{1.8}Ho_{0.2}Co_{1.9}V_{0.1}O_9$ | 201 | 8.6 | 0.9 |
| $Bi_2Pb_{0.2}Ba_{1.8}Er_{0.2}Co_{1.9}V_{0.1}O_9$ | 207 | 9.1 | 1.1 |

TABLE 32-continued

| Formula | | | |
|---|---|---|---|
| $Bi_2Pb_{0.2}Ba_{1.8}Yb_{0.2}Co_{1.9}V_{0.1}O_9$ | 190 | 6.9 | 1.2 |
| $Bi_2Sr_2Co_{1.9}Mn_{0.1}O_9$ | 199 | 7.8 | 0.8 |
| $Bi_2Sr_{1.8}Na_{0.2}Co_{1.9}Mn_{0.1}O_9$ | 201 | 7.7 | 1.3 |
| $Bi_2Sr_{1.8}K_{0.2}Co_{1.9}Mn_{0.1}O_9$ | 210 | 8 | 1.2 |
| $Bi_2Sr_{1.8}Li_{0.2}Co_{1.9}Mn_{0.1}O_9$ | 206 | 8.2 | 1.1 |
| $Bi_2Sr_{1.8}Ti_{0.2}Co_{1.9}Mn_{0.1}O_9$ | 205 | 7.9 | 0.8 |
| $Bi_2Sr_{1.8}V_{0.2}Co_{1.9}Mn_{0.1}O_9$ | 198 | 9.1 | 0.7 |
| $Bi_2Sr_{1.8}Cr_{0.2}Co_{1.9}Mn_{0.1}O_9$ | 195 | 8.4 | 1.3 |
| $Bi_2Sr_{1.8}Mn_{0.2}Co_{1.9}Mn_{0.1}O_9$ | 200 | 8.6 | 0.8 |
| $Bi_2Sr_{1.8}Fe_{0.2}Co_{1.9}Mn_{0.1}O_9$ | 203 | 7.8 | 1.1 |
| $Bi_2Sr_{1.8}Ni_{0.2}Co_{1.9}Mn_{0.1}O_9$ | 201 | 9 | 1.4 |
| $Bi_2Sr_{1.8}Cu_{0.2}Co_{1.9}Mn_{0.1}O_9$ | 208 | 8.2 | 1.2 |
| $Bi_2Sr_{1.8}Zn_{0.2}Co_{1.9}Mn_{0.1}O_9$ | 198 | 8.3 | 0.9 |
| $Bi_2Sr_{1.8}Pb_{0.2}Co_{1.9}Mn_{0.1}O_9$ | 199 | 8.6 | 1.1 |
| $Bi_2Sr_{1.8}Ca_{0.2}Co_{1.9}Mn_{0.1}O_9$ | 200 | 8.7 | 1.2 |
| $Bi_2Sr_{1.8}Ba_{0.2}Co_{1.9}Mn_{0.1}O_9$ | 206 | 8.3 | 0.9 |
| $Bi_2Sr_{1.8}Al_{0.2}Co_{1.9}Mn_{0.1}O_9$ | 205 | 9 | 1.1 |
| $Bi_2Sr_{1.8}Y_{0.2}Co_{1.9}Mn_{0.1}O_9$ | 198 | 7.9 | 1.2 |
| $Bi_2Sr_{1.8}La_{0.2}Co_{1.9}Mn_{0.1}O_9$ | 206 | 8.1 | 1.4 |
| $Bi_2Sr_{1.8}Ce_{0.2}Co_{1.9}Mn_{0.1}O_9$ | 198 | 8 | 0.8 |
| $Bi_2Sr_{1.8}Pr_{0.2}Co_{1.9}Mn_{0.1}O_9$ | 195 | 7.8 | 1.3 |
| $Bi_2Sr_{1.8}Nd_{0.2}Co_{1.9}Mn_{0.1}O_9$ | 200 | 7.2 | 1.2 |
| $Bi_2Sr_{1.8}Sm_{0.2}Co_{1.9}Mn_{0.1}O_9$ | 203 | 9 | 1.1 |
| $Bi_2Sr_{1.8}Eu_{0.2}Co_{1.9}Mn_{0.1}O_9$ | 201 | 7.8 | 0.8 |
| $Bi_2Sr_{1.8}Gd_{0.2}Co_{1.9}Mn_{0.1}O_9$ | 208 | 7.5 | 1.3 |
| $Bi_2Sr_{1.8}Dy_{0.2}Co_{1.9}Mn_{0.1}O_9$ | 198 | 8.6 | 1.4 |
| $Bi_2Sr_{1.8}Ho_{0.2}Co_{1.9}Mn_{0.1}O_9$ | 199 | 8.2 | 1.1 |
| $Bi_2Sr_{1.8}Er_{0.2}Co_{1.9}Mn_{0.1}O_9$ | 200 | 7.9 | 1 |
| $Bi_2Sr_{1.8}Yb_{0.2}Co_{1.9}Mn_{0.1}O_9$ | 199 | 6.9 | 1.3 |
| $Bi_2Pb_{0.2}Sr_2Co_{1.9}Mn_{0.1}O_9$ | 202 | 7.5 | 1.1 |
| $Bi_2Pb_{0.2}Sr_{1.8}Na_{0.2}Co_{1.9}Mn_{0.1}O_9$ | 204 | 8.6 | 1.4 |
| $Bi_2Pb_{0.2}Sr_{1.8}K_{0.2}Co_{1.9}Mn_{0.1}O_9$ | 197 | 8.2 | 1.2 |

TABLE 33

| Formula | | | |
|---|---|---|---|
| $Bi_2Pb_{0.2}Sr_{1.8}Li_{0.2}Co_{1.9}Mn_{0.1}O_9$ | 190 | 7.9 | 0.9 |
| $Bi_2Pb_{0.2}Sr_{1.8}Ti_{0.2}Co_{1.9}Mn_{0.1}O_9$ | 198 | 6.9 | 1.1 |
| $Bi_2Pb_{0.2}Sr_{1.8}V_{0.2}Co_{1.9}Mn_{0.1}O_9$ | 199 | 8.1 | 1.2 |
| $Bi_2Pb_{0.2}Sr_{1.8}Cr_{0.2}Co_{1.9}Mn_{0.1}O_9$ | 201 | 9 | 0.9 |
| $Bi_2Pb_{0.2}Sr_{1.8}Mn_{0.2}Co_{1.9}Mn_{0.1}O_9$ | 207 | 8.2 | 1.1 |
| $Bi_2Pb_{0.2}Sr_{1.8}Fe_{0.2}Co_{1.9}Mn_{0.1}O_9$ | 190 | 7.9 | 1.2 |
| $Bi_2Pb_{0.2}Sr_{1.8}Ni_{0.2}Co_{1.9}Mn_{0.1}O_9$ | 198 | 8.6 | 1.4 |
| $Bi_2Pb_{0.2}Sr_{1.8}Cu_{0.2}Co_{1.9}Mn_{0.1}O_9$ | 200 | 9.1 | 0.8 |
| $Bi_2Pb_{0.2}Sr_{1.8}Zn_{0.2}Co_{1.9}Mn_{0.1}O_9$ | 203 | 6.9 | 1.3 |
| $Bi_2Pb_{0.2}Sr_{1.8}Pb_{0.2}Co_{1.9}Mn_{0.1}O_9$ | 201 | 7.4 | 1.2 |
| $Bi_2Pb_{0.2}Sr_{1.8}Ca_{0.2}Co_{1.9}Mn_{0.1}O_9$ | 208 | 7.8 | 1.1 |
| $Bi_2Pb_{0.2}Sr_{1.8}Ba_{0.2}Co_{1.9}Mn_{0.1}O_9$ | 198 | 7.7 | 1.4 |
| $Bi_2Pb_{0.2}Sr_{1.8}Al_{0.2}Co_{1.9}Mn_{0.1}O_9$ | 199 | 8 | 1.2 |
| $Bi_2Pb_{0.2}Sr_{1.8}Y_{0.2}Co_{1.9}Mn_{0.1}O_9$ | 200 | 8.2 | 0.9 |
| $Bi_2Pb_{0.2}Sr_{1.8}La_{0.2}Co_{1.9}Mn_{0.1}O_9$ | 199 | 8 | 1.1 |
| $Bi_2Pb_{0.2}Sr_{1.8}Ce_{0.2}Co_{1.9}Mn_{0.1}O_9$ | 210 | 7.7 | 1.2 |
| $Bi_2Pb_{0.2}Sr_{1.8}Pr_{0.2}Co_{1.9}Mn_{0.1}O_9$ | 202 | 8.3 | 0.9 |
| $Bi_2Pb_{0.2}Sr_{1.8}Nd_{0.2}Co_{1.9}Mn_{0.1}O_9$ | 204 | 8.6 | 1.1 |
| $Bi_2Pb_{0.2}Sr_{1.8}Sm_{0.2}Co_{1.9}Mn_{0.1}O_9$ | 197 | 8.7 | 1.2 |
| $Bi_2Pb_{0.2}Sr_{1.8}Eu_{0.2}Co_{1.9}Mn_{0.1}O_9$ | 190 | 8.3 | 1.4 |
| $Bi_2Pb_{0.2}Sr_{1.8}Gd_{0.2}Co_{1.9}Mn_{0.1}O_9$ | 198 | 9 | 0.8 |
| $Bi_2Pb_{0.2}Sr_{1.8}Dy_{0.2}Co_{1.9}Mn_{0.1}O_9$ | 199 | 7.9 | 1.3 |
| $Bi_2Pb_{0.2}Sr_{1.8}Ho_{0.2}Co_{1.9}Mn_{0.1}O_9$ | 201 | 8.1 | 1.2 |
| $Bi_2Pb_{0.2}Sr_{1.8}Er_{0.2}Co_{1.9}Mn_{0.1}O_9$ | 207 | 8 | 1.1 |
| $Bi_2Pb_{0.2}Sr_{1.8}Yb_{0.2}Co_{1.9}Mn_{0.1}O_9$ | 190 | 7.8 | 0.8 |
| $Bi_2Ca_2Co_{1.9}Mn_{0.1}O_9$ | 199 | 9 | 1.4 |
| $Bi_2Ca_{1.8}Na_{0.2}Co_{1.9}Mn_{0.1}O_9$ | 201 | 7.8 | 1.1 |
| $Bi_2Ca_{1.8}K_{0.2}Co_{1.9}Mn_{0.1}O_9$ | 210 | 7.5 | 1 |
| $Bi_2Ca_{1.8}Li_{0.2}Co_{1.9}Mn_{0.1}O_9$ | 206 | 8.6 | 1.3 |
| $Bi_2Ca_{1.8}Ti_{0.2}Co_{1.9}Mn_{0.1}O_9$ | 205 | 8.2 | 0.9 |
| $Bi_2Ca_{1.8}V_{0.2}Co_{1.9}Mn_{0.1}O_9$ | 198 | 7.9 | 1.1 |
| $Bi_2Ca_{1.8}Cr_{0.2}Co_{1.9}Mn_{0.1}O_9$ | 195 | 6.9 | 1.4 |
| $Bi_2Ca_{1.8}Mn_{0.2}Co_{1.9}Mn_{0.1}O_9$ | 200 | 8.1 | 1.2 |
| $Bi_2Ca_{1.8}Fe_{0.2}Co_{1.9}Mn_{0.1}O_9$ | 203 | 9 | 0.9 |
| $Bi_2Ca_{1.8}Ni_{0.2}Co_{1.9}Mn_{0.1}O_9$ | 201 | 8.2 | 1.1 |
| $Bi_2Ca_{1.8}Cu_{0.2}Co_{1.9}Mn_{0.1}O_9$ | 208 | 7.9 | 1.2 |

TABLE 34

| | | | |
|---|---|---|---|
| $Bi_2Ca_{1.8}Zn_{0.2}Co_{1.9}Mn_{0.1}O_9$ | 201 | 8.6 | 0.9 |
| $Bi_2Ca_{1.8}Pb_{0.2}Co_{1.9}Mn_{0.1}O_9$ | 190 | 9.1 | 1.1 |
| $Bi_2Ca_{1.8}Sr_{0.2}Co_{1.9}Mn_{0.1}O_9$ | 198 | 6.9 | 1.2 |
| $Bi_2Ca_{1.8}Ba_{0.2}Co_{1.9}Mn_{0.1}O_9$ | 199 | 7.4 | 1 |
| $Bi_2Ca_{1.8}Al_{0.2}Co_{1.9}Mn_{0.1}O_9$ | 201 | 7.8 | 1.3 |
| $Bi_2Ca_{1.8}Y_{0.2}Co_{1.9}Mn_{0.1}O_9$ | 200 | 7.7 | 1 |
| $Bi_2Ca_{1.8}La_{0.2}Co_{1.9}Mn_{0.1}O_9$ | 206 | 8 | 0.9 |
| $Bi_2Ca_{1.8}Ce_{0.2}Co_{1.9}Mn_{0.1}O_9$ | 205 | 8.2 | 1.1 |
| $Bi_2Ca_{1.8}Pr_{0.2}Co_{1.9}Mn_{0.1}O_9$ | 198 | 7.9 | 1 |
| $Bi_2Ca_{1.8}Nd_{0.2}Co_{1.9}Mn_{0.1}O_9$ | 201 | 9.1 | 1.2 |
| $Bi_2Ca_{1.8}Sm_{0.2}Co_{1.9}Mn_{0.1}O_9$ | 196 | 8.4 | 1.1 |
| $Bi_2Ca_{1.8}Eu_{0.2}Co_{1.9}Mn_{0.1}O_9$ | 202 | 8.6 | 0.9 |
| $Bi_2Ca_{1.8}Gd_{0.2}Co_{1.9}Mn_{0.1}O_9$ | 203 | 8.2 | 0.8 |
| $Bi_2Ca_{1.8}Dy_{0.2}Co_{1.9}Mn_{0.1}O_9$ | 205 | 7.9 | 1 |
| $Bi_2Ca_{1.8}Ho_{0.2}Co_{1.9}Mn_{0.1}O_9$ | 198 | 8.6 | 1.3 |
| $Bi_2Ca_{1.8}Er_{0.2}Co_{1.9}Mn_{0.1}O_9$ | 195 | 9.1 | 1.2 |
| $Bi_2Ca_{1.8}Yb_{0.2}Co_{1.9}Mn_{0.1}O_9$ | 200 | 6.9 | 1.3 |
| $Bi_2Pb_{0.2}Ca_2Co_{1.9}Mn_{0.1}O_9$ | 198 | 7.8 | 1.1 |
| $Bi_2Pb_{0.2}Ca_{1.8}Na_{0.2}Co_{1.9}Mn_{0.1}O_9$ | 199 | 7.7 | 1.4 |
| $Bi_2Pb_{0.2}Ca_{1.8}K_{0.2}Co_{1.9}Mn_{0.1}O_9$ | 210 | 8 | 1.2 |
| $Bi_2Pb_{0.2}Ca_{1.8}Li_{0.2}Co_{1.9}Mn_{0.1}O_9$ | 202 | 8.2 | 0.9 |
| $Bi_2Pb_{0.2}Ca_{1.8}Ti_{0.2}Co_{1.9}Mn_{0.1}O_9$ | 204 | 7.9 | 1.1 |
| $Bi_2Pb_{0.2}Ca_{1.8}V_{0.2}Co_{1.9}Mn_{0.1}O_9$ | 197 | 9.1 | 1.2 |
| $Bi_2Pb_{0.2}Ca_{1.8}Cr_{0.2}Co_{1.9}Mn_{0.1}O_9$ | 190 | 6.9 | 0.9 |
| $Bi_2Pb_{0.2}Ca_{1.8}Mn_{0.2}Co_{1.9}Mn_{0.1}O_9$ | 198 | 9.1 | 1.1 |
| $Bi_2Pb_{0.2}Ca_{1.8}Fe_{0.2}Co_{1.9}Mn_{0.1}O_9$ | 199 | 8.4 | 1.2 |
| $Bi_2Pb_{0.2}Ca_{1.8}Ni_{0.2}Co_{1.9}Mn_{0.1}O_9$ | 201 | 8.6 | 1 |
| $Bi_2Pb_{0.2}Ca_{1.8}Cu_{0.2}Co_{1.9}Mn_{0.1}O_9$ | 207 | 8.2 | 1.3 |
| $Bi_2Pb_{0.2}Ca_{1.8}Zn_{0.2}Co_{1.9}Mn_{0.1}O_9$ | 190 | 7.9 | 1 |
| $Bi_2Pb_{0.2}Ca_{1.8}Pb_{0.2}Co_{1.9}Mn_{0.1}O_9$ | 198 | 8.6 | 0.9 |
| $Bi_2Pb_{0.2}Ca_{1.8}Sr_{0.2}Co_{1.9}Mn_{0.1}O_9$ | 199 | 9.1 | 1.1 |
| $Bi_2Pb_{0.2}Ca_{1.8}Ba_{0.2}Co_{1.9}Mn_{0.1}O_9$ | 201 | 6.9 | 1 |
| $Bi_2Pb_{0.2}Ca_{1.8}Al_{0.2}Co_{1.9}Mn_{0.1}O_9$ | 210 | 7.4 | 1.2 |
| $Bi_2Pb_{0.2}Ca_{1.8}Y_{0.2}Co_{1.9}Mn_{0.1}O_9$ | 206 | 7.8 | 1.1 |
| $Bi_2Pb_{0.2}Ca_{1.8}La_{0.2}Co_{1.9}Mn_{0.1}O_9$ | 205 | 7.7 | 0.9 |
| $Bi_2Pb_{0.2}Ca_{1.8}Ce_{0.2}Co_{1.9}Mn_{0.1}O_9$ | 198 | 8.0 | 0.8 |

TABLE 35

| | | | |
|---|---|---|---|
| $Bi_2Pb_{0.2}Ca_{1.8}Pr_{0.2}Co_{1.9}Mn_{0.1}O_9$ | 195 | 8.2 | 1 |
| $Bi_2Pb_{0.2}Ca_{1.8}Nd_{0.2}Co_{1.9}Mn_{0.1}O_9$ | 200 | 7.9 | 1.3 |
| $Bi_2Pb_{0.2}Ca_{1.8}Sm_{0.2}Co_{1.9}Mn_{0.1}O_9$ | 203 | 7.9 | 1.2 |
| $Bi_2Pb_{0.2}Ca_{1.8}Eu_{0.2}Co_{1.9}Mn_{0.1}O_9$ | 201 | 8.1 | 0.7 |
| $Bi_2Pb_{0.2}Ca_{1.8}Gd_{0.2}Co_{1.9}Mn_{0.1}O_9$ | 208 | 8 | 1.3 |
| $Bi_2Pb_{0.2}Ca_{1.8}Dy_{0.2}Co_{1.9}Mn_{1.0}O_9$ | 198 | 7.8 | 1.4 |
| $Bi_2Pb_{0.2}Ca_{1.8}Ho_{0.2}Co_{1.9}Mn_{0.1}O_9$ | 199 | 7.2 | 1.1 |
| $Bi_2Pb_{0.2}Ca_{1.8}Er_{0.2}Co_{1.9}Mn_{0.1}O_9$ | 200 | 9 | 1 |
| $Bi_2Pb_{0.2}Ca_{1.8}Yb_{0.2}Co_{1.9}Mn_{0.1}O_9$ | 206 | 7.8 | 1.3 |
| $Bi_2Ba_2Co_{1.9}Mn_{0.1}O_9$ | 198 | 8.6 | 1.1 |
| $Bi_2Ba_{1.8}Na_{0.2}Co_{1.9}Mn_{0.1}O_9$ | 206 | 8.2 | 1.4 |
| $Bi_2Ba_{1.8}K_{0.2}Co_{1.9}Mn_{0.1}O_9$ | 198 | 7.9 | 1.2 |
| $Bi_2Ba_{1.8}Li_{0.2}Co_{1.9}Mn_{0.1}O_9$ | 207 | 6.9 | 0.9 |
| $Bi_2Ba_{1.8}Ti_{0.2}Co_{1.9}Mn_{0.1}O_9$ | 190 | 8.1 | 1.1 |
| $Bi_2Ba_{1.8}V_{0.2}Co_{1.9}Mn_{0.1}O_9$ | 198 | 6.9 | 1.2 |
| $Bi_2Ba_{1.8}Cr_{0.2}Co_{1.9}Mn_{0.1}O_9$ | 199 | 7.4 | 1.2 |
| $Bi_2Ba_{1.8}Mn_{0.2}Co_{1.9}Mn_{0.1}O_9$ | 201 | 7.8 | 1.1 |
| $Bi_2Ba_{1.8}Fe_{0.2}Co_{1.9}Mn_{0.1}O_9$ | 210 | 7.7 | 1.2 |
| $Bi_2Ba_{1.8}Ni_{0.2}Co_{1.9}Mn_{0.1}O_9$ | 206 | 8 | 1.4 |
| $Bi_2Ba_{1.8}Cu_{0.2}Co_{1.9}Mn_{0.1}O_9$ | 205 | 8.2 | 0.8 |
| $Bi_2Ba_{1.8}Zn_{0.2}Co_{1.9}Mn_{0.1}O_9$ | 198 | 7.9 | 1.3 |
| $Bi_2Ba_{1.8}Pb_{0.2}Co_{1.9}Mn_{0.1}O_9$ | 195 | 9.1 | 1.2 |
| $Bi_2Ba_{1.8}Ca_{0.2}Co_{1.9}Mn_{0.1}O_9$ | 200 | 8.4 | 1.1 |
| $Bi_2Ba_{1.8}Sr_{0.2}Co_{1.9}Mn_{0.1}O_9$ | 203 | 8.6 | 0.8 |
| $Bi_2Ba_{1.8}Al_{0.2}Co_{1.9}Mn_{0.1}O_9$ | 201 | 8.2 | 1.3 |
| $Bi_2Ba_{1.8}Y_{0.2}Co_{1.9}Mn_{0.1}O_9$ | 208 | 7.9 | 1.4 |
| $Bi_2Ba_{1.8}La_{0.2}Co_{1.9}Mn_{0.1}O_9$ | 198 | 8.6 | 1.1 |
| $Bi_2Ba_{1.8}Ce_{0.2}Co_{1.9}Mn_{0.1}O_9$ | 199 | 9.1 | 1 |
| $Bi_2Ba_{1.8}Pr_{0.2}Co_{1.9}Mn_{0.1}O_9$ | 200 | 6.9 | 1.3 |
| $Bi_2Ba_{1.8}Nd_{0.2}Co_{1.9}Mn_{0.1}O_9$ | 206 | 7.4 | 0.9 |
| $Bi_2Ba_{1.8}Sm_{0.2}Co_{1.9}Mn_{0.1}O_9$ | 205 | 7.8 | 1.1 |
| $Bi_2Ba_{1.8}Eu_{0.2}Co_{1.9}Mn_{0.1}O_9$ | 198 | 7.7 | 1.4 |
| $Bi_2Ba_{1.8}Gd_{0.2}Co_{1.9}Mn_{0.1}O_9$ | 206 | 8 | 1.2 |
| $Bi_2Ba_{1.8}Dy_{0.2}Co_{1.9}Mn_{0.1}O_9$ | 198 | 8.2 | 0.9 |
| $Bi_2Ba_{1.8}Ho_{0.2}Co_{1.9}Mn_{0.1}O_9$ | 195 | 7.9 | 1.1 |
| $Bi_2Ba_{1.8}Er_{0.2}Co_{1.9}Mn_{0.1}O_9$ | 200 | 9.1 | 1.2 |

TABLE 36

| | | | |
|---|---|---|---|
| $Bi_2Ba_{1.8}Yb_{0.2}Co_{1.9}Mn_{0.1}O_9$ | 203 | 8.4 | 0.9 |
| $Bi_2Pb_{0.2}Ba_2Co_{1.9}Mn_{0.1}O_9$ | 208 | 7.8 | 1.2 |
| $Bi_2Pb_{0.2}Ba_{1.8}Na_{0.2}Co_{1.9}Mn_{0.1}O_9$ | 198 | 9 | 1.4 |
| $Bi_2Pb_{0.2}Ba_{1.8}K_{0.2}Co_{1.9}Mn_{0.1}O_9$ | 199 | 8.2 | 0.8 |
| $Bi_2Pb_{0.2}Ba_{1.8}Li_{0.2}Co_{1.9}Mn_{0.1}O_9$ | 200 | 8.3 | 1.3 |
| $Bi_2Pb_{0.2}Ba_{1.8}Ti_{0.2}Co_{1.9}Mn_{0.1}O_9$ | 199 | 8.6 | 1.2 |
| $Bi_2Pb_{0.2}Ba_{1.8}V_{0.2}Co_{1.9}Mn_{0.1}O_9$ | 210 | 8.7 | 1.1 |
| $Bi_2Pb_{0.2}Ba_{1.8}Cr_{0.2}Co_{1.9}Mn_{0.1}O_9$ | 202 | 8.3 | 0.8 |
| $Bi_2Pb_{0.2}Ba_{1.8}Mn_{0.2}Co_{1.9}Mn_{0.1}O_9$ | 204 | 9 | 0.7 |
| $Bi_2Pb_{0.2}Ba_{1.8}Fe_{0.2}Co_{1.9}Mn_{0.1}O_9$ | 197 | 7.9 | 1.3 |
| $Bi_2Pb_{0.2}Ba_{1.8}Ni_{0.2}Co_{1.9}Mn_{0.1}O_9$ | 190 | 8.1 | 0.8 |
| $Bi_2Pb_{0.2}Ba_{1.8}Cu_{0.2}Co_{1.9}Mn_{0.1}O_9$ | 198 | 8 | 1.3 |
| $Bi_2Pb_{0.2}Ba_{1.8}Zn_{0.2}Co_{1.9}Mn_{0.1}O_9$ | 199 | 7.8 | 1.2 |
| $Bi_2Pb_{0.2}Ba_{1.8}Pb_{0.2}Co_{1.9}Mn_{0.1}O_9$ | 201 | 7.2 | 1.1 |
| $Bi_2Pb_{0.2}Ba_{1.8}Ca_{0.2}Co_{1.9}Mn_{0.1}O_9$ | 207 | 9 | 0.8 |
| $Bi_2Pb_{0.2}Ba_{1.8}Sr_{0.2}Co_{1.9}Mn_{0.1}O_9$ | 190 | 7.8 | 1.3 |
| $Bi_2Pb_{0.2}Ba_{1.8}Al_{0.2}Co_{1.9}Mn_{0.1}O_9$ | 198 | 7.5 | 1.4 |
| $Bi_2Pb_{0.2}Ba_{1.8}Y_{0.2}Co_{1.9}Mn_{0.1}O_9$ | 198 | 8.6 | 1.1 |
| $Bi_2Pb_{0.2}Ba_{1.8}La_{0.2}Co_{1.9}Mn_{0.1}O_9$ | 201 | 8.2 | 1 |
| $Bi_2Pb_{0.2}Ba_{1.8}Ce_{0.2}Co_{1.9}Mn_{0.1}O_9$ | 196 | 7.9 | 1.3 |
| $Bi_2Pb_{0.2}Ba_{1.8}Pr_{0.2}Co_{1.9}Mn_{0.1}O_9$ | 202 | 6.9 | 0.9 |
| $Bi_2Pb_{0.2}Ba_{1.8}Nd_{0.2}Co_{1.9}Mn_{0.1}O_9$ | 203 | 9 | 1.1 |
| $Bi_2Pb_{0.2}Ba_{1.8}Sm_{0.2}Co_{1.9}Mn_{0.1}O_9$ | 205 | 7.8 | 1.4 |
| $Bi_2Pb_{0.2}Ba_{1.8}Eu_{0.2}Co_{1.9}Mn_{0.1}O_9$ | 198 | 7.5 | 1.2 |
| $Bi_2Pb_{0.2}Ba_{1.8}Gd_{0.2}Co_{1.9}Mn_{0.1}O_9$ | 195 | 8.6 | 0.9 |
| $Bi_2Pb_{0.2}Ba_{1.8}Dy_{0.2}Co_{1.9}Mn_{0.1}O_9$ | 200 | 8.2 | 1.1 |
| $Bi_2Pb_{0.2}Ba_{1.8}Ho_{0.2}Co_{1.9}Mn_{0.1}O_9$ | 205 | 7.9 | 1.2 |
| $Bi_2Pb_{0.2}Ba_{1.8}Er_{0.2}Co_{1.9}Mn_{0.1}O_9$ | 198 | 6.9 | 0.9 |
| $Bi_2Pb_{0.2}Ba_{1.8}Yb_{0.2}Co_{1.9}Mn_{0.1}O_9$ | 199 | 8.1 | 1.1 |
| $Bi_2Sr_2Co_{1.9}Fe_{0.1}O_9$ | 202 | 7.4 | 1.4 |
| $Bi_2Sr_{1.8}Na_{0.2}Co_{1.9}Fe_{0.1}O_9$ | 204 | 7.8 | 0.8 |
| $Bi_2Sr_{1.8}K_{0.2}Co_{1.9}Fe_{0.1}O_9$ | 197 | 7.7 | 1.3 |
| $Bi_2Sr_{1.8}Li_{0.2}Co_{1.9}Fe_{0.1}O_9$ | 190 | 8 | 1.2 |
| $Bi_2Sr_{1.8}Ti_{0.2}Co_{1.9}Fe_{0.1}O_9$ | 198 | 8.2 | 1.1 |
| $Bi_2Sr_{1.8}V_{0.2}Co_{1.9}Fe_{0.1}O_9$ | 199 | 7.9 | 1.4 |

TABLE 37

| | | | |
|---|---|---|---|
| $Bi_2Sr_{1.8}Cr_{0.2}Co_{1.9}Fe_{0.1}O_9$ | 201 | 9.1 | 1.2 |
| $Bi_2Sr_{1.8}Mn_{0.2}Co_{1.9}Fe_{0.1}O_9$ | 207 | 8.4 | 0.9 |
| $Bi_2Sr_{1.8}Fe_{0.2}Co_{1.9}Fe_{0.1}O_9$ | 190 | 8.6 | 1.1 |
| $Bi_2Sr_{1.8}Ni_{0.2}Co_{1.9}Fe_{0.1}O_9$ | 198 | 8.2 | 1.2 |
| $Bi_2Sr_{1.8}Cu_{0.2}Co_{1.9}Fe_{0.1}O_9$ | 199 | 7.9 | 0.9 |
| $Bi_2Sr_{1.8}Zn_{0.2}Co_{1.9}Fe_{0.1}O_9$ | 201 | 8.6 | 1.1 |
| $Bi_2Sr_{1.8}Pb_{0.2}Co_{1.9}Fe_{0.1}O_9$ | 210 | 9.1 | 1.2 |
| $Bi_2Sr_{1.8}Ca_{0.2}Co_{1.9}Fe_{0.1}O_9$ | 206 | 6.9 | 1.4 |
| $Bi_2Sr_{1.8}Ba_{0.2}Co_{1.9}Fe_{0.1}O_9$ | 205 | 7.4 | 0.8 |
| $Bi_2Sr_{1.8}Al_{0.2}Co_{1.9}Fe_{0.1}O_9$ | 198 | 7.8 | 1.3 |
| $Bi_2Sr_{1.8}Y_{0.2}Co_{1.9}Fe_{0.1}O_9$ | 195 | 7.7 | 1.2 |
| $Bi_2Sr_{1.8}La_{0.2}Co_{1.9}Fe_{0.1}O_9$ | 200 | 8 | 1.1 |
| $Bi_2Sr_{1.8}Ce_{0.2}Co_{1.9}Fe_{0.1}O_9$ | 203 | 8.2 | 0.8 |
| $Bi_2Sr_{1.8}Pr_{0.2}Co_{1.9}Fe_{0.1}O_9$ | 201 | 7.9 | 1.3 |
| $Bi_2Sr_{1.8}Nd_{0.2}Co_{1.9}Fe_{0.1}O_9$ | 208 | 9.1 | 1.4 |
| $Bi_2Sr_{1.8}Sm_{0.2}Co_{1.9}Fe_{0.1}O_9$ | 198 | 8.4 | 1.1 |
| $Bi_2Sr_{1.8}Eu_{0.2}Co_{1.9}Fe_{0.1}O_9$ | 199 | 8.6 | 1 |
| $Bi_2Sr_{1.8}Gd_{0.2}Co_{1.9}Fe_{0.1}O_9$ | 200 | 7.8 | 1.3 |
| $Bi_2Sr_{1.8}Dy_{0.2}Co_{1.9}Fe_{0.1}O_9$ | 206 | 9 | 0.9 |
| $Bi_2Sr_{1.8}Ho_{0.2}Co_{1.9}Fe_{0.1}O_9$ | 205 | 8.2 | 1.1 |
| $Bi_2Sr_{1.8}Er_{0.2}Co_{1.9}Fe_{0.1}O_9$ | 198 | 8.3 | 1.4 |
| $Bi_2Sr_{1.8}Yb_{0.2}Co_{1.9}Fe_{0.1}O_9$ | 206 | 8.6 | 1.2 |
| $Bi_2Pb_{0.2}Sr_2Co_{1.9}Fe_{0.1}O_9$ | 207 | 8.3 | 1.1 |
| $Bi_2Pb_{0.2}Sr_{1.8}Na_{0.2}Co_{1.9}Fe_{0.1}O_9$ | 190 | 9 | 1.2 |
| $Bi_2Pb_{0.2}Sr_{1.8}K_{0.2}Co_{1.9}Fe_{0.1}O_9$ | 198 | 7.9 | 0.9 |
| $Bi_2Pb_{0.2}Sr_{1.8}Li_{0.2}Co_{1.9}Fe_{0.1}O_9$ | 199 | 8.1 | 1.1 |
| $Bi_2Pb_{0.2}Sr_{1.8}Ti_{0.2}Co_{1.9}Fe_{0.1}O_9$ | 201 | 8 | 1.2 |
| $Bi_2Pb_{0.2}Sr_{1.8}V_{0.2}Co_{1.9}Fe_{0.1}O_9$ | 210 | 7.8 | 1 |
| $Bi_2Pb_{0.2}Sr_{1.8}Cr_{0.2}Co_{1.9}Fe_{0.1}O_9$ | 206 | 7.2 | 1.3 |
| $Bi_2Pb_{0.2}Sr_{1.8}Mn_{0.2}Co_{1.9}Fe_{0.1}O_9$ | 205 | 9 | 1 |
| $Bi_2Pb_{0.2}Sr_{1.8}Fe_{0.2}Co_{1.9}Fe_{0.1}O_9$ | 198 | 8.2 | 0.9 |
| $Bi_2Pb_{0.2}Sr_{1.8}Ni_{0.2}Co_{1.9}Fe_{0.1}O_9$ | 195 | 7.9 | 1.1 |
| $Bi_2Pb_{0.2}Sr_{1.8}Cu_{0.2}Co_{1.9}Fe_{0.1}O_9$ | 200 | 6.9 | 1 |
| $Bi_2Pb_{0.2}Sr_{1.8}Zn_{0.2}Co_{1.9}Fe_{0.1}O_9$ | 203 | 8.1 | 1.2 |
| $Bi_2Pb_{0.2}Sr_{1.8}Pb_{0.2}Co_{1.9}Fe_{0.1}O_9$ | 201 | 6.9 | 1.1 |
| $Bi_2Pb_{0.2}Sr_{1.8}Ca_{0.2}Co_{1.9}Fe_{0.1}O_9$ | 208 | 7.4 | 0.9 |

TABLE 38

| | | | |
|---|---|---|---|
| $Bi_2Pb_{0.2}Sr_{1.8}Ba_{0.2}Co_{1.9}Fe_{0.1}O_9$ | 198 | 7.8 | 0.8 |
| $Bi_2Pb_{0.2}Sr_{1.8}Al_{0.2}Co_{1.9}Fe_{0.1}O_9$ | 199 | 7.7 | 1 |
| $Bi_2Pb_{0.2}Sr_{1.8}Y_{0.2}Co_{1.9}Fe_{0.1}O_9$ | 200 | 8 | 1.3 |
| $Bi_2Pb_{0.2}Sr_{1.8}La_{0.2}Co_{1.9}Fe_{0.1}O_9$ | 206 | 8.2 | 1.2 |
| $Bi_2Pb_{0.2}Sr_{1.8}Ce_{0.2}Co_{1.9}Fe_{0.1}O_9$ | 205 | 7.9 | 1.3 |
| $Bi_2Pb_{0.2}Sr_{1.8}Pr_{0.2}Co_{1.9}Fe_{0.1}O_9$ | 198 | 9.1 | 1 |
| $Bi_2Pb_{0.2}Sr_{1.8}Nd_{0.2}Co_{1.9}Fe_{0.1}O_9$ | 206 | 8.4 | 0.8 |
| $Bi_2Pb_{0.2}Sr_{1.8}Sm_{0.2}Co_{1.9}Fe_{0.1}O_9$ | 198 | 8.6 | 1.3 |
| $Bi_2Pb_{0.2}Sr_{1.8}Eu_{0.2}Co_{1.9}Fe_{0.1}O_9$ | 195 | 8.2 | 1.2 |
| $Bi_2Pb_{0.2}Sr_{1.8}Gd_{0.2}Co_{1.9}Fe_{0.1}O_9$ | 200 | 7.9 | 1.1 |
| $Bi_2Pb_{0.2}Sr_{1.8}Dy_{0.2}Co_{1.9}Fe_{0.1}O_9$ | 203 | 8.6 | 0.8 |
| $Bi_2Pb_{0.2}Sr_{1.8}Ho_{0.2}Co_{1.9}Fe_{0.1}O_9$ | 201 | 9.1 | 1.3 |
| $Bi_2Pb_{0.2}Sr_{1.8}Er_{0.2}Co_{1.9}Fe_{0.1}O_9$ | 208 | 6.9 | 1.4 |
| $Bi_2Pb_{0.2}Sr_{1.8}Yb_{0.2}Co_{1.9}Fe_{0.1}O_9$ | 198 | 7.4 | 1.1 |
| $Bi_2Ca_2Co_{1.9}Fe_{0.1}O_9$ | 200 | 7.7 | 1.3 |
| $Bi_2Ca_{1.8}Na_{0.2}Co_{1.9}Fe_{0.1}O_9$ | 199 | 8 | 0.9 |
| $Bi_2Ca_{1.8}K_{0.2}Co_{1.9}Fe_{0.1}O_9$ | 210 | 8.2 | 1.1 |
| $Bi_2Ca_{1.8}Li_{0.2}Co_{1.9}Fe_{0.1}O_9$ | 202 | 7.9 | 1.4 |
| $Bi_2Ca_{1.8}Ti_{0.2}Co_{1.9}Fe_{0.1}O_9$ | 204 | 9.1 | 1.2 |
| $Bi_2Ca_{1.8}V_{0.2}Co_{1.9}Fe_{0.1}O_9$ | 197 | 8.4 | 0.9 |
| $Bi_2Ca_{1.8}Cr_{0.2}Co_{1.9}Fe_{0.1}O_9$ | 190 | 8.6 | 1.1 |
| $Bi_2Ca_{1.8}Mn_{0.2}Co_{1.9}Fe_{0.1}O_9$ | 198 | 7.8 | 1.2 |
| $Bi_2Ca_{1.8}Fe_{0.2}Co_{1.9}Fe_{0.1}O_9$ | 199 | 9 | 0.9 |
| $Bi_2Ca_{1.8}Ni_{0.2}Co_{1.9}Fe_{0.1}O_9$ | 201 | 8.2 | 1.1 |
| $Bi_2Ca_{1.8}Cu_{0.2}Co_{1.9}Fe_{0.1}O_9$ | 207 | 8.3 | 1.2 |
| $Bi_2Ca_{1.8}Zn_{0.2}Co_{1.9}Fe_{0.1}O_9$ | 190 | 8.6 | 1.4 |
| $Bi_2Ca_{1.8}Pb_{0.2}Co_{1.9}Fe_{0.1}O_9$ | 201 | 8.7 | 0.8 |
| $Bi_2Ca_{1.8}Sr_{0.2}Co_{1.9}Fe_{0.1}O_9$ | 208 | 8.3 | 1.3 |
| $Bi_2Ca_{1.8}Ba_{0.2}Co_{1.9}Fe_{0.1}O_9$ | 198 | 9 | 1.2 |
| $Bi_2Ca_{1.8}Al_{0.2}Co_{1.9}Fe_{0.1}O_9$ | 199 | 7.9 | 1.1 |
| $Bi_2Ca_{1.8}Y_{0.2}Co_{1.9}Fe_{0.1}O_9$ | 200 | 8.1 | 1.4 |
| $Bi_2Ca_{1.8}La_{0.2}Co_{1.9}Fe_{0.1}O_9$ | 199 | 8 | 1.2 |
| $Bi_2Ca_{1.8}Ce_{0.2}Co_{1.9}Fe_{0.1}O_9$ | 210 | 7.8 | 0.9 |
| $Bi_2Ca_{1.8}Pr_{0.2}Co_{1.9}Fe_{0.1}O_9$ | 202 | 7.2 | 1.1 |
| $Bi_2Ca_{1.8}Nd_{0.2}Co_{1.9}Fe_{0.1}O_9$ | 204 | 9 | 1.2 |
| $Bi_2Ca_{1.8}Sm_{0.2}Co_{1.9}Fe_{0.1}O_9$ | 197 | 7.8 | 0.9 |

TABLE 39

| | | | |
|---|---|---|---|
| $Bi_2Ca_{1.8}Eu_{0.2}Co_{1.9}Fe_{0.1}O_9$ | 190 | 7.5 | 1.1 |
| $Bi_2Ca_{1.8}Gd_{0.2}Co_{1.9}Fe_{0.1}O_9$ | 198 | 8.6 | 1.2 |
| $Bi_2Ca_{1.8}Dy_{0.2}Co_{1.9}Fe_{0.1}O_9$ | 199 | 8.2 | 1.4 |
| $Bi_2Ca_{1.8}Ho_{0.2}Co_{1.9}Fe_{0.1}O_9$ | 201 | 7.9 | 0.8 |
| $Bi_2Ca_{1.8}Er_{0.2}Co_{1.9}Fe_{0.1}O_9$ | 207 | 6.9 | 1.3 |
| $Bi_2Ca_{1.8}Yb_{0.2}Co_{1.9}Fe_{0.1}O_9$ | 190 | 9 | 1.2 |
| $Bi_2Pb_{0.2}Ca_2Co_{1.9}Fe_{0.1}O_9$ | 200 | 7.5 | 0.8 |
| $Bi_2Pb_{0.2}Ca_{1.8}Na_{0.2}Co_{1.9}Fe_{0.1}O_9$ | 203 | 8.6 | 1.3 |
| $Bi_2Pb_{0.2}Ca_{1.8}K_{0.2}Co_{1.9}Fe_{0.1}O_9$ | 201 | 8.2 | 1.4 |
| $Bi_2Pb_{0.2}Ca_{1.8}Li_{0.2}Co_{1.9}Fe_{0.1}O_9$ | 208 | 7.9 | 1.1 |
| $Bi_2Pb_{0.2}Ca_{1.8}Ti_{0.2}Co_{1.9}Fe_{0.1}O_9$ | 198 | 6.9 | 1 |
| $Bi_2Pb_{0.2}Ca_{1.8}V_{0.2}Co_{1.9}Fe_{0.1}O_9$ | 199 | 8.1 | 1.3 |
| $Bi_2Pb_{0.2}Ca_{1.8}Cr_{0.2}Co_{1.9}Fe_{0.1}O_9$ | 200 | 6.9 | 0.9 |
| $Bi_2Pb_{0.2}Ca_{1.8}Mn_{0.2}Co_{1.9}Fe_{0.1}O_9$ | 199 | 7.4 | 1.1 |
| $Bi_2Pb_{0.2}Ca_{1.8}Fe_{0.2}Co_{1.9}Fe_{0.1}O_9$ | 210 | 7.8 | 1.4 |
| $Bi_2Pb_{0.2}Ca_{1.8}Ni_{0.2}Co_{1.9}Fe_{0.1}O_9$ | 202 | 7.7 | 1.2 |
| $Bi_2Pb_{0.2}Ca_{1.8}Cu_{0.2}Co_{1.9}Fe_{0.1}O_9$ | 204 | 8 | 0.9 |
| $Bi_2Pb_{0.2}Ca_{1.8}Zn_{0.2}Co_{1.9}Fe_{0.1}O_9$ | 197 | 8.2 | 1.1 |
| $Bi_2Pb_{0.2}Ca_{1.8}Pb_{0.2}Co_{1.9}Fe_{0.1}O_9$ | 190 | 7.9 | 1.2 |
| $Bi_2Pb_{0.2}Ca_{1.8}Sr_{0.2}Co_{1.9}Fe_{0.1}O_9$ | 198 | 9.1 | 0.9 |
| $Bi_2Pb_{0.2}Ca_{1.8}Ba_{0.2}Co_{1.9}Fe_{0.1}O_9$ | 199 | 8.4 | 1.1 |
| $Bi_2Pb_{0.2}Ca_{1.8}Al_{0.2}Co_{1.9}Fe_{0.1}O_9$ | 201 | 8.6 | 1.2 |
| $Bi_2Pb_{0.2}Ca_{1.8}Y_{0.2}Co_{1.9}Fe_{0.1}O_9$ | 207 | 8.2 | 1 |
| $Bi_2Pb_{0.2}Ca_{1.8}La_{0.2}Co_{1.9}Fe_{0.1}O_9$ | 190 | 7.9 | 1.3 |
| $Bi_2Pb_{0.2}Ca_{1.8}Ce_{0.2}Co_{1.9}Fe_{0.1}O_9$ | 198 | 8.6 | 1 |
| $Bi_2Pb_{0.2}Ca_{1.8}Pr_{0.2}Co_{1.9}Fe_{0.1}O_9$ | 199 | 9.1 | 0.9 |
| $Bi_2Pb_{0.2}Ca_{1.8}Nd_{0.2}Co_{1.9}Fe_{0.1}O_9$ | 201 | 6.9 | 1.1 |
| $Bi_2Pb_{0.2}Ca_{1.8}Sm_{0.2}Co_{1.9}Fe_{0.1}O_9$ | 210 | 7.4 | 1 |
| $Bi_2Pb_{0.2}Ca_{1.8}Eu_{0.2}Co_{1.9}Fe_{0.1}O_9$ | 206 | 7.8 | 1.2 |
| $Bi_2Pb_{0.2}Ca_{1.8}Gd_{0.2}Co_{1.9}Fe_{0.1}O_9$ | 205 | 7.7 | 1.1 |
| $Bi_2Pb_{0.2}Ca_{1.8}Dy_{0.2}Co_{1.9}Fe_{0.1}O_9$ | 198 | 8 | 0.9 |
| $Bi_2Pb_{0.2}Ca_{1.8}Ho_{0.2}Co_{1.9}Fe_{0.1}O_9$ | 195 | 8.2 | 0.8 |
| $Bi_2Pb_{0.2}Ca_{1.8}Er_{0.2}Co_{1.9}Fe_{0.1}O_9$ | 200 | 7.9 | 1 |
| $Bi_2Pb_{0.2}Ca_{1.8}Yb_{0.2}Co_{1.9}Fe_{0.1}O_9$ | 203 | 9.1 | 1.3 |
| $Bi_2Ba_2Co_{1.9}Fe_{0.1}O_9$ | 208 | 8.6 | 1.3 |

TABLE 40

| | | | |
|---|---|---|---|
| $Bi_2Ba_{1.8}Na_{0.2}Co_{1.9}Fe_{0.1}O_9$ | 201 | 7.8 | 0.9 |
| $Bi_2Ba_{1.8}K_{0.2}Co_{1.9}Fe_{0.1}O_9$ | 190 | 9 | 1.1 |
| $Bi_2Ba_{1.8}Li_{0.2}Co_{1.9}Fe_{0.1}O_9$ | 198 | 8.2 | 1.4 |
| $Bi_2Ba_{1.8}Ti_{0.2}Co_{1.9}Fe_{0.1}O_9$ | 199 | 9.1 | 1.2 |
| $Bi_2Ba_{1.8}V_{0.2}Co_{1.9}Fe_{0.1}O_9$ | 201 | 8.4 | 0.9 |
| $Bi_2Ba_{1.8}Cr_{0.2}Co_{1.9}Fe_{0.1}O_9$ | 200 | 8.6 | 1.1 |
| $Bi_2Ba_{1.8}Mn_{0.2}Co_{1.9}Fe_{0.1}O_9$ | 206 | 7.8 | 1.2 |
| $Bi_2Ba_{1.8}Fe_{0.2}Co_{1.9}Fe_{0.1}O_9$ | 205 | 9 | 0.9 |
| $Bi_2Ba_{1.8}Ni_{0.2}Co_{1.9}Fe_{0.1}O_9$ | 198 | 8.2 | 1.1 |
| $Bi_2Ba_{1.8}Cu_{0.2}Co_{1.9}Fe_{0.1}O_9$ | 201 | 8.3 | 1.2 |
| $Bi_2Ba_{1.8}Zn_{0.2}Co_{1.9}Fe_{0.1}O_9$ | 196 | 8.6 | 1 |
| $Bi_2Ba_{1.8}Pb_{0.2}Co_{1.9}Fe_{0.1}O_9$ | 202 | 8.7 | 1.3 |
| $Bi_2Ba_{1.8}Ca_{0.2}Co_{1.9}Fe_{0.1}O_9$ | 203 | 8.3 | 1 |
| $Bi_2Ba_{1.8}Sr_{0.2}Co_{1.9}Fe_{0.1}O_9$ | 205 | 9 | 0.9 |
| $Bi_2Ba_{1.8}Al_{0.2}Co_{1.9}Fe_{0.1}O_9$ | 198 | 7.9 | 1.1 |
| $Bi_2Ba_{1.8}Y_{0.2}Co_{1.9}Fe_{0.1}O_9$ | 195 | 8.1 | 1 |
| $Bi_2Ba_{1.8}La_{0.2}Co_{1.9}Fe_{0.1}O_9$ | 200 | 8 | 0.9 |
| $Bi_2Ba_{1.8}Ce_{0.2}Co_{1.9}Fe_{0.1}O_9$ | 205 | 7.8 | 1.1 |
| $Bi_2Ba_{1.8}Pr_{0.2}Co_{1.9}Fe_{0.1}O_9$ | 198 | 7.2 | 1.4 |
| $Bi_2Ba_{1.8}Nd_{0.2}Co_{1.9}Fe_{0.1}O_9$ | 199 | 9 | 1.2 |
| $Bi_2Ba_{1.8}Sm_{0.2}Co_{1.9}Fe_{0.1}O_9$ | 210 | 8.2 | 0.9 |
| $Bi_2Ba_{1.8}Eu_{0.2}Co_{1.9}Fe_{0.1}O_9$ | 202 | 7.9 | 1.1 |
| $Bi_2Ba_{1.8}Gd_{0.2}Co_{1.9}Fe_{0.1}O_9$ | 204 | 6.9 | 1.2 |
| $Bi_2Ba_{1.8}Dy_{0.2}Co_{1.9}Fe_{0.1}O_9$ | 197 | 8.1 | 0.9 |
| $Bi_2Ba_{1.8}Ho_{0.2}Co_{1.9}Fe_{0.1}O_9$ | 190 | 6.9 | 1.1 |
| $Bi_2Ba_{1.8}Er_{0.2}Co_{1.9}Fe_{0.1}O_9$ | 198 | 7.4 | 1.2 |
| $Bi_2Ba_{1.8}Yb_{0.2}Co_{1.9}Fe_{0.1}O_9$ | 199 | 7.8 | 1.4 |
| $Bi_2Pb_{0.2}Ba_2Co_{1.9}Fe_{0.1}O_9$ | 207 | 8 | 1.3 |
| $Bi_2Pb_{0.2}Ba_{1.8}Na_{0.2}Co_{1.9}Fe_{0.1}O_9$ | 190 | 8.2 | 1.2 |
| $Bi_2Pb_{0.2}Ba_{1.8}K_{0.2}Co_{1.9}Fe_{0.1}O_9$ | 198 | 7.9 | 1.1 |
| $Bi_2Pb_{0.2}Ba_{1.8}Li_{0.2}Co_{1.9}Fe_{0.1}O_9$ | 199 | 9.1 | 1.4 |
| $Bi_2Pb_{0.2}Ba_{1.8}Ti_{0.2}Co_{1.9}Fe_{0.1}O_9$ | 201 | 8.4 | 1.2 |
| $Bi_2Pb_{0.2}Ba_{1.8}V_{0.2}Co_{1.9}Fe_{0.1}O_9$ | 210 | 8.6 | 0.9 |
| $Bi_2Pb_{0.2}Ba_{1.8}Cr_{0.2}Co_{1.9}Fe_{0.1}O_9$ | 206 | 8.2 | 1.1 |
| $Bi_2Pb_{0.2}Ba_{1.8}Mn_{0.2}Co_{1.9}Fe_{0.1}O_9$ | 205 | 7.9 | 1.2 |
| $Bi_2Pb_{0.2}Ba_{1.8}Fe_{0.2}Co_{1.9}Fe_{0.1}O_9$ | 198 | 8.6 | 0.9 |

TABLE 41

| | | | |
|---|---|---|---|
| $Bi_2Pb_{0.2}Ba_{1.8}Ni_{0.2}Co_{1.9}Fe_{0.1}O_9$ | 195 | 9.1 | 1.1 |
| $Bi_2Pb_{0.2}Ba_{1.8}Cu_{0.2}Co_{1.9}Fe_{0.1}O_9$ | 200 | 6.9 | 1.2 |
| $Bi_2Pb_{0.2}Ba_{1.8}Zn_{0.2}Co_{1.9}Fe_{0.1}O_9$ | 203 | 7.4 | 1.4 |
| $Bi_2Pb_{0.2}Ba_{1.8}Pb_{0.2}Co_{1.9}Fe_{0.1}O_9$ | 201 | 7.8 | 0.8 |
| $Bi_2Pb_{0.2}Ba_{1.8}Ca_{0.2}Co_{1.9}Fe_{0.1}O_9$ | 208 | 7.7 | 1.3 |
| $Bi_2Pb_{0.2}Ba_{1.8}Sr_{0.2}Co_{1.9}Fe_{0.1}O_9$ | 198 | 8 | 1.2 |
| $Bi_2Pb_{0.2}Ba_{1.8}Al_{0.2}Co_{1.9}Fe_{0.1}O_9$ | 199 | 8.2 | 1.1 |
| $Bi_2Pb_{0.2}Ba_{1.8}Y_{0.2}Co_{1.9}Fe_{0.1}O_9$ | 200 | 7.9 | 0.8 |
| $Bi_2Pb_{0.2}Ba_{1.8}La_{0.2}Co_{1.9}Fe_{0.1}O_9$ | 206 | 9.1 | 1.3 |
| $Bi_2Pb_{0.2}Ba_{1.8}Ce_{0.2}Co_{1.9}Fe_{0.1}O_9$ | 205 | 8.4 | 1.4 |
| $Bi_2Pb_{0.2}Ba_{1.8}Pr_{0.2}Co_{1.9}Fe_{0.1}O_9$ | 198 | 8.6 | 1.1 |
| $Bi_2Pb_{0.2}Ba_{1.8}Nd_{0.2}Co_{1.9}Fe_{0.1}O_9$ | 206 | 7.8 | 1 |
| $Bi_2Pb_{0.2}Ba_{1.8}Sm_{0.2}Co_{1.9}Fe_{0.1}O_9$ | 198 | 9 | 1.3 |
| $Bi_2Pb_{0.2}Ba_{1.8}Eu_{0.2}Co_{1.9}Fe_{0.1}O_9$ | 207 | 8.2 | 0.9 |
| $Bi_2Pb_{0.2}Ba_{1.8}Gd_{0.2}Co_{1.9}Fe_{0.1}O_9$ | 190 | 8.3 | 1.1 |
| $Bi_2Pb_{0.2}Ba_{1.8}Dy_{0.2}Co_{1.9}Fe_{0.1}O_9$ | 198 | 8.4 | 1.4 |
| $Bi_2Pb_{0.2}Ba_{1.8}Ho_{0.2}Co_{1.9}Fe_{0.1}O_9$ | 199 | 8.6 | 1.2 |
| $Bi_2Pb_{0.2}Ba_{1.8}Er_{0.2}Co_{1.9}Fe_{0.1}O_9$ | 201 | 8.2 | 0.9 |
| $Bi_2Pb_{0.2}Ba_{1.8}Yb_{0.2}Co_{1.9}Fe_{0.1}O_9$ | 210 | 7.9 | 1.1 |
| $Bi_2Sr_2Co_{1.9}Ni_{0.1}O_9$ | 205 | 9.1 | 0.9 |
| $Bi_2Sr_{1.8}Na_{0.2}Co_{1.9}Ni_{0.1}O_9$ | 198 | 6.9 | 1.1 |
| $Bi_2Sr_{1.8}K_{0.2}Co_{1.9}Ni_{0.1}O_9$ | 195 | 7.4 | 1.2 |
| $Bi_2Sr_{1.8}Li_{0.2}Co_{1.9}Ni_{0.1}O_9$ | 200 | 7.8 | 1 |
| $Bi_2Sr_{1.8}Ti_{0.2}Co_{1.9}Ni_{0.1}O_9$ | 203 | 7.7 | 1.3 |
| $Bi_2Sr_{1.8}V_{0.2}Co_{1.9}Ni_{0.1}O_9$ | 201 | 8 | 1 |
| $Bi_2Sr_{1.8}Cr_{0.2}Co_{1.9}Ni_{0.1}O_9$ | 208 | 8.2 | 0.9 |
| $Bi_2Sr_{1.8}Mn_{0.2}Co_{1.9}Ni_{0.1}O_9$ | 198 | 7.9 | 1.1 |
| $Bi_2Sr_{1.8}Fe_{0.2}Co_{1.9}Ni_{0.1}O_9$ | 199 | 9.1 | 1 |
| $Bi_2Sr_{1.8}Ni_{0.2}Co_{1.9}Ni_{0.1}O_9$ | 200 | 8.4 | 1.2 |
| $Bi_2Sr_{1.8}Cu_{0.2}Co_{1.9}Ni_{0.1}O_9$ | 206 | 8.6 | 1.1 |
| $Bi_2Sr_{1.8}Zn_{0.2}Co_{1.9}Ni_{0.1}O_9$ | 205 | 7.8 | 0.9 |
| $Bi_2Sr_{1.8}Pb_{0.2}Co_{1.9}Ni_{0.1}O_9$ | 198 | 9 | 0.8 |
| $Bi_2Sr_{1.8}Ca_{0.2}Co_{1.9}Ni_{0.1}O_9$ | 206 | 8.2 | 1 |
| $Bi_2Sr_{1.8}Ba_{0.2}Co_{1.9}Ni_{0.1}O_9$ | 198 | 8.3 | 1.3 |
| $Bi_2Sr_{1.8}Al_{0.2}Co_{1.9}Ni_{0.1}O_9$ | 195 | 8.6 | 1.2 |
| $Bi_2Sr_{1.8}Y_{0.2}Co_{1.9}Ni_{0.1}O_9$ | 200 | 8.7 | 1.3 |

TABLE 42

| | | | |
|---|---|---|---|
| $Bi_2Sr_{1.8}La_{0.2}Co_{1.9}Ni_{0.1}O_9$ | 203 | 8.3 | 1 |
| $Bi_2Sr_{1.8}Ce_{0.2}Co_{1.9}Ni_{0.1}O_9$ | 201 | 9 | 1.3 |
| $Bi_2Sr_{1.8}Pr_{0.2}Co_{1.9}Ni_{0.1}O_9$ | 208 | 7.9 | 0.9 |
| $Bi_2Sr_{1.8}Nd_{0.2}Co_{1.9}Ni_{0.1}O_9$ | 198 | 8.1 | 1.1 |
| $Bi_2Sr_{1.8}Sm_{0.2}Co_{1.9}Ni_{0.1}O_9$ | 199 | 8 | 1.4 |
| $Bi_2Sr_{1.8}Eu_{0.2}Co_{1.9}Ni_{0.1}O_9$ | 200 | 7.8 | 1.2 |
| $Bi_2Sr_{1.8}Gd_{0.2}Co_{1.9}Ni_{0.1}O_9$ | 199 | 7.2 | 0.9 |
| $Bi_2Sr_{1.8}Dy_{0.2}Co_{1.9}Ni_{0.1}O_9$ | 210 | 9 | 1.1 |
| $Bi_2Sr_{1.8}Ho_{0.2}Co_{1.9}Ni_{0.1}O_9$ | 202 | 8.2 | 1.2 |
| $Bi_2Sr_{1.8}Er_{0.2}Co_{1.9}Ni_{0.1}O_9$ | 204 | 7.9 | 0.9 |
| $Bi_2Sr_{1.8}Yb_{0.2}Co_{1.9}Ni_{0.1}O_9$ | 197 | 6.9 | 1.1 |
| $Bi_2Pb_{0.2}Sr_2Co_{1.9}Ni_{0.1}O_9$ | 208 | 6.9 | 1.4 |
| $Bi_2Pb_{0.2}Sr_{1.8}Na_{0.2}Co_{1.9}Ni_{0.1}O_9$ | 198 | 7.4 | 1.2 |
| $Bi_2Pb_{0.2}Sr_{1.8}K_{0.2}Co_{1.9}Ni_{0.1}O_9$ | 199 | 7.8 | 1.3 |
| $Bi_2Pb_{0.2}Sr_{1.8}Li_{0.2}Co_{1.9}Ni_{0.1}O_9$ | 200 | 7.7 | 1.2 |
| $Bi_2Pb_{0.2}Sr_{1.8}Ti_{0.2}Co_{1.9}Ni_{0.1}O_9$ | 199 | 8 | 1.1 |
| $Bi_2Pb_{0.2}Sr_{1.8}V_{0.2}Co_{1.9}Ni_{0.1}O_9$ | 210 | 8.2 | 0.8 |
| $Bi_2Pb_{0.2}Sr_{1.8}Cr_{0.2}Co_{1.9}Ni_{0.1}O_9$ | 202 | 7.9 | 0.7 |
| $Bi_2Pb_{0.2}Sr_{1.8}Mn_{0.2}Co_{1.9}Ni_{0.1}O_9$ | 204 | 9.1 | 1.3 |
| $Bi_2Pb_{0.2}Sr_{1.8}Fe_{0.2}Co_{1.9}Ni_{0.1}O_9$ | 197 | 8.4 | 0.8 |
| $Bi_2Pb_{0.2}Sr_{1.8}Ni_{0.2}Co_{1.9}Ni_{0.1}O_9$ | 190 | 8.6 | 1.1 |
| $Bi_2Pb_{0.2}Sr_{1.8}Cu_{0.2}Co_{1.9}Ni_{0.1}O_9$ | 198 | 8.2 | 1.4 |
| $Bi_2Pb_{0.2}Sr_{1.8}Zn_{0.2}Co_{1.9}Ni_{0.1}O_9$ | 199 | 7.9 | 1.2 |
| $Bi_2Pb_{0.2}Sr_{1.8}Pb_{0.2}Co_{1.9}Ni_{0.1}O_9$ | 201 | 8.6 | 0.9 |
| $Bi_2Pb_{0.2}Sr_{1.8}Ca_{0.2}Co_{1.9}Ni_{0.1}O_9$ | 207 | 9.1 | 1.1 |
| $Bi_2Pb_{0.2}Sr_{1.8}Ba_{0.2}Co_{1.9}Ni_{0.1}O_9$ | 190 | 6.9 | 1.2 |
| $Bi_2Pb_{0.2}Sr_{1.8}Al_{0.2}Co_{1.9}Ni_{0.1}O_9$ | 198 | 7.4 | 0.9 |
| $Bi_2Pb_{0.2}Sr_{1.8}Y_{0.2}Co_{1.9}Ni_{0.1}O_9$ | 199 | 7.8 | 1.1 |
| $Bi_2Pb_{0.2}Sr_{1.8}La_{0.2}Co_{1.9}Ni_{0.1}O_9$ | 201 | 7.7 | 1.2 |
| $Bi_2Pb_{0.2}Sr_{1.8}Ce_{0.2}Co_{1.9}Ni_{0.1}O_9$ | 210 | 8 | 1.4 |
| $Bi_2Pb_{0.2}Sr_{1.8}Pr_{0.2}Co_{1.9}Ni_{0.1}O_9$ | 206 | 8.2 | 0.8 |
| $Bi_2Pb_{0.2}Sr_{1.8}Nd_{0.2}Co_{1.9}Ni_{0.1}O_9$ | 205 | 7.9 | 1.3 |
| $Bi_2Pb_{0.2}Sr_{1.8}Sm_{0.2}Co_{1.9}Ni_{0.1}O_9$ | 198 | 9.1 | 1.2 |
| $Bi_2Pb_{0.2}Sr_{1.8}Eu_{0.2}Co_{1.9}Ni_{0.1}O_9$ | 195 | 8.4 | 1.1 |
| $Bi_2Pb_{0.2}Sr_{1.8}Gd_{0.2}Co_{1.9}Ni_{0.1}O_9$ | 200 | 8.6 | 0.8 |
| $Bi_2Pb_{0.2}Sr_{1.8}Dy_{0.2}Co_{1.9}Ni_{0.1}O_9$ | 203 | 7.8 | 1.3 |

TABLE 43

| | | | |
|---|---|---|---|
| $Bi_2Pb_{0.2}Sr_{1.8}Ho_{0.2}Co_{1.9}Ni_{0.1}O_9$ | 201 | 9 | 1.4 |
| $Bi_2Pb_{0.2}Sr_{1.8}Er_{0.2}Co_{1.9}Ni_{0.1}O_9$ | 208 | 8.2 | 1.1 |
| $Bi_2Pb_{0.2}Sr_{1.8}Yb_{0.2}Co_{1.9}Ni_{0.1}O_9$ | 201 | 8.3 | 1 |
| $Bi_2Ca_2Co_{1.9}Ni_{0.1}O_9$ | 198 | 8.7 | 0.9 |
| $Bi_2Ca_{1.8}Na_{0.2}Co_{1.9}Ni_{0.1}O_9$ | 199 | 8.3 | 1.1 |
| $Bi_2Ca_{1.8}K_{0.2}Co_{1.9}Ni_{0.1}O_9$ | 201 | 9 | 1.4 |
| $Bi_2Ca_{1.8}Li_{0.2}Co_{1.9}Ni_{0.1}O_9$ | 200 | 7.9 | 1.2 |
| $Bi_2Ca_{1.8}Ti_{0.2}Co_{1.9}Ni_{0.1}O_9$ | 206 | 8.1 | 0.9 |
| $Bi_2Ca_{1.8}V_{0.2}Co_{1.9}Ni_{0.1}O_9$ | 205 | 8 | 1.1 |
| $Bi_2Ca_{1.8}Cr_{0.2}Co_{1.9}Ni_{0.1}O_9$ | 198 | 7.8 | 1.2 |
| $Bi_2Ca_{1.8}Mn_{0.2}Co_{1.9}Ni_{0.1}O_9$ | 201 | 7.2 | 0.9 |
| $Bi_2Ca_{1.8}Fe_{0.2}Co_{1.9}Ni_{0.1}O_9$ | 196 | 9 | 1.1 |
| $Bi_2Ca_{1.8}Ni_{0.2}Co_{1.9}Ni_{0.1}O_9$ | 202 | 7.8 | 1.2 |
| $Bi_2Ca_{1.8}Cu_{0.2}Co_{1.9}Ni_{0.1}O_9$ | 203 | 7.5 | 1.4 |
| $Bi_2Ca_{1.8}Zn_{0.2}Co_{1.9}Ni_{0.1}O_9$ | 205 | 8.6 | 0.8 |
| $Bi_2Ca_{1.8}Pb_{0.2}Co_{1.9}Ni_{0.1}O_9$ | 198 | 8.2 | 1.3 |
| $Bi_2Ca_{1.8}Sr_{0.2}Co_{1.9}Ni_{0.1}O_9$ | 195 | 7.9 | 1.2 |
| $Bi_2Ca_{1.8}Ba_{0.2}Co_{1.9}Ni_{0.1}O_9$ | 200 | 6.9 | 1.1 |
| $Bi_2Ca_{1.8}Al_{0.2}Co_{1.9}Ni_{0.1}O_9$ | 205 | 9 | 1.4 |
| $Bi_2Ca_{1.8}Y_{0.2}Co_{1.9}Ni_{0.1}O_9$ | 198 | 7.8 | 1.2 |
| $Bi_2Ca_{1.8}La_{0.2}Co_{1.9}Ni_{0.1}O_9$ | 199 | 7.5 | 0.9 |
| $Bi_2Ca_{1.8}Ce_{0.2}Co_{1.9}Ni_{0.1}O_9$ | 210 | 8.6 | 1.1 |
| $Bi_2Ca_{1.8}Pr_{0.2}Co_{1.9}Ni_{0.1}O_9$ | 202 | 8.2 | 1.2 |
| $Bi_2Ca_{1.8}Nd_{0.2}Co_{1.9}Ni_{0.1}O_9$ | 204 | 7.9 | 0.9 |
| $Bi_2Ca_{1.8}Sm_{0.2}Co_{1.9}Ni_{0.1}O_9$ | 197 | 6.9 | 1.1 |
| $Bi_2Ca_{1.8}Eu_{0.2}Co_{1.9}Ni_{0.1}O_9$ | 190 | 8.1 | 1.2 |
| $Bi_2Ca_{1.8}Gd_{0.2}Co_{1.9}Ni_{0.1}O_9$ | 198 | 6.9 | 1.4 |
| $Bi_2Ca_{1.8}Dy_{0.2}Co_{1.9}Ni_{0.1}O_9$ | 199 | 7.4 | 0.8 |
| $Bi_2Ca_{1.8}Ho_{0.2}Co_{1.9}Ni_{0.1}O_9$ | 201 | 7.8 | 1.3 |
| $Bi_2Ca_{1.8}Er_{0.2}Co_{1.9}Ni_{0.1}O_9$ | 207 | 7.7 | 1.2 |
| $Bi_2Ca_{1.8}Yb_{0.2}Co_{1.9}Ni_{0.1}O_9$ | 190 | 8 | 1.1 |
| $Bi_2Pb_{0.2}Ca_2Co_{1.9}Ni_{0.1}O_9$ | 199 | 7.9 | 1.2 |
| $Bi_2Pb_{0.2}Ca_{1.8}Na_{0.2}Co_{1.9}Ni_{0.1}O_9$ | 201 | 9.1 | 1.4 |
| $Bi_2Pb_{0.2}Ca_{1.8}K_{0.2}Co_{1.9}Ni_{0.1}O_9$ | 210 | 8.4 | 1.1 |
| $Bi_2Pb_{0.2}Ca_{1.8}Li_{0.2}Co_{1.9}Ni_{0.1}O_9$ | 206 | 8.6 | 1 |

TABLE 44

| | | | |
|---|---|---|---|
| $Bi_2Pb_{0.2}Ca_{1.8}Ti_{0.2}Co_{1.9}Ni_{0.1}O_9$ | 205 | 8.2 | 1.3 |
| $Bi_2Pb_{0.2}Ca_{1.8}V_{0.2}Co_{1.9}Ni_{0.1}O_9$ | 198 | 7.9 | 0.9 |
| $Bi_2Pb_{0.2}Ca_{1.8}Cr_{0.2}Co_{1.9}Ni_{0.1}O_9$ | 195 | 8.6 | 1.1 |
| $Bi_2Pb_{0.2}Ca_{1.8}Mn_{0.2}Co_{1.9}Ni_{0.1}O_9$ | 200 | 9.1 | 1.4 |
| $Bi_2Pb_{0.2}Ca_{1.8}Fe_{0.2}Co_{1.9}Ni_{0.1}O_9$ | 203 | 6.9 | 1.2 |
| $Bi_2Pb_{0.2}Ca_{1.8}Ni_{0.2}Co_{1.9}Ni_{0.1}O_9$ | 201 | 7.4 | 0.9 |
| $Bi_2Pb_{0.2}Ca_{1.8}Cu_{0.2}Co_{1.9}Ni_{0.1}O_9$ | 208 | 7.8 | 1.1 |
| $Bi_2Pb_{0.2}Ca_{1.8}Zn_{0.2}Co_{1.9}Ni_{0.1}O_9$ | 198 | 7.7 | 1.2 |
| $Bi_2Pb_{0.2}Ca_{1.8}Pb_{0.2}Co_{1.9}Ni_{0.1}O_9$ | 199 | 8 | 0.9 |
| $Bi_2Pb_{0.2}Ca_{1.8}Sr_{0.2}Co_{1.9}Ni_{0.1}O_9$ | 200 | 8.2 | 1.1 |
| $Bi_2Pb_{0.2}Ca_{1.8}Ba_{0.2}Co_{1.9}Ni_{0.1}O_9$ | 206 | 7.9 | 1.2 |
| $Bi_2Pb_{0.2}Ca_{1.8}Al_{0.2}Co_{1.9}Ni_{0.1}O_9$ | 205 | 9.1 | 1 |
| $Bi_2Pb_{0.2}Ca_{1.8}Y_{0.2}Co_{1.9}Ni_{0.1}O_9$ | 198 | 8.4 | 1.3 |
| $Bi_2Pb_{0.2}Ca_{1.8}La_{0.2}Co_{1.9}Ni_{0.1}O_9$ | 206 | 8.6 | 1 |
| $Bi_2Pb_{0.2}Ca_{1.8}Ce_{0.2}Co_{1.9}Ni_{0.1}O_9$ | 198 | 7.8 | 0.9 |
| $Bi_2Pb_{0.2}Ca_{1.8}Pr_{0.2}Co_{1.9}Ni_{0.1}O_9$ | 207 | 9 | 1.1 |
| $Bi_2Pb_{0.2}Ca_{1.8}Nd_{0.2}Co_{1.9}Ni_{0.1}O_9$ | 190 | 8.2 | 1 |
| $Bi_2Pb_{0.2}Ca_{1.8}Sm_{0.2}Co_{1.9}Ni_{0.1}O_9$ | 198 | 9.1 | 1.2 |
| $Bi_2Pb_{0.2}Ca_{1.8}Eu_{0.2}Co_{1.9}Ni_{0.1}O_9$ | 199 | 8.4 | 1.1 |
| $Bi_2Pb_{0.2}Ca_{1.8}Gd_{0.2}Co_{1.9}Ni_{0.1}O_9$ | 201 | 8.6 | 0.9 |
| $Bi_2Pb_{0.2}Ca_{1.8}Dy_{0.2}Co_{1.9}Ni_{0.1}O_9$ | 210 | 7.8 | 0.8 |
| $Bi_2Pb_{0.2}Ca_{1.8}Ho_{0.2}Co_{1.9}Ni_{0.1}O_9$ | 206 | 9 | 1 |
| $Bi_2Pb_{0.2}Ca_{1.8}Er_{0.2}Co_{1.9}Ni_{0.1}O_9$ | 205 | 8.4 | 1.3 |
| $Bi_2Pb_{0.2}Ca_{1.8}Yb_{0.2}Co_{1.9}Ni_{0.1}O_9$ | 198 | 8.6 | 1.2 |
| $Bi_2Ba_2Co_{1.9}Ni_{0.1}O_9$ | 200 | 9 | 0.9 |
| $Bi_2Ba_{1.8}Na_{0.2}Co_{1.9}Ni_{0.1}O_9$ | 203 | 8.2 | 1.1 |
| $Bi_2Ba_{1.8}K_{0.2}Co_{1.9}Ni_{0.1}O_9$ | 201 | 8.3 | 1.4 |
| $Bi_2Ba_{1.8}Li_{0.2}Co_{1.9}Ni_{0.1}O_9$ | 208 | 8.6 | 1.2 |
| $Bi_2Ba_{1.8}Ti_{0.2}Co_{1.9}Ni_{0.1}O_9$ | 198 | 8.7 | 0.9 |
| $Bi_2Ba_{1.8}V_{0.2}Co_{1.9}Ni_{0.1}O_9$ | 199 | 8.3 | 1.1 |
| $Bi_2Ba_{1.8}Cr_{0.2}Co_{1.9}Ni_{0.1}O_9$ | 200 | 9 | 1.2 |
| $Bi_2Ba_{1.8}Mn_{0.2}Co_{1.9}Ni_{0.1}O_9$ | 206 | 7.9 | 0.9 |
| $Bi_2Ba_{1.8}Fe_{0.2}Co_{1.9}Ni_{0.1}O_9$ | 205 | 8.1 | 1.1 |
| $Bi_2Ba_{1.8}Ni_{0.2}Co_{1.9}Ni_{0.1}O_9$ | 198 | 8 | 1.2 |
| $Bi_2Ba_{1.8}Cu_{0.2}Co_{1.9}Ni_{0.1}O_9$ | 199 | 7.8 | 1 |
| $Bi_2Ba_{1.8}Zn_{0.2}Co_{1.9}Ni_{0.1}O_9$ | 200 | 7.2 | 1.3 |

TABLE 45

| | | | |
|---|---|---|---|
| $Bi_2Ba_{1.8}Pb_{0.2}Co_{1.9}Ni_{0.1}O_9$ | 199 | 9 | 1 |
| $Bi_2Ba_{1.8}Ca_{0.2}Co_{1.9}Ni_{0.1}O_9$ | 210 | 7.8 | 0.9 |
| $Bi_2Ba_{1.8}Sr_{0.2}Co_{1.9}Ni_{0.1}O_9$ | 202 | 7.5 | 1.1 |
| $Bi_2Ba_{1.8}Al_{0.2}Co_{1.9}Ni_{0.1}O_9$ | 204 | 8.6 | 1 |
| $Bi_2Ba_{1.8}Y_{0.2}Co_{1.9}Ni_{0.1}O_9$ | 197 | 8.2 | 1.2 |
| $Bi_2Ba_{1.8}La_{0.2}Co_{1.9}Ni_{0.1}O_9$ | 190 | 7.9 | 1.1 |
| $Bi_2Ba_{1.8}Ce_{0.2}Co_{1.9}Ni_{0.1}O_9$ | 198 | 6.9 | 0.9 |
| $Bi_2Ba_{1.8}Pr_{0.2}Co_{1.9}Ni_{0.1}O_9$ | 199 | 9 | 0.8 |
| $Bi_2Ba_{1.8}Nd_{0.2}Co_{1.9}Ni_{0.1}O_9$ | 201 | 7.8 | 1 |
| $Bi_2Ba_{1.8}Sm_{0.2}Co_{1.9}Ni_{0.1}O_9$ | 207 | 7.5 | 1.3 |
| $Bi_2Ba_{1.8}Eu_{0.2}Co_{1.9}Ni_{0.1}O_9$ | 190 | 8.6 | 1.2 |
| $Bi_2Ba_{1.8}Gd_{0.2}Co_{1.9}Ni_{0.1}O_9$ | 198 | 8.2 | 0.7 |
| $Bi_2Ba_{1.8}Dy_{0.2}Co_{1.9}Ni_{0.1}O_9$ | 199 | 7.9 | 1.3 |
| $Bi_2Ba_{1.8}Ho_{0.2}Co_{1.9}Ni_{0.1}O_9$ | 201 | 6.9 | 1.4 |
| $Bi_2Ba_{1.8}Er_{0.2}Co_{1.9}Ni_{0.1}O_9$ | 210 | 8.1 | 1.1 |
| $Bi_2Ba_{1.8}Yb_{0.2}Co_{1.9}Ni_{0.1}O_9$ | 206 | 6.9 | 1 |
| $Bi_2Pb_{0.2}Ba_2Co_{1.9}Ni_{0.1}O_9$ | 198 | 7.8 | 0.9 |
| $Bi_2Pb_{0.2}Ba_{1.8}Na_{0.2}Co_{1.9}Ni_{0.1}O_9$ | 195 | 7.7 | 1.1 |
| $Bi_2Pb_{0.2}Ba_{1.8}K_{0.2}Co_{1.9}Ni_{0.1}O_9$ | 200 | 8 | 1.4 |
| $Bi_2Pb_{0.2}Ba_{1.8}Li_{0.2}Co_{1.9}Ni_{0.1}O_9$ | 203 | 8.2 | 1.2 |
| $Bi_2Pb_{0.2}Ba_{1.8}Ti_{0.2}Co_{1.9}Ni_{0.1}O_9$ | 201 | 7.9 | 0.9 |
| $Bi_2Pb_{0.2}Ba_{1.8}V_{0.2}Co_{1.9}Ni_{0.1}O_9$ | 196 | 9.1 | 1.1 |
| $Bi_2Pb_{0.2}Ba_{1.8}Cr_{0.2}Co_{1.9}Ni_{0.1}O_9$ | 202 | 8.4 | 1.2 |
| $Bi_2Pb_{0.2}Ba_{1.8}Mn_{0.2}Co_{1.9}Ni_{0.1}O_9$ | 203 | 8.6 | 0.9 |
| $Bi_2Pb_{0.2}Ba_{1.8}Fe_{0.2}Co_{1.9}Ni_{0.1}O_9$ | 205 | 8.2 | 1.1 |
| $Bi_2Pb_{0.2}Ba_{1.8}Ni_{0.2}Co_{1.9}Ni_{0.1}O_9$ | 198 | 7.9 | 1.2 |
| $Bi_2Pb_{0.2}Ba_{1.8}Cu_{0.2}Co_{1.9}Ni_{0.1}O_9$ | 195 | 8.6 | 1.4 |
| $Bi_2Pb_{0.2}Ba_{1.8}Zn_{0.2}Co_{1.9}Ni_{0.1}O_9$ | 200 | 9.1 | 0.8 |
| $Bi_2Pb_{0.2}Ba_{1.8}Pb_{0.2}Co_{1.9}Ni_{0.1}O_9$ | 205 | 6.9 | 1.3 |
| $Bi_2Pb_{0.2}Ba_{1.8}Ca_{0.2}Co_{1.9}Ni_{0.1}O_9$ | 198 | 7.4 | 1.2 |
| $Bi_2Pb_{0.2}Ba_{1.8}Sr_{0.2}Co_{1.9}Ni_{0.1}O_9$ | 199 | 7.8 | 1.1 |
| $Bi_2Pb_{0.2}Ba_{1.8}Al_{0.2}Co_{1.9}Ni_{0.1}O_9$ | 210 | 7.7 | 0.8 |
| $Bi_2Pb_{0.2}Ba_{1.8}Y_{0.2}Co_{1.9}Ni_{0.1}O_9$ | 202 | 8 | 1.3 |
| $Bi_2Pb_{0.2}Ba_{1.8}La_{0.2}Co_{1.9}Ni_{0.1}O_9$ | 204 | 8.2 | 1.4 |
| $Bi_2Pb_{0.2}Ba_{1.8}Ce_{0.2}Co_{1.9}Ni_{0.1}O_9$ | 197 | 7.9 | 1.1 |
| $Bi_2Pb_{0.2}Ba_{1.8}Pr_{0.2}Co_{1.9}Ni_{0.1}O_9$ | 190 | 9.1 | 1 |

TABLE 46

| | | | |
|---|---|---|---|
| $Bi_2Pb_{0.2}Ba_{1.8}Nd_{0.2}Co_{1.9}Ni_{0.1}O_9$ | 198 | 8.4 | 1.3 |
| $Bi_2Pb_{0.2}Ba_{1.8}Sm_{0.2}Co_{1.9}Ni_{0.1}O_9$ | 199 | 8.6 | 0.9 |
| $Bi_2Pb_{0.2}Ba_{1.8}Eu_{0.2}Co_{1.9}Ni_{0.1}O_9$ | 201 | 7.8 | 1.1 |
| $Bi_2Pb_{0.2}Ba_{1.8}Gd_{0.2}Co_{1.9}Ni_{0.1}O_9$ | 207 | 9 | 1.4 |
| $Bi_2Pb_{0.2}Ba_{1.8}Dy_{0.2}Co_{1.9}Ni_{0.1}O_9$ | 190 | 8.2 | 1.2 |
| $Bi_2Pb_{0.2}Ba_{1.8}Ho_{0.2}Co_{1.9}Ni_{0.1}O_9$ | 198 | 8.3 | 0.9 |
| $Bi_2Pb_{0.2}Ba_{1.8}Er_{0.2}Co_{1.9}Ni_{0.1}O_9$ | 199 | 8.6 | 1.1 |
| $Bi_2Pb_{0.2}Ba_{1.8}Yb_{0.2}Co_{1.9}Ni_{0.1}O_9$ | 201 | 8.7 | 1.2 |
| $Bi_2Sr_2Co_{1.9}Cu_{0.1}O_9$ | 206 | 9 | 1.1 |
| $Bi_2Sr_{1.8}Na_{0.2}Co_{1.9}Cu_{0.1}O_9$ | 205 | 7.9 | 1.2 |
| $Bi_2Sr_{1.8}K_{0.2}Co_{1.9}Cu_{0.1}O_9$ | 198 | 8.1 | 1.4 |
| $Bi_2Sr_{1.8}Li_{0.2}Co_{1.9}Cu_{0.1}O_9$ | 195 | 8 | 0.8 |
| $Bi_2Sr_{1.8}Ti_{0.2}Co_{1.9}Cu_{0.1}O_9$ | 200 | 7.8 | 1.3 |
| $Bi_2Sr_{1.8}V_{0.2}Co_{1.9}Cu_{0.1}O_9$ | 203 | 7.2 | 1.2 |
| $Bi_2Sr_{1.8}Cr_{0.2}Co_{1.9}Cu_{0.1}O_9$ | 201 | 9 | 1.1 |
| $Bi_2Sr_{1.8}Mn_{0.2}Co_{1.9}Cu_{0.1}O_9$ | 208 | 8.2 | 0.8 |
| $Bi_2Sr_{1.8}Fe_{0.2}Co_{1.9}Cu_{0.1}O_9$ | 198 | 7.9 | 0.7 |
| $Bi_2Sr_{1.8}Ni_{0.2}Co_{1.9}Cu_{0.1}O_9$ | 199 | 6.9 | 1.3 |
| $Bi_2Sr_{1.8}Cu_{0.2}Co_{1.9}Cu_{0.1}O_9$ | 200 | 8.1 | 0.8 |
| $Bi_2Sr_{1.8}Zn_{0.2}Co_{1.9}Cu_{0.1}O_9$ | 206 | 6.9 | 1.3 |
| $Bi_2Sr_{1.8}Pb_{0.2}Co_{1.9}Cu_{0.1}O_9$ | 205 | 7.4 | 1.2 |
| $Bi_2Sr_{1.8}Ca_{0.2}Co_{1.9}Cu_{0.1}O_9$ | 198 | 7.8 | 1.1 |
| $Bi_2Sr_{1.8}Ba_{0.2}Co_{1.9}Cu_{0.1}O_9$ | 206 | 7.7 | 0.8 |
| $Bi_2Sr_{1.8}Al_{0.2}Co_{1.9}Cu_{0.1}O_9$ | 198 | 8 | 1.3 |
| $Bi_2Sr_{1.8}Y_{0.2}Co_{1.9}Cu_{0.1}O_9$ | 207 | 8.2 | 1.4 |
| $Bi_2Sr_{1.8}La_{0.2}Co_{1.9}Cu_{0.1}O_9$ | 190 | 7.9 | 1.1 |
| $Bi_2Sr_{1.8}Ce_{0.2}Co_{1.9}Cu_{0.1}O_9$ | 198 | 9.1 | 1 |
| $Bi_2Sr_{1.8}Pr_{0.2}Co_{1.9}Cu_{0.1}O_9$ | 199 | 8.4 | 1.3 |
| $Bi_2Sr_{1.8}Nd_{0.2}Co_{1.9}Cu_{0.1}O_9$ | 201 | 8.6 | 0.9 |
| $Bi_2Sr_{1.8}Sm_{0.2}Co_{1.9}Cu_{0.1}O_9$ | 210 | 8.2 | 1.1 |
| $Bi_2Sr_{1.8}Eu_{0.2}Co_{1.9}Cu_{0.1}O_9$ | 206 | 7.9 | 1.4 |
| $Bi_2Sr_{1.8}Gd_{0.2}Co_{1.9}Cu_{0.1}O_9$ | 205 | 8.6 | 1.2 |
| $Bi_2Sr_{1.8}Dy_{0.2}Co_{1.9}Cu_{0.1}O_9$ | 198 | 9.1 | 0.9 |
| $Bi_2Sr_{1.8}Ho_{0.2}Co_{1.9}Cu_{0.1}O_9$ | 195 | 6.9 | 1.1 |
| $Bi_2Sr_{1.8}Er_{0.2}Co_{1.9}Cu_{0.1}O_9$ | 200 | 7.4 | 1.2 |
| $Bi_2Sr_{1.8}Yb_{0.2}Co_{1.9}Cu_{0.1}O_9$ | 203 | 7.8 | 0.9 |

TABLE 47

| | | | |
|---|---|---|---|
| $Bi_2Pb_{0.2}Sr_2Co_{1.9}Cu_{0.1}O_9$ | 208 | 8.0 | 1.2 |
| $Bi_2Pb_{0.2}Sr_{1.8}Na_{0.2}Co_{1.9}Cu_{0.1}O_9$ | 198 | 8.2 | 1.4 |
| $Bi_2Pb_{0.2}Sr_{1.8}K_{0.2}Co_{1.9}Cu_{0.1}O_9$ | 199 | 7.9 | 0.8 |
| $Bi_2Pb_{0.2}Sr_{1.8}Li_{0.2}Co_{1.9}Cu_{0.1}O_9$ | 200 | 9.1 | 1.3 |
| $Bi_2Pb_{0.2}Sr_{1.8}Ti_{0.2}Co_{1.9}Cu_{0.1}O_9$ | 206 | 8.4 | 1.2 |
| $Bi_2Pb_{0.2}Sr_{1.8}V_{0.2}Co_{1.9}Cu_{0.1}O_9$ | 206 | 8.6 | 1.1 |
| $Bi_2Pb_{0.2}Sr_{1.8}Cr_{0.2}Co_{1.9}Cu_{0.1}O_9$ | 205 | 7.8 | 1.4 |
| $Bi_2Pb_{0.2}Sr_{1.8}Mn_{0.2}Co_{1.9}Cu_{0.1}O_9$ | 198 | 9 | 1.2 |
| $Bi_2Pb_{0.2}Sr_{1.8}Fe_{0.2}Co_{1.9}Cu_{0.1}O_9$ | 195 | 8.2 | 0.9 |
| $Bi_2Pb_{0.2}Sr_{1.8}Ni_{0.2}Co_{1.9}Cu_{0.1}O_9$ | 200 | 8.3 | 1.1 |
| $Bi_2Pb_{0.2}Sr_{1.8}Cu_{0.2}Co_{1.9}Cu_{0.1}O_9$ | 203 | 8.6 | 1.2 |
| $Bi_2Pb_{0.2}Sr_{1.8}Zn_{0.2}Co_{1.9}Cu_{0.1}O_9$ | 201 | 8.7 | 0.9 |
| $Bi_2Pb_{0.2}Sr_{1.8}Pb_{0.2}Co_{1.9}Cu_{0.1}O_9$ | 208 | 8.3 | 1.1 |
| $Bi_2Pb_{0.2}Sr_{1.8}Ca_{0.2}Co_{1.9}Cu_{0.1}O_9$ | 198 | 9 | 1.2 |
| $Bi_2Pb_{0.2}Sr_{1.8}Ba_{0.2}Co_{1.9}Cu_{0.1}O_9$ | 199 | 7.9 | 1.4 |
| $Bi_2Pb_{0.2}Sr_{1.8}Al_{0.2}Co_{1.9}Cu_{0.1}O_9$ | 200 | 8.1 | 0.8 |
| $Bi_2Pb_{0.2}Sr_{1.8}Y_{0.2}Co_{1.9}Cu_{0.1}O_9$ | 206 | 8 | 1.3 |
| $Bi_2Pb_{0.2}Sr_{1.8}La_{0.2}Co_{1.9}Cu_{0.1}O_9$ | 205 | 7.8 | 1.2 |
| $Bi_2Pb_{0.2}Sr_{1.8}Ce_{0.2}Co_{1.9}Cu_{0.1}O_9$ | 198 | 7.2 | 1.1 |
| $Bi_2Pb_{0.2}Sr_{1.8}Pr_{0.2}Co_{1.9}Cu_{0.1}O_9$ | 206 | 9 | 0.8 |
| $Bi_2Pb_{0.2}Sr_{1.8}Nd_{0.2}Co_{1.9}Cu_{0.1}O_9$ | 198 | 7.8 | 1.3 |
| $Bi_2Pb_{0.2}Sr_{1.8}Sm_{0.2}Co_{1.9}Cu_{0.1}O_9$ | 207 | 7.5 | 1.4 |
| $Bi_2Pb_{0.2}Sr_{1.8}Eu_{0.2}Co_{1.9}Cu_{0.1}O_9$ | 190 | 8.6 | 1.1 |
| $Bi_2Pb_{0.2}Sr_{1.8}Gd_{0.2}Co_{1.9}Cu_{0.1}O_9$ | 198 | 8.2 | 1 |
| $Bi_2Pb_{0.2}Sr_{1.8}Dy_{0.2}Co_{1.9}Cu_{0.1}O_9$ | 199 | 7.9 | 1.3 |
| $Bi_2Pb_{0.2}Sr_{1.8}Ho_{0.2}Co_{1.9}Cu_{0.1}O_9$ | 201 | 6.9 | 0.9 |
| $Bi_2Pb_{0.2}Sr_{1.8}Er_{0.2}Co_{1.9}Cu_{0.1}O_9$ | 210 | 9 | 1.1 |
| $Bi_2Pb_{0.2}Sr_{1.8}Yb_{0.2}Co_{1.9}Cu_{0.1}O_9$ | 206 | 7.8 | 1.4 |
| $Bi_2Ca_2Co_{1.9}Cu_{0.1}O_9$ | 198 | 8.6 | 0.9 |
| $Bi_2Ca_{1.8}Na_{0.2}Co_{1.9}Cu_{0.1}O_9$ | 195 | 8.2 | 1.1 |
| $Bi_2Ca_{1.8}K_{0.2}Co_{1.9}Cu_{0.1}O_9$ | 200 | 7.9 | 1.2 |
| $Bi_2Ca_{1.8}Li_{0.2}Co_{1.9}Cu_{0.1}O_9$ | 203 | 6.9 | 0.9 |
| $Bi_2Ca_{1.8}Ti_{0.2}Co_{1.9}Cu_{0.1}O_9$ | 201 | 8.1 | 1.1 |
| $Bi_2Ca_{1.8}V_{0.2}Co_{1.9}Cu_{0.1}O_9$ | 208 | 6.9 | 1.2 |
| $Bi_2Ca_{1.8}Cr_{0.2}Co_{1.9}Cu_{0.1}O_9$ | 198 | 7.4 | 1 |

TABLE 48

| | | | |
|---|---|---|---|
| $Bi_2Ca_{1.8}Mn_{0.2}Co_{1.9}Cu_{0.1}O_9$ | 199 | 7.8 | 1.3 |
| $Bi_2Ca_{1.8}Fe_{0.2}Co_{1.9}Cu_{0.1}O_9$ | 200 | 7.7 | 1 |
| $Bi_2Ca_{1.8}Ni_{0.2}Co_{1.9}Cu_{0.1}O_9$ | 206 | 8 | 0.9 |
| $Bi_2Ca_{1.8}Cu_{0.2}Co_{1.9}Cu_{0.1}O_9$ | 205 | 8.2 | 1.1 |
| $Bi_2Ca_{1.8}Zn_{0.2}Co_{1.9}Cu_{0.1}O_9$ | 198 | 7.9 | 1 |
| $Bi_2Ca_{1.8}Pb_{0.2}Co_{1.9}Cu_{0.1}O_9$ | 199 | 9.1 | 1.2 |
| $Bi_2Ca_{1.8}Sr_{0.2}Co_{1.9}Cu_{0.1}O_9$ | 200 | 8.4 | 1.1 |
| $Bi_2Ca_{1.8}Ba_{0.2}Co_{1.9}Cu_{0.1}O_9$ | 199 | 8.6 | 0.9 |
| $Bi_2Ca_{1.8}Al_{0.2}Co_{1.9}Cu_{0.1}O_9$ | 210 | 8.2 | 0.8 |
| $Bi_2Ca_{1.8}Y_{0.2}Co_{1.9}Cu_{0.1}O_9$ | 202 | 7.9 | 1 |
| $Bi_2Ca_{1.8}La_{0.2}Co_{1.9}Cu_{0.1}O_9$ | 204 | 8.6 | 1.3 |
| $Bi_2Ca_{1.8}Ce_{0.2}Co_{1.9}Cu_{0.1}O_9$ | 197 | 9.1 | 1.2 |
| $Bi_2Ca_{1.8}Pr_{0.2}Co_{1.9}Cu_{0.1}O_9$ | 190 | 6.9 | 1.3 |
| $Bi_2Ca_{1.8}Nd_{0.2}Co_{1.9}Cu_{0.1}O_9$ | 198 | 7.4 | 1 |
| $Bi_2Ca_{1.8}Sm_{0.2}Co_{1.9}Cu_{0.1}O_9$ | 199 | 7.8 | 0.8 |
| $Bi_2Ca_{1.8}Eu_{0.2}Co_{1.9}Cu_{0.1}O_9$ | 201 | 7.7 | 1.1 |
| $Bi_2Ca_{1.8}Gd_{0.2}Co_{1.9}Cu_{0.1}O_9$ | 207 | 8 | 1.2 |
| $Bi_2Ca_{1.8}Dy_{0.2}Co_{1.9}Cu_{0.1}O_9$ | 190 | 8.2 | 0.9 |
| $Bi_2Ca_{1.8}Ho_{0.2}Co_{1.9}Cu_{0.1}O_9$ | 198 | 7.9 | 1.1 |
| $Bi_2Ca_{1.8}Er_{0.2}Co_{1.9}Cu_{0.1}O_9$ | 199 | 9.1 | 1.2 |
| $Bi_2Ca_{1.8}Yb_{0.2}Co_{1.9}Cu_{0.1}O_9$ | 201 | 8.4 | 1.4 |
| $Bi_2Pb_{0.2}Ca_2Co_{1.9}Cu_{0.1}O_9$ | 206 | 7.8 | 1.3 |
| $Bi_2Pb_{0.2}Ca_{1.8}Na_{0.2}Co_{1.9}Cu_{0.1}O_9$ | 205 | 9 | 1.2 |
| $Bi_2Pb_{0.2}Ca_{1.8}K_{0.2}Co_{1.9}Cu_{0.1}O_9$ | 198 | 8.2 | 1.1 |
| $Bi_2Pb_{0.2}Ca_{1.8}Li_{0.2}Co_{1.9}Cu_{0.1}O_9$ | 195 | 9.1 | 0.8 |
| $Bi_2Pb_{0.2}Ca_{1.8}Ti_{0.2}Co_{1.9}Cu_{0.1}O_9$ | 200 | 8.4 | 1.3 |
| $Bi_2Pb_{0.2}Ca_{1.8}V_{0.2}Co_{1.9}Cu_{0.1}O_9$ | 203 | 8.6 | 1.4 |
| $Bi_2Pb_{0.2}Ca_{1.8}Cr_{0.2}Co_{1.9}Cu_{0.1}O_9$ | 200 | 7.8 | 1.1 |
| $Bi_2Pb_{0.2}Ca_{1.8}Mn_{0.2}Co_{1.9}Cu_{0.1}O_9$ | 203 | 9 | 1 |
| $Bi_2Pb_{0.2}Ca_{1.8}Fe_{0.2}Co_{1.9}Cu_{0.1}O_9$ | 201 | 8.2 | 1.3 |
| $Bi_2Pb_{0.2}Ca_{1.8}Ni_{0.2}Co_{1.9}Cu_{0.1}O_9$ | 208 | 8.3 | 0.9 |
| $Bi_2Pb_{0.2}Ca_{1.8}Cu_{0.2}Co_{1.9}Cu_{0.1}O_9$ | 198 | 8.6 | 1.1 |
| $Bi_2Pb_{0.2}Ca_{1.8}Zn_{0.2}Co_{1.9}Cu_{0.1}O_9$ | 199 | 8.7 | 1.4 |
| $Bi_2Pb_{0.2}Ca_{1.8}Pb_{0.2}Co_{1.9}Cu_{0.1}O_9$ | 200 | 8.3 | 1.2 |
| $Bi_2Pb_{0.2}Ca_{1.8}Sr_{0.2}Co_{1.9}Cu_{0.1}O_9$ | 206 | 9 | 0.9 |
| $Bi_2Pb_{0.2}Ca_{1.8}Ba_{0.2}Co_{1.9}Cu_{0.1}O_9$ | 205 | 7.9 | 1.1 |

TABLE 49

| | | | |
|---|---|---|---|
| $Bi_2Pb_{0.2}Ca_{1.8}Al_{0.2}Co_{1.9}Cu_{0.1}O_9$ | 198 | 8.1 | 1.2 |
| $Bi_2Pb_{0.2}Ca_{1.8}Y_{0.2}Co_{1.9}Cu_{0.1}O_9$ | 206 | 8 | 0.9 |
| $Bi_2Pb_{0.2}Ca_{1.8}La_{0.2}Co_{1.9}Cu_{0.1}O_9$ | 198 | 7.8 | 1.1 |
| $Bi_2Pb_{0.2}Ca_{1.8}Ce_{0.2}Co_{1.9}Cu_{0.1}O_9$ | 207 | 7.2 | 1.2 |
| $Bi_2Pb_{0.2}Ca_{1.8}Pr_{0.2}Co_{1.9}Cu_{0.1}O_9$ | 190 | 9 | 1.4 |
| $Bi_2Pb_{0.2}Ca_{1.8}Nd_{0.2}Co_{1.9}Cu_{0.1}O_9$ | 198 | 8.2 | 0.8 |
| $Bi_2Pb_{0.2}Ca_{1.8}Sm_{0.2}Co_{1.9}Cu_{0.1}O_9$ | 199 | 7.9 | 1.3 |
| $Bi_2Pb_{0.2}Ca_{1.8}Eu_{0.2}Co_{1.9}Cu_{0.1}O_9$ | 201 | 6.9 | 1.2 |
| $Bi_2Pb_{0.2}Ca_{1.8}Gd_{0.2}Co_{1.9}Cu_{0.1}O_9$ | 210 | 8.1 | 1.1 |
| $Bi_2Pb_{0.2}Ca_{1.8}Dy_{0.2}Co_{1.9}Cu_{0.1}O_9$ | 206 | 6.9 | 1.4 |
| $Bi_2Pb_{0.2}Ca_{1.8}Ho_{0.2}Co_{1.9}Cu_{0.1}O_9$ | 205 | 7.4 | 1.2 |
| $Bi_2Pb_{0.2}Ca_{1.8}Er_{0.2}Co_{1.9}Cu_{0.1}O_9$ | 198 | 7.8 | 0.9 |
| $Bi_2Pb_{0.2}Ca_{1.8}Yb_{0.2}Co_{1.9}Cu_{0.1}O_9$ | 195 | 7.7 | 1.1 |
| $Bi_2Ba_2Co_{1.9}Cu_{0.1}O_9$ | 203 | 8.2 | 0.9 |
| $Bi_2Ba_{1.8}Na_{0.2}Co_{1.9}Cu_{0.1}O_9$ | 201 | 7.9 | 1.1 |
| $Bi_2Ba_{1.8}K_{0.2}Co_{1.9}Cu_{0.1}O_9$ | 208 | 9.1 | 1.2 |
| $Bi_2Ba_{1.8}Li_{0.2}Co_{1.9}Cu_{0.1}O_9$ | 198 | 8.4 | 1.4 |
| $Bi_2Ba_{1.8}Ti_{0.2}Co_{1.9}Cu_{0.1}O_9$ | 199 | 8.6 | 0.8 |
| $Bi_2Ba_{1.8}V_{0.2}Co_{1.9}Cu_{0.1}O_9$ | 200 | 8.2 | 1.3 |
| $Bi_2Ba_{1.8}Cr_{0.2}Co_{1.9}Cu_{0.1}O_9$ | 206 | 7.9 | 1.2 |
| $Bi_2Ba_{1.8}Mn_{0.2}Co_{1.9}Cu_{0.1}O_9$ | 206 | 8.6 | 1.1 |
| $Bi_2Ba_{1.8}Fe_{0.2}Co_{1.9}Cu_{0.1}O_9$ | 198 | 9.1 | 0.8 |
| $Bi_2Ba_{1.8}Ni_{0.2}Co_{1.9}Cu_{0.1}O_9$ | 199 | 6.9 | 1.3 |
| $Bi_2Ba_{1.8}Cu_{0.2}Co_{1.9}Cu_{0.1}O_9$ | 200 | 7.4 | 1.4 |
| $Bi_2Ba_{1.8}Zn_{0.2}Co_{1.9}Cu_{0.1}O_9$ | 206 | 7.8 | 1.1 |
| $Bi_2Ba_{1.8}Pb_{0.2}Co_{1.9}Cu_{0.1}O_9$ | 205 | 7.7 | 1 |
| $Bi_2Ba_{1.8}Ca_{0.2}Co_{1.9}Cu_{0.1}O_9$ | 198 | 8 | 1.3 |
| $Bi_2Ba_{1.8}Sr_{0.2}Co_{1.9}Cu_{0.1}O_9$ | 199 | 8.2 | 0.9 |
| $Bi_2Ba_{1.8}Al_{0.2}Co_{1.9}Cu_{0.1}O_9$ | 200 | 7.9 | 1.2 |
| $Bi_2Ba_{1.8}Y_{0.2}Co_{1.9}Cu_{0.1}O_9$ | 199 | 9.1 | 1.4 |
| $Bi_2Ba_{1.8}La_{0.2}Co_{1.9}Cu_{0.1}O_9$ | 210 | 8.4 | 1.2 |
| $Bi_2Ba_{1.8}Ce_{0.2}Co_{1.9}Cu_{0.1}O_9$ | 202 | 8.6 | 0.9 |
| $Bi_2Ba_{1.8}Pr_{0.2}Co_{1.9}Cu_{0.1}O_9$ | 204 | 7.8 | 1.1 |
| $Bi_2Ba_{1.8}Nd_{0.2}Co_{1.9}Cu_{0.1}O_9$ | 197 | 9 | 1.2 |
| $Bi_2Ba_{1.8}Sm_{0.2}Co_{1.9}Cu_{0.1}O_9$ | 190 | 8.2 | 0.9 |
| $Bi_2Ba_{1.8}Eu_{0.2}Co_{1.9}Cu_{0.1}O_9$ | 198 | 8.3 | 1.1 |

TABLE 50

| | | | |
|---|---|---|---|
| $Bi_2Ba_{1.8}Gd_{0.2}Co_{1.9}Cu_{0.1}O_9$ | 199 | 8.4 | 1.2 |
| $Bi_2Ba_{1.8}Dy_{0.2}Co_{1.9}Cu_{0.1}O_9$ | 201 | 6.9 | 1 |
| $Bi_2Ba_{1.8}Ho_{0.2}Co_{1.9}Cu_{0.1}O_9$ | 207 | 8.1 | 1.3 |
| $Bi_2Ba_{1.8}Er_{0.2}Co_{1.9}Cu_{0.1}O_9$ | 190 | 6.9 | 1 |
| $Bi_2Ba_{1.8}Yb_{0.2}Co_{1.9}Cu_{0.1}O_9$ | 198 | 7.4 | 0.9 |
| $Bi_2Pb_{0.2}Ba_2Co_{1.9}Cu_{0.1}O_9$ | 201 | 7.7 | 1 |
| $Bi_2Pb_{0.2}Ba_{1.8}Na_{0.2}Co_{1.9}Cu_{0.1}O_9$ | 210 | 8 | 1.2 |
| $Bi_2Pb_{0.2}Ba_{1.8}K_{0.2}Co_{1.9}Cu_{0.1}O_9$ | 206 | 8.2 | 1.1 |
| $Bi_2Pb_{0.2}Ba_{1.8}Li_{0.2}Co_{1.9}Cu_{0.1}O_9$ | 205 | 7.9 | 0.9 |
| $Bi_2Pb_{0.2}Ba_{1.8}Ti_{0.2}Co_{1.9}Cu_{0.1}O_9$ | 198 | 9.1 | 0.8 |
| $Bi_2Pb_{0.2}Ba_{1.8}V_{0.2}Co_{1.9}Cu_{0.1}O_9$ | 195 | 8.4 | 1 |
| $Bi_2Pb_{0.2}Ba_{1.8}Cr_{0.2}Co_{1.9}Cu_{0.1}O_9$ | 200 | 8.6 | 1.3 |
| $Bi_2Pb_{0.2}Ba_{1.8}Mn_{0.2}Co_{1.9}Cu_{0.1}O_9$ | 203 | 8.2 | 1.2 |
| $Bi_2Pb_{0.2}Ba_{1.8}Fe_{0.2}Co_{1.9}Cu_{0.1}O_9$ | 200 | 7.9 | 1.3 |
| $Bi_2Pb_{0.2}Ba_{1.8}Ni_{0.2}Co_{1.9}Cu_{0.1}O_9$ | 203 | 8.6 | 0.9 |
| $Bi_2Pb_{0.2}Ba_{1.8}Cu_{0.2}Co_{1.9}Cu_{0.1}O_9$ | 201 | 9.1 | 1.1 |
| $Bi_2Pb_{0.2}Ba_{1.8}Zn_{0.2}Co_{1.9}Cu_{0.1}O_9$ | 208 | 6.9 | 1.4 |
| $Bi_2Pb_{0.2}Ba_{1.8}Pb_{0.2}Co_{1.9}Cu_{0.1}O_9$ | 198 | 7.4 | 1.2 |
| $Bi_2Pb_{0.2}Ba_{1.8}Ca_{0.2}Co_{1.9}Cu_{0.1}O_9$ | 199 | 7.8 | 0.9 |
| $Bi_2Pb_{0.2}Ba_{1.8}Sr_{0.2}Co_{1.9}Cu_{0.1}O_9$ | 200 | 7.7 | 1.1 |
| $Bi_2Pb_{0.2}Ba_{1.8}Al_{0.2}Co_{1.9}Cu_{0.1}O_9$ | 206 | 8 | 1.2 |
| $Bi_2Pb_{0.2}Ba_{1.8}Y_{0.2}Co_{1.9}Cu_{0.1}O_9$ | 205 | 8.2 | 0.9 |
| $Bi_2Pb_{0.2}Ba_{1.8}La_{0.2}Co_{1.9}Cu_{0.1}O_9$ | 198 | 7.9 | 1.1 |
| $Bi_2Pb_{0.2}Ba_{1.8}Ce_{0.2}Co_{1.9}Cu_{0.1}O_9$ | 206 | 9.1 | 1.2 |
| $Bi_2Pb_{0.2}Ba_{1.8}Pr_{0.2}Co_{1.9}Cu_{0.1}O_9$ | 198 | 8.4 | 1 |
| $Bi_2Pb_{0.2}Ba_{1.8}Nd_{0.2}Co_{1.9}Cu_{0.1}O_9$ | 207 | 8.6 | 1.3 |
| $Bi_2Pb_{0.2}Ba_{1.8}Sm_{0.2}Co_{1.9}Cu_{0.1}O_9$ | 190 | 7.8 | 1 |
| $Bi_2Pb_{0.2}Ba_{1.8}Eu_{0.2}Co_{1.9}Cu_{0.1}O_9$ | 198 | 9 | 0.9 |
| $Bi_2Pb_{0.2}Ba_{1.8}Gd_{0.2}Co_{1.9}Cu_{0.1}O_9$ | 199 | 8.2 | 1.1 |
| $Bi_2Pb_{0.2}Ba_{1.8}Dy_{0.2}Co_{1.9}Cu_{0.1}O_9$ | 201 | 9.1 | 1 |
| $Bi_2Pb_{0.2}Ba_{1.8}Ho_{0.2}Co_{1.9}Cu_{0.1}O_9$ | 210 | 8.4 | 1.2 |
| $Bi_2Pb_{0.2}Ba_{1.8}Er_{0.2}Co_{1.9}Cu_{0.1}O_9$ | 206 | 8.6 | 1.1 |
| $Bi_2Pb_{0.2}Ba_{1.8}Yb_{0.2}Co_{1.9}Cu_{0.1}O_9$ | 205 | 7.8 | 0.9 |
| $Bi_2Sr_2Co_{1.9}Ag_{0.1}O_9$ | 195 | 8.2 | 1 |
| $Bi_2Sr_{1.8}Na_{0.2}Co_{1.9}Ag_{0.1}O_9$ | 200 | 8.3 | 1.3 |

TABLE 51

| | | | |
|---|---|---|---|
| $Bi_2Sr_{1.8}K_{0.2}Co_{1.9}Ag_{0.1}O_9$ | 203 | 8.6 | 1.2 |
| $Bi_2Sr_{1.8}Li_{0.2}Co_{1.9}Ag_{0.1}O_9$ | 201 | 8.7 | 0.7 |
| $Bi_2Sr_{1.8}Ti_{0.2}Co_{1.9}Ag_{0.1}O_9$ | 208 | 8.3 | 1.3 |
| $Bi_2Sr_{1.8}V_{0.2}Co_{1.9}Ag_{0.1}O_9$ | 198 | 9 | 1.4 |
| $Bi_2Sr_{1.8}Cr_{0.2}Co_{1.9}Ag_{0.1}O_9$ | 206 | 7.9 | 1.1 |
| $Bi_2Sr_{1.8}Mn_{0.2}Co_{1.9}Ag_{0.1}O_9$ | 198 | 8.1 | 1 |
| $Bi_2Sr_{1.8}Fe_{0.2}Co_{1.9}Ag_{0.1}O_9$ | 207 | 8 | 1.3 |
| $Bi_2Sr_{1.8}Ni_{0.2}Co_{1.9}Ag_{0.1}O_9$ | 190 | 7.8 | 0.9 |
| $Bi_2Sr_{1.8}Cu_{0.2}Co_{1.9}Ag_{0.1}O_9$ | 198 | 7.2 | 1.1 |
| $Bi_2Sr_{1.8}Zn_{0.2}Co_{1.9}Ag_{0.1}O_9$ | 199 | 9 | 1.4 |
| $Bi_2Sr_{1.8}Pb_{0.2}Co_{1.9}Ag_{0.1}O_9$ | 201 | 8.2 | 1.2 |
| $Bi_2Sr_{1.8}Ca_{0.2}Co_{1.9}Ag_{0.1}O_9$ | 210 | 7.9 | 0.9 |
| $Bi_2Sr_{1.8}Ba_{0.2}Co_{1.9}Ag_{0.1}O_9$ | 206 | 6.9 | 1.1 |
| $Bi_2Sr_{1.8}Al_{0.2}Co_{1.9}Ag_{0.1}O_9$ | 205 | 8.1 | 1.2 |
| $Bi_2Sr_{1.8}Y_{0.2}Co_{1.9}Ag_{0.1}O_9$ | 198 | 6.9 | 0.9 |
| $Bi_2Sr_{1.8}La_{0.2}Co_{1.9}Ag_{0.1}O_9$ | 195 | 7.4 | 1.1 |
| $Bi_2Sr_{1.8}Ce_{0.2}Co_{1.9}Ag_{0.1}O_9$ | 200 | 7.8 | 1.2 |
| $Bi_2Sr_{1.8}Pr_{0.2}Co_{1.9}Ag_{0.1}O_9$ | 203 | 7.7 | 1.4 |
| $Bi_2Sr_{1.8}Nd_{0.2}Co_{1.9}Ag_{0.1}O_9$ | 201 | 8 | 0.8 |
| $Bi_2Sr_{1.8}Sm_{0.2}Co_{1.9}Ag_{0.1}O_9$ | 208 | 8.2 | 1.3 |
| $Bi_2Sr_{1.8}Eu_{0.2}Co_{1.9}Ag_{0.1}O_9$ | 198 | 7.9 | 1.2 |
| $Bi_2Sr_{1.8}Gd_{0.2}Co_{1.9}Ag_{0.1}O_9$ | 199 | 9.1 | 1.1 |
| $Bi_2Sr_{1.8}Dy_{0.2}Co_{1.9}Ag_{0.1}O_9$ | 200 | 8.4 | 0.8 |
| $Bi_2Sr_{1.8}Ho_{0.2}Co_{1.9}Ag_{0.1}O_9$ | 206 | 8.6 | 1.3 |
| $Bi_2Sr_{1.8}Er_{0.2}Co_{1.9}Ag_{0.1}O_9$ | 206 | 8.2 | 1.4 |
| $Bi_2Sr_{1.8}Yb_{0.2}Co_{1.9}Ag_{0.1}O_9$ | 198 | 7.9 | 1.1 |
| $Bi_2Pb_{0.2}Sr_2Co_{1.9}Ag_{0.1}O_9$ | 200 | 9.1 | 1.3 |
| $Bi_2Pb_{0.2}Sr_{1.8}Na_{0.2}Co_{1.9}Ag_{0.1}O_9$ | 206 | 6.9 | 0.9 |
| $Bi_2Pb_{0.2}Sr_{1.8}K_{0.2}Co_{1.9}Ag_{0.1}O_9$ | 205 | 7.4 | 1.1 |
| $Bi_2Pb_{0.2}Sr_{1.8}Li_{0.2}Co_{1.9}Ag_{0.1}O_9$ | 198 | 7.8 | 1.4 |
| $Bi_2Pb_{0.2}Sr_{1.8}Ti_{0.2}Co_{1.9}Ag_{0.1}O_9$ | 199 | 7.7 | 1.2 |
| $Bi_2Pb_{0.2}Sr_{1.8}V_{0.2}Co_{1.9}Ag_{0.1}O_9$ | 200 | 8 | 0.9 |
| $Bi_2Pb_{0.2}Sr_{1.8}Cr_{0.2}Co_{1.9}Ag_{0.1}O_9$ | 199 | 8.2 | 1.1 |
| $Bi_2Pb_{0.2}Sr_{1.8}Mn_{0.2}Co_{1.9}Ag_{0.1}O_9$ | 210 | 7.9 | 1.2 |
| $Bi_2Pb_{0.2}Sr_{1.8}Fe_{0.2}Co_{1.9}Ag_{0.1}O_9$ | 202 | 9.1 | 0.9 |
| $Bi_2Pb_{0.2}Sr_{1.8}Ni_{0.2}Co_{1.9}Ag_{0.1}O_9$ | 204 | 8.4 | 1.1 |

TABLE 52

| | | | |
|---|---|---|---|
| $Bi_2Pb_{0.2}Sr_{1.8}Cu_{0.2}Co_{1.9}Ag_{0.1}O_9$ | 197 | 8.6 | 1.2 |
| $i_2Pb_{0.2}Sr_{1.8}Zn_{0.2}Co_{1.9}Ag_{0.1}O_9$ | 190 | 7.8 | 1.4 |
| $Bi_2Pb_{0.2}Sr_{1.8}Pb_{0.2}Co_{1.9}Ag_{0.1}O_9$ | 198 | 9 | 0.8 |
| $Bi_2Pb_{0.2}Sr_{1.8}Ca_{0.2}Co_{1.9}Ag_{0.1}O_9$ | 199 | 8.2 | 1.3 |
| $Bi_2Pb_{0.2}Sr_{1.8}Ba_{0.2}Co_{1.9}Ag_{0.1}O_9$ | 201 | 8.3 | 1.2 |
| $Bi_2Pb_{0.2}Sr_{1.8}Al_{0.2}Co_{1.9}Ag_{0.1}O_9$ | 207 | 8.4 | 1.1 |
| $Bi_2Pb_{0.2}Sr_{1.8}Y_{0.2}Co_{1.9}Ag_{0.1}O_9$ | 190 | 8.6 | 0.8 |
| $Bi_2Pb_{0.2}Sr_{1.8}La_{0.2}Co_{1.9}Ag_{0.1}O_9$ | 198 | 8.2 | 0.7 |
| $Bi_2Pb_{0.2}Sr_{1.8}Ce_{0.2}Co_{1.9}Ag_{0.1}O_9$ | 199 | 7.9 | 1.3 |
| $Bi_2Pb_{0.2}Sr_{1.8}Pr_{0.2}Co_{1.9}Ag_{0.1}O_9$ | 201 | 8.6 | 0.8 |
| $Bi_2Pb_{0.2}Sr_{1.8}Nd_{0.2}Co_{1.9}Ag_{0.1}O_9$ | 210 | 9.1 | 1.3 |
| $Bi_2Pb_{0.2}Sr_{1.8}Sm_{0.2}Co_{1.9}Ag_{0.1}O_9$ | 206 | 6.9 | 1.2 |
| $Bi_2Pb_{0.2}Sr_{1.8}Eu_{0.2}Co_{1.9}Ag_{0.1}O_9$ | 205 | 7.4 | 1.1 |
| $Bi_2Pb_{0.2}Sr_{1.8}Gd_{0.2}Co_{1.9}Ag_{0.1}O_9$ | 198 | 7.8 | 0.8 |
| $Bi_2Pb_{0.2}Sr_{1.8}Dy_{0.2}Co_{1.9}Ag_{0.1}O_9$ | 195 | 7.7 | 1.3 |
| $Bi_2Pb_{0.2}Sr_{1.8}Ho_{0.2}Co_{1.9}Ag_{0.1}O_9$ | 200 | 8 | 1.4 |
| $Bi_2Pb_{0.2}Sr_{1.8}Er_{0.2}Co_{1.9}Ag_{0.1}O_9$ | 203 | 8.2 | 1.1 |
| $Bi_2Pb_{0.2}Sr_{1.8}Yb_{0.2}Co_{1.9}Ag_{0.1}O_9$ | 200 | 7.9 | 1 |
| $Bi_2Ca_2Co_{1.9}Ag_{0.1}O_9$ | 201 | 8.4 | 0.9 |
| $Bi_2Ca_{1.8}Na_{0.2}Co_{1.9}Ag_{0.1}O_9$ | 208 | 8.6 | 1.1 |
| $Bi_2Ca_{1.8}K_{0.2}Co_{1.9}Ag_{0.1}O_9$ | 198 | 7.8 | 1.4 |
| $Bi_2Ca_{1.8}Li_{0.2}Co_{1.9}Ag_{0.1}O_9$ | 199 | 9 | 1.2 |
| $Bi_2Ca_{1.8}Ti_{0.2}Co_{1.9}Ag_{0.1}O_9$ | 200 | 8.2 | 0.9 |
| $Bi_2Ca_{1.8}V_{0.2}Co_{1.9}Ag_{0.1}O_9$ | 206 | 8.3 | 1.1 |
| $Bi_2Ca_{1.8}Cr_{0.2}Co_{1.9}Ag_{0.1}O_9$ | 205 | 8.6 | 1.2 |
| $Bi_2Ca_{1.8}Mn_{0.2}Co_{1.9}Ag_{0.1}O_9$ | 198 | 8.7 | 0.9 |
| $Bi_2Ca_{1.8}Fe_{0.2}Co_{1.9}Ag_{0.1}O_9$ | 206 | 8.3 | 1.1 |
| $Bi_2Ca_{1.8}Ni_{0.2}Co_{1.9}Ag_{0.1}O_9$ | 198 | 9 | 1.2 |
| $Bi_2Ca_{1.8}Cu_{0.2}Co_{1.9}Ag_{0.1}O_9$ | 207 | 7.9 | 1.4 |
| $Bi_2Ca_{1.8}Zn_{0.2}Co_{1.9}Ag_{0.1}O_9$ | 190 | 8.1 | 0.8 |
| $Bi_2Ca_{1.8}Pb_{0.2}Co_{1.9}Ag_{0.1}O_9$ | 198 | 8 | 1.3 |
| $Bi_2Ca_{1.8}Sr_{0.2}Co_{1.9}Ag_{0.1}O_9$ | 199 | 7.8 | 1.2 |
| $Bi_2Ca_{1.8}Ba_{0.2}Co_{1.9}Ag_{0.1}O_9$ | 201 | 7.2 | 1.1 |
| $Bi_2Ca_{1.8}Al_{0.2}Co_{1.9}Ag_{0.1}O_9$ | 210 | 9 | 1.4 |
| $Bi_2Ca_{1.8}Y_{0.2}Co_{1.9}Ag_{0.1}O_9$ | 206 | 8.2 | 1.2 |
| $Bi_2Ca_{1.8}La_{0.2}Co_{1.9}Ag_{0.1}O_9$ | 205 | 7.9 | 0.9 |

TABLE 53

| | | | |
|---|---|---|---|
| $Bi_2Ca_{1.8}Ce_{0.2}Co_{1.9}Ag_{0.1}O_9$ | 198 | 6.9 | 1.1 |
| $Bi_2Ca_{1.8}Pr_{0.2}Co_{1.9}Ag_{0.1}O_9$ | 195 | 8.1 | 1.2 |
| $Bi_2Ca_{1.8}Nd_{0.2}Co_{1.9}Ag_{0.1}O_9$ | 200 | 6.9 | 0.9 |
| $Bi_2Ca_{1.8}Sm_{0.2}Co_{1.9}Ag_{0.1}O_9$ | 203 | 7.4 | 1.1 |
| $Bi_2Ca_{1.8}Eu_{0.2}Co_{1.9}Ag_{0.1}O_9$ | 201 | 7.8 | 1.2 |
| $Bi_2Ca_{1.8}Gd_{0.2}Co_{1.9}Ag_{0.1}O_9$ | 208 | 7.7 | 1.4 |
| $Bi_2Ca_{1.8}Dy_{0.2}Co_{1.9}Ag_{0.1}O_9$ | 198 | 8 | 0.8 |
| $Bi_2Ca_{1.8}Ho_{0.2}Co_{1.9}Ag_{0.1}O_9$ | 199 | 8.2 | 1.3 |
| $Bi_2Ca_{1.8}Er_{0.2}Co_{1.9}Ag_{0.1}O_9$ | 200 | 7.9 | 1.2 |
| $Bi_2Ca_{1.8}Yb_{0.2}Co_{1.9}Ag_{0.1}O_9$ | 206 | 9.1 | 1.1 |
| $Bi_2Pb_{0.2}Ca_2Co_{1.9}Ag_{0.1}O_9$ | 198 | 8.6 | 1.3 |
| $Bi_2Pb_{0.2}Ca_{1.8}Na_{0.2}Co_{1.9}Ag_{0.1}O_9$ | 199 | 8.2 | 1.4 |
| $Bi_2Pb_{0.2}Ca_{1.8}K_{0.2}Co_{1.9}Ag_{0.1}O_9$ | 200 | 7.9 | 1.1 |
| $Bi_2Pb_{0.2}Ca_{1.8}Li_{0.2}Co_{1.9}Ag_{0.1}O_9$ | 206 | 8.6 | 1 |
| $Bi_2Pb_{0.2}Ca_{1.8}Ti_{0.2}Co_{1.9}Ag_{0.1}O_9$ | 205 | 9.1 | 1.3 |
| $Bi_2Pb_{0.2}Ca_{1.8}V_{0.2}Co_{1.9}Ag_{0.1}O_9$ | 198 | 6.9 | 0.9 |
| $Bi_2Pb_{0.2}Ca_{1.8}Cr_{0.2}Co_{1.9}Ag_{0.1}O_9$ | 199 | 7.4 | 1.1 |
| $Bi_2Pb_{0.2}Ca_{1.8}Mn_{0.2}Co_{1.9}Ag_{0.1}O_9$ | 200 | 7.8 | 1.4 |
| $Bi_2Pb_{0.2}Ca_{1.8}Fe_{0.2}Co_{1.9}Ag_{0.1}O_9$ | 199 | 7.7 | 1.2 |
| $Bi_2Pb_{0.2}Ca_{1.8}Ni_{0.2}Co_{1.9}Ag_{0.1}O_9$ | 210 | 8 | 0.9 |
| $Bi_2Pb_{0.2}Ca_{1.8}Cu_{0.2}Co_{1.9}Ag_{0.1}O_9$ | 202 | 8.2 | 1.1 |
| $Bi_2Pb_{0.2}Ca_{1.8}Zn_{0.2}Co_{1.9}Ag_{0.1}O_9$ | 204 | 7.9 | 1.2 |
| $Bi_2Pb_{0.2}Ca_{1.8}Pb_{0.2}Co_{1.9}Ag_{0.1}O_9$ | 197 | 9.1 | 0.9 |
| $Bi_2Pb_{0.2}Ca_{1.8}Sr_{0.2}Co_{1.9}Ag_{0.1}O_9$ | 190 | 8.4 | 1.1 |
| $Bi_2Pb_{0.2}Ca_{1.8}Ba_{0.2}Co_{1.9}Ag_{0.1}O_9$ | 198 | 8.6 | 1.2 |
| $Bi_2Pb_{0.2}Ca_{1.8}Al_{0.2}Co_{1.9}Ag_{0.1}O_9$ | 199 | 7.8 | 1 |
| $Bi_2Pb_{0.2}Ca_{1.8}Y_{0.2}Co_{1.9}Ag_{0.1}O_9$ | 201 | 9 | 1.3 |
| $Bi_2Pb_{0.2}Ca_{1.8}La_{0.2}Co_{1.9}Ag_{0.1}O_9$ | 207 | 8.2 | 1 |
| $Bi_2Pb_{0.2}Ca_{1.8}Ce_{0.2}Co_{1.9}Ag_{0.1}O_9$ | 190 | 8.3 | 0.9 |
| $Bi_2Pb_{0.2}Ca_{1.8}Pr_{0.2}Co_{1.9}Ag_{0.1}O_9$ | 198 | 8.6 | 1.1 |
| $Bi_2Pb_{0.2}Ca_{1.8}Nd_{0.2}Co_{1.9}Ag_{0.1}O_9$ | 199 | 8.7 | 1 |
| $Bi_2Pb_{0.2}Ca_{1.8}Sm_{0.2}Co_{1.9}Ag_{0.1}O_9$ | 201 | 8.3 | 1.2 |
| $Bi_2Pb_{0.2}Ca_{1.8}Eu_{0.2}Co_{1.9}Ag_{0.1}O_9$ | 210 | 9 | 1.4 |
| $Bi_2Pb_{0.2}Ca_{1.8}Gd_{0.2}Co_{1.9}Ag_{0.1}O_9$ | 206 | 7.9 | 0.9 |
| $Bi_2Pb_{0.2}Ca_{1.8}Dy_{0.2}Co_{1.9}Ag_{0.1}O_9$ | 205 | 8.1 | 0.8 |
| $Bi_2Pb_{0.2}Ca_{1.8}Ho_{0.2}Co_{1.9}Ag_{0.1}O_9$ | 198 | 8 | 1 |

TABLE 54

| | | | |
|---|---|---|---|
| $Bi_2Pb_{0.2}Ca_{1.8}Er_{0.2}Co_{1.9}Ag_{0.1}O_9$ | 195 | 7.8 | 1.3 |
| $Bi_2Pb_{0.2}Ca_{1.8}Yb_{0.2}Co_{1.9}Ag_{0.1}O_9$ | 200 | 7.2 | 1.2 |
| $Bi_2Ba_2Co_{1.9}Ag_{0.1}O_9$ | 200 | 7.8 | 1 |
| $Bi_2Ba_{1.8}Na_{0.2}Co_{1.9}Ag_{0.1}O_9$ | 203 | 7.5 | 1.3 |
| $Bi_2Ba_{1.8}K_{0.2}Co_{1.9}Ag_{0.1}O_9$ | 201 | 8.6 | 0.9 |
| $Bi_2Ba_{1.8}Li_{0.2}Co_{1.9}Ag_{0.1}O_9$ | 208 | 8.2 | 1.1 |
| $Bi_2Ba_{1.8}Ti_{0.2}Co_{1.9}Ag_{0.1}O_9$ | 198 | 7.9 | 1.4 |
| $Bi_2Ba_{1.8}V_{0.2}Co_{1.9}Ag_{0.1}O_9$ | 199 | 6.9 | 1.2 |
| $Bi_2Ba_{1.8}Cr_{0.2}Co_{1.9}Ag_{0.1}O_9$ | 200 | 9 | 0.9 |
| $Bi_2Ba_{1.8}Mn_{0.2}Co_{1.9}Ag_{0.1}O_9$ | 206 | 7.8 | 1.1 |
| $Bi_2Ba_{1.8}Fe_{0.2}Co_{1.9}Ag_{0.1}O_9$ | 205 | 7.5 | 1.2 |
| $Bi_2Ba_{1.8}Ni_{0.2}Co_{1.9}Ag_{0.1}O_9$ | 198 | 8.6 | 0.9 |
| $Bi_2Ba_{1.8}Cu_{0.2}Co_{1.9}Ag_{0.1}O_9$ | 206 | 8.2 | 1.1 |
| $Bi_2Ba_{1.8}Zn_{0.2}Co_{1.9}Ag_{0.1}O_9$ | 198 | 7.9 | 1.2 |
| $Bi_2Ba_{1.8}Pb_{0.2}Co_{1.9}Ag_{0.1}O_9$ | 207 | 6.9 | 1 |
| $Bi_2Ba_{1.8}Ca_{0.2}Co_{1.9}Ag_{0.1}O_9$ | 190 | 8.1 | 1.3 |
| $Bi_2Ba_{1.8}Sr_{0.2}Co_{1.9}Ag_{0.1}O_9$ | 190 | 6.9 | 1 |
| $Bi_2Ba_{1.8}Al_{0.2}Co_{1.9}Ag_{0.1}O_9$ | 198 | 7.4 | 0.9 |
| $Bi_2Ba_{1.8}Y_{0.2}Co_{1.9}Ag_{0.1}O_9$ | 199 | 7.8 | 1.1 |
| $Bi_2Ba_{1.8}La_{0.2}Co_{1.9}Ag_{0.1}O_9$ | 201 | 7.7 | 1 |
| $Bi_2Ba_{1.8}Ce_{0.2}Co_{1.9}Ag_{0.1}O_9$ | 210 | 8 | 1.2 |
| $Bi_2Ba_{1.8}Pr_{0.2}Co_{1.9}Ag_{0.1}O_9$ | 206 | 8.2 | 1.1 |
| $Bi_2Ba_{1.8}Nd_{0.2}Co_{1.9}Ag_{0.1}O_9$ | 205 | 7.9 | 0.9 |
| $Bi_2Ba_{1.8}Sm_{0.2}Co_{1.9}Ag_{0.1}O_9$ | 198 | 9.1 | 0.8 |
| $Bi_2Ba_{1.8}Eu_{0.2}Co_{1.9}Ag_{0.1}O_9$ | 195 | 8.4 | 1 |
| $Bi_2Ba_{1.8}Gd_{0.2}Co_{1.9}Ag_{0.1}O_9$ | 200 | 8.6 | 1.3 |
| $Bi_2Ba_{1.8}Dy_{0.2}Co_{1.9}Ag_{0.1}O_9$ | 203 | 8.2 | 1.2 |
| $Bi_2Ba_{1.8}Ho_{0.2}Co_{1.9}Ag_{0.1}O_9$ | 201 | 7.9 | 1.3 |
| $Bi_2Ba_{1.8}Er_{0.2}Co_{1.9}Ag_{0.1}O_9$ | 208 | 8.6 | 1 |
| $Bi_2Ba_{1.8}Yb_{0.2}Co_{1.9}Ag_{0.1}O_9$ | 198 | 9.1 | 0.8 |
| $Bi_2Pb_{0.2}Ba_2Co_{1.9}Ag_{0.1}O_9$ | 200 | 7.4 | 1.2 |
| $Bi_2Pb_{0.2}Ba_{1.8}Na_{0.2}Co_{1.9}Ag_{0.1}O_9$ | 206 | 7.8 | 0.9 |
| $Bi_2Pb_{0.2}Ba_{1.8}K_{0.2}Co_{1.9}Ag_{0.1}O_9$ | 206 | 7.7 | 1.1 |
| $Bi_2Pb_{0.2}Ba_{1.8}Li_{0.2}Co_{1.9}Ag_{0.1}O_9$ | 198 | 8 | 1.2 |
| $Bi_2Pb_{0.2}Ba_{1.8}Ti_{0.2}Co_{1.9}Ag_{0.1}O_9$ | 199 | 8.2 | 1.4 |

TABLE 55

| | | | |
|---|---|---|---|
| $Bi_2Pb_{0.2}Ba_{1.8}V_{0.2}Co_{1.9}Ag_{0.1}O_9$ | 200 | 7.9 | 0.8 |
| $Bi_2Pb_{0.2}Ba_{1.8}Cr_{0.2}Co_{1.9}Ag_{0.1}O_9$ | 206 | 9.1 | 1.3 |
| $Bi_2Pb_{0.2}Ba_{1.8}Mn_{0.2}Co_{1.9}Ag_{0.1}O_9$ | 205 | 8.4 | 1.2 |
| $Bi_2Pb_{0.2}Ba_{1.8}Fe_{0.2}Co_{1.9}Ag_{0.1}O_9$ | 198 | 8.6 | 1.1 |
| $Bi_2Pb_{0.2}Ba_{1.8}Ni_{0.2}Co_{1.9}Ag_{0.1}O_9$ | 199 | 7.8 | 0.8 |
| $Bi_2Pb_{0.2}Ba_{1.8}Cu_{0.2}Co_{1.9}Ag_{0.1}O_9$ | 200 | 9 | 1.3 |
| $Bi_2Pb_{0.2}Ba_{1.8}Zn_{0.2}Co_{1.9}Ag_{0.1}O_9$ | 199 | 8.2 | 1.4 |
| $Bi_2Pb_{0.2}Ba_{1.8}Pb_{0.2}Co_{1.9}Ag_{0.1}O_9$ | 210 | 9.1 | 1.1 |
| $Bi_2Pb_{0.2}Ba_{1.8}Ca_{0.2}Co_{1.9}Ag_{0.1}O_9$ | 202 | 8.4 | 1 |
| $Bi_2Pb_{0.2}Ba_{1.8}Sr_{0.2}Co_{1.9}Ag_{0.1}O_9$ | 204 | 8.6 | 1.3 |
| $Bi_2Pb_{0.2}Ba_{1.8}Al_{0.2}Co_{1.9}Ag_{0.1}O_9$ | 197 | 7.8 | 0.9 |
| $Bi_2Pb_{0.2}Ba_{1.8}Y_{0.2}Co_{1.9}Ag_{0.1}O_9$ | 190 | 9 | 1.1 |
| $Bi_2Pb_{0.2}Ba_{1.8}La_{0.2}Co_{1.9}Ag_{0.1}O_9$ | 198 | 8.4 | 1.4 |
| $Bi_2Pb_{0.2}Ba_{1.8}Ce_{0.2}Co_{1.9}Ag_{0.1}O_9$ | 199 | 7.8 | 1.2 |
| $Bi_2Pb_{0.2}Ba_{1.8}Pr_{0.2}Co_{1.9}Ag_{0.1}O_9$ | 201 | 9 | 0.9 |
| $Bi_2Pb_{0.2}Ba_{1.8}Nd_{0.2}Co_{1.9}Ag_{0.1}O_9$ | 207 | 8.2 | 1.1 |
| $Bi_2Pb_{0.2}Ba_{1.8}Sm_{0.2}Co_{1.9}Ag_{0.1}O_9$ | 190 | 8.3 | 1.2 |
| $Bi_2Pb_{0.2}Ba_{1.8}Eu_{0.2}Co_{1.9}Ag_{0.1}O_9$ | 198 | 8.6 | 0.9 |
| $Bi_2Pb_{0.2}Ba_{1.8}Gd_{0.2}Co_{1.9}Ag_{0.1}O_9$ | 199 | 8.7 | 1.1 |
| $Bi_2Pb_{0.2}Ba_{1.8}Dy_{0.2}Co_{1.9}Ag_{0.1}O_9$ | 201 | 8.3 | 1.2 |
| $Bi_2Pb_{0.2}Ba_{1.8}Ho_{0.2}Co_{1.9}Ag_{0.1}O_9$ | 210 | 9 | 1.4 |
| $Bi_2Pb_{0.2}Ba_{1.8}Er_{0.2}Co_{1.9}Ag_{0.1}O_9$ | 206 | 7.9 | 0.8 |
| $Bi_2Pb_{0.2}Ba_{1.8}Yb_{0.2}Co_{1.9}Ag_{0.1}O_9$ | 205 | 8.1 | 1.3 |
| $Bi_2Sr_2Co_{1.9}Mo_{0.1}O_9$ | 195 | 7.8 | 1.1 |
| $Bi_2Sr_{1.8}Na_{0.2}Co_{1.9}Mo_{0.1}O_9$ | 200 | 7.2 | 1.4 |
| $Bi_2Sr_{1.8}K_{0.2}Co_{1.9}Mo_{0.1}O_9$ | 203 | 9 | 1.2 |
| $Bi_2Sr_{1.8}Li_{0.2}Co_{1.9}Mo_{0.1}O_9$ | 200 | 8.2 | 0.9 |
| $Bi_2Sr_{1.8}Ti_{0.2}Co_{1.9}Mo_{0.1}O_9$ | 203 | 7.9 | 1.1 |
| $Bi_2Sr_{1.8}V_{0.2}Co_{1.9}Mo_{0.1}O_9$ | 201 | 6.9 | 1.2 |
| $Bi_2Sr_{1.8}Cr_{0.2}Co_{1.9}Mo_{0.1}O_9$ | 208 | 8.1 | 0.9 |
| $Bi_2Sr_{1.8}Mn_{0.2}Co_{1.9}Mo_{0.1}O_9$ | 198 | 6.9 | 1.1 |
| $Bi_2Sr_{1.8}Fe_{0.2}Co_{1.9}Mo_{0.1}O_9$ | 199 | 7.4 | 1.2 |
| $Bi_2Sr_{1.8}Ni_{0.2}Co_{1.9}Mo_{0.1}O_9$ | 200 | 7.8 | 1 |
| $Bi_2Sr_{1.8}Cu_{0.2}Co_{1.9}Mo_{0.1}O_9$ | 199 | 7.7 | 0.8 |
| $Bi_2Sr_{1.8}Zn_{0.2}Co_{1.9}Mo_{0.1}O_9$ | 200 | 8 | 1.3 |
| $Bi_2Sr_{1.8}Pb_{0.2}Co_{1.9}Mo_{0.1}O_9$ | 206 | 8.2 | 1.2 |

TABLE 56

| | | | |
|---|---|---|---|
| $Bi_2Sr_{1.8}Ca_{0.2}Co_{1.9}Mo_{0.1}O_9$ | 206 | 7.9 | 1.1 |
| $Bi_2Sr_{1.8}Ba_{0.2}Co_{1.9}Mo_{0.1}O_9$ | 198 | 9.1 | 0.8 |
| $Bi_2Sr_{1.8}Al_{0.2}Co_{1.9}Mo_{0.1}O_9$ | 199 | 8.4 | 1.3 |
| $Bi_2Sr_{1.8}Y_{0.2}Co_{1.9}Mo_{0.1}O_9$ | 200 | 8.6 | 1.4 |
| $Bi_2Sr_{1.8}La_{0.2}Co_{1.9}Mo_{0.1}O_9$ | 206 | 8.2 | 1.1 |
| $Bi_2Sr_{1.8}Ce_{0.2}Co_{1.9}Mo_{0.1}O_9$ | 205 | 7.9 | 1 |
| $Bi_2Sr_{1.8}Pr_{0.2}Co_{1.9}Mo_{0.1}O_9$ | 198 | 8.6 | 1.3 |
| $Bi_2Sr_{1.8}Nd_{0.2}Co_{1.9}Mo_{0.1}O_9$ | 199 | 9.1 | 0.9 |
| $Bi_2Sr_{1.8}Sm_{0.2}Co_{1.9}Mo_{0.1}O_9$ | 200 | 6.9 | 1.1 |
| $Bi_2Sr_{1.8}Eu_{0.2}Co_{1.9}Mo_{0.1}O_9$ | 199 | 7.4 | 1.4 |
| $Bi_2Sr_{1.8}Gd_{0.2}Co_{1.9}Mo_{0.1}O_9$ | 210 | 7.8 | 1.2 |
| $Bi_2Sr_{1.8}Dy_{0.2}Co_{1.9}Mo_{0.1}O_9$ | 202 | 7.7 | 0.9 |
| $Bi_2Sr_{1.8}Ho_{0.2}Co_{1.9}Mo_{0.1}O_9$ | 204 | 8 | 1.1 |
| $Bi_2Sr_{1.8}Er_{0.2}Co_{1.9}Mo_{0.1}O_9$ | 197 | 8.2 | 1.2 |
| $Bi_2Sr_{1.8}Yb_{0.2}Co_{1.9}Mo_{0.1}O_9$ | 190 | 7.9 | 0.9 |
| $Bi_2Pb_{0.2}Sr_2Co_{1.9}Mo_{0.1}O_9$ | 199 | 8.4 | 1.2 |
| $Bi_2Pb_{0.2}Sr_{1.8}Na_{0.2}Co_{1.9}Mo_{0.1}O_9$ | 201 | 8.6 | 1 |
| $Bi_2Pb_{0.2}Sr_{1.8}K_{0.2}Co_{1.9}Mo_{0.1}O_9$ | 207 | 7.8 | 1.3 |
| $Bi_2Pb_{0.2}Sr_{1.8}Li_{0.2}Co_{1.9}Mo_{0.1}O_9$ | 190 | 9 | 1 |
| $Bi_2Pb_{0.2}Sr_{1.8}Ti_{0.2}Co_{1.9}Mo_{0.1}O_9$ | 198 | 8.2 | 0.9 |
| $Bi_2Pb_{0.2}Sr_{1.8}V_{0.2}Co_{1.9}Mo_{0.1}O_9$ | 199 | 8.3 | 1.1 |
| $Bi_2Pb_{0.2}Sr_{1.8}Cr_{0.2}Co_{1.9}Mo_{0.1}O_9$ | 201 | 8.4 | 1 |
| $Bi_2Pb_{0.2}Sr_{1.8}Mn_{0.2}Co_{1.9}Mo_{0.1}O_9$ | 210 | 8.6 | 1.2 |
| $Bi_2Pb_{0.2}Sr_{1.8}Fe_{0.2}Co_{1.9}Mo_{0.1}O_9$ | 206 | 8.2 | 1.1 |
| $Bi_2Pb_{0.2}Sr_{1.8}Ni_{0.2}Co_{1.9}Mo_{0.1}O_9$ | 205 | 7.9 | 0.9 |
| $Bi_2Pb_{0.2}Sr_{1.8}Cu_{0.2}Co_{1.9}Mo_{0.1}O_9$ | 198 | 8.6 | 0.8 |
| $Bi_2Pb_{0.2}Sr_{1.8}Zn_{0.2}Co_{1.9}Mo_{0.1}O_9$ | 195 | 9.1 | 1 |
| $Bi_2Pb_{0.2}Sr_{1.8}Pb_{0.2}Co_{1.9}Mo_{0.1}O_9$ | 200 | 6.9 | 1.3 |
| $Bi_2Pb_{0.2}Sr_{1.8}Ca_{0.2}Co_{1.9}Mo_{0.1}O_9$ | 203 | 7.4 | 1.2 |
| $Bi_2Pb_{0.2}Sr_{1.8}Ba_{0.2}Co_{1.9}Mo_{0.1}O_9$ | 200 | 7.8 | 1.3 |
| $Bi_2Pb_{0.2}Sr_{1.8}Al_{0.2}Co_{1.9}Mo_{0.1}O_9$ | 203 | 7.7 | 0.9 |
| $Bi_2Pb_{0.2}Sr_{1.8}Y_{0.2}Co_{1.9}Mo_{0.1}O_9$ | 201 | 8 | 1.1 |
| $Bi_2Pb_{0.2}Sr_{1.8}La_{0.2}Co_{1.9}Mo_{0.1}O_9$ | 208 | 8.2 | 1.4 |
| $Bi_2Pb_{0.2}Sr_{1.8}Ce_{0.2}Co_{1.9}Mo_{0.1}O_9$ | 198 | 7.9 | 1.2 |
| $Bi_2Pb_{0.2}Sr_{1.8}Pr_{0.2}Co_{1.9}Mo_{0.1}O_9$ | 199 | 9.1 | 0.9 |
| $Bi_2Pb_{0.2}Sr_{1.8}Nd_{0.2}Co_{1.9}Mo_{0.1}O_9$ | 200 | 8.4 | 1.1 |

TABLE 57

| | | | |
|---|---|---|---|
| $Bi_2Pb_{0.2}Sr_{1.8}Sm_{0.2}Co_{1.9}Mo_{0.1}O_9$ | 203 | 8.6 | 1.2 |
| $Bi_2Pb_{0.2}Sr_{1.8}Eu_{0.2}Co_{1.9}Mo_{0.1}O_9$ | 200 | 7.8 | 0.9 |
| $Bi_2Pb_{0.2}Sr_{1.8}Gd_{0.2}Co_{1.9}Mo_{0.1}O_9$ | 203 | 9 | 1.1 |
| $Bi_2Pb_{0.2}Sr_{1.8}Dy_{0.2}Co_{1.9}Mo_{0.1}O_9$ | 201 | 8.2 | 1.2 |
| $Bi_2Pb_{0.2}Sr_{1.8}Ho_{0.2}Co_{1.9}Mo_{0.1}O_9$ | 208 | 8.3 | 1 |
| $Bi_2Pb_{0.2}Sr_{1.8}Er_{0.2}Co_{1.9}Mo_{0.1}O_9$ | 198 | 8.6 | 1.3 |
| $Bi_2Pb_{0.2}Sr_{1.8}Yb_{0.2}Co_{1.9}Mo_{0.1}O_9$ | 199 | 8.7 | 1 |
| $Bi_2Ca_2Co_{1.9}Mo_{0.1}O_9$ | 199 | 9 | 1.1 |
| $Bi_2Ca_{1.8}Na_{0.2}Co_{1.9}Mo_{0.1}O_9$ | 200 | 7.9 | 1 |
| $Bi_2Ca_{1.8}K_{0.2}Co_{1.9}Mo_{0.1}O_9$ | 206 | 8.1 | 1.2 |
| $Bi_2Ca_{1.8}Li_{0.2}Co_{1.9}Mo_{0.1}O_9$ | 206 | 8 | 1.1 |
| $Bi_2Ca_{1.8}Ti_{0.2}Co_{1.9}Mo_{0.1}O_9$ | 198 | 7.8 | 0.9 |
| $Bi_2Ca_{1.8}V_{0.2}Co_{1.9}Mo_{0.1}O_9$ | 199 | 7.2 | 0.8 |
| $Bi_2Ca_{1.8}Cr_{0.2}Co_{1.9}Mo_{0.1}O_9$ | 200 | 9 | 1 |
| $Bi_2Ca_{1.8}Mn_{0.2}Co_{1.9}Mo_{0.1}O_9$ | 206 | 8.2 | 1.3 |
| $Bi_2Ca_{1.8}Fe_{0.2}Co_{1.9}Mo_{0.1}O_9$ | 205 | 7.9 | 1.2 |
| $Bi_2Ca_{1.8}Ni_{0.2}Co_{1.9}Mo_{0.1}O_9$ | 198 | 6.9 | 0.7 |
| $Bi_2Ca_{1.8}Cu_{0.2}Co_{1.9}Mo_{0.1}O_9$ | 199 | 8.1 | 1.3 |
| $Bi_2Ca_{1.8}Zn_{0.2}Co_{1.9}Mo_{0.1}O_9$ | 200 | 6.9 | 1.4 |
| $Bi_2Ca_{1.8}Pb_{0.2}Co_{1.9}Mo_{0.1}O_9$ | 199 | 7.4 | 1.1 |
| $Bi_2Ca_{1.8}Sr_{0.2}Co_{1.9}Mo_{0.1}O_9$ | 210 | 7.8 | 1 |
| $Bi_2Ca_{1.8}Ba_{0.2}Co_{1.9}Mo_{0.1}O_9$ | 202 | 7.7 | 1.3 |
| $Bi_2Ca_{1.8}Al_{0.2}Co_{1.9}Mo_{0.1}O_9$ | 204 | 8 | 0.9 |
| $Bi_2Ca_{1.8}Y_{0.2}Co_{1.9}Mo_{0.1}O_9$ | 197 | 8.2 | 1.1 |
| $Bi_2Ca_{1.8}La_{0.2}Co_{1.9}Mo_{0.1}O_9$ | 190 | 7.9 | 1.4 |
| $Bi_2Ca_{1.8}Ce_{0.2}Co_{1.9}Mo_{0.1}O_9$ | 198 | 9.1 | 1.2 |
| $Bi_2Ca_{1.8}Pr_{0.2}Co_{1.9}Mo_{0.1}O_9$ | 199 | 8.4 | 0.9 |
| $Bi_2Ca_{1.8}Nd_{0.2}Co_{1.9}Mo_{0.1}O_9$ | 201 | 8.6 | 1.1 |
| $Bi_2Ca_{1.8}Sm_{0.2}Co_{1.9}Mo_{0.1}O_9$ | 207 | 8.2 | 1.2 |
| $Bi_2Ca_{1.8}Eu_{0.2}Co_{1.9}Mo_{0.1}O_9$ | 190 | 7.9 | 0.9 |
| $Bi_2Ca_{1.8}Gd_{0.2}Co_{1.9}Mo_{0.1}O_9$ | 198 | 8.6 | 1.1 |
| $Bi_2Ca_{1.8}Dy_{0.2}Co_{1.9}Mo_{0.1}O_9$ | 199 | 9.1 | 1.4 |
| $Bi_2Ca_{1.8}Ho_{0.2}Co_{1.9}Mo_{0.1}O_9$ | 201 | 6.9 | 1.4 |
| $Bi_2Ca_{1.8}Er_{0.2}Co_{1.9}Mo_{0.1}O_9$ | 210 | 7.4 | 0.8 |
| $Bi_2Ca_{1.8}Yb_{0.2}Co_{1.9}Mo_{0.1}O_9$ | 198 | 7.8 | 1.3 |

TABLE 58

| | | | |
|---|---|---|---|
| $Bi_2Pb_{0.2}Ca_2Co_{1.9}Mo_{0.1}O_9$ | 201 | 8.0 | 1.1 |
| $Bi_2Pb_{0.2}Ca_{1.8}Na_{0.2}Co_{1.9}Mo_{0.1}O_9$ | 207 | 8.2 | 0.8 |
| $Bi_2Pb_{0.2}Ca_{1.8}K_{0.2}Co_{1.9}Mo_{0.1}O_9$ | 190 | 7.9 | 1.3 |
| $Bi_2Pb_{0.2}Ca_{1.8}Li_{0.2}Co_{1.9}Mo_{0.1}O_9$ | 198 | 9.1 | 1.4 |
| $Bi_2Pb_{0.2}Ca_{1.8}Ti_{0.2}Co_{1.9}Mo_{0.1}O_9$ | 199 | 8.4 | 1.1 |
| $Bi_2Pb_{0.2}Ca_{1.8}V_{0.2}Co_{1.9}Mo_{0.1}O_9$ | 201 | 8.6 | 1 |
| $Bi_2Pb_{0.2}Ca_{1.8}Cr_{0.2}Co_{1.9}Mo_{0.1}O_9$ | 210 | 7.8 | 1.3 |
| $Bi_2Pb_{0.2}Ca_{1.8}Mn_{0.2}Co_{1.9}Mo_{0.1}O_9$ | 206 | 9 | 0.9 |
| $Bi_2Pb_{0.2}Ca_{1.8}Fe_{0.2}Co_{1.9}Mo_{0.1}O_9$ | 205 | 8.2 | 1.1 |
| $Bi_2Pb_{0.2}Ca_{1.8}Ni_{0.2}Co_{1.9}Mo_{0.1}O_9$ | 198 | 8.3 | 1.4 |
| $Bi_2Pb_{0.2}Ca_{1.8}Cu_{0.2}Co_{1.9}Mo_{0.1}O_9$ | 195 | 8.6 | 1.2 |
| $Bi_2Pb_{0.2}Ca_{1.8}Zn_{0.2}Co_{1.9}Mo_{0.1}O_9$ | 200 | 8.7 | 0.9 |
| $Bi_2Pb_{0.2}Ca_{1.8}Pb_{0.2}Co_{1.9}Mo_{0.1}O_9$ | 203 | 8.3 | 1.1 |
| $Bi_2Pb_{0.2}Ca_{1.8}Sr_{0.2}Co_{1.9}Mo_{0.1}O_9$ | 200 | 9 | 1.2 |
| $Bi_2Pb_{0.2}Ca_{1.8}Ba_{0.2}Co_{1.9}Mo_{0.1}O_9$ | 203 | 7.9 | 0.9 |
| $Bi_2Pb_{0.2}Ca_{1.8}Al_{0.2}Co_{1.9}Mo_{0.1}O_9$ | 201 | 8.1 | 1.1 |
| $Bi_2Pb_{0.2}Ca_{1.8}Y_{0.2}Co_{1.9}Mo_{0.1}O_9$ | 208 | 8 | 1.2 |
| $Bi_2Pb_{0.2}Ca_{1.8}La_{0.2}Co_{1.9}Mo_{0.1}O_9$ | 198 | 7.8 | 1.4 |
| $Bi_2Pb_{0.2}Ca_{1.8}Ce_{0.2}Co_{1.9}Mo_{0.1}O_9$ | 199 | 7.2 | 0.8 |
| $Bi_2Pb_{0.2}Ca_{1.8}Pr_{0.2}Co_{1.9}Mo_{0.1}O_9$ | 200 | 9 | 1.3 |
| $Bi_2Pb_{0.2}Ca_{1.8}Nd_{0.2}Co_{1.9}Mo_{0.1}O_9$ | 206 | 7.8 | 1.2 |
| $Bi_2Pb_{0.2}Ca_{1.8}Sm_{0.2}Co_{1.9}Mo_{0.1}O_9$ | 205 | 7.5 | 1.1 |
| $Bi_2Pb_{0.2}Ca_{1.8}Eu_{0.2}Co_{1.9}Mo_{0.1}O_9$ | 198 | 8.6 | 0.8 |
| $Bi_2Pb_{0.2}Ca_{1.8}Gd_{0.2}Co_{1.9}Mo_{0.1}O_9$ | 206 | 8.2 | 0.7 |
| $Bi_2Pb_{0.2}Ca_{1.8}Dy_{0.2}Co_{1.9}Mo_{0.1}O_9$ | 198 | 7.9 | 1.3 |
| $Bi_2Pb_{0.2}Ca_{1.8}Ho_{0.2}Co_{1.9}Mo_{0.1}O_9$ | 207 | 6.9 | 0.8 |
| $Bi_2Pb_{0.2}Ca_{1.8}Er_{0.2}Co_{1.9}Mo_{0.1}O_9$ | 190 | 9 | 1.3 |
| $Bi_2Pb_{0.2}Ca_{1.8}Yb_{0.2}Co_{1.9}Mo_{0.1}O_9$ | 190 | 7.8 | 1.2 |
| $Bi_2Ba_2Co_{1.9}Mo_{0.1}O_9$ | 199 | 8.6 | 0.8 |
| $Bi_2Ba_{1.8}Na_{0.2}Co_{1.9}Mo_{0.1}O_9$ | 201 | 8.2 | 1.3 |
| $Bi_2Ba_{1.8}K_{0.2}Co_{1.9}Mo_{0.1}O_9$ | 210 | 7.9 | 1.4 |
| $Bi_2Ba_{1.8}Li_{0.2}Co_{1.9}Mo_{0.1}O_9$ | 206 | 6.9 | 1.1 |
| $Bi_2Ba_{1.8}Ti_{0.2}Co_{1.9}Mo_{0.1}O_9$ | 205 | 8.1 | 1 |
| $Bi_2Ba_{1.8}V_{0.2}Co_{1.9}Mo_{0.1}O_9$ | 198 | 6.9 | 1.3 |
| $Bi_2Ba_{1.8}Cr_{0.2}Co_{1.9}Mo_{0.1}O_9$ | 195 | 7.4 | 0.9 |
| $Bi_2Ba_{1.8}Mn_{0.2}Co_{1.9}Mo_{0.1}O_9$ | 200 | 7.8 | 1.1 |

TABLE 59

| | | | |
|---|---|---|---|
| $Bi_2Ba_{1.8}Fe_{0.2}Co_{1.9}Mo_{0.1}O_9$ | 203 | 7.7 | 1.4 |
| $Bi_2Ba_{1.8}Ni_{0.2}Co_{1.9}Mo_{0.1}O_9$ | 201 | 8 | 1.2 |
| $Bi_2Ba_{1.8}Cu_{0.2}Co_{1.9}Mo_{0.1}O_9$ | 208 | 8.2 | 0.9 |
| $Bi_2Ba_{1.8}Zn_{0.2}Co_{1.9}Mo_{0.1}O_9$ | 198 | 7.9 | 1.1 |
| $Bi_2Ba_{1.8}Pb_{0.2}Co_{1.9}Mo_{0.1}O_9$ | 199 | 9.1 | 1.2 |
| $Bi_2Ba_{1.8}Ca_{0.2}Co_{1.9}Mo_{0.1}O_9$ | 200 | 8.4 | 0.9 |
| $Bi_2Ba_{1.8}Sr_{0.2}Co_{1.9}Mo_{0.1}O_9$ | 206 | 8.6 | 1.1 |
| $Bi_2Ba_{1.8}Al_{0.2}Co_{1.9}Mo_{0.1}O_9$ | 206 | 8.2 | 1.2 |
| $Bi_2Ba_{1.8}Y_{0.2}Co_{1.9}Mo_{0.1}O_9$ | 198 | 7.9 | 1.4 |
| $Bi_2Ba_{1.8}La_{0.2}Co_{1.9}Mo_{0.1}O_9$ | 199 | 8.6 | 0.8 |
| $Bi_2Ba_{1.8}Ce_{0.2}Co_{1.9}Mo_{0.1}O_9$ | 200 | 9.1 | 1.3 |
| $Bi_2Ba_{1.8}Pr_{0.2}Co_{1.9}Mo_{0.1}O_9$ | 206 | 6.9 | 1.2 |
| $Bi_2Ba_{1.8}Nd_{0.2}Co_{1.9}Mo_{0.1}O_9$ | 205 | 7.4 | 1.1 |
| $Bi_2Ba_{1.8}Sm_{0.2}Co_{1.9}Mo_{0.1}O_9$ | 198 | 7.8 | 1.4 |
| $Bi_2Ba_{1.8}Eu_{0.2}Co_{1.9}Mo_{0.1}O_9$ | 199 | 7.7 | 1.2 |
| $Bi_2Ba_{1.8}Gd_{0.2}Co_{1.9}Mo_{0.1}O_9$ | 200 | 8 | 0.9 |
| $Bi_2Ba_{1.8}Dy_{0.2}Co_{1.9}Mo_{0.1}O_9$ | 199 | 8.2 | 1.1 |
| $Bi_2Ba_{1.8}Ho_{0.2}Co_{1.9}Mo_{0.1}O_9$ | 210 | 7.9 | 1.2 |
| $Bi_2Ba_{1.8}Er_{0.2}Co_{1.9}Mo_{0.1}O_9$ | 202 | 9.1 | 0.9 |
| $Bi_2Ba_{1.8}Yb_{0.2}Co_{1.9}Mo_{0.1}O_9$ | 204 | 8.4 | 1.1 |
| $Bi_2Pb_{0.2}Ba_2Co_{1.9}Mo_{0.1}O_9$ | 190 | 7.8 | 1.4 |
| $Bi_2Pb_{0.2}Ba_{1.8}Na_{0.2}Co_{1.9}Mo_{0.1}O_9$ | 198 | 9 | 0.8 |
| $Bi_2Pb_{0.2}Ba_{1.8}K_{0.2}Co_{1.9}Mo_{0.1}O_9$ | 199 | 8.2 | 1.3 |
| $Bi_2Pb_{0.2}Ba_{1.8}Li_{0.2}Co_{1.9}Mo_{0.1}O_9$ | 201 | 9.1 | 1.2 |
| $Bi_2Pb_{0.2}Ba_{1.8}Ti_{0.2}Co_{1.9}Mo_{0.1}O_9$ | 207 | 8.4 | 1.1 |
| $Bi_2Pb_{0.2}Ba_{1.8}V_{0.2}Co_{1.9}Mo_{0.1}O_9$ | 190 | 8.6 | 0.8 |
| $Bi_2Pb_{0.2}Ba_{1.8}Cr_{0.2}Co_{1.9}Mo_{0.1}O_9$ | 198 | 7.8 | 1.3 |
| $Bi_2Pb_{0.2}Ba_{1.8}Mn_{0.2}Co_{1.9}Mo_{0.1}O_9$ | 199 | 9 | 1.4 |
| $Bi_2Pb_{0.2}Ba_{1.8}Fe_{0.2}Co_{1.9}Mo_{0.1}O_9$ | 201 | 8.4 | 1.1 |
| $Bi_2Pb_{0.2}Ba_{1.8}Ni_{0.2}Co_{1.9}Mo_{0.1}O_9$ | 210 | 8.2 | 1 |
| $Bi_2Pb_{0.2}Ba_{1.8}Cu_{0.2}Co_{1.9}Mo_{0.1}O_9$ | 206 | 9.1 | 1.3 |
| $Bi_2Pb_{0.2}Ba_{1.8}Zn_{0.2}Co_{1.9}Mo_{0.1}O_9$ | 205 | 8.4 | 0.9 |
| $Bi_2Pb_{0.2}Ba_{1.8}Pb_{0.2}Co_{1.9}Mo_{0.1}O_9$ | 198 | 8.6 | 1.1 |
| $Bi_2Pb_{0.2}Ba_{1.8}Ca_{0.2}Co_{1.9}Mo_{0.1}O_9$ | 195 | 7.8 | 1.4 |
| $Bi_2Pb_{0.2}Ba_{1.8}Sr_{0.2}Co_{1.9}Mo_{0.1}O_9$ | 200 | 9 | 1.2 |
| $Bi_2Pb_{0.2}Ba_{1.8}Al_{0.2}Co_{1.9}Mo_{0.1}O_9$ | 203 | 8.2 | 0.9 |

TABLE 60

| | | | |
|---|---|---|---|
| $Bi_2Pb_{0.2}Ba_{1.8}Y_{0.2}Co_{1.9}Mo_{0.1}O_9$ | 200 | 8.3 | 1.1 |
| $Bi_2Pb_{0.2}Ba_{1.8}La_{0.2}Co_{1.9}Mo_{0.1}O_9$ | 203 | 8.6 | 1.2 |
| $Bi_2Pb_{0.2}Ba_{1.8}Ce_{0.2}Co_{1.9}Mo_{0.1}O_9$ | 201 | 8.7 | 0.9 |
| $Bi_2Pb_{0.2}Ba_{1.8}Pr_{0.2}Co_{1.9}Mo_{0.1}O_9$ | 208 | 8.3 | 1.1 |
| $Bi_2Pb_{0.2}Ba_{1.8}Nd_{0.2}Co_{1.9}Mo_{0.1}O_9$ | 198 | 9 | 1.2 |
| $Bi_2Pb_{0.2}Ba_{1.8}Sm_{0.2}Co_{1.9}Mo_{0.1}O_9$ | 199 | 7.9 | 1 |
| $Bi_2Pb_{0.2}Ba_{1.8}Eu_{0.2}Co_{1.9}Mo_{0.1}O_9$ | 200 | 8.1 | 1.3 |
| $Bi_2Pb_{0.2}Ba_{1.8}Gd_{0.2}Co_{1.9}Mo_{0.1}O_9$ | 199 | 8 | 1 |
| $Bi_2Pb_{0.2}Ba_{1.8}Dy_{0.2}Co_{1.9}Mo_{0.1}O_9$ | 200 | 7.8 | 0.9 |
| $Bi_2Pb_{0.2}Ba_{1.8}Ho_{0.2}Co_{1.9}Mo_{0.1}O_9$ | 206 | 7.2 | 1.1 |
| $Bi_2Pb_{0.2}Ba_{1.8}Er_{0.2}Co_{1.9}Mo_{0.1}O_9$ | 206 | 9 | 1 |
| $Bi_2Pb_{0.2}Ba_{1.8}Yb_{0.2}Co_{1.9}Mo_{0.1}O_9$ | 198 | 8.2 | 1.2 |
| $Bi_2Sr_2Co_{1.9}W_{0.1}O_9$ | 200 | 6.9 | 0.9 |
| $Bi_2Sr_{1.8}Na_{0.2}Co_{1.9}W_{0.1}O_9$ | 206 | 8.1 | 0.8 |
| $Bi_2Sr_{1.8}K_{0.2}Co_{1.9}W_{0.1}O_9$ | 205 | 6.9 | 0.8 |
| $Bi_2Sr_{1.8}Li_{0.2}Co_{1.9}W_{0.1}O_9$ | 198 | 7.4 | 1.3 |
| $Bi_2Sr_{1.8}Ti_{0.2}Co_{1.9}W_{0.1}O_9$ | 199 | 7.8 | 1.2 |
| $Bi_2Sr_{1.8}V_{0.2}Co_{1.9}W_{0.1}O_9$ | 200 | 7.7 | 1.1 |
| $Bi_2Sr_{1.8}Cr_{0.2}Co_{1.9}W_{0.1}O_9$ | 199 | 8 | 1.4 |
| $Bi_2Sr_{1.8}Mn_{0.2}Co_{1.9}W_{0.1}O_9$ | 210 | 8.2 | 1.2 |
| $Bi_2Sr_{1.8}Fe_{0.2}Co_{1.9}W_{0.1}O_9$ | 202 | 7.9 | 0.9 |
| $Bi_2Sr_{1.8}Ni_{0.2}Co_{1.9}W_{0.1}O_9$ | 204 | 9.1 | 1.1 |
| $Bi_2Sr_{1.8}Cu_{0.2}Co_{1.9}W_{0.1}O_9$ | 197 | 8.4 | 1.2 |
| $Bi_2Sr_{1.8}Zn_{0.2}Co_{1.9}W_{0.1}O_9$ | 190 | 8.6 | 0.9 |
| $Bi_2Sr_{1.8}Pb_{0.2}Co_{1.9}W_{0.1}O_9$ | 198 | 8.2 | 1.1 |
| $Bi_2Sr_{1.8}Ca_{0.2}Co_{1.9}W_{0.1}O_9$ | 199 | 7.9 | 1.2 |
| $Bi_2Sr_{1.8}Ba_{0.2}Co_{1.9}W_{0.1}O_9$ | 201 | 8.6 | 1.4 |
| $Bi_2Sr_{1.8}Al_{0.2}Co_{1.9}W_{0.1}O_9$ | 207 | 9.1 | 0.8 |
| $Bi_2Sr_{1.8}Y_{0.2}Co_{1.9}W_{0.1}O_9$ | 190 | 6.9 | 1.3 |
| $Bi_2Sr_{1.8}La_{0.2}Co_{1.9}W_{0.1}O_9$ | 198 | 7.4 | 1.2 |
| $Bi_2Sr_{1.8}Ce_{0.2}Co_{1.9}W_{0.1}O_9$ | 199 | 7.8 | 1.1 |
| $Bi_2Sr_{1.8}Pr_{0.2}Co_{1.9}W_{0.1}O_9$ | 201 | 7.7 | 0.8 |
| $Bi_2Sr_{1.8}Nd_{0.2}Co_{1.9}W_{0.1}O_9$ | 210 | 8 | 1.3 |
| $Bi_2Sr_{1.8}Sm_{0.2}Co_{1.9}W_{0.1}O_9$ | 206 | 8.2 | 1.4 |
| $Bi_2Sr_{1.8}Eu_{0.2}Co_{1.9}W_{0.1}O_9$ | 205 | 7.9 | 1.1 |
| $Bi_2Sr_{1.8}Gd_{0.2}Co_{1.9}W_{0.1}O_9$ | 198 | 9.1 | 1 |

TABLE 61

| | | | |
|---|---|---|---|
| $Bi_2Sr_{1.8}Dy_{0.2}Co_{1.9}W_{0.1}O_9$ | 195 | 8.4 | 1.3 |
| $Bi_2Sr_{1.8}Ho_{0.2}Co_{1.9}W_{0.1}O_9$ | 200 | 8.6 | 0.9 |
| $Bi_2Sr_{1.8}Er_{0.2}Co_{1.9}W_{0.1}O_9$ | 203 | 7.8 | 1.1 |
| $Bi_2Sr_{1.8}Yb_{0.2}Co_{1.9}W_{0.1}O_9$ | 200 | 9 | 1.4 |
| $Bi_2Pb_{0.2}Sr_2Co_{1.9}W_{0.1}O_9$ | 201 | 8.3 | 0.9 |
| $Bi_2Pb_{0.2}Sr_{1.8}Na_{0.2}Co_{1.9}W_{0.1}O_9$ | 208 | 8.4 | 1.1 |
| $Bi_2Pb_{0.2}Sr_{1.8}K_{0.2}Co_{1.9}W_{0.1}O_9$ | 198 | 8.6 | 1.2 |
| $Bi_2Pb_{0.2}Sr_{1.8}Li_{0.2}Co_{1.9}W_{0.1}O_9$ | 199 | 8.2 | 0.9 |
| $Bi_2Pb_{0.2}Sr_{1.8}Ti_{0.2}Co_{1.9}W_{0.1}O_9$ | 200 | 7.9 | 1.1 |
| $Bi_2Pb_{0.2}Sr_{1.8}V_{0.2}Co_{1.9}W_{0.1}O_9$ | 203 | 8.6 | 1.2 |
| $Bi_2Pb_{0.2}Sr_{1.8}Cr_{0.2}Co_{1.9}W_{0.1}O_9$ | 200 | 9.1 | 1 |
| $Bi_2Pb_{0.2}Sr_{1.8}Mn_{0.2}Co_{1.9}W_{0.1}O_9$ | 203 | 6.9 | 1.3 |
| $Bi_2Pb_{0.2}Sr_{1.8}Fe_{0.2}Co_{1.9}W_{0.1}O_9$ | 201 | 7.4 | 1 |
| $Bi_2Pb_{0.2}Sr_{1.8}Ni_{0.2}Co_{1.9}W_{0.1}O_9$ | 208 | 7.8 | 0.9 |
| $Bi_2Pb_{0.2}Sr_{1.8}Cu_{0.2}Co_{1.9}W_{0.1}O_9$ | 198 | 7.7 | 1.1 |
| $Bi_2Pb_{0.2}Sr_{1.8}Zn_{0.2}Co_{1.9}W_{0.1}O_9$ | 199 | 8 | 1 |
| $Bi_2Pb_{0.2}Sr_{1.8}Pb_{0.2}Co_{1.9}W_{0.1}O_9$ | 200 | 8.2 | 1.2 |
| $Bi_2Pb_{0.2}Sr_{1.8}Ca_{0.2}Co_{1.9}W_{0.1}O_9$ | 199 | 7.9 | 1.1 |
| $Bi_2Pb_{0.2}Sr_{1.8}Ba_{0.2}Co_{1.9}W_{0.1}O_9$ | 200 | 9.1 | 0.9 |
| $Bi_2Pb_{0.2}Sr_{1.8}Al_{0.2}Co_{1.9}W_{0.1}O_9$ | 206 | 8.4 | 0.8 |
| $Bi_2Pb_{0.2}Sr_{1.8}Y_{0.2}Co_{1.9}W_{0.1}O_9$ | 206 | 8.6 | 1 |
| $Bi_2Pb_{0.2}Sr_{1.8}La_{0.2}Co_{1.9}W_{0.1}O_9$ | 198 | 7.8 | 1.3 |
| $Bi_2Pb_{0.2}Sr_{1.8}Ce_{0.2}Co_{1.9}W_{0.1}O_9$ | 199 | 9 | 1.2 |
| $Bi_2Pb_{0.2}Sr_{1.8}Pr_{0.2}Co_{1.9}W_{0.1}O_9$ | 200 | 8.2 | 1.3 |
| $Bi_2Pb_{0.2}Sr_{1.8}Nd_{0.2}Co_{1.9}W_{0.1}O_9$ | 206 | 8.3 | 1 |
| $Bi_2Pb_{0.2}Sr_{1.8}Sm_{0.2}Co_{1.9}W_{0.1}O_9$ | 205 | 8.6 | 1.3 |
| $Bi_2Pb_{0.2}Sr_{1.8}Eu_{0.2}Co_{1.9}W_{0.1}O_9$ | 198 | 8.7 | 0.9 |
| $Bi_2Pb_{0.2}Sr_{1.8}Gd_{0.2}Co_{1.9}W_{0.1}O_9$ | 199 | 8.3 | 1.1 |
| $Bi_2Pb_{0.2}Sr_{1.8}Dy_{0.2}Co_{1.9}W_{0.1}O_9$ | 200 | 9 | 1.4 |
| $Bi_2Pb_{0.2}Sr_{1.8}Ho_{0.2}Co_{1.9}W_{0.1}O_9$ | 199 | 7.9 | 1.2 |
| $Bi_2Pb_{0.2}Sr_{1.8}Er_{0.2}Co_{1.9}W_{0.1}O_9$ | 210 | 8.1 | 0.9 |
| $Bi_2Pb_{0.2}Sr_{1.8}Yb_{0.2}Co_{1.9}W_{0.1}O_9$ | 202 | 8 | 1.1 |
| $Bi_2Ca_2Co_{1.9}W_{0.1}O_9$ | 197 | 7.2 | 0.9 |
| $Bi_2Ca_{1.8}Na_{0.2}Co_{1.9}W_{0.1}O_9$ | 190 | 9 | 1.1 |
| $Bi_2Ca_{1.8}K_{0.2}Co_{1.9}W_{0.1}O_9$ | 198 | 8.2 | 1.2 |

TABLE 62

| | | | |
|---|---|---|---|
| $Bi_2Ca_{1.8}Li_{0.2}Co_{1.9}W_{0.1}O_9$ | 199 | 7.9 | 1 |
| $Bi_2Ca_{1.8}Ti_{0.2}Co_{1.9}W_{0.1}O_9$ | 201 | 6.9 | 1.3 |
| $Bi_2Ca_{1.8}V_{0.2}Co_{1.9}W_{0.1}O_9$ | 207 | 8.1 | 1 |
| $Bi_2Ca_{1.8}Cr_{0.2}Co_{1.9}W_{0.1}O_9$ | 208 | 6.9 | 0.9 |
| $Bi_2Ca_{1.8}Mn_{0.2}Co_{1.9}W_{0.1}O_9$ | 198 | 7.4 | 1.1 |
| $Bi_2Ca_{1.8}Fe_{0.2}Co_{1.9}W_{0.1}O_9$ | 199 | 7.8 | 1 |
| $Bi_2Ca_{1.8}Ni_{0.2}Co_{1.9}W_{0.1}O_9$ | 200 | 7.7 | 1.2 |
| $Bi_2Ca_{1.8}Cu_{0.2}Co_{1.9}W_{0.1}O_9$ | 206 | 8 | 1.1 |
| $Bi_2Ca_{1.8}Zn_{0.2}Co_{1.9}W_{0.1}O_9$ | 205 | 8.2 | 0.9 |
| $Bi_2Ca_{1.8}Pb_{0.2}Co_{1.9}W_{0.1}O_9$ | 198 | 7.9 | 0.8 |
| $Bi_2Ca_{1.8}Sr_{0.2}Co_{1.9}W_{0.1}O_9$ | 206 | 9.1 | 1 |
| $Bi_2Ca_{1.8}Ba_{0.2}Co_{1.9}W_{0.1}O_9$ | 198 | 8.4 | 1.3 |
| $Bi_2Ca_{1.8}Al_{0.2}Co_{1.9}W_{0.1}O_9$ | 207 | 8.6 | 1.2 |
| $Bi_2Ca_{1.8}Y_{0.2}Co_{1.9}W_{0.1}O_9$ | 190 | 8.2 | 1.3 |
| $Bi_2Ca_{1.8}La_{0.2}Co_{1.9}W_{0.1}O_9$ | 198 | 7.9 | 1 |
| $Bi_2Ca_{1.8}Ce_{0.2}Co_{1.9}W_{0.1}O_9$ | 199 | 8.6 | 0.8 |
| $Bi_2Ca_{1.8}Pr_{0.2}Co_{1.9}W_{0.1}O_9$ | 201 | 9.1 | 1.1 |
| $Bi_2Ca_{1.8}Nd_{0.2}Co_{1.9}W_{0.1}O_9$ | 210 | 6.9 | 1.2 |
| $Bi_2Ca_{1.8}Sm_{0.2}Co_{1.9}W_{0.1}O_9$ | 206 | 7.4 | 0.9 |
| $Bi_2Ca_{1.8}Eu_{0.2}Co_{1.9}W_{0.1}O_9$ | 205 | 7.8 | 1.1 |
| $Bi_2Ca_{1.8}Gd_{0.2}Co_{1.9}W_{0.1}O_9$ | 198 | 7.7 | 1.2 |
| $Bi_2Ca_{1.8}Dy_{0.2}Co_{1.9}W_{0.1}O_9$ | 195 | 8 | 1.4 |
| $Bi_2Ca_{1.8}Ho_{0.2}Co_{1.9}W_{0.1}O_9$ | 200 | 8.2 | 0.8 |
| $Bi_2Ca_{1.8}Er_{0.2}Co_{1.9}W_{0.1}O_9$ | 203 | 7.9 | 1.3 |
| $Bi_2Ca_{1.8}Yb_{0.2}Co_{1.9}W_{0.1}O_9$ | 201 | 9.1 | 1.2 |
| $Bi_2Pb_{0.2}Ca_2Co_{1.9}W_{0.1}O_9$ | 198 | 8.6 | 0.8 |
| $Bi_2Pb_{0.2}Ca_{1.8}Na_{0.2}Co_{1.9}W_{0.1}O_9$ | 199 | 7.8 | 1.3 |
| $Bi_2Pb_{0.2}Ca_{1.8}K_{0.2}Co_{1.9}W_{0.1}O_9$ | 200 | 9 | 1.4 |
| $Bi_2Pb_{0.2}Ca_{1.8}Li_{0.2}Co_{1.9}W_{0.1}O_9$ | 206 | 8.2 | 1.1 |
| $Bi_2Pb_{0.2}Ca_{1.8}Ti_{0.2}Co_{1.9}W_{0.1}O_9$ | 206 | 8.3 | 1 |
| $Bi_2Pb_{0.2}Ca_{1.8}V_{0.2}Co_{1.9}W_{0.1}O_9$ | 198 | 8.6 | 1.3 |
| $Bi_2Pb_{0.2}Ca_{1.8}Cr_{0.2}Co_{1.9}W_{0.1}O_9$ | 199 | 8.7 | 0.9 |
| $Bi_2Pb_{0.2}Ca_{1.8}Mn_{0.2}Co_{1.9}W_{0.1}O_9$ | 200 | 8.3 | 1.1 |
| $Bi_2Pb_{0.2}Ca_{1.8}Fe_{0.2}Co_{1.9}W_{0.1}O_9$ | 206 | 9 | 1.4 |
| $Bi_2Pb_{0.2}Ca_{1.8}Ni_{0.2}Co_{1.9}W_{0.1}O_9$ | 205 | 7.9 | 1.2 |
| $Bi_2Pb_{0.2}Ca_{1.8}Cu_{0.2}Co_{1.9}W_{0.1}O_9$ | 198 | 8.1 | 0.9 |

TABLE 63

| | | | |
|---|---|---|---|
| $Bi_2Pb_{0.2}Ca_{1.8}Zn_{0.2}Co_{1.9}W_{0.1}O_9$ | 199 | 8.0 | 1.1 |
| $Bi_2Pb_{0.2}Ca_{1.8}Pb_{0.2}Co_{1.9}W_{0.1}O_9$ | 200 | 7.8 | 1.2 |
| $Bi_2Pb_{0.2}Ca_{1.8}Sr_{0.2}Co_{1.9}W_{0.1}O_9$ | 199 | 7.2 | 0.9 |
| $Bi_2Pb_{0.2}Ca_{1.8}Ba_{0.2}Co_{1.9}W_{0.1}O_9$ | 210 | 9.0 | 1.1 |
| $Bi_2Pb_{0.2}Ca_{1.8}Al_{0.2}Co_{1.9}W_{0.1}O_9$ | 202 | 7.8 | 1.2 |
| $Bi_2Pb_{0.2}Ca_{1.8}Y_{0.2}Co_{1.9}W_{0.1}O_9$ | 204 | 7.5 | 1.4 |
| $Bi_2Pb_{0.2}Ca_{1.8}La_{0.2}Co_{1.9}W_{0.1}O_9$ | 197 | 8.6 | 0.8 |
| $Bi_2Pb_{0.2}Ca_{1.8}Ce_{0.2}Co_{1.9}W_{0.1}O_9$ | 190 | 8.2 | 1.3 |
| $Bi_2Pb_{0.2}Ca_{1.8}Pr_{0.2}Co_{1.9}W_{0.1}O_9$ | 198 | 7.9 | 1.2 |
| $Bi_2Pb_{0.2}Ca_{1.8}Nd_{0.2}Co_{1.9}W_{0.1}O_9$ | 199 | 6.9 | 1.1 |
| $Bi_2Pb_{0.2}Ca_{1.8}Sm_{0.2}Co_{1.9}W_{0.1}O_9$ | 201 | 9 | 1.4 |
| $Bi_2Pb_{0.2}Ca_{1.8}Eu_{0.2}Co_{1.9}W_{0.1}O_9$ | 207 | 7.8 | 1.2 |
| $Bi_2Pb_{0.2}Ca_{1.8}Gd_{0.2}Co_{1.9}W_{0.1}O_9$ | 190 | 7.5 | 0.9 |
| $Bi_2Pb_{0.2}Ca_{1.8}Dy_{0.2}Co_{1.9}W_{0.1}O_9$ | 198 | 8.6 | 1.1 |
| $Bi_2Pb_{0.2}Ca_{1.8}Ho_{0.2}Co_{1.9}W_{0.1}O_9$ | 199 | 8.2 | 1.2 |
| $Bi_2Pb_{0.2}Ca_{1.8}Er_{0.2}Co_{1.9}W_{0.1}O_9$ | 201 | 7.9 | 0.9 |
| $Bi_2Pb_{0.2}Ca_{1.8}Yb_{0.2}Co_{1.9}W_{0.1}O_9$ | 210 | 6.9 | 1.1 |
| $Bi_2Ba_2Co_{1.9}W_{0.1}O_9$ | 205 | 6.9 | 1.4 |
| $Bi_2Ba_{1.8}Na_{0.2}Co_{1.9}W_{0.1}O_9$ | 198 | 7.4 | 0.8 |
| $Bi_2Ba_{1.8}K_{0.2}Co_{1.9}W_{0.1}O_9$ | 195 | 7.8 | 1.3 |
| $Bi_2Ba_{1.8}Li_{0.2}Co_{1.9}W_{0.1}O_9$ | 200 | 7.7 | 1.2 |
| $Bi_2Ba_{1.8}Ti_{0.2}Co_{1.9}W_{0.1}O_9$ | 203 | 8 | 1.1 |
| $Bi_2Ba_{1.8}V_{0.2}Co_{1.9}W_{0.1}O_9$ | 200 | 8.2 | 0.8 |
| $Bi_2Ba_{1.8}Cr_{0.2}Co_{1.9}W_{0.1}O_9$ | 203 | 7.9 | 1.3 |
| $Bi_2Ba_{1.8}Mn_{0.2}Co_{1.9}W_{0.1}O_9$ | 201 | 9.1 | 1.4 |
| $Bi_2Ba_{1.8}Fe_{0.2}Co_{1.9}W_{0.1}O_9$ | 208 | 8.4 | 1.1 |
| $Bi_2Ba_{1.8}Ni_{0.2}Co_{1.9}W_{0.1}O_9$ | 198 | 8.6 | 1 |
| $Bi_2Ba_{1.8}Cu_{0.2}Co_{1.9}W_{0.1}O_9$ | 199 | 8.2 | 1.3 |
| $Bi_2Ba_{1.8}Zn_{0.2}Co_{1.9}W_{0.1}O_9$ | 200 | 7.9 | 0.9 |
| $Bi_2Ba_{1.8}Pb_{0.2}Co_{1.9}W_{0.1}O_9$ | 206 | 8.6 | 1.1 |
| $Bi_2Ba_{1.8}Ca_{0.2}Co_{1.9}W_{0.1}O_9$ | 205 | 9.1 | 1.4 |
| $Bi_2Ba_{1.8}Sr_{0.2}Co_{1.9}W_{0.1}O_9$ | 198 | 6.9 | 1.2 |
| $Bi_2Ba_{1.8}Al_{0.2}Co_{1.9}W_{0.1}O_9$ | 206 | 7.4 | 0.9 |
| $Bi_2Ba_{1.8}Y_{0.2}Co_{1.9}W_{0.1}O_9$ | 198 | 7.8 | 1.1 |
| $Bi_2Ba_{1.8}La_{0.2}Co_{1.9}W_{0.1}O_9$ | 207 | 7.7 | 1.2 |
| $Bi_2Ba_{1.8}Ce_{0.2}Co_{1.9}W_{0.1}O_9$ | 190 | 8.0 | 0.9 |

TABLE 64

| | | | |
|---|---|---|---|
| $Bi_2Ba_{1.8}Pr_{0.2}Co_{1.9}W_{0.1}O_9$ | 190 | 8.2 | 1.1 |
| $Bi_2Ba_{1.8}Nd_{0.2}Co_{1.9}W_{0.1}O_9$ | 198 | 7.9 | 1.2 |
| $Bi_2Ba_{1.8}Sm_{0.2}Co_{1.9}W_{0.1}O_9$ | 199 | 9.1 | 1 |
| $Bi_2Ba_{1.8}Eu_{0.2}Co_{1.9}W_{0.1}O_9$ | 201 | 8.4 | 1.3 |
| $Bi_2Ba_{1.8}Gd_{0.2}Co_{1.9}W_{0.1}O_9$ | 210 | 8.6 | 1 |
| $Bi_2Ba_{1.8}Dy_{0.2}Co_{1.9}W_{0.1}O_9$ | 206 | 7.8 | 0.9 |
| $Bi_2Ba_{1.8}Ho_{0.2}Co_{1.9}W_{0.1}O_9$ | 205 | 9 | 1.1 |
| $Bi_2Ba_{1.8}Er_{0.2}Co_{1.9}W_{0.1}O_9$ | 198 | 8.2 | 1 |
| $Bi_2Ba_{1.8}Yb_{0.2}Co_{1.9}W_{0.1}O_9$ | 195 | 9.1 | 1.2 |
| $Bi_2Pb_{0.2}Ba_2Co_{1.9}W_{0.1}O_9$ | 203 | 8.6 | 0.9 |
| $Bi_2Pb_{0.2}Ba_{1.8}Na_{0.2}Co_{1.9}W_{0.1}O_9$ | 201 | 7.8 | 0.8 |
| $Bi_2Pb_{0.2}Ba_{1.8}K_{0.2}Co_{1.9}W_{0.1}O_9$ | 208 | 9 | 1 |
| $Bi_2Pb_{0.2}Ba_{1.8}Li_{0.2}Co_{1.9}W_{0.1}O_9$ | 198 | 8.4 | 1.3 |
| $Bi_2Pb_{0.2}Ba_{1.8}Ti_{0.2}Co_{1.9}W_{0.1}O_9$ | 199 | 7.8 | 1.2 |
| $Bi_2Pb_{0.2}Ba_{1.8}V_{0.2}Co_{1.9}W_{0.1}O_9$ | 200 | 8 | 1.3 |
| $Bi_2Pb_{0.2}Ba_{1.8}Cr_{0.2}Co_{1.9}W_{0.1}O_9$ | 206 | 7.8 | 0.9 |
| $Bi_2Pb_{0.2}Ba_{1.8}Mn_{0.2}Co_{1.9}W_{0.1}O_9$ | 206 | 7.2 | 1.1 |
| $Bi_2Pb_{0.2}Ba_{1.8}Fe_{0.2}Co_{1.9}W_{0.1}O_9$ | 198 | 9 | 1.4 |
| $Bi_2Pb_{0.2}Ba_{1.8}Ni_{0.2}Co_{1.9}W_{0.1}O_9$ | 199 | 7.8 | 1.2 |
| $Bi_2Pb_{0.2}Ba_{1.8}Cu_{0.2}Co_{1.9}W_{0.1}O_9$ | 200 | 7.5 | 0.9 |
| $Bi_2Pb_{0.2}Ba_{1.8}Zn_{0.2}Co_{1.9}W_{0.1}O_9$ | 206 | 8.6 | 1.1 |
| $Bi_2Pb_{0.2}Ba_{1.8}Pb_{0.2}Co_{1.9}W_{0.1}O_9$ | 205 | 8.2 | 1.2 |
| $Bi_2Pb_{0.2}Ba_{1.8}Ca_{0.2}Co_{1.9}W_{0.1}O_9$ | 198 | 7.9 | 0.9 |
| $Bi_2Pb_{0.2}Ba_{1.8}Sr_{0.2}Co_{1.9}W_{0.1}O_9$ | 199 | 6.9 | 1.1 |
| $Bi_2Pb_{0.2}Ba_{1.8}Al_{0.2}Co_{1.9}W_{0.1}O_9$ | 200 | 9 | 1.2 |
| $Bi_2Pb_{0.2}Ba_{1.8}Y_{0.2}Co_{1.9}W_{0.1}O_9$ | 199 | 7.8 | 1 |
| $Bi_2Pb_{0.2}Ba_{1.8}La_{0.2}Co_{1.9}W_{0.1}O_9$ | 210 | 7.5 | 1.3 |
| $Bi_2Pb_{0.2}Ba_{1.8}Ce_{0.2}Co_{1.9}W_{0.1}O_9$ | 202 | 8.6 | 1 |
| $Bi_2Pb_{0.2}Ba_{1.8}Pr_{0.2}Co_{1.9}W_{0.1}O_9$ | 204 | 8.2 | 0.9 |
| $Bi_2Pb_{0.2}Ba_{1.8}Nd_{0.2}Co_{1.9}W_{0.1}O_9$ | 197 | 7.9 | 1.1 |
| $Bi_2Pb_{0.2}Ba_{1.8}Sm_{0.2}Co_{1.9}W_{0.1}O_9$ | 190 | 6.9 | 1 |
| $Bi_2Pb_{0.2}Ba_{1.8}Eu_{0.2}Co_{1.9}W_{0.1}O_9$ | 198 | 8.1 | 1.2 |
| $Bi_2Pb_{0.2}Ba_{1.8}Gd_{0.2}Co_{1.9}W_{0.1}O_9$ | 199 | 6.9 | 1.1 |
| $Bi_2Pb_{0.2}Ba_{1.8}Dy_{0.2}Co_{1.9}W_{0.1}O_9$ | 201 | 7.4 | 0.9 |
| $Bi_2Pb_{0.2}Ba_{1.8}Ho_{0.2}Co_{1.9}W_{0.1}O_9$ | 207 | 7.8 | 0.8 |
| $Bi_2Pb_{0.2}Ba_{1.8}Er_{0.2}Co_{1.9}W_{0.1}O_9$ | 190 | 7.7 | 1 |

TABLE 65

| | | | |
|---|---|---|---|
| $Bi_2Pb_{0.2}Ba_{1.8}Yb_{0.2}Co_{1.9}W_{0.1}O_9$ | 198 | 8 | 1.3 |
| $Bi_2Sr_2Co_{1.9}Nb_{0.1}O_9$ | 201 | 7.9 | 0.7 |
| $Bi_2Sr_{1.8}Na_{0.2}Co_{1.9}Nb_{0.1}O_9$ | 210 | 9.1 | 1.3 |
| $Bi_2Sr_{1.8}K_{0.2}Co_{1.9}Nb_{0.1}O_9$ | 206 | 8.4 | 1.4 |
| $Bi_2Sr_{1.8}Li_{0.2}Co_{1.9}Nb_{0.1}O_9$ | 205 | 8.6 | 1.1 |
| $Bi_2Sr_{1.8}Ti_{0.2}Co_{1.9}Nb_{0.1}O_9$ | 198 | 8.2 | 1 |
| $Bi_2Sr_{1.8}V_{0.2}Co_{1.9}Nb_{0.1}O_9$ | 195 | 7.9 | 1.3 |
| $Bi_2Sr_{1.8}Cr_{0.2}Co_{1.9}Nb_{0.1}O_9$ | 200 | 8.6 | 0.9 |
| $Bi_2Sr_{1.8}Mn_{0.2}Co_{1.9}Nb_{0.1}O_9$ | 203 | 9.1 | 1.1 |
| $Bi_2Sr_{1.8}Fe_{0.2}Co_{1.9}Nb_{0.1}O_9$ | 200 | 6.9 | 1.4 |
| $Bi_2Sr_{1.8}Ni_{0.2}Co_{1.9}Nb_{0.1}O_9$ | 203 | 7.4 | 1.2 |
| $Bi_2Sr_{1.8}Cu_{0.2}Co_{1.9}Nb_{0.1}O_9$ | 201 | 7.8 | 0.9 |
| $Bi_2Sr_{1.8}Zn_{0.2}Co_{1.9}Nb_{0.1}O_9$ | 208 | 7.7 | 1.1 |
| $Bi_2Sr_{1.8}Pb_{0.2}Co_{1.9}Nb_{0.1}O_9$ | 198 | 8 | 1.2 |
| $Bi_2Sr_{1.8}Ca_{0.2}Co_{1.9}Nb_{0.1}O_9$ | 199 | 8.2 | 0.9 |
| $Bi_2Sr_{1.8}Ba_{0.2}Co_{1.9}Nb_{0.1}O_9$ | 200 | 7.9 | 1.1 |
| $Bi_2Sr_{1.8}Al_{0.2}Co_{1.9}Nb_{0.1}O_9$ | 199 | 9.1 | 1.2 |
| $Bi_2Sr_{1.8}Y_{0.2}Co_{1.9}Nb_{0.1}O_9$ | 200 | 8.4 | 1.4 |
| $Bi_2Sr_{1.8}La_{0.2}Co_{1.9}Nb_{0.1}O_9$ | 206 | 8.6 | 0.8 |
| $Bi_2Sr_{1.8}Ce_{0.2}Co_{1.9}Nb_{0.1}O_9$ | 206 | 7.8 | 1.3 |
| $Bi_2Sr_{1.8}Pr_{0.2}Co_{1.9}Nb_{0.1}O_9$ | 198 | 9 | 1.2 |
| $Bi_2Sr_{1.8}Nd_{0.2}Co_{1.9}Nb_{0.1}O_9$ | 199 | 8.2 | 1.1 |
| $Bi_2Sr_{1.8}Sm_{0.2}Co_{1.9}Nb_{0.1}O_9$ | 200 | 9.1 | 0.8 |
| $Bi_2Sr_{1.8}Eu_{0.2}Co_{1.9}Nb_{0.1}O_9$ | 206 | 8.4 | 1.3 |
| $Bi_2Sr_{1.8}Gd_{0.2}Co_{1.9}Nb_{0.1}O_9$ | 205 | 8.6 | 1.4 |
| $Bi_2Sr_{1.8}Dy_{0.2}Co_{1.9}Nb_{0.1}O_9$ | 198 | 7.8 | 1.1 |
| $Bi_2Sr_{1.8}Ho_{0.2}Co_{1.9}Nb_{0.1}O_9$ | 199 | 9 | 1 |
| $Bi_2Sr_{1.8}Er_{0.2}Co_{1.9}Nb_{0.1}O_9$ | 200 | 8.4 | 1.3 |
| $Bi_2Sr_{1.8}Yb_{0.2}Co_{1.9}Nb_{0.1}O_9$ | 199 | 7.8 | 0.9 |
| $Bi_2Pb_{0.2}Sr_2Co_{1.9}Nb_{0.1}O_9$ | 202 | 8.2 | 1.4 |
| $Bi_2Pb_{0.2}Sr_{1.8}Na_{0.2}Co_{1.9}Nb_{0.1}O_9$ | 204 | 8.3 | 1.2 |
| $Bi_2Pb_{0.2}Sr_{1.8}K_{0.2}Co_{1.9}Nb_{0.1}O_9$ | 197 | 8.6 | 0.9 |
| $Bi_2Pb_{0.2}Sr_{1.8}Li_{0.2}Co_{1.9}Nb_{0.1}O_9$ | 190 | 8.7 | 1.1 |
| $Bi_2Pb_{0.2}Sr_{1.8}Ti_{0.2}Co_{1.9}Nb_{0.1}O_9$ | 198 | 8.3 | 1.2 |
| $Bi_2Pb_{0.2}Sr_{1.8}V_{0.2}Co_{1.9}Nb_{0.1}O_9$ | 199 | 9 | 0.9 |

TABLE 66

| | | | |
|---|---|---|---|
| $Bi_2Pb_{0.2}Sr_{1.8}Cr_{0.2}Co_{1.9}Nb_{0.1}O_9$ | 201 | 7.9 | 1.1 |
| $Bi_2Pb_{0.2}Sr_{1.8}Mn_{0.2}Co_{1.9}Nb_{0.1}O_9$ | 207 | 8.1 | 1.2 |
| $Bi_2Pb_{0.2}Sr_{1.8}Fe_{0.2}Co_{1.9}Nb_{0.1}O_9$ | 190 | 8 | 1.4 |
| $Bi_2Pb_{0.2}Sr_{1.8}Ni_{0.2}Co_{1.9}Nb_{0.1}O_9$ | 198 | 7.8 | 0.8 |
| $Bi_2Pb_{0.2}Sr_{1.8}Cu_{0.2}Co_{1.9}Nb_{0.1}O_9$ | 199 | 7.2 | 1.3 |
| $Bi_2Pb_{0.2}Sr_{1.8}Zn_{0.2}Co_{1.9}Nb_{0.1}O_9$ | 201 | 9 | 1.2 |
| $Bi_2Pb_{0.2}Sr_{1.8}Pb_{0.2}Co_{1.9}Nb_{0.1}O_9$ | 210 | 8.2 | 1.1 |
| $Bi_2Pb_{0.2}Sr_{1.8}Ca_{0.2}Co_{1.9}Nb_{0.1}O_9$ | 206 | 7.9 | 0.8 |
| $Bi_2Pb_{0.2}Sr_{1.8}Ba_{0.2}Co_{1.9}Nb_{0.1}O_9$ | 205 | 6.9 | 0.7 |
| $Bi_2Pb_{0.2}Sr_{1.8}Al_{0.2}Co_{1.9}Nb_{0.1}O_9$ | 198 | 8.1 | 1.3 |
| $Bi_2Pb_{0.2}Sr_{1.8}Y_{0.2}Co_{1.9}Nb_{0.1}O_9$ | 195 | 6.9 | 0.8 |
| $Bi_2Pb_{0.2}Sr_{1.8}La_{0.2}Co_{1.9}Nb_{0.1}O_9$ | 200 | 7.4 | 1.3 |
| $Bi_2Pb_{0.2}Sr_{1.8}Ce_{0.2}Co_{1.9}Nb_{0.1}O_9$ | 203 | 7.8 | 1.2 |
| $Bi_2Pb_{0.2}Sr_{1.8}Pr_{0.2}Co_{1.9}Nb_{0.1}O_9$ | 200 | 7.7 | 1.1 |
| $Bi_2Pb_{0.2}Sr_{1.8}Nd_{0.2}Co_{1.9}Nb_{0.1}O_9$ | 203 | 8 | 0.8 |
| $Bi_2Pb_{0.2}Sr_{1.8}Sm_{0.2}Co_{1.9}Nb_{0.1}O_9$ | 201 | 8.2 | 1.3 |
| $Bi_2Pb_{0.2}Sr_{1.8}Eu_{0.2}Co_{1.9}Nb_{0.1}O_9$ | 208 | 7.9 | 1.4 |
| $Bi_2Pb_{0.2}Sr_{1.8}Gd_{0.2}Co_{1.9}Nb_{0.1}O_9$ | 198 | 9.1 | 1.1 |
| $Bi_2Pb_{0.2}Sr_{1.8}Dy_{0.2}Co_{1.9}Nb_{0.1}O_9$ | 199 | 8.4 | 1 |
| $Bi_2Pb_{0.2}Sr_{1.8}Ho_{0.2}Co_{1.9}Nb_{0.1}O_9$ | 200 | 8.6 | 1.3 |
| $Bi_2Pb_{0.2}Sr_{1.8}Er_{0.2}Co_{1.9}Nb_{0.1}O_9$ | 203 | 8.2 | 0.9 |
| $Bi_2Pb_{0.2}Sr_{1.8}Yb_{0.2}Co_{1.9}Nb_{0.1}O_9$ | 200 | 7.9 | 1.1 |
| $Bi_2Ca_2Co_{1.9}Nb_{0.1}O_9$ | 201 | 9.1 | 1.2 |
| $Bi_2Ca_{1.8}Na_{0.2}Co_{1.9}Nb_{0.1}O_9$ | 208 | 6.9 | 0.9 |
| $Bi_2Ca_{1.8}K_{0.2}Co_{1.9}Nb_{0.1}O_9$ | 198 | 7.4 | 1.1 |
| $Bi_2Ca_{1.8}Li_{0.2}Co_{1.9}Nb_{0.1}O_9$ | 199 | 7.8 | 1.2 |
| $Bi_2Ca_{1.8}Ti_{0.2}Co_{1.9}Nb_{0.1}O_9$ | 200 | 7.7 | 0.9 |
| $Bi_2Ca_{1.8}V_{0.2}Co_{1.9}Nb_{0.1}O_9$ | 199 | 8 | 1.1 |
| $Bi_2Ca_{1.8}Cr_{0.2}Co_{1.9}Nb_{0.1}O_9$ | 200 | 8.2 | 1.2 |
| $Bi_2Ca_{1.8}Mn_{0.2}Co_{1.9}Nb_{0.1}O_9$ | 206 | 7.9 | 1.4 |
| $Bi_2Ca_{1.8}Fe_{0.2}Co_{1.9}Nb_{0.1}O_9$ | 206 | 9.1 | 0.8 |
| $Bi_2Ca_{1.8}Ni_{0.2}Co_{1.9}Nb_{0.1}O_9$ | 198 | 8.4 | 1.3 |
| $Bi_2Ca_{1.8}Cu_{0.2}Co_{1.9}Nb_{0.1}O_9$ | 199 | 8.6 | 1.2 |
| $Bi_2Ca_{1.8}Zn_{0.2}Co_{1.9}Nb_{0.1}O_9$ | 200 | 7.8 | 1.1 |
| $Bi_2Ca_{1.8}Pb_{0.2}Co_{1.9}Nb_{0.1}O_9$ | 206 | 9 | 1.4 |
| $Bi_2Ca_{1.8}Sr_{0.2}Co_{1.9}Nb_{0.1}O_9$ | 205 | 8.2 | 1.2 |

TABLE 67

| | | | |
|---|---|---|---|
| $Bi_2Ca_{1.8}Ba_{0.2}Co_{1.9}Nb_{0.1}O_9$ | 198 | 8.3 | 0.9 |
| $Bi_2Ca_{1.8}Al_{0.2}Co_{1.9}Nb_{0.1}O_9$ | 199 | 8.4 | 1.1 |
| $Bi_2Ca_{1.8}Y_{0.2}Co_{1.9}Nb_{0.1}O_9$ | 200 | 8.6 | 1.2 |
| $Bi_2Ca_{1.8}La_{0.2}Co_{1.9}Nb_{0.1}O_9$ | 199 | 8.2 | 0.9 |
| $Bi_2Ca_{1.8}Ce_{0.2}Co_{1.9}Nb_{0.1}O_9$ | 210 | 7.9 | 1.1 |
| $Bi_2Ca_{1.8}Pr_{0.2}Co_{1.9}Nb_{0.1}O_9$ | 202 | 8.6 | 1.2 |
| $Bi_2Ca_{1.8}Nd_{0.2}Co_{1.9}Nb_{0.1}O_9$ | 204 | 9.1 | 1.4 |
| $Bi_2Ca_{1.8}Sm_{0.2}Co_{1.9}Nb_{0.1}O_9$ | 197 | 6.9 | 0.8 |
| $Bi_2Ca_{1.8}Eu_{0.2}Co_{1.9}Nb_{0.1}O_9$ | 190 | 7.4 | 1.3 |
| $Bi_2Ca_{1.8}Gd_{0.2}Co_{1.9}Nb_{0.1}O_9$ | 198 | 7.8 | 1.2 |
| $Bi_2Ca_{1.8}Dy_{0.2}Co_{1.9}Nb_{0.1}O_9$ | 199 | 7.7 | 1.1 |
| $Bi_2Ca_{1.8}Ho_{0.2}Co_{1.9}Nb_{0.1}O_9$ | 201 | 8 | 0.8 |
| $Bi_2Ca_{1.8}Er_{0.2}Co_{1.9}Nb_{0.1}O_9$ | 207 | 8.2 | 1.3 |
| $Bi_2Ca_{1.8}Yb_{0.2}Co_{1.9}Nb_{0.1}O_9$ | 190 | 7.9 | 1.4 |
| $Bi_2Pb_{0.2}Ca_2Co_{1.9}Nb_{0.1}O_9$ | 199 | 8.4 | 1 |
| $Bi_2Pb_{0.2}Ca_{1.8}Na_{0.2}Co_{1.9}Nb_{0.1}O_9$ | 201 | 8.6 | 1.3 |
| $Bi_2Pb_{0.2}Ca_{1.8}K_{0.2}Co_{1.9}Nb_{0.1}O_9$ | 210 | 7.8 | 0.9 |
| $Bi_2Pb_{0.2}Ca_{1.8}Li_{0.2}Co_{1.9}Nb_{0.1}O_9$ | 198 | 9 | 1.1 |
| $Bi_2Pb_{0.2}Ca_{1.8}Ti_{0.2}Co_{1.9}Nb_{0.1}O_9$ | 200 | 8.2 | 1.4 |
| $Bi_2Pb_{0.2}Ca_{1.8}V_{0.2}Co_{1.9}Nb_{0.1}O_9$ | 203 | 8.3 | 1.2 |
| $Bi_2Pb_{0.2}Ca_{1.8}Cr_{0.2}Co_{1.9}Nb_{0.1}O_9$ | 201 | 8.6 | 0.9 |
| $Bi_2Pb_{0.2}Ca_{1.8}Mn_{0.2}Co_{1.9}Nb_{0.1}O_9$ | 208 | 8.7 | 1.1 |
| $Bi_2Pb_{0.2}Ca_{1.8}Fe_{0.2}Co_{1.9}Nb_{0.1}O_9$ | 198 | 8.3 | 1.2 |
| $Bi_2Pb_{0.2}Ca_{1.8}Ni_{0.2}Co_{1.9}Nb_{0.1}O_9$ | 199 | 9 | 0.9 |
| $Bi_2Pb_{0.2}Ca_{1.8}Cu_{0.2}Co_{1.9}Nb_{0.1}O_9$ | 200 | 7.9 | 1.1 |
| $Bi_2Pb_{0.2}Ca_{1.8}Zn_{0.2}Co_{1.9}Nb_{0.1}O_9$ | 206 | 8.1 | 1.2 |
| $Bi_2Pb_{0.2}Ca_{1.8}Pb_{0.2}Co_{1.9}Nb_{0.1}O_9$ | 206 | 8 | 1 |
| $Bi_2Pb_{0.2}Ca_{1.8}Sr_{0.2}Co_{1.9}Nb_{0.1}O_9$ | 198 | 7.8 | 1.3 |
| $Bi_2Pb_{0.2}Ca_{1.8}Ba_{0.2}Co_{1.9}Nb_{0.1}O_9$ | 199 | 7.2 | 1 |
| $Bi_2Pb_{0.2}Ca_{1.8}Al_{0.2}Co_{1.9}Nb_{0.1}O_9$ | 200 | 9 | 0.9 |
| $Bi_2Pb_{0.2}Ca_{1.8}Y_{0.2}Co_{1.9}Nb_{0.1}O_9$ | 206 | 8.2 | 1.1 |
| $Bi_2Pb_{0.2}Ca_{1.8}La_{0.2}Co_{1.9}Nb_{0.1}O_9$ | 205 | 7.9 | 1 |
| $Bi_2Pb_{0.2}Ca_{1.8}Ce_{0.2}Co_{1.9}Nb_{0.1}O_9$ | 198 | 6.9 | 1.2 |
| $Bi_2Pb_{0.2}Ca_{1.8}Pr_{0.2}Co_{1.9}Nb_{0.1}O_9$ | 199 | 8.1 | 1.1 |
| $Bi_2Pb_{0.2}Ca_{1.8}Nd_{0.2}Co_{1.9}Nb_{0.1}O_9$ | 200 | 6.9 | 1 |
| $Bi_2Pb_{0.2}Ca_{1.8}Sm_{0.2}Co_{1.9}Nb_{0.1}O_9$ | 199 | 7.4 | 0.9 |

TABLE 68

| | | | |
|---|---|---|---|
| $Bi_2Pb_{0.2}Ca_{1.8}Eu_{0.2}Co_{1.9}Nb_{0.1}O_9$ | 210 | 7.8 | 1.1 |
| $Bi_2Pb_{0.2}Ca_{1.8}Gd_{0.2}Co_{1.9}Nb_{0.1}O_9$ | 202 | 7.7 | 1 |
| $Bi_2Pb_{0.2}Ca_{1.8}Dy_{0.2}Co_{1.9}Nb_{0.1}O_9$ | 204 | 8 | 1.2 |
| $Bi_2Pb_{0.2}Ca_{1.8}Ho_{0.2}Co_{1.9}Nb_{0.1}O_9$ | 197 | 8.2 | 1.1 |
| $Bi_2Pb_{0.2}Ca_{1.8}Er_{0.2}Co_{1.9}Nb_{0.1}O_9$ | 190 | 7.9 | 0.9 |
| $Bi_2Pb_{0.2}Ca_{1.8}Yb_{0.2}Co_{1.9}Nb_{0.1}O_9$ | 198 | 9.1 | 0.8 |
| $Bi_2Ba_2Co_{1.9}Nb_{0.1}O_9$ | 201 | 8.6 | 1.3 |
| $Bi_2Ba_{1.8}Na_{0.2}Co_{1.9}Nb_{0.1}O_9$ | 207 | 8.2 | 1.2 |
| $Bi_2Ba_{1.8}K_{0.2}Co_{1.9}Nb_{0.1}O_9$ | 190 | 7.9 | 1.3 |
| $Bi_2Ba_{1.8}Li_{0.2}Co_{1.9}Nb_{0.1}O_9$ | 198 | 8.6 | 1 |
| $Bi_2Ba_{1.8}Ti_{0.2}Co_{1.9}Nb_{0.1}O_9$ | 199 | 9.1 | 0.8 |
| $Bi_2Ba_{1.8}V_{0.2}Co_{1.9}Nb_{0.1}O_9$ | 201 | 6.9 | 1.1 |
| $Bi_2Ba_{1.8}Cr_{0.2}Co_{1.9}Nb_{0.1}O_9$ | 210 | 7.4 | 1.2 |
| $Bi_2Ba_{1.8}Mn_{0.2}Co_{1.9}Nb_{0.1}O_9$ | 206 | 7.8 | 0.9 |
| $Bi_2Ba_{1.8}Fe_{0.2}Co_{1.9}Nb_{0.1}O_9$ | 205 | 7.7 | 1.1 |
| $Bi_2Ba_{1.8}Ni_{0.2}Co_{1.9}Nb_{0.1}O_9$ | 198 | 8 | 1.2 |
| $Bi_2Ba_{1.8}Cu_{0.2}Co_{1.9}Nb_{0.1}O_9$ | 195 | 8.2 | 1.4 |
| $Bi_2Ba_{1.8}Zn_{0.2}Co_{1.9}Nb_{0.1}O_9$ | 200 | 7.9 | 0.8 |
| $Bi_2Ba_{1.8}Pb_{0.2}Co_{1.9}Nb_{0.1}O_9$ | 203 | 9.1 | 1.3 |
| $Bi_2Ba_{1.8}Ca_{0.2}Co_{1.9}Nb_{0.1}O_9$ | 200 | 8.4 | 1.2 |
| $Bi_2Ba_{1.8}Sr_{0.2}Co_{1.9}Nb_{0.1}O_9$ | 203 | 8.6 | 1.1 |
| $Bi_2Ba_{1.8}Al_{0.2}Co_{1.9}Nb_{0.1}O_9$ | 201 | 7.8 | 0.8 |
| $Bi_2Ba_{1.8}Y_{0.2}Co_{1.9}Nb_{0.1}O_9$ | 208 | 9 | 1.3 |
| $Bi_2Ba_{1.8}La_{0.2}Co_{1.9}Nb_{0.1}O_9$ | 198 | 8.2 | 1.4 |
| $Bi_2Ba_{1.8}Ce_{0.2}Co_{1.9}Nb_{0.1}O_9$ | 199 | 8.3 | 1.1 |
| $Bi_2Ba_{1.8}Pr_{0.2}Co_{1.9}Nb_{0.1}O_9$ | 200 | 8.6 | 1 |
| $Bi_2Ba_{1.8}Nd_{0.2}Co_{1.9}Nb_{0.1}O_9$ | 199 | 8.7 | 1.3 |
| $Bi_2Ba_{1.8}Sm_{0.2}Co_{1.9}Nb_{0.1}O_9$ | 200 | 8.3 | 0.9 |
| $Bi_2Ba_{1.8}Eu_{0.2}Co_{1.9}Nb_{0.1}O_9$ | 206 | 9 | 1.1 |
| $Bi_2Ba_{1.8}Gd_{0.2}Co_{1.9}Nb_{0.1}O_9$ | 206 | 7.9 | 1.4 |
| $Bi_2Ba_{1.8}Dy_{0.2}Co_{1.9}Nb_{0.1}O_9$ | 198 | 8.1 | 1.2 |
| $Bi_2Ba_{1.8}Ho_{0.2}Co_{1.9}Nb_{0.1}O_9$ | 199 | 8 | 0.9 |
| $Bi_2Ba_{1.8}Er_{0.2}Co_{1.9}Nb_{0.1}O_9$ | 200 | 7.8 | 1.1 |
| $Bi_2Ba_{1.8}Yb_{0.2}Co_{1.9}Nb_{0.1}O_9$ | 206 | 7.2 | 1.2 |
| $Bi_2Pb_{0.2}Ba_{0.2}Co_{1.9}Nb_{0.1}O_9$ | 198 | 7.8 | 1.1 |

TABLE 69

| | | | |
|---|---|---|---|
| $Bi_2Pb_{0.2}Ba_{1.8}Na_{0.2}Co_{1.9}Nb_{0.1}O_9$ | 199 | 7.5 | 1.2 |
| $Bi_2Pb_{0.2}Ba_{1.8}K_{0.2}Co_{1.9}Nb_{0.1}O_9$ | 200 | 8.6 | 1.4 |
| $Bi_2Pb_{0.2}Ba_{1.8}Li_{0.2}Co_{1.9}Nb_{0.1}O_9$ | 199 | 8.2 | 0.8 |
| $Bi_2Pb_{0.2}Ba_{1.8}Ti_{0.2}Co_{1.9}Nb_{0.1}O_9$ | 210 | 7.9 | 1.2 |
| $Bi_2Pb_{0.2}Ba_{1.8}V_{0.2}Co_{1.9}Nb_{0.1}O_9$ | 202 | 6.9 | 1.2 |
| $Bi_2Pb_{0.2}Ba_{1.8}Cr_{0.2}Co_{1.9}Nb_{0.1}O_9$ | 204 | 9 | 1.1 |
| $Bi_2Pb_{0.2}Ba_{1.8}Mn_{0.2}Co_{1.9}Nb_{0.1}O_9$ | 197 | 7.8 | 1.4 |
| $Bi_2Pb_{0.2}Ba_{1.8}Fe_{0.2}Co_{1.9}Nb_{0.1}O_9$ | 190 | 7.5 | 1.2 |
| $Bi_2Pb_{0.2}Ba_{1.8}Ni_{0.2}Co_{1.9}Nb_{0.1}O_9$ | 198 | 8.6 | 0.9 |
| $Bi_2Pb_{0.2}Ba_{1.8}Cu_{0.2}Co_{1.9}Nb_{0.1}O_9$ | 199 | 8.2 | 1.1 |
| $Bi_2Pb_{0.2}Ba_{1.8}Zn_{0.2}Co_{1.9}Nb_{0.1}O_9$ | 201 | 7.9 | 1.2 |
| $Bi_2Pb_{0.2}Ba_{1.8}Pb_{0.2}Co_{1.9}Nb_{0.1}O_9$ | 207 | 6.9 | 0.9 |
| $Bi_2Pb_{0.2}Ba_{1.8}Ca_{0.2}Co_{1.9}Nb_{0.1}O_9$ | 190 | 8.1 | 1.1 |
| $Bi_2Pb_{0.2}Ba_{1.8}Sr_{0.2}Co_{1.9}Nb_{0.1}O_9$ | 198 | 6.9 | 1.2 |
| $Bi_2Pb_{0.2}Ba_{1.8}Al_{0.2}Co_{1.9}Nb_{0.1}O_9$ | 199 | 7.4 | 1.4 |
| $Bi_2Pb_{0.2}Ba_{1.8}Y_{0.2}Co_{1.9}Nb_{0.1}O_9$ | 201 | 7.8 | 0.8 |
| $Bi_2Pb_{0.2}Ba_{1.8}La_{0.2}Co_{1.9}Nb_{0.1}O_9$ | 210 | 7.7 | 1.3 |
| $Bi_2Pb_{0.2}Ba_{1.8}Ce_{0.2}Co_{1.9}Nb_{0.1}O_9$ | 206 | 8 | 1.2 |
| $Bi_2Pb_{0.2}Ba_{1.8}Pr_{0.2}Co_{1.9}Nb_{0.1}O_9$ | 205 | 8.2 | 1.1 |
| $Bi_2Pb_{0.2}Ba_{1.8}Nd_{0.2}Co_{1.9}Nb_{0.1}O_9$ | 198 | 7.9 | 0.8 |
| $Bi_2Pb_{0.2}Ba_{1.8}Sm_{0.2}Co_{1.9}Nb_{0.1}O_9$ | 195 | 9.1 | 1.3 |
| $Bi_2Pb_{0.2}Ba_{1.8}Eu_{0.2}Co_{1.9}Nb_{0.1}O_9$ | 200 | 8.4 | 1.4 |
| $Bi_2Pb_{0.2}Ba_{1.8}Gd_{0.2}Co_{1.9}Nb_{0.1}O_9$ | 203 | 8.6 | 1.1 |
| $Bi_2Pb_{0.2}Ba_{1.8}Dy_{0.2}Co_{1.9}Nb_{0.1}O_9$ | 200 | 8.2 | 1 |
| $Bi_2Pb_{0.2}Ba_{1.8}Ho_{0.2}Co_{1.9}Nb_{0.1}O_9$ | 203 | 7.9 | 1.3 |
| $Bi_2Pb_{0.2}Ba_{1.8}Er_{0.2}Co_{1.9}Nb_{0.1}O_9$ | 201 | 8.6 | 0.9 |
| $Bi_2Pb_{0.2}Ba_{1.8}Yb_{0.2}Co_{1.9}Nb_{0.1}O_9$ | 208 | 9.1 | 1.1 |
| $Bi_2Sr_2Co_{1.9}Ta_{0.1}O_9$ | 199 | 7.4 | 1.2 |
| $Bi_2Sr_{1.8}Na_{0.2}Co_{1.9}Ta_{0.1}O_9$ | 200 | 7.8 | 1 |
| $Bi_2Sr_{1.8}K_{0.2}Co_{1.9}Ta_{0.1}O_9$ | 203 | 7.7 | 1.1 |
| $Bi_2Sr_{1.8}Li_{0.2}Co_{1.9}Ta_{0.1}O_9$ | 200 | 8 | 1.2 |
| $Bi_2Sr_{1.8}Ti_{0.2}Co_{1.9}Ta_{0.1}O_9$ | 203 | 8.2 | 0.9 |
| $Bi_2Sr_{1.8}V_{0.2}Co_{1.9}Ta_{0.1}O_9$ | 201 | 7.9 | 1.1 |
| $Bi_2Sr_{1.8}Cr_{0.2}Co_{1.9}Ta_{0.1}O_9$ | 208 | 9.1 | 1.2 |
| $Bi_2Sr_{1.8}Mn_{0.2}Co_{1.9}Ta_{0.1}O_9$ | 198 | 8.4 | 1 |
| $Bi_2Sr_{1.8}Fe_{0.2}Co_{1.9}Ta_{0.1}O_9$ | 199 | 8.6 | 1.3 |

TABLE 70

| Compound | | | |
|---|---|---|---|
| Bi$_2$Sr$_{1.8}$Ni$_{0.2}$Co$_{1.9}$Ta$_{0.1}$O$_9$ | 200 | 7.8 | 1 |
| Bi$_2$Sr$_{1.8}$Cu$_{0.2}$Co$_{1.9}$Ta$_{0.1}$O$_9$ | 199 | 9 | 0.9 |
| Bi$_2$Sr$_{1.8}$Zn$_{0.2}$Co$_{1.9}$Ta$_{0.1}$O$_9$ | 200 | 8.2 | 1.1 |
| Bi$_2$Sr$_{1.8}$Pb$_{0.2}$Co$_{1.9}$Ta$_{0.1}$O$_9$ | 206 | 9.1 | 1 |
| Bi$_2$Sr$_{1.8}$Ca$_{0.2}$Co$_{1.9}$Ta$_{0.1}$O$_9$ | 206 | 8.4 | 1.2 |
| Bi$_2$Sr$_{1.8}$Ba$_{0.2}$Co$_{1.9}$Ta$_{0.1}$O$_9$ | 198 | 8.6 | 1.1 |
| Bi$_2$Sr$_{1.8}$Al$_{0.2}$Co$_{1.9}$Ta$_{0.1}$O$_9$ | 199 | 7.2 | 0.9 |
| Bi$_2$Sr$_{1.8}$Y$_{0.2}$Co$_{1.9}$Ta$_{0.1}$O$_9$ | 200 | 9 | 0.8 |
| Bi$_2$Sr$_{1.8}$La$_{0.2}$Co$_{1.9}$Ta$_{0.1}$O$_9$ | 206 | 8.2 | 1 |
| Bi$_2$Sr$_{1.8}$Ce$_{0.2}$Co$_{1.9}$Ta$_{0.1}$O$_9$ | 205 | 7.9 | 1.3 |
| Bi$_2$Sr$_{1.8}$Pr$_{0.2}$Co$_{1.9}$Ta$_{0.1}$O$_9$ | 198 | 6.9 | 1.2 |
| Bi$_2$Sr$_{1.8}$Nd$_{0.2}$Co$_{1.9}$Ta$_{0.1}$O$_9$ | 199 | 8.1 | 1.3 |
| Bi$_2$Sr$_{1.8}$Sm$_{0.2}$Co$_{1.9}$Ta$_{0.1}$O$_9$ | 200 | 6.9 | 0.9 |
| Bi$_2$Sr$_{1.8}$Eu$_{0.2}$Co$_{1.9}$Ta$_{0.1}$O$_9$ | 199 | 7.4 | 1.1 |
| Bi$_2$Sr$_{1.8}$Gd$_{0.2}$Co$_{1.9}$Ta$_{0.1}$O$_9$ | 210 | 7.8 | 1.4 |
| Bi$_2$Sr$_{1.8}$Dy$_{0.2}$Co$_{1.9}$Ta$_{0.1}$O$_9$ | 202 | 7.7 | 1.2 |
| Bi$_2$Sr$_{1.8}$Ho$_{0.2}$Co$_{1.9}$Ta$_{0.1}$O$_9$ | 204 | 8 | 0.9 |
| Bi$_2$Sr$_{1.8}$Er$_{0.2}$Co$_{1.9}$Ta$_{0.1}$O$_9$ | 197 | 8.2 | 1.1 |
| Bi$_2$Sr$_{1.8}$Yb$_{0.2}$Co$_{1.9}$Ta$_{0.1}$O$_9$ | 190 | 7.9 | 1.2 |
| Bi$_2$Pb$_{0.2}$Sr$_2$Co$_{1.9}$Ta$_{0.1}$O$_9$ | 199 | 8.4 | 1.1 |
| Bi$_2$Pb$_{0.2}$Sr$_{1.8}$Na$_{0.2}$Co$_{1.9}$Ta$_{0.1}$O$_9$ | 201 | 8.6 | 1.2 |
| Bi$_2$Pb$_{0.2}$Sr$_{1.8}$K$_{0.2}$Co$_{1.9}$Ta$_{0.1}$O$_9$ | 207 | 8.2 | 1 |
| Bi$_2$Pb$_{0.2}$Sr$_{1.8}$Li$_{0.2}$Co$_{1.9}$Ta$_{0.1}$O$_9$ | 190 | 7.9 | 1.3 |
| Bi$_2$Pb$_{0.2}$Sr$_{1.8}$Ti$_{0.2}$Co$_{1.9}$Ta$_{0.1}$O$_9$ | 198 | 8.6 | 1 |
| Bi$_2$Pb$_{0.2}$Sr$_{1.8}$V$_{0.2}$Co$_{1.9}$Ta$_{0.1}$O$_9$ | 199 | 9.1 | 0.9 |
| Bi$_2$Pb$_{0.2}$Sr$_{1.8}$Cr$_{0.2}$Co$_{1.9}$Ta$_{0.1}$O$_9$ | 201 | 6.9 | 1.1 |
| Bi$_2$Pb$_{0.2}$Sr$_{1.8}$Mn$_{0.2}$Co$_{1.9}$Ta$_{0.1}$O$_9$ | 210 | 7.4 | 1 |
| Bi$_2$Pb$_{0.2}$Sr$_{1.8}$Fe$_{0.2}$Co$_{1.9}$Ta$_{0.1}$O$_9$ | 200 | 7.8 | 1.2 |
| Bi$_2$Pb$_{0.2}$Sr$_{1.8}$Ni$_{0.2}$Co$_{1.9}$Ta$_{0.1}$O$_9$ | 206 | 7.7 | 1.1 |
| Bi$_2$Pb$_{0.2}$Sr$_{1.8}$Cu$_{0.2}$Co$_{1.9}$Ta$_{0.1}$O$_9$ | 206 | 8.0 | 0.9 |
| Bi$_2$Pb$_{0.2}$Sr$_{1.8}$Zn$_{0.2}$Co$_{1.9}$Ta$_{0.1}$O$_9$ | 198 | 8.2 | 0.8 |
| Bi$_2$Pb$_{0.2}$Sr$_{1.8}$Pb$_{0.2}$Co$_{1.9}$Ta$_{0.1}$O$_9$ | 199 | 7.9 | 1 |
| Bi$_2$Pb$_{0.2}$Sr$_{1.8}$Ca$_{0.2}$Co$_{1.9}$Ta$_{0.1}$O$_9$ | 200 | 9.1 | 1.3 |
| Bi$_2$Pb$_{0.2}$Sr$_{1.8}$Ba$_{0.2}$Co$_{1.9}$Ta$_{0.1}$O$_9$ | 206 | 8.4 | 1.2 |
| Bi$_2$Pb$_{0.2}$Sr$_{1.8}$Al$_{0.2}$Co$_{1.9}$Ta$_{0.1}$O$_9$ | 205 | 8.6 | 0.7 |
| Bi$_2$Pb$_{0.2}$Sr$_{1.8}$Y$_{0.2}$Co$_{1.9}$Ta$_{0.1}$O$_9$ | 198 | 7.8 | 1.3 |

TABLE 71

| Compound | | | |
|---|---|---|---|
| Bi$_2$Pb$_{0.2}$Sr$_{1.8}$La$_{0.2}$Co$_{1.9}$Ta$_{0.1}$O$_9$ | 199 | 9.0 | 1.4 |
| Bi$_2$Pb$_{0.2}$Sr$_{1.8}$Ce$_{0.2}$Co$_{1.9}$Ta$_{0.1}$O$_9$ | 200 | 8.2 | 1.1 |
| Bi$_2$Pb$_{0.2}$Sr$_{1.8}$Pr$_{0.2}$Co$_{1.9}$Ta$_{0.1}$O$_9$ | 199 | 8.3 | 1 |
| Bi$_2$Pb$_{0.2}$Sr$_{1.8}$Nd$_{0.2}$Co$_{1.9}$Ta$_{0.1}$O$_9$ | 210 | 8.4 | 1.3 |
| Bi$_2$Pb$_{0.2}$Sr$_{1.8}$Sm$_{0.2}$Co$_{1.9}$Ta$_{0.1}$O$_9$ | 202 | 8.6 | 0.9 |
| Bi$_2$Pb$_{0.2}$Sr$_{1.8}$Eu$_{0.2}$Co$_{1.9}$Ta$_{0.1}$O$_9$ | 204 | 8.2 | 1.1 |
| Bi$_2$Pb$_{0.2}$Sr$_{1.8}$Gd$_{0.2}$Co$_{1.9}$Ta$_{0.1}$O$_9$ | 197 | 7.9 | 1.4 |
| Bi$_2$Pb$_{0.2}$Sr$_{1.8}$Dy$_{0.2}$Co$_{1.9}$Ta$_{0.1}$O$_9$ | 190 | 8.6 | 1.2 |
| Bi$_2$Pb$_{0.2}$Sr$_{1.8}$Ho$_{0.2}$Co$_{1.9}$Ta$_{0.1}$O$_9$ | 198 | 9.1 | 0.9 |
| Bi$_2$Pb$_{0.2}$Sr$_{1.8}$Er$_{0.2}$Co$_{1.9}$Ta$_{0.1}$O$_9$ | 199 | 6.9 | 1.1 |
| Bi$_2$Pb$_{0.2}$Sr$_{1.8}$Yb$_{0.2}$Co$_{1.9}$Ta$_{0.1}$O$_9$ | 201 | 7.4 | 1.2 |
| Bi$_2$Ca$_2$Co$_{1.9}$Ta$_{0.1}$O$_9$ | 190 | 7.7 | 1.1 |
| Bi$_2$Ca$_{1.8}$Na$_{0.2}$Co$_{1.9}$Ta$_{0.1}$O$_9$ | 198 | 8 | 1.2 |
| Bi$_2$Ca$_{1.8}$K$_{0.2}$Co$_{1.9}$Ta$_{0.1}$O$_9$ | 199 | 8.2 | 1.4 |
| Bi$_2$Ca$_{1.8}$Li$_{0.2}$Co$_{1.9}$Ta$_{0.1}$O$_9$ | 201 | 7.9 | 0.8 |
| Bi$_2$Ca$_{1.8}$Ti$_{0.2}$Co$_{1.9}$Ta$_{0.1}$O$_9$ | 210 | 9.1 | 1.3 |
| Bi$_2$Ca$_{1.8}$V$_{0.2}$Co$_{1.9}$Ta$_{0.1}$O$_9$ | 206 | 8.4 | 1.2 |
| Bi$_2$Ca$_{1.8}$Cr$_{0.2}$Co$_{1.9}$Ta$_{0.1}$O$_9$ | 205 | 8.6 | 1.1 |
| Bi$_2$Ca$_{1.8}$Mn$_{0.2}$Co$_{1.9}$Ta$_{0.1}$O$_9$ | 198 | 7.8 | 0.8 |
| Bi$_2$Ca$_{1.8}$Fe$_{0.2}$Co$_{1.9}$Ta$_{0.1}$O$_9$ | 195 | 9 | 1.3 |
| Bi$_2$Ca$_{1.8}$Ni$_{0.2}$Co$_{1.9}$Ta$_{0.1}$O$_9$ | 200 | 8.2 | 1.4 |
| Bi$_2$Ca$_{1.8}$Cu$_{0.2}$Co$_{1.9}$Ta$_{0.1}$O$_9$ | 203 | 8.3 | 1.1 |
| Bi$_2$Ca$_{1.8}$Zn$_{0.2}$Co$_{1.9}$Ta$_{0.1}$O$_9$ | 200 | 8.6 | 1 |
| Bi$_2$Ca$_{1.8}$Pb$_{0.2}$Co$_{1.9}$Ta$_{0.1}$O$_9$ | 203 | 8.7 | 1.3 |
| Bi$_2$Ca$_{1.8}$Sr$_{0.2}$Co$_{1.9}$Ta$_{0.1}$O$_9$ | 201 | 8.3 | 0.9 |
| Bi$_2$Ca$_{1.8}$Ba$_{0.2}$Co$_{1.9}$Ta$_{0.1}$O$_9$ | 208 | 9 | 1.1 |
| Bi$_2$Ca$_{1.8}$Al$_{0.2}$Co$_{1.9}$Ta$_{0.1}$O$_9$ | 198 | 7.9 | 1.4 |
| Bi$_2$Ca$_{1.8}$Y$_{0.2}$Co$_{1.9}$Ta$_{0.1}$O$_9$ | 199 | 8.1 | 1.2 |
| Bi$_2$Ca$_{1.8}$La$_{0.2}$Co$_{1.9}$Ta$_{0.1}$O$_9$ | 200 | 8 | 0.9 |
| Bi$_2$Ca$_{1.8}$Ce$_{0.2}$Co$_{1.9}$Ta$_{0.1}$O$_9$ | 199 | 7.8 | 1.1 |
| Bi$_2$Ca$_{1.8}$Pr$_{0.2}$Co$_{1.9}$Ta$_{0.1}$O$_9$ | 200 | 7.2 | 1.2 |
| Bi$_2$Ca$_{1.8}$Nd$_{0.2}$Co$_{1.9}$Ta$_{0.1}$O$_9$ | 206 | 9 | 0.9 |
| Bi$_2$Ca$_{1.8}$Sm$_{0.2}$Co$_{1.9}$Ta$_{0.1}$O$_9$ | 206 | 8.2 | 1.3 |
| Bi$_2$Ca$_{1.8}$Eu$_{0.2}$Co$_{1.9}$Ta$_{0.1}$O$_9$ | 198 | 7.9 | 1.4 |
| Bi$_2$Ca$_{1.8}$Gd$_{0.2}$Co$_{1.9}$Ta$_{0.1}$O$_9$ | 199 | 6.9 | 1.1 |
| Bi$_2$Ca$_{1.8}$Dy$_{0.2}$Co$_{1.9}$Ta$_{0.1}$O$_9$ | 200 | 8.1 | 1.0 |

TABLE 72

| Compound | | | |
|---|---|---|---|
| Bi$_2$Ca$_{1.8}$Ho$_{0.2}$Co$_{1.9}$Ta$_{0.1}$O$_9$ | 206 | 6.9 | 1.3 |
| Bi$_2$Ca$_{1.8}$Er$_{0.2}$Co$_{1.9}$Ta$_{0.1}$O$_9$ | 205 | 7.4 | 0.9 |
| Bi$_2$Ca$_{1.8}$Yb$_{0.2}$Co$_{1.9}$Ta$_{0.1}$O$_9$ | 198 | 7.8 | 1.1 |
| Bi$_2$Pb$_{0.2}$Ca$_2$Co$_{1.9}$Ta$_{0.1}$O$_9$ | 200 | 8 | 1.2 |
| Bi$_2$Pb$_{0.2}$Ca$_{1.8}$Na$_{0.2}$Co$_{1.9}$Ta$_{0.1}$O$_9$ | 199 | 8.2 | 0.9 |
| Bi$_2$Pb$_{0.2}$Ca$_{1.8}$K$_{0.2}$Co$_{1.9}$Ta$_{0.1}$O$_9$ | 210 | 7.9 | 1.1 |
| Bi$_2$Pb$_{0.2}$Ca$_{1.8}$Li$_{0.2}$Co$_{1.9}$Ta$_{0.1}$O$_9$ | 202 | 9.1 | 1.2 |
| Bi$_2$Pb$_{0.2}$Ca$_{1.8}$Ti$_{0.2}$Co$_{1.9}$Ta$_{0.1}$O$_9$ | 204 | 8.4 | 0.9 |
| Bi$_2$Pb$_{0.2}$Ca$_{1.8}$V$_{0.2}$Co$_{1.9}$Ta$_{0.1}$O$_9$ | 197 | 8.6 | 1.1 |
| Bi$_2$Pb$_{0.2}$Ca$_{1.8}$Cr$_{0.2}$Co$_{1.9}$Ta$_{0.1}$O$_9$ | 190 | 8.2 | 1.2 |
| Bi$_2$Pb$_{0.2}$Ca$_{1.8}$Mn$_{0.2}$Co$_{1.9}$Ta$_{0.1}$O$_9$ | 198 | 7.9 | 1.4 |
| Bi$_2$Pb$_{0.2}$Ca$_{1.8}$Fe$_{0.2}$Co$_{1.9}$Ta$_{0.1}$O$_9$ | 199 | 8.6 | 0.8 |
| Bi$_2$Pb$_{0.2}$Ca$_{1.8}$Ni$_{0.2}$Co$_{1.9}$Ta$_{0.1}$O$_9$ | 201 | 9.1 | 1.3 |
| Bi$_2$Pb$_{0.2}$Ca$_{1.8}$Cu$_{0.2}$Co$_{1.9}$Ta$_{0.1}$O$_9$ | 207 | 6.9 | 1.2 |
| Bi$_2$Pb$_{0.2}$Ca$_{1.8}$Zn$_{0.2}$Co$_{1.9}$Ta$_{0.1}$O$_9$ | 190 | 7.4 | 1.1 |
| Bi$_2$Pb$_{0.2}$Ca$_{1.8}$Pb$_{0.2}$Co$_{1.9}$Ta$_{0.1}$O$_9$ | 198 | 7.8 | 0.8 |
| Bi$_2$Pb$_{0.2}$Ca$_{1.8}$Sr$_{0.2}$Co$_{1.9}$Ta$_{0.1}$O$_9$ | 199 | 7.7 | 1.3 |
| Bi$_2$Pb$_{0.2}$Ca$_{1.8}$Ba$_{0.2}$Co$_{1.9}$Ta$_{0.1}$O$_9$ | 201 | 8 | 1.4 |
| Bi$_2$Pb$_{0.2}$Ca$_{1.8}$Al$_{0.2}$Co$_{1.9}$Ta$_{0.1}$O$_9$ | 210 | 8.2 | 1.1 |
| Bi$_2$Pb$_{0.2}$Ca$_{1.8}$Y$_{0.2}$Co$_{1.9}$Ta$_{0.1}$O$_9$ | 206 | 7.9 | 1 |
| Bi$_2$Pb$_{0.2}$Ca$_{1.8}$La$_{0.2}$Co$_{1.9}$Ta$_{0.1}$O$_9$ | 205 | 9.1 | 1.3 |
| Bi$_2$Pb$_{0.2}$Ca$_{1.8}$Ce$_{0.2}$Co$_{1.9}$Ta$_{0.1}$O$_9$ | 198 | 8.4 | 0.9 |
| Bi$_2$Pb$_{0.2}$Ca$_{1.8}$Pr$_{0.2}$Co$_{1.9}$Ta$_{0.1}$O$_9$ | 195 | 8.6 | 1.1 |
| Bi$_2$Pb$_{0.2}$Ca$_{1.8}$Nd$_{0.2}$Co$_{1.9}$Ta$_{0.1}$O$_9$ | 200 | 7.8 | 1.4 |
| Bi$_2$Pb$_{0.2}$Ca$_{1.8}$Sm$_{0.2}$Co$_{1.9}$Ta$_{0.1}$O$_9$ | 203 | 9 | 1.2 |
| Bi$_2$Pb$_{0.2}$Ca$_{1.8}$Eu$_{0.2}$Co$_{1.9}$Ta$_{0.1}$O$_9$ | 200 | 8.2 | 0.9 |
| Bi$_2$Pb$_{0.2}$Ca$_{1.8}$Gd$_{0.2}$Co$_{1.9}$Ta$_{0.1}$O$_9$ | 203 | 8.3 | 1.1 |
| Bi$_2$Pb$_{0.2}$Ca$_{1.8}$Dy$_{0.2}$Co$_{1.9}$Ta$_{0.1}$O$_9$ | 201 | 8.6 | 1.2 |
| Bi$_2$Pb$_{0.2}$Ca$_{1.8}$Ho$_{0.2}$Co$_{1.9}$Ta$_{0.1}$O$_9$ | 208 | 8.7 | 0.9 |
| Bi$_2$Pb$_{0.2}$Ca$_{1.8}$Er$_{0.2}$Co$_{1.9}$Ta$_{0.1}$O$_9$ | 198 | 8.3 | 1.1 |
| Bi$_2$Pb$_{0.2}$Ca$_{1.8}$Yb$_{0.2}$Co$_{1.9}$Ta$_{0.1}$O$_9$ | 199 | 9 | 1.2 |
| Bi$_2$Ba$_2$Co$_{1.9}$Ta$_{0.1}$O$_9$ | 203 | 8.1 | 0.8 |
| Bi$_2$Ba$_{1.8}$Na$_{0.2}$Co$_{1.9}$Ta$_{0.1}$O$_9$ | 200 | 8 | 1.3 |
| Bi$_2$Ba$_{1.8}$K$_{0.2}$Co$_{1.9}$Ta$_{0.1}$O$_9$ | 203 | 7.8 | 1.2 |
| Bi$_2$Ba$_{1.8}$Li$_{0.2}$Co$_{1.9}$Ta$_{0.1}$O$_9$ | 201 | 7.2 | 1.1 |
| Bi$_2$Ba$_{1.8}$Ti$_{0.2}$Co$_{1.9}$Ta$_{0.1}$O$_9$ | 208 | 9 | 0.8 |
| Bi$_2$Ba$_{1.8}$V$_{0.2}$Co$_{1.9}$Ta$_{0.1}$O$_9$ | 198 | 7.8 | 0.7 |

TABLE 73

| Compound | | | |
|---|---|---|---|
| Bi$_2$Ba$_{1.8}$Cr$_{0.2}$Co$_{1.9}$Ta$_{0.1}$O$_9$ | 199 | 7.5 | 1.3 |
| Bi$_2$Ba$_{1.8}$Mn$_{0.2}$Co$_{1.9}$Ta$_{0.1}$O$_9$ | 200 | 8.6 | 0.8 |
| Bi$_2$Ba$_{1.8}$Fe$_{0.2}$Co$_{1.9}$Ta$_{0.1}$O$_9$ | 199 | 8.2 | 1.3 |
| Bi$_2$Ba$_{1.8}$Ni$_{0.2}$Co$_{1.9}$Ta$_{0.1}$O$_9$ | 200 | 7.9 | 1.2 |
| Bi$_2$Ba$_{1.8}$Cu$_{0.2}$Co$_{1.9}$Ta$_{0.1}$O$_9$ | 206 | 6.9 | 1.1 |
| Bi$_2$Ba$_{1.8}$Zn$_{0.2}$Co$_{1.9}$Ta$_{0.1}$O$_9$ | 206 | 9 | 0.8 |
| Bi$_2$Ba$_{1.8}$Pb$_{0.2}$Co$_{1.9}$Ta$_{0.1}$O$_9$ | 198 | 7.8 | 1.3 |
| Bi$_2$Ba$_{1.8}$Ca$_{0.2}$Co$_{1.9}$Ta$_{0.1}$O$_9$ | 199 | 7.5 | 1.4 |
| Bi$_2$Ba$_{1.8}$Sr$_{0.2}$Co$_{1.9}$Ta$_{0.1}$O$_9$ | 200 | 8.6 | 1.1 |
| Bi$_2$Ba$_{1.8}$Al$_{0.2}$Co$_{1.9}$Ta$_{0.1}$O$_9$ | 206 | 8.2 | 1 |
| Bi$_2$Ba$_{1.8}$Y$_{0.2}$Co$_{1.9}$Ta$_{0.1}$O$_9$ | 205 | 7.9 | 1.3 |
| Bi$_2$Ba$_{1.8}$La$_{0.2}$Co$_{1.9}$Ta$_{0.1}$O$_9$ | 198 | 6.9 | 0.9 |
| Bi$_2$Ba$_{1.8}$Ce$_{0.2}$Co$_{1.9}$Ta$_{0.1}$O$_9$ | 199 | 8.1 | 1.1 |
| Bi$_2$Ba$_{1.8}$Pr$_{0.2}$Co$_{1.9}$Ta$_{0.1}$O$_9$ | 200 | 6.9 | 1.4 |
| Bi$_2$Ba$_{1.8}$Nd$_{0.2}$Co$_{1.9}$Ta$_{0.1}$O$_9$ | 199 | 7.4 | 1.2 |
| Bi$_2$Ba$_{1.8}$Sm$_{0.2}$Co$_{1.9}$Ta$_{0.1}$O$_9$ | 210 | 7.8 | 0.9 |
| Bi$_2$Ba$_{1.8}$Eu$_{0.2}$Co$_{1.9}$Ta$_{0.1}$O$_9$ | 202 | 7.7 | 1.1 |
| Bi$_2$Ba$_{1.8}$Gd$_{0.2}$Co$_{1.9}$Ta$_{0.1}$O$_9$ | 204 | 8 | 1.2 |
| Bi$_2$Ba$_{1.8}$Dy$_{0.2}$Co$_{1.9}$Ta$_{0.1}$O$_9$ | 197 | 8.2 | 0.9 |
| Bi$_2$Ba$_{1.8}$Ho$_{0.2}$Co$_{1.9}$Ta$_{0.1}$O$_9$ | 190 | 7.9 | 1.1 |
| Bi$_2$Ba$_{1.8}$Er$_{0.2}$Co$_{1.9}$Ta$_{0.1}$O$_9$ | 198 | 9.1 | 1.2 |
| Bi$_2$Ba$_{1.8}$Yb$_{0.2}$Co$_{1.9}$Ta$_{0.1}$O$_9$ | 199 | 8.4 | 1.4 |
| Bi$_2$Pb$_{0.2}$Ba$_2$Co$_{1.9}$Ta$_{0.1}$O$_9$ | 207 | 8.2 | 1.3 |
| Bi$_2$Pb$_{0.2}$Ba$_{1.8}$Na$_{0.2}$Co$_{1.9}$Ta$_{0.1}$O$_9$ | 190 | 7.9 | 1.2 |
| Bi$_2$Pb$_{0.2}$Ba$_{1.8}$K$_{0.2}$Co$_{1.9}$Ta$_{0.1}$O$_9$ | 198 | 8.6 | 1.1 |
| Bi$_2$Pb$_{0.2}$Ba$_{1.8}$Li$_{0.2}$Co$_{1.9}$Ta$_{0.1}$O$_9$ | 199 | 9.1 | 1.4 |
| Bi$_2$Pb$_{0.2}$Ba$_{1.8}$Ti$_{0.2}$Co$_{1.9}$Ta$_{0.1}$O$_9$ | 201 | 6.9 | 1.2 |
| Bi$_2$Pb$_{0.2}$Ba$_{1.8}$V$_{0.2}$Co$_{1.9}$Ta$_{0.1}$O$_9$ | 210 | 7.4 | 0.9 |
| Bi$_2$Pb$_{0.2}$Ba$_{1.8}$Cr$_{0.2}$Co$_{1.9}$Ta$_{0.1}$O$_9$ | 198 | 7.8 | 1.1 |
| Bi$_2$Pb$_{0.2}$Ba$_{1.8}$Mn$_{0.2}$Co$_{1.9}$Ta$_{0.1}$O$_9$ | 200 | 7.7 | 1.2 |
| Bi$_2$Pb$_{0.2}$Ba$_{1.8}$Fe$_{0.2}$Co$_{1.9}$Ta$_{0.1}$O$_9$ | 203 | 8 | 0.9 |
| Bi$_2$Pb$_{0.2}$Ba$_{1.8}$Ni$_{0.2}$Co$_{1.9}$Ta$_{0.1}$O$_9$ | 201 | 8.2 | 1.1 |
| Bi$_2$Pb$_{0.2}$Ba$_{1.8}$Cu$_{0.2}$Co$_{1.9}$Ta$_{0.1}$O$_9$ | 208 | 7.9 | 1.2 |
| Bi$_2$Pb$_{0.2}$Ba$_{1.8}$Zn$_{0.2}$Co$_{1.9}$Ta$_{0.1}$O$_9$ | 198 | 9.1 | 1.4 |
| Bi$_2$Pb$_{0.2}$Ba$_{1.8}$Pb$_{0.2}$Co$_{1.9}$Ta$_{0.1}$O$_9$ | 199 | 8.4 | 0.8 |
| Bi$_2$Pb$_{0.2}$Ba$_{1.8}$Ca$_{0.2}$Co$_{1.9}$Ta$_{0.1}$O$_9$ | 200 | 8.6 | 1.3 |
| Bi$_2$Pb$_{0.2}$Ba$_{1.8}$Sr$_{0.2}$Co$_{1.9}$Ta$_{0.1}$O$_9$ | 206 | 7.8 | 1.2 |

TABLE 74

| Composition | | | |
|---|---|---|---|
| $Bi_2Pb_{0.2}Ba_{1.8}Al_{0.2}Co_{1.9}Ta_{0.1}O_9$ | 206 | 9.0 | 1.1 |
| $Bi_2Pb_{0.2}Ba_{1.8}Y_{0.2}Co_{1.9}Ta_{0.1}O_9$ | 198 | 8.2 | 0.8 |
| $Bi_2Pb_{0.2}Ba_{1.8}La_{0.2}Co_{1.9}Ta_{0.1}O_9$ | 199 | 9.1 | 1.3 |
| $Bi_2Pb_{0.2}Ba_{1.8}Ce_{0.2}Co_{1.9}Ta_{0.1}O_9$ | 200 | 8.4 | 1.4 |
| $Bi_2Pb_{0.2}Ba_{1.8}Pr_{0.2}Co_{1.9}Ta_{0.1}O_9$ | 206 | 8.6 | 1.1 |
| $Bi_2Pb_{0.2}Ba_{1.8}Nd_{0.2}Co_{1.9}Ta_{0.1}O_9$ | 205 | 7.8 | 1 |
| $Bi_2Pb_{0.2}Ba_{1.8}Sm_{0.2}Co_{1.9}Ta_{0.1}O_9$ | 198 | 9 | 1.3 |
| $Bi_2Pb_{0.2}Ba_{1.8}Eu_{0.2}Co_{1.9}Ta_{0.1}O_9$ | 199 | 7.8 | 0.9 |
| $Bi_2Pb_{0.2}Ba_{1.8}Gd_{0.2}Co_{1.9}Ta_{0.1}O_9$ | 200 | 7.5 | 1.1 |
| $Bi_2Pb_{0.2}Ba_{1.8}Dy_{0.2}Co_{1.9}Ta_{0.1}O_9$ | 199 | 8.6 | 1.4 |
| $Bi_2Pb_{0.2}Ba_{1.8}Ho_{0.2}Co_{1.9}Ta_{0.1}O_9$ | 210 | 8.2 | 1.2 |
| $Bi_2Pb_{0.2}Ba_{1.8}Er_{0.2}Co_{1.9}Ta_{0.1}O_9$ | 202 | 7.9 | 0.9 |
| $Bi_2Pb_{0.2}Ba_{1.8}Yb_{0.2}Co_{1.9}Ta_{0.1}O_9$ | 204 | 6.9 | 1.1 |
| $Bi_2Sr_{1.9}Na_{0.1}Co_2O_9$ | 199 | 8.6 | 1.2 |
| $Bi_2Sr_{1.9}Na_{0.1}Co_{1.9}Ti_{0.1}O_9$ | 201 | 8.2 | 1 |
| $Bi_2Sr_{1.9}Na_{0.1}Co_{1.9}V_{0.1}O_9$ | 207 | 7.9 | 1.3 |
| $Bi_2Sr_{1.9}Na_{0.1}Co_{1.9}Cr_{0.1}O_9$ | 190 | 6.9 | 1 |
| $Bi_2Sr_{1.9}Na_{0.1}Co_{1.9}Mn_{0.1}O_9$ | 198 | 8.1 | 0.9 |
| $Bi_2Sr_{1.9}Na_{0.1}Co_{1.9}Fe_{0.1}O_9$ | 199 | 6.9 | 1.1 |
| $Bi_2Sr_{1.9}Na_{0.1}Co_{1.9}Cu_{0.1}O_9$ | 201 | 7.4 | 1 |
| $Bi_2Sr_{1.9}Na_{0.1}Co_{1.9}Ag_{0.1}O_9$ | 210 | 7.8 | 1.2 |
| $Bi_2Sr_{1.9}Na_{0.1}Co_{1.9}Mo_{0.1}O_9$ | 206 | 7.7 | 1.1 |
| $Bi_2Sr_{1.9}Na_{0.1}Co_{1.9}W_{0.1}O_9$ | 205 | 8 | 1 |
| $Bi_2Sr_{1.9}Na_{0.1}Co_{1.9}Nb_{0.1}O_9$ | 198 | 8.2 | 0.9 |
| $Bi_2Sr_{1.9}Na_{0.1}Co_{1.9}Ta_{0.1}O_9$ | 195 | 7.9 | 1.1 |
| $Bi_2Sr_{1.9}K_{0.1}Co_2O_9$ | 203 | 8.4 | 1.2 |
| $Bi_2Sr_{1.9}K_{0.1}Co_{1.9}Ti_{0.1}O_9$ | 200 | 8.6 | 1.1 |
| $Bi_2Sr_{1.9}K_{0.1}Co_{1.9}V_{0.1}O_9$ | 203 | 8.2 | 0.9 |
| $Bi_2Sr_{1.9}K_{0.1}Co_{1.9}Cr_{0.1}O_9$ | 201 | 7.9 | 0.8 |
| $Bi_2Sr_{1.9}K_{0.1}Co_{1.9}Mn_{0.1}O_9$ | 208 | 8.6 | 1 |
| $Bi_2Sr_{1.9}K_{0.1}Co_{1.9}Fe_{0.1}O_9$ | 198 | 9.1 | 1.3 |
| $Bi_2Sr_{1.9}K_{0.1}Co_{1.9}Cu_{0.1}O_9$ | 199 | 6.9 | 1.2 |
| $Bi_2Sr_{1.9}K_{0.1}Co_{1.9}Ag_{0.1}O_9$ | 200 | 7.4 | 1.3 |
| $Bi_2Sr_{1.9}K_{0.1}Co_{1.9}Mo_{0.1}O_9$ | 199 | 7.8 | 1 |
| $Bi_2Sr_{1.9}K_{0.1}Co_{1.9}W_{0.1}O_9$ | 200 | 7.7 | 0.8 |
| $Bi_2Sr_{1.9}K_{0.1}Co_{1.9}Nb_{0.1}O_9$ | 206 | 8 | 1.1 |
| $Bi_2Sr_{1.9}K_{0.1}Co_{1.9}Ta_{0.1}O_9$ | 206 | 8.2 | 1.2 |

As is clear from the above results, the complex oxides represented by the formulae shown in Tables 7 to 74 exhibit excellent properties as a p-type thermoelectric material and have favorable electrical conductivity. Therefore, the complex oxides can possibly demonstrate excellent thermoelectric generation properties when used in place of the p-type thermoelectric materials of the Examples.

Reference Example 2

A complex oxide having properties of the n-type thermoelectric material represented by the formula $Ln_mR^1_nNi_pR^2_qO_r$ or $(Ln_sR^3_t)_2Ni_uR^4_vO_w$ was prepared by the following method.

As a starting material, nitrates comprising an element of an intended complex oxide were used. The starting materials were completely dissolved in distilled water in such a manner as to yield the atomic ratio of each formula shown in Tables 75 to 121. The solution was thoroughly mixed while stirring in a crucible of alumina, and solidified by evaporating the water. The solidified product was calcined at 600° C. in air for 10 hours to decompose the nitrates. The obtained calcinate was crushed, and then molded under pressure. The molded body was heated in a 300 mL/min oxygen stream for 20 hours, thereby producing a complex oxide. The heating temperature and heating time varied in the range of 700 to 1100° C. in such a manner that an intended oxide is produced.

The complex oxides obtained were measured for the Seebeck coefficient at 700° C., electrical resistivity at 700° C. and thermal conductivity at 700° C. Tables 75 to 121 show the measurement results.

TABLE 75 n-type

| Composition $Ln_mR^1_nNi_pR^2_qO_r$ | Seebeck Coefficient μV/K (700° C.) | Electrical Resistivity mΩcm (700° C.) | Thermal Conductivity W/mK (700° C.) |
|---|---|---|---|
| $LaNiO_3$ | −22 | 2.2 | 4.2 |
| $CeNiO_3$ | −19 | 1.9 | 4.1 |
| $PrNiO_3$ | −25 | 1.8 | 3.9 |
| $NdNiO_3$ | −30 | 2.9 | 4 |
| $SmNiO_3$ | −28 | 3.1 | 3.8 |
| $EuNiO_3$ | −27 | 2.2 | 3.7 |
| $GdNiO_3$ | −25 | 2.1 | 4 |
| $DyNiO_3$ | −18 | 3 | 3.9 |
| $HoNiO_3$ | −22 | 2.8 | 3.6 |
| $ErNiO_3$ | −10 | 3.2 | 4.1 |
| $YbNiO_3$ | −26 | 3.1 | 3.9 |
| $La_{0.9}Na_{0.1}NiO_3$ | −19 | 2.4 | 4.3 |
| $La_{0.9}K_{0.1}NiO_3$ | −17 | 2.8 | 4 |
| $La_{0.9}Sr_{0.1}NiO_3$ | −23 | 2.9 | 4.7 |
| $La_{0.9}Ca_{0.1}NiO_3$ | −22 | 3 | 4.2 |
| $La_{0.9}Bi_{0.1}NiO_3$ | −18 | 2.8 | 4.3 |
| | −20 | 3.5 | 4.9 |
| $Ce_{0.9}Na_{0.1}NiO_3$ | −21 | 4 | 3.9 |
| $Ce_{0.9}K_{0.1}NiO_3$ | −21 | 3.9 | 4.2 |
| $Ce_{0.9}Sr_{0.1}NiO_3$ | −22 | 2.1 | 4 |
| $Ce_{0.9}Ca_{0.1}NiO_3$ | −18 | 2.6 | 4.7 |
| $Ce_{0.9}Bi_{0.1}NiO_3$ | −25 | 2.8 | 4.6 |
| $Pr_{0.9}Na_{0.1}NiO_3$ | −28 | 3.9 | 4.2 |
| $Pr_{0.9}K_{0.1}NiO_3$ | −19 | 3.8 | 4.7 |
| $Pr_{0.9}Sr_{0.1}NiO_3$ | −20 | 2.7 | 4.8 |
| $Pr_{0.9}Ca_{0.1}NiO_3$ | −26 | 1.9 | 4.1 |
| $Pr_{0.9}Bi_{0.1}NiO_3$ | −23 | 2.8 | 3.8 |
| $Nd_{0.9}Na_{0.1}NiO_3$ | −19 | 3.4 | 4.6 |
| $Nd_{0.9}K_{0.1}NiO_3$ | −17 | 2.8 | 4.2 |
| $Nd_{0.9}Sr_{0.1}NiO_3$ | −20 | 3 | 4.5 |
| $Nd_{0.9}Ca_{0.1}NiO_3$ | −22 | 2.9 | 4.3 |

TABLE 76

| $Nd_{0.9}Bi_{0.1}NiO_3$ | −20 | 1.8 | 4.2 |
|---|---|---|---|
| $Sm_{0.9}Na_{0.1}NiO_3$ | −23 | 3.1 | 3.9 |
| $Sm_{0.9}K_{0.1}NiO_3$ | −18 | 2.2 | 4 |
| $Sm_{0.9}Sr_{0.1}NiO_3$ | −28 | 2.1 | 3.8 |
| $Sm_{0.9}Ca_{0.1}NiO_3$ | −19 | 3 | 3.7 |
| $Sm_{0.9}Bi_{0.1}NiO_3$ | −24 | 2.8 | 4 |
| $Eu_{0.9}Na_{0.1}NiO_3$ | −16 | 3.1 | 3.6 |
| $Eu_{0.9}K_{0.1}NiO_3$ | −20 | 3 | 4.1 |
| $Eu_{0.9}Sr_{0.1}NiO_3$ | −22 | 2.4 | 3.9 |
| $Eu_{0.9}Ca_{0.1}NiO_3$ | −24 | 2.8 | 4.6 |
| $Eu_{0.9}Bi_{0.1}NiO_3$ | −23 | 2.9 | 4.3 |
| $Gd_{0.9}Na_{0.1}NiO_3$ | −28 | 2.8 | 4.7 |
| $Gd_{0.9}K_{0.1}NiO_3$ | −19 | 3.5 | 4.2 |
| $Gd_{0.9}Sr_{0.1}NiO_3$ | −21 | 4 | 4.3 |
| $Gd_{0.9}Ca_{0.1}NiO_3$ | −22 | 3.9 | 4.9 |
| $Gd_{0.9}Bi_{0.1}NiO_3$ | −24 | 2.1 | 3.9 |
| $Dy_{0.9}Na_{0.1}NiO_3$ | −29 | 2.8 | 4 |
| $Dy_{0.9}K_{0.1}NiO_3$ | −17 | 2.7 | 4.7 |
| $Dy_{0.9}Sr_{0.1}NiO_3$ | −18 | 3.9 | 4.6 |
| $Dy_{0.9}Ca_{0.1}NiO_3$ | −24 | 3.8 | 4.5 |
| $Dy_{0.9}Bi_{0.1}NiO_3$ | −22 | 2.7 | 4.2 |
| $Ho_{0.9}Na_{0.1}NiO_3$ | −27 | 2.8 | 4.8 |
| $Ho_{0.9}K_{0.1}NiO_3$ | −21 | 3.7 | 4.1 |
| $Ho_{0.9}Sr_{0.1}NiO_3$ | −23 | 3.4 | 3.8 |
| $Ho_{0.9}Ca_{0.1}NiO_3$ | −19 | 2.8 | 4 |
| $Ho_{0.9}Bi_{0.1}NiO_3$ | −23 | 3 | 4.6 |
| $Er_{0.9}Na_{0.1}NiO_3$ | −25 | 2.2 | 4.5 |
| $Er_{0.9}K_{0.1}NiO_3$ | −16 | 1.9 | 4.3 |
| $Er_{0.9}Sr_{0.1}NiO_3$ | −20 | 1.8 | 4.1 |
| $Er_{0.9}Ca_{0.1}NiO_3$ | −22 | 2.9 | 3.9 |
| $Er_{0.9}Bi_{0.1}NiO_3$ | −29 | 3.1 | 4 |

TABLE 77

| | | | |
|---|---|---|---|
| $Yb_{0.9}Na_{0.1}NiO_3$ | −22 | 2.2 | 3.8 |
| $Yb_{0.9}K_{0.1}NiO_3$ | −19 | 2.1 | 3.7 |
| $Yb_{0.9}Sr_{0.1}NiO_3$ | −25 | 3 | 4 |
| $Yb_{0.9}Ca_{0.1}NiO_3$ | −30 | 2.8 | 3.9 |
| $Yb_{0.9}Bi_{0.1}NiO_3$ | −28 | 3.2 | 3.6 |
| $LaNi_{0.9}Ti_{0.1}O_3$ | −25 | 3 | 3.9 |
| $LaNi_{0.9}V_{0.1}O_3$ | −18 | 2.4 | 4.6 |
| $LaNi_{0.9}Cr_{0.1}O_3$ | −22 | 2.8 | 4.3 |
| $LaNi_{0.9}Mn_{0.1}O_3$ | −10 | 2.9 | 4 |
| $LaNi_{0.9}Fe_{0.1}O_3$ | −26 | 3 | 4.7 |
| $LaNi_{0.9}Co_{0.1}O_3$ | −20 | 2.8 | 4.2 |
| $LaNi_{0.9}Cu_{0.1}O_3$ | −19 | 3.5 | 4.3 |
| $LaNi_{0.9}Mo_{0.1}O_3$ | −17 | 4 | 4.9 |
| $LaNi_{0.9}W_{0.1}O_3$ | −23 | 3.9 | 3.9 |
| $LaNi_{0.9}Nb_{0.1}O_3$ | −22 | 2.1 | 4.2 |
| $LaNi_{0.9}Ta_{0.1}O_3$ | −18 | 2.6 | 4 |
| $CeNi_{0.9}Ti_{0.1}O_3$ | −21 | 2.7 | 4.6 |
| $CeNi_{0.9}V_{0.1}O_3$ | −21 | 3.9 | 4.5 |
| $CeNi_{0.9}Cr_{0.1}O_3$ | −22 | 3.8 | 4.2 |
| $CeNi_{0.9}Mn_{0.1}O_3$ | −18 | 2.7 | 4.7 |
| $CeNi_{0.9}Fe_{0.1}O_3$ | −25 | 1.9 | 4.8 |
| $CeNi_{0.9}Co_{0.1}O_3$ | −24 | 2.8 | 4.1 |
| $CeNi_{0.9}Cu_{0.1}O_3$ | −28 | 3.7 | 3.8 |
| $CeNi_{0.9}Mo_{0.1}O_3$ | −19 | 3.4 | 4 |
| $CeNi_{0.9}W_{0.1}O_3$ | −20 | 2.8 | 4.6 |
| $CeNi_{0.9}Nb_{0.1}O_3$ | −26 | 3 | 4.2 |
| $CeNi_{0.9}Ta_{0.1}O_3$ | −23 | 2.9 | 4.5 |
| $PrNi_{0.9}Ti_{0.1}O_3$ | −19 | 2.9 | 4.2 |
| $PrNi_{0.9}V_{0.1}O_3$ | −17 | 3.1 | 4.1 |
| $PrNi_{0.9}Cr_{0.1}O_3$ | −20 | 2.2 | 3.9 |
| $PrNi_{0.9}Mn_{0.1}O_3$ | −22 | 2.1 | 4 |
| $PrNi_{0.9}Fe_{0.1}O_3$ | −20 | 3 | 3.8 |
| $PrNi_{0.9}Co_{0.1}O_3$ | −21 | 2.8 | 3.7 |
| $PrNi_{0.9}Cu_{0.1}O_3$ | −23 | 3.2 | 4 |

TABLE 78

| | | | |
|---|---|---|---|
| $PrNi_{0.9}Mo_{0.1}O_3$ | −18 | 3.1 | 3.9 |
| $PrNi_{0.9}W_{0.1}O_3$ | −28 | 3 | 3.6 |
| $PrNi_{0.9}Nb_{0.1}O_3$ | −19 | 2.4 | 4.1 |
| $PrNi_{0.9}Ta_{0.1}O_3$ | −24 | 2.8 | 3.9 |
| $NdNi_{0.9}Ti_{0.1}O_3$ | −16 | 3 | 4.3 |
| $NdNi_{0.9}V_{0.1}O_3$ | −20 | 2.8 | 4 |
| $NdNi_{0.9}Cr_{0.1}O_3$ | −22 | 3.5 | 4.7 |
| $NdNi_{0.9}Mn_{0.1}O_3$ | −24 | 4 | 4.2 |
| $NdNi_{0.9}Fe_{0.1}O_3$ | −23 | 3.9 | 4.3 |
| $NdNi_{0.9}Co_{0.1}O_3$ | −26 | 2.1 | 4.9 |
| $NdNi_{0.9}Cu_{0.1}O_3$ | −28 | 2.6 | 3.9 |
| $NdNi_{0.9}Mo_{0.1}O_3$ | −19 | 2.2 | 4.2 |
| $NdNi_{0.9}W_{0.1}O_3$ | −21 | 1.9 | 4 |
| $NdNi_{0.9}Nb_{0.1}O_3$ | −22 | 1.8 | 4.7 |
| $NdNi_{0.9}Ta_{0.1}O_3$ | −24 | 2.9 | 4.6 |
| $SmNi_{0.9}Ti_{0.1}O_3$ | −29 | 2.2 | 4.2 |
| $SmNi_{0.9}V_{0.1}O_3$ | −17 | 2.1 | 4.7 |
| $SmNi_{0.9}Cr_{0.1}O_3$ | −18 | 3 | 4.8 |
| $SmNi_{0.9}Mn_{0.1}O_3$ | −24 | 2.8 | 4.1 |
| $SmNi_{0.9}Fe_{0.1}O_3$ | −22 | 3.2 | 3.8 |
| $SmNi_{0.9}Co_{0.1}O_3$ | −21 | 3.1 | 4 |
| $SmNi_{0.9}Cu_{0.1}O_3$ | −27 | 3 | 4.6 |
| $SmNi_{0.9}Mo_{0.1}O_3$ | −25 | 2.4 | 4.2 |
| $SmNi_{0.9}W_{0.1}O_3$ | −30 | 2.8 | 4.1 |
| $SmNi_{0.9}Nb_{0.1}O_3$ | −28 | 2.9 | 3.9 |
| $SmNi_{0.9}Ta_{0.1}O_3$ | −27 | 3 | 4 |
| $EuNi_{0.9}Ti_{0.1}O_3$ | −18 | 3.5 | 3.7 |
| $EuNi_{0.9}V_{0.1}O_3$ | −22 | 4 | 4 |
| $EuNi_{0.9}Cr_{0.1}O_3$ | −10 | 3.9 | 3.9 |
| $EuNi_{0.9}Mn_{0.1}O_3$ | −26 | 2.1 | 3.6 |
| $EuNi_{0.9}Fe_{0.1}O_3$ | −20 | 2.6 | 4.1 |
| $EuNi_{0.9}Co_{0.1}O_3$ | −19 | 2.8 | 3.9 |
| $EuNi_{0.9}Cu_{0.1}O_3$ | −17 | 2.7 | 4.6 |
| $EuNi_{0.9}Mo_{0.1}O_3$ | −23 | 3.9 | 4.3 |

TABLE 79

| | | | |
|---|---|---|---|
| $EuNi_{0.9}W_{0.1}O_3$ | −22 | 3.8 | 4 |
| $EuNi_{0.9}Nb_{0.1}O_3$ | −18 | 2.7 | 4.7 |
| $EuNi_{0.9}Ta_{0.1}O_3$ | −20 | 1.9 | 4.2 |
| $GdNi_{0.9}Ti_{0.1}O_3$ | −21 | 3.7 | 4.9 |
| $GdNi_{0.9}V_{0.1}O_3$ | −22 | 3.4 | 3.9 |
| $GdNi_{0.9}Cr_{0.1}O_3$ | −18 | 2.8 | 4.2 |
| $GdNi_{0.9}Mn_{0.1}O_3$ | −25 | 3 | 4 |
| $GdNi_{0.9}Fe_{0.1}O_3$ | −24 | 2.9 | 4.7 |
| $GdNi_{0.9}Co_{0.1}O_3$ | −28 | 1.8 | 4.6 |
| $GdNi_{0.9}Cu_{0.1}O_3$ | −19 | 2.9 | 4.5 |
| $GdNi_{0.9}Mo_{0.1}O_3$ | −20 | 3.1 | 4.2 |
| $GdNi_{0.9}W_{0.1}O_3$ | −26 | 2.2 | 4.7 |
| $GdNi_{0.9}Nb_{0.1}O_3$ | −23 | 2.1 | 4.8 |
| $GdNi_{0.9}Ta_{0.1}O_3$ | −22 | 3 | 4.1 |
| $DyNi_{0.9}Ti_{0.1}O_3$ | −17 | 3.2 | 4 |
| $DyNi_{0.9}V_{0.1}O_3$ | −20 | 3.1 | 4.6 |
| $DyNi_{0.9}Cr_{0.1}O_3$ | −22 | 3 | 4.2 |
| $DyNi_{0.9}Mn_{0.1}O_3$ | −20 | 2.4 | 4.5 |
| $DyNi_{0.9}Fe_{0.1}O_3$ | −21 | 2.8 | 4.3 |
| $DyNi_{0.9}Co_{0.1}O_3$ | −23 | 2.9 | 4.2 |
| $DyNi_{0.9}Cu_{0.1}O_3$ | −18 | 3 | 4.1 |
| $DyNi_{0.9}Mo_{0.1}O_3$ | −28 | 2.8 | 3.9 |
| $DyNi_{0.9}W_{0.1}O_3$ | −19 | 3.5 | 4 |
| $DyNi_{0.9}Nb_{0.1}O_3$ | −24 | 4 | 3.8 |
| $DyNi_{0.9}Ta_{0.1}O_3$ | −25 | 3.9 | 3.7 |
| $HoNi_{0.9}Ti_{0.1}O_3$ | −20 | 2.6 | 3.9 |
| $HoNi_{0.9}V_{0.1}O_3$ | −22 | 2.8 | 3.6 |
| $HoNi_{0.9}Cr_{0.1}O_3$ | −24 | 2.7 | 4.1 |
| $HoNi_{0.9}Mn_{0.1}O_3$ | −23 | 3.9 | 3.9 |
| $HoNi_{0.9}Fe_{0.1}O_3$ | −26 | 1.8 | 4.6 |
| $HoNi_{0.9}Co_{0.1}O_3$ | −28 | 2.9 | 4.3 |
| $HoNi_{0.9}Cu_{0.1}O_3$ | −19 | 3.1 | 4 |
| $HoNi_{0.9}Mo_{0.1}O_3$ | −21 | 2.2 | 4.7 |
| $HoNi_{0.9}W_{0.1}O_3$ | −22 | 2.1 | 4.2 |

TABLE 80

| | | | |
|---|---|---|---|
| $HoNi_{0.9}Nb_{0.1}O_3$ | −24 | 3 | 4.3 |
| $HoNi_{0.9}Ta_{0.1}O_3$ | −21 | 2.8 | 4.9 |
| $ErNi_{0.9}Ti_{0.1}O_3$ | −17 | 3.1 | 4.2 |
| $ErNi_{0.9}V_{0.1}O_3$ | −18 | 3 | 4 |
| $ErNi_{0.9}Cr_{0.1}O_3$ | −24 | 2.4 | 4.7 |
| $ErNi_{0.9}Mn_{0.1}O_3$ | −22 | 2.8 | 4.6 |
| $ErNi_{0.9}Fe_{0.1}O_3$ | −21 | 2.9 | 4.5 |
| $ErNi_{0.9}Co_{0.1}O_3$ | −27 | 3 | 4.2 |
| $ErNi_{0.9}Cu_{0.1}O_3$ | −21 | 2.8 | 4.7 |
| $ErNi_{0.9}Mo_{0.1}O_3$ | −23 | 3.5 | 4.8 |
| $ErNi_{0.9}W_{0.1}O_3$ | −19 | 4 | 4.1 |
| $ErNi_{0.9}Nb_{0.1}O_3$ | −23 | 3.9 | 3.8 |
| $ErNi_{0.9}Ta_{0.1}O_3$ | −24 | 2.1 | 4 |
| $YbNi_{0.9}Ti_{0.1}O_3$ | −16 | 2.8 | 4.2 |
| $YbNi_{0.9}V_{0.1}O_3$ | −20 | 2.7 | 4.5 |
| $YbNi_{0.9}Cr_{0.1}O_3$ | −22 | 3.9 | 4.3 |
| $YbNi_{0.9}Mn_{0.1}O_3$ | −29 | 3.8 | 4.1 |
| $YbNi_{0.9}Fe_{0.1}O_3$ | −28 | 2.7 | 3.9 |
| $YbNi_{0.9}Co_{0.1}O_3$ | −27 | 1.9 | 4 |
| $YbNi_{0.9}Cu_{0.1}O_3$ | −25 | 2.8 | 3.8 |
| $YbNi_{0.9}Mo_{0.1}O_3$ | −18 | 3.7 | 3.7 |
| $YbNi_{0.9}W_{0.1}O_3$ | −22 | 3.4 | 4 |
| $YbNi_{0.9}Nb_{0.1}O_3$ | −10 | 2.8 | 3.9 |
| $YbNi_{0.9}Ta_{0.1}O_3$ | −26 | 3 | 3.6 |
| $La_{0.9}Na_{0.1}Ni_{0.9}Ti_{0.1}O_3$ | −19 | 1.8 | 3.9 |
| $La_{0.9}Na_{0.1}Ni_{0.9}V_{0.1}O_3$ | −17 | 2.9 | 4.6 |
| $La_{0.9}Na_{0.1}Ni_{0.9}Cr_{0.1}O_3$ | −23 | 3.1 | 4.3 |
| $La_{0.9}Na_{0.1}Ni_{0.9}Mn_{0.1}O_3$ | −22 | 2.2 | 4 |
| $La_{0.9}Na_{0.1}Ni_{0.9}Fe_{0.1}O_3$ | −18 | 2.1 | 4.7 |
| $La_{0.9}Na_{0.1}Ni_{0.9}Co_{0.1}O_3$ | −20 | 3 | 4.2 |
| $La_{0.9}Na_{0.1}Ni_{0.9}Cu_{0.1}O_3$ | −21 | 2.8 | 4.3 |
| $La_{0.9}Na_{0.1}Ni_{0.9}Mo_{0.1}O_3$ | −21 | 3.2 | 4.9 |
| $La_{0.9}Na_{0.1}Ni_{0.9}W_{0.1}O_3$ | −22 | 3.1 | 3.9 |
| $La_{0.9}Na_{0.1}Ni_{0.9}Nb_{0.1}O_3$ | −18 | 3 | 4.2 |

TABLE 81

| | | | |
|---|---|---|---|
| $La_{0.9}Na_{0.1}Ni_{0.9}Ta_{0.1}O_3$ | −25 | 2.4 | 4 |
| $La_{0.9}K_{0.1}Ni_{0.9}Ti_{0.1}O_3$ | −28 | 2.9 | 4.6 |
| $La_{0.9}K_{0.1}Ni_{0.9}V_{0.1}O_3$ | −19 | 3 | 4.5 |
| $La_{0.9}K_{0.1}Ni_{0.9}Cr_{0.1}O_3$ | −20 | 2.8 | 4.2 |
| $La_{0.9}K_{0.1}Ni_{0.9}Mn_{0.1}O_3$ | −26 | 3.5 | 4.7 |
| $La_{0.9}K_{0.1}Ni_{0.9}Fe_{0.1}O_3$ | −23 | 4 | 4.8 |
| $La_{0.9}K_{0.1}Ni_{0.9}Co_{0.1}O_3$ | −22 | 3.9 | 4.1 |
| $La_{0.9}K_{0.1}Ni_{0.9}Cu_{0.1}O_3$ | −19 | 2.1 | 3.8 |
| $La_{0.9}K_{0.1}Ni_{0.9}Mo_{0.1}O_3$ | −17 | 2.6 | 4 |
| $La_{0.9}K_{0.1}Ni_{0.9}W_{0.1}O_3$ | −20 | 2.8 | 4.6 |
| $La_{0.9}K_{0.1}Ni_{0.9}Nb_{0.1}O_3$ | −22 | 2.7 | 4.2 |
| $La_{0.9}K_{0.1}Ni_{0.9}Ta_{0.1}O_3$ | −20 | 3.9 | 4.5 |
| $La_{0.9}Sr_{0.1}Ni_{0.9}Ti_{0.1}O_3$ | −23 | 2.7 | 4.2 |
| $La_{0.9}Sr_{0.1}Ni_{0.9}V_{0.1}O_3$ | −18 | 1.9 | 4.1 |
| $La_{0.9}Sr_{0.1}Ni_{0.9}Cr_{0.1}O_3$ | −28 | 2.8 | 3.9 |
| $La_{0.9}Sr_{0.1}Ni_{0.9}Mn_{0.1}O_3$ | −19 | 3.7 | 4 |
| $La_{0.9}Sr_{0.1}Ni_{0.9}Fe_{0.1}O_3$ | −24 | 3.4 | 3.8 |
| $La_{0.9}Sr_{0.1}Ni_{0.9}Co_{0.1}O_3$ | −25 | 2.8 | 3.7 |
| $La_{0.9}Sr_{0.1}Ni_{0.9}Cu_{0.1}O_3$ | −16 | 3 | 4 |
| $La_{0.9}Sr_{0.1}Ni_{0.9}Mo_{0.1}O_3$ | −20 | 2.9 | 3.9 |
| $La_{0.9}Sr_{0.1}Ni_{0.9}W_{0.1}O_3$ | −22 | 2.2 | 3.6 |
| $La_{0.9}Sr_{0.1}Ni_{0.9}Nb_{0.1}O_3$ | −24 | 1.9 | 4.1 |
| $La_{0.9}Sr_{0.1}Ni_{0.9}Ta_{0.1}O_3$ | −23 | 1.8 | 3.9 |
| $La_{0.9}Ca_{0.1}Ni_{0.9}Ti_{0.1}O_3$ | −28 | 3.1 | 4.3 |
| $La_{0.9}Ca_{0.1}Ni_{0.9}V_{0.1}O_3$ | −19 | 2.2 | 4 |
| $La_{0.9}Ca_{0.1}Ni_{0.9}Cr_{0.1}O_3$ | −21 | 2.1 | 4.7 |
| $La_{0.9}Ca_{0.1}Ni_{0.9}Mn_{0.1}O_3$ | −22 | 3 | 4.2 |
| $La_{0.9}Ca_{0.1}Ni_{0.9}Fe_{0.1}O_3$ | −24 | 2.8 | 4.3 |
| $La_{0.9}Ca_{0.1}Ni_{0.9}Co_{0.1}O_3$ | −21 | 3.2 | 4.9 |
| $La_{0.9}Ca_{0.1}Ni_{0.9}Cu_{0.1}O_3$ | −29 | 3.1 | 3.9 |
| $La_{0.9}Ca_{0.1}Ni_{0.9}Mo_{0.1}O_3$ | −17 | 3 | 4.2 |
| $La_{0.9}Ca_{0.1}Ni_{0.9}W_{0.1}O_3$ | −18 | 2.4 | 4 |
| $La_{0.9}Ca_{0.1}Ni_{0.9}Nb_{0.1}O_3$ | −24 | 2.8 | 4.7 |
| $La_{0.9}Ca_{0.1}Ni_{0.9}Ta_{0.1}O_3$ | −22 | 2.9 | 4.6 |

TABLE 82

| | | | |
|---|---|---|---|
| $La_{0.9}Bi_{0.1}Ni_{0.9}Ti_{0.1}O_3$ | −21 | 3 | 4.5 |
| $La_{0.9}Bi_{0.1}Ni_{0.9}V_{0.1}O_3$ | −27 | 2.8 | 4.2 |
| $La_{0.9}Bi_{0.1}Ni_{0.9}Cr_{0.1}O_3$ | −21 | 3.5 | 4.7 |
| $La_{0.9}Bi_{0.1}Ni_{0.9}Mn_{0.1}O_3$ | −23 | 4 | 4.8 |
| $La_{0.9}Bi_{0.1}Ni_{0.9}Fe_{0.1}O_3$ | −19 | 3.9 | 4.1 |
| $La_{0.9}Bi_{0.1}Ni_{0.9}Co_{0.1}O_3$ | −23 | 2.1 | 3.8 |
| $La_{0.9}Bi_{0.1}Ni_{0.9}Cu_{0.1}O_3$ | −24 | 2.6 | 4 |
| $La_{0.9}Bi_{0.1}Ni_{0.9}Mo_{0.1}O_3$ | −25 | 2.8 | 4.6 |
| $La_{0.9}Bi_{0.1}Ni_{0.9}W_{0.1}O_3$ | −16 | 2.7 | 4 |
| $La_{0.9}Bi_{0.1}Ni_{0.9}Nb_{0.1}O_3$ | −20 | 3.9 | 4.7 |
| $La_{0.9}Bi_{0.1}Ni_{0.9}Ta_{0.1}O_3$ | −22 | 3.8 | 4.2 |
| $Ce_{0.9}Na_{0.1}Ni_{0.9}Ti_{0.1}O_3$ | −18 | 1.9 | 4.9 |
| $Ce_{0.9}Na_{0.1}Ni_{0.9}V_{0.1}O_3$ | −22 | 2.8 | 3.9 |
| $Ce_{0.9}Na_{0.1}Ni_{0.9}Cr_{0.1}O_3$ | −10 | 3.7 | 4.2 |
| $Ce_{0.9}Na_{0.1}Ni_{0.9}Mn_{0.1}O_3$ | −26 | 3.4 | 4 |
| $Ce_{0.9}Na_{0.1}Ni_{0.9}Fe_{0.1}O_3$ | −20 | 2.8 | 4.7 |
| $Ce_{0.9}Na_{0.1}Ni_{0.9}Co_{0.1}O_3$ | −19 | 3 | 4.6 |
| $Ce_{0.9}Na_{0.1}Ni_{0.9}Cu_{0.1}O_3$ | −17 | 2.9 | 4.5 |
| $Ce_{0.9}Na_{0.1}Ni_{0.9}Mo_{0.1}O_3$ | −23 | 1.8 | 4.2 |
| $Ce_{0.9}Na_{0.1}Ni_{0.9}W_{0.1}O_3$ | −22 | 2.9 | 4.7 |
| $Ce_{0.9}Na_{0.1}Ni_{0.9}Nb_{0.1}O_3$ | −18 | 3.1 | 4.8 |
| $Ce_{0.9}Na_{0.1}Ni_{0.9}Ta_{0.1}O_3$ | −20 | 2.2 | 4.1 |
| $Ce_{0.9}K_{0.1}Ni_{0.9}Ti_{0.1}O_3$ | −21 | 3 | 4 |
| $Ce_{0.9}K_{0.1}Ni_{0.9}V_{0.1}O_3$ | −22 | 2.8 | 4.6 |
| $Ce_{0.9}K_{0.1}Ni_{0.9}Cr_{0.1}O_3$ | −18 | 3.2 | 4.2 |
| $Ce_{0.9}K_{0.1}Ni_{0.9}Mn_{0.1}O_3$ | −25 | 3.1 | 4.5 |
| $Ce_{0.9}K_{0.1}Ni_{0.9}Fe_{0.1}O_3$ | −24 | 3 | 4.3 |
| $Ce_{0.9}K_{0.1}Ni_{0.9}Co_{0.1}O_3$ | −28 | 2.4 | 4.2 |
| $Ce_{0.9}K_{0.1}Ni_{0.9}Cu_{0.1}O_3$ | −19 | 2.8 | 4.1 |
| $Ce_{0.9}K_{0.1}Ni_{0.9}Mo_{0.1}O_3$ | −20 | 2.9 | 3.9 |
| $Ce_{0.9}K_{0.1}Ni_{0.9}W_{0.1}O_3$ | −26 | 3 | 4 |
| $Ce_{0.9}K_{0.1}Ni_{0.9}Nb_{0.1}O_3$ | −23 | 2.8 | 3.8 |
| $Ce_{0.9}K_{0.1}Ni_{0.9}Ta_{0.1}O_3$ | −22 | 3.5 | 3.7 |
| $Ce_{0.9}Sr_{0.1}Ni_{0.9}Ti_{0.1}O_3$ | −17 | 3.9 | 3.9 |

TABLE 83

| | | | |
|---|---|---|---|
| $Ce_{0.9}Sr_{0.1}Ni_{0.9}V_{0.1}O_3$ | −20 | 2.1 | 3.6 |
| $Ce_{0.9}Sr_{0.1}Ni_{0.9}Cr_{0.1}O_3$ | −22 | 2.6 | 4.1 |
| $Ce_{0.9}Sr_{0.1}Ni_{0.9}Mn_{0.1}O_3$ | −20 | 2.2 | 3.9 |
| $Ce_{0.9}Sr_{0.1}Ni_{0.9}Fe_{0.1}O_3$ | −21 | 1.9 | 4.6 |
| $Ce_{0.9}Sr_{0.1}Ni_{0.9}Co_{0.1}O_3$ | −23 | 1.8 | 4.3 |
| $Ce_{0.9}Sr_{0.1}Ni_{0.9}Cu_{0.1}O_3$ | −18 | 2.9 | 4 |
| $Ce_{0.9}Sr_{0.1}Ni_{0.9}Mo_{0.1}O_3$ | −28 | 3.1 | 4.7 |
| $Ce_{0.9}Sr_{0.1}Ni_{0.9}W_{0.1}O_3$ | −19 | 2.2 | 4.2 |
| $Ce_{0.9}Sr_{0.1}Ni_{0.9}Nb_{0.1}O_3$ | −24 | 2.1 | 4.3 |
| $Ce_{0.9}Sr_{0.1}Ni_{0.9}Ta_{0.1}O_3$ | −25 | 3 | 4.9 |
| $Ce_{0.9}Ca_{0.1}Ni_{0.9}Ti_{0.1}O_3$ | −20 | 3.2 | 4.2 |
| $Ce_{0.9}Ca_{0.1}Ni_{0.9}V_{0.1}O_3$ | −22 | 3.1 | 4 |
| $Ce_{0.9}Ca_{0.1}Ni_{0.9}Cr_{0.1}O_3$ | −24 | 3 | 4.7 |
| $Ce_{0.9}Ca_{0.1}Ni_{0.9}Mn_{0.1}O_3$ | −23 | 2.4 | 4.6 |
| $Ce_{0.9}Ca_{0.1}Ni_{0.9}Fe_{0.1}O_3$ | −26 | 2.8 | 4.5 |
| $Ce_{0.9}Ca_{0.1}Ni_{0.9}Co_{0.1}O_3$ | −28 | 2.9 | 4.2 |
| $Ce_{0.9}Ca_{0.1}Ni_{0.9}Cu_{0.1}O_3$ | −19 | 3 | 4.7 |
| $Ce_{0.9}Ca_{0.1}Ni_{0.9}Mo_{0.1}O_3$ | −21 | 2.8 | 4.8 |
| $Ce_{0.9}Ca_{0.1}Ni_{0.9}W_{0.1}O_3$ | −22 | 3.5 | 4.1 |
| $Ce_{0.9}Ca_{0.1}Ni_{0.9}Nb_{0.1}O_3$ | −24 | 4 | 3.8 |
| $Ce_{0.9}Ca_{0.1}Ni_{0.9}Ta_{0.1}O_3$ | −21 | 3.9 | 4 |
| $Ce_{0.9}Bi_{0.1}Ni_{0.9}Ti_{0.1}O_3$ | −29 | 2.1 | 4.6 |
| $Ce_{0.9}Bi_{0.1}Ni_{0.9}V_{0.1}O_3$ | −17 | 2.6 | 4.2 |
| $Ce_{0.9}Bi_{0.1}Ni_{0.9}Cr_{0.1}O_3$ | −18 | 2.8 | 4.5 |
| $Ce_{0.9}Bi_{0.1}Ni_{0.9}Mn_{0.1}O_3$ | −24 | 2.7 | 4.3 |
| $Ce_{0.9}Bi_{0.1}Ni_{0.9}Fe_{0.1}O_3$ | −22 | 3.9 | 4.1 |
| $Ce_{0.9}Bi_{0.1}Ni_{0.9}Co_{0.1}O_3$ | −21 | 3.8 | 3.9 |
| $Ce_{0.9}Bi_{0.1}Ni_{0.9}Cu_{0.1}O_3$ | −27 | 2.7 | 4 |
| $Ce_{0.9}Bi_{0.1}Ni_{0.9}Mo_{0.1}O_3$ | −21 | 1.9 | 3.8 |
| $Ce_{0.9}Bi_{0.1}Ni_{0.9}W_{0.1}O_3$ | −23 | 2.8 | 3.7 |
| $Ce_{0.9}Bi_{0.1}Ni_{0.9}Nb_{0.1}O_3$ | −19 | 3.7 | 4 |
| $Ce_{0.9}Bi_{0.1}Ni_{0.9}Ta_{0.1}O_3$ | −23 | 3.4 | 3.9 |
| $Pr_{0.9}Na_{0.1}Ni_{0.9}Ti_{0.1}O_3$ | −25 | 3 | 4.1 |
| $Pr_{0.9}Na_{0.1}Ni_{0.9}V_{0.1}O_3$ | −16 | 2.9 | 3.9 |
| $Pr_{0.9}Na_{0.1}Ni_{0.9}Cr_{0.1}O_3$ | −20 | 1.8 | 4.6 |

TABLE 84

| | | | |
|---|---|---|---|
| $Pr_{0.9}Na_{0.1}Ni_{0.9}Mn_{0.1}O_3$ | −22 | 2.9 | 4.3 |
| $Pr_{0.9}Na_{0.1}Ni_{0.9}Fe_{0.1}O_3$ | −29 | 3.1 | 4 |
| $Pr_{0.9}Na_{0.1}Ni_{0.9}Co_{0.1}O_3$ | −22 | 2.2 | 4.7 |
| $Pr_{0.9}Na_{0.1}Ni_{0.9}Cu_{0.1}O_3$ | −19 | 2.1 | 4.2 |
| $Pr_{0.9}Na_{0.1}Ni_{0.9}Mo_{0.1}O_3$ | −25 | 3 | 4.3 |
| $Pr_{0.9}Na_{0.1}Ni_{0.9}W_{0.1}O_3$ | −30 | 2.8 | 4.9 |
| $Pr_{0.9}Na_{0.1}Ni_{0.9}Nb_{0.1}O_3$ | −28 | 3.2 | 3.9 |
| $Pr_{0.9}Na_{0.1}Ni_{0.9}Ta_{0.1}O_3$ | −27 | 3.1 | 4.2 |
| $Pr_{0.9}K_{0.1}Ni_{0.9}Ti_{0.1}O_3$ | −18 | 2.4 | 4.7 |
| $Pr_{0.9}K_{0.1}Ni_{0.9}V_{0.1}O_3$ | −22 | 2.8 | 4.6 |
| $Pr_{0.9}K_{0.1}Ni_{0.9}Cr_{0.1}O_3$ | −10 | 2.9 | 4.5 |
| $Pr_{0.9}K_{0.1}Ni_{0.9}Mn_{0.1}O_3$ | −26 | 3 | 4.2 |
| $Pr_{0.9}K_{0.1}Ni_{0.9}Fe_{0.1}O_3$ | −20 | 2.8 | 4.7 |
| $Pr_{0.9}K_{0.1}Ni_{0.9}Co_{0.1}O_3$ | −19 | 3.5 | 4.8 |
| $Pr_{0.9}K_{0.1}Ni_{0.9}Cu_{0.1}O_3$ | −17 | 4 | 4.1 |
| $Pr_{0.9}K_{0.1}Ni_{0.9}Mo_{0.1}O_3$ | −23 | 3.9 | 3.8 |
| $Pr_{0.9}K_{0.1}Ni_{0.9}W_{0.1}O_3$ | −22 | 2.1 | 4 |
| $Pr_{0.9}K_{0.1}Ni_{0.9}Nb_{0.1}O_3$ | −18 | 2.6 | 4.6 |
| $Pr_{0.9}K_{0.1}Ni_{0.9}Ta_{0.1}O_3$ | −20 | 2.8 | 4.2 |
| $Pr_{0.9}Sr_{0.1}Ni_{0.9}Ti_{0.1}O_3$ | −21 | 2.9 | 4.3 |
| $Pr_{0.9}Sr_{0.1}Ni_{0.9}V_{0.1}O_3$ | −22 | 3.1 | 4.2 |
| $Pr_{0.9}Sr_{0.1}Ni_{0.9}Cr_{0.1}O_3$ | −18 | 2.2 | 4.1 |
| $Pr_{0.9}Sr_{0.1}Ni_{0.9}Mn_{0.1}O_3$ | −25 | 2.1 | 3.9 |
| $Pr_{0.9}Sr_{0.1}Ni_{0.9}Fe_{0.1}O_3$ | −24 | 3 | 4 |
| $Pr_{0.9}Sr_{0.1}Ni_{0.9}Co_{0.1}O_3$ | −28 | 2.8 | 3.8 |
| $Pr_{0.9}Sr_{0.1}Ni_{0.9}Cu_{0.1}O_3$ | −19 | 3.2 | 3.7 |
| $Pr_{0.9}Sr_{0.1}Ni_{0.9}Mo_{0.1}O_3$ | −20 | 3.1 | 4 |
| $Pr_{0.9}Sr_{0.1}Ni_{0.9}W_{0.1}O_3$ | −26 | 3 | 3.9 |
| $Pr_{0.9}Sr_{0.1}Ni_{0.9}Nb_{0.1}O_3$ | −23 | 2.4 | 3.6 |
| $Pr_{0.9}Sr_{0.1}Ni_{0.9}Ta_{0.1}O_3$ | −22 | 2.8 | 4.1 |
| $Pr_{0.9}Ca_{0.1}Ni_{0.9}Ti_{0.1}O_3$ | −17 | 3 | 4.6 |
| $Pr_{0.9}Ca_{0.1}Ni_{0.9}V_{0.1}O_3$ | −20 | 2.8 | 4.3 |
| $Pr_{0.9}Ca_{0.1}Ni_{0.9}Cr_{0.1}O_3$ | −22 | 3.5 | 4 |
| $Pr_{0.9}Ca_{0.1}Ni_{0.9}Mn_{0.1}O_3$ | −20 | 4 | 4.7 |

TABLE 85

| | | | |
|---|---|---|---|
| $Pr_{0.9}Ca_{0.1}Ni_{0.9}Fe_{0.1}O_3$ | −21 | 3.9 | 4.2 |
| $Pr_{0.9}Ca_{0.1}Ni_{0.9}Co_{0.1}O_3$ | −23 | 2.1 | 4.3 |
| $Pr_{0.9}Ca_{0.1}Ni_{0.9}Cu_{0.1}O_3$ | −18 | 2.6 | 4.9 |
| $Pr_{0.9}Ca_{0.1}Ni_{0.9}Mo_{0.1}O_3$ | −28 | 2.8 | 3.9 |
| $Pr_{0.9}Ca_{0.1}Ni_{0.9}W_{0.1}O_3$ | −19 | 2.7 | 4.2 |
| $Pr_{0.9}Ca_{0.1}Ni_{0.9}Nb_{0.1}O_3$ | −24 | 3.9 | 4 |
| $Pr_{0.9}Ca_{0.1}Ni_{0.9}Ta_{0.1}O_3$ | −25 | 3.8 | 4.7 |
| $Pr_{0.9}Bi_{0.1}Ni_{0.9}Ti_{0.1}O_3$ | −16 | 2.7 | 4.6 |
| $Pr_{0.9}Bi_{0.1}Ni_{0.9}V_{0.1}O_3$ | −20 | 1.9 | 4.5 |
| $Pr_{0.9}Bi_{0.1}Ni_{0.9}Cr_{0.1}O_3$ | −22 | 2.8 | 4.2 |
| $Pr_{0.9}Bi_{0.1}Ni_{0.9}Mn_{0.1}O_3$ | −24 | 3.7 | 4.7 |
| $Pr_{0.9}Bi_{0.1}Ni_{0.9}Fe_{0.1}O_3$ | −23 | 3.4 | 4.8 |
| $Pr_{0.9}Bi_{0.1}Ni_{0.9}Co_{0.1}O_3$ | −26 | 2.8 | 4.1 |
| $Pr_{0.9}Bi_{0.1}Ni_{0.9}Cu_{0.1}O_3$ | −28 | 3 | 3.8 |
| $Pr_{0.9}Bi_{0.1}Ni_{0.9}Mo_{0.1}O_3$ | −19 | 2.9 | 4.1 |
| $Pr_{0.9}Bi_{0.1}Ni_{0.9}W_{0.1}O_3$ | −21 | 1.8 | 3.9 |
| $Pr_{0.9}Bi_{0.1}Ni_{0.9}Nb_{0.1}O_3$ | −22 | 2.9 | 4.6 |
| $Pr_{0.9}Bi_{0.1}Ni_{0.9}Ta_{0.1}O_3$ | −24 | 3.1 | 4.3 |
| $Nd_{0.9}Na_{0.1}Ni_{0.9}Ti_{0.1}O_3$ | −29 | 2.1 | 4.7 |
| $Nd_{0.9}Na_{0.1}Ni_{0.9}V_{0.1}O_3$ | −17 | 3 | 4.2 |
| $Nd_{0.9}Na_{0.1}Ni_{0.9}Cr_{0.1}O_3$ | −18 | 2.8 | 4.3 |
| $Nd_{0.9}Na_{0.1}Ni_{0.9}Mn_{0.1}O_3$ | −24 | 3.2 | 4.9 |
| $Nd_{0.9}Na_{0.1}Ni_{0.9}Fe_{0.1}O_3$ | −22 | 3.1 | 3.9 |
| $Nd_{0.9}Na_{0.1}Ni_{0.9}Co_{0.1}O_3$ | −21 | 3 | 4.2 |
| $Nd_{0.9}Na_{0.1}Ni_{0.9}Cu_{0.1}O_3$ | −27 | 2.4 | 4 |
| $Nd_{0.9}Na_{0.1}Ni_{0.9}Mo_{0.1}O_3$ | −25 | 2.8 | 4.7 |
| $Nd_{0.9}Na_{0.1}Ni_{0.9}W_{0.1}O_3$ | −30 | 2.9 | 4.6 |
| $Nd_{0.9}Na_{0.1}Ni_{0.9}Nb_{0.1}O_3$ | −28 | 3 | 4.5 |
| $Nd_{0.9}Na_{0.1}Ni_{0.9}Ta_{0.1}O_3$ | −27 | 2.8 | 4.2 |
| $Nd_{0.9}K_{0.1}Ni_{0.9}Ti_{0.1}O_3$ | −18 | 4 | 4.8 |
| $Nd_{0.9}K_{0.1}Ni_{0.9}V_{0.1}O_3$ | −22 | 3.9 | 4.1 |
| $Nd_{0.9}K_{0.1}Ni_{0.9}Cr_{0.1}O_3$ | −10 | 2.1 | 3.8 |
| $Nd_{0.9}K_{0.1}Ni_{0.9}Mn_{0.1}O_3$ | −26 | 2.6 | 4 |
| $Nd_{0.9}K_{0.1}Ni_{0.9}Fe_{0.1}O_3$ | −20 | 2.2 | 4.6 |
| $Nd_{0.9}K_{0.1}Ni_{0.9}Co_{0.1}O_3$ | −19 | 1.9 | 4.2 |

TABLE 86

| | | | |
|---|---|---|---|
| $Nd_{0.9}K_{0.1}Ni_{0.9}Cu_{0.1}O_3$ | −17 | 1.8 | 4.5 |
| $Nd_{0.9}K_{0.1}Ni_{0.9}Mo_{0.1}O_3$ | −23 | 2.9 | 4.3 |
| $Nd_{0.9}K_{0.1}Ni_{0.9}W_{0.1}O_3$ | −22 | 3.1 | 4.1 |
| $Nd_{0.9}K_{0.1}Ni_{0.9}Nb_{0.1}O_3$ | −18 | 2.2 | 3.9 |
| $Nd_{0.9}K_{0.1}Ni_{0.9}Ta_{0.1}O_3$ | −20 | 2.1 | 4 |
| $Nd_{0.9}Sr_{0.1}Ni_{0.9}Ti_{0.1}O_3$ | −21 | 2.8 | 3.7 |
| $Nd_{0.9}Sr_{0.1}Ni_{0.9}V_{0.1}O_3$ | −22 | 3.2 | 4 |
| $Nd_{0.9}Sr_{0.1}Ni_{0.9}Cr_{0.1}O_3$ | −18 | 3.1 | 3.9 |
| $Nd_{0.9}Sr_{0.1}Ni_{0.9}Mn_{0.1}O_3$ | −25 | 3 | 3.6 |
| $Nd_{0.9}Sr_{0.1}Ni_{0.9}Fe_{0.1}O_3$ | −24 | 2.4 | 4.1 |
| $Nd_{0.9}Sr_{0.1}Ni_{0.9}Co_{0.1}O_3$ | −28 | 2.8 | 3.9 |
| $Nd_{0.9}Sr_{0.1}Ni_{0.9}Cu_{0.1}O_3$ | −19 | 2.9 | 4.6 |
| $Nd_{0.9}Sr_{0.1}Ni_{0.9}Mo_{0.1}O_3$ | −20 | 3 | 4.3 |
| $Nd_{0.9}Sr_{0.1}Ni_{0.9}W_{0.1}O_3$ | −26 | 2.8 | 4 |
| $Nd_{0.9}Sr_{0.1}Ni_{0.9}Nb_{0.1}O_3$ | −23 | 3.5 | 4.7 |
| $Nd_{0.9}Sr_{0.1}Ni_{0.9}Ta_{0.1}O_3$ | −22 | 4 | 4.2 |
| $Nd_{0.9}Ca_{0.1}Ni_{0.9}Ti_{0.1}O_3$ | −17 | 2.1 | 4.9 |
| $Nd_{0.9}Ca_{0.1}Ni_{0.9}V_{0.1}O_3$ | −20 | 2.6 | 3.9 |
| $Nd_{0.9}Ca_{0.1}Ni_{0.9}Cr_{0.1}O_3$ | −22 | 2.8 | 4.2 |
| $Nd_{0.9}Ca_{0.1}Ni_{0.9}Mn_{0.1}O_3$ | −20 | 2.7 | 4 |
| $Nd_{0.9}Ca_{0.1}Ni_{0.9}Fe_{0.1}O_3$ | −21 | 3.9 | 4.7 |
| $Nd_{0.9}Ca_{0.1}Ni_{0.9}Co_{0.1}O_3$ | −23 | 3.8 | 4.6 |
| $Nd_{0.9}Ca_{0.1}Ni_{0.9}Cu_{0.1}O_3$ | −18 | 2.7 | 4.5 |
| $Nd_{0.9}Ca_{0.1}Ni_{0.9}Mo_{0.1}O_3$ | −28 | 1.9 | 4.2 |
| $Nd_{0.9}Ca_{0.1}Ni_{0.9}W_{0.1}O_3$ | −19 | 2.8 | 4.7 |
| $Nd_{0.9}Ca_{0.1}Ni_{0.9}Nb_{0.1}O_3$ | −24 | 3.7 | 4.8 |
| $Nd_{0.9}Ca_{0.1}Ni_{0.9}Ta_{0.1}O_3$ | −25 | 3.4 | 4.1 |
| $Nd_{0.9}Bi_{0.1}Ni_{0.9}Ti_{0.1}O_3$ | −16 | 2.8 | 3.8 |
| $Nd_{0.9}Bi_{0.1}Ni_{0.9}V_{0.1}O_3$ | −20 | 3 | 4 |
| $Nd_{0.9}Bi_{0.1}Ni_{0.9}Cr_{0.1}O_3$ | −22 | 2.9 | 4.6 |
| $Nd_{0.9}Bi_{0.1}Ni_{0.9}Mn_{0.1}O_3$ | −24 | 1.8 | 4.2 |
| $Nd_{0.9}Bi_{0.1}Ni_{0.9}Fe_{0.1}O_3$ | −23 | 2.9 | 4.5 |
| $Nd_{0.9}Bi_{0.1}Ni_{0.9}Co_{0.1}O_3$ | −26 | 3.1 | 4.3 |
| $Nd_{0.9}Bi_{0.1}Ni_{0.9}Cu_{0.1}O_3$ | −28 | 2.2 | 4.2 |
| $Nd_{0.9}Bi_{0.1}Ni_{0.9}Mo_{0.1}O_3$ | −19 | 2.1 | 4.1 |

TABLE 87

| | | | |
|---|---|---|---|
| $Nd_{0.9}Bi_{0.1}Ni_{0.9}W_{0.1}O_3$ | −21 | 3 | 3.9 |
| $Nd_{0.9}Bi_{0.1}Ni_{0.9}Nb_{0.1}O_3$ | −22 | 2.8 | 4 |
| $Nd_{0.9}Bi_{0.1}Ni_{0.9}Ta_{0.1}O_3$ | −24 | 3.2 | 3.8 |
| $Sm_{0.9}Na_{0.1}Ni_{0.9}Ti_{0.1}O_3$ | −29 | 3 | 4 |
| $Sm_{0.9}Na_{0.1}Ni_{0.9}V_{0.1}O_3$ | −17 | 2.4 | 3.9 |
| $Sm_{0.9}Na_{0.1}Ni_{0.9}Cr_{0.1}O_3$ | −18 | 2.8 | 3.6 |
| $Sm_{0.9}Na_{0.1}Ni_{0.9}Mn_{0.1}O_3$ | −24 | 2.9 | 4.1 |
| $Sm_{0.9}Na_{0.1}Ni_{0.9}Fe_{0.1}O_3$ | −22 | 3 | 3.9 |
| $Sm_{0.9}Na_{0.1}Ni_{0.9}Co_{0.1}O_3$ | −21 | 2.8 | 4.6 |
| $Sm_{0.9}Na_{0.1}Ni_{0.9}Cu_{0.1}O_3$ | −27 | 3.5 | 4.3 |
| $Sm_{0.9}Na_{0.1}Ni_{0.9}Mo_{0.1}O_3$ | −21 | 4 | 4 |
| $Sm_{0.9}Na_{0.1}Ni_{0.9}W_{0.1}O_3$ | −23 | 3.9 | 4.7 |
| $Sm_{0.9}Na_{0.1}Ni_{0.9}Nb_{0.1}O_3$ | −19 | 2.1 | 4.2 |
| $Sm_{0.9}Na_{0.1}Ni_{0.9}Ta_{0.1}O_3$ | −23 | 2.6 | 4.3 |
| $Sm_{0.9}K_{0.1}Ni_{0.9}Ti_{0.1}O_3$ | −25 | 2.7 | 3.9 |
| $Sm_{0.9}K_{0.1}Ni_{0.9}V_{0.1}O_3$ | −16 | 3.9 | 4.2 |
| $Sm_{0.9}K_{0.1}Ni_{0.9}Cr_{0.1}O_3$ | −20 | 1.8 | 4 |
| $Sm_{0.9}K_{0.1}Ni_{0.9}Mn_{0.1}O_3$ | −22 | 2.9 | 4.7 |
| $Sm_{0.9}K_{0.1}Ni_{0.9}Fe_{0.1}O_3$ | −22 | 3.1 | 4.6 |
| $Sm_{0.9}K_{0.1}Ni_{0.9}Co_{0.1}O_3$ | −10 | 2.2 | 4.5 |
| $Sm_{0.9}K_{0.1}Ni_{0.9}Cu_{0.1}O_3$ | −26 | 2.1 | 4.2 |
| $Sm_{0.9}K_{0.1}Ni_{0.9}Mo_{0.1}O_3$ | −20 | 3 | 4.7 |
| $Sm_{0.9}K_{0.1}Ni_{0.9}W_{0.1}O_3$ | −19 | 2.8 | 4.8 |
| $Sm_{0.9}K_{0.1}Ni_{0.9}Nb_{0.1}O_3$ | −17 | 3.2 | 4.1 |
| $Sm_{0.9}K_{0.1}Ni_{0.9}Ta_{0.1}O_3$ | −23 | 3.1 | 3.8 |
| $Sm_{0.9}Sr_{0.1}Ni_{0.9}Ti_{0.1}O_3$ | −18 | 2.4 | 4 |
| $Sm_{0.9}Sr_{0.1}Ni_{0.9}V_{0.1}O_3$ | −20 | 2.8 | 4.7 |
| $Sm_{0.9}Sr_{0.1}Ni_{0.9}Cr_{0.1}O_3$ | −21 | 2.9 | 4.2 |
| $Sm_{0.9}Sr_{0.1}Ni_{0.9}Mn_{0.1}O_3$ | −21 | 3 | 4.3 |
| $Sm_{0.9}Sr_{0.1}Ni_{0.9}Fe_{0.1}O_3$ | −22 | 2.8 | 4.9 |
| $Sm_{0.9}Sr_{0.1}Ni_{0.9}Co_{0.1}O_3$ | −18 | 3.5 | 3.9 |
| $Sm_{0.9}Sr_{0.1}Ni_{0.9}Cu_{0.1}O_3$ | −25 | 4 | 4.2 |
| $Sm_{0.9}Sr_{0.1}Ni_{0.9}Mo_{0.1}O_3$ | −24 | 3.9 | 4 |
| $Sm_{0.9}Sr_{0.1}Ni_{0.9}W_{0.1}O_3$ | −28 | 2.1 | 4.7 |

TABLE 88

| | | | |
|---|---|---|---|
| $Sm_{0.9}Sr_{0.1}Ni_{0.9}Nb_{0.1}O_3$ | −19 | 2.6 | 4.6 |
| $Sm_{0.9}Sr_{0.1}Ni_{0.9}Ta_{0.1}O_3$ | −20 | 2.8 | 4.5 |
| $Sm_{0.9}Ca_{0.1}Ni_{0.9}Ti_{0.1}O_3$ | −23 | 3.9 | 4.7 |
| $Sm_{0.9}Ca_{0.1}Ni_{0.9}V_{0.1}O_3$ | −22 | 3.8 | 4.8 |
| $Sm_{0.9}Ca_{0.1}Ni_{0.9}Cr_{0.1}O_3$ | −19 | 2.7 | 4.1 |
| $Sm_{0.9}Ca_{0.1}Ni_{0.9}Mn_{0.1}O_3$ | −17 | 1.9 | 3.8 |
| $Sm_{0.9}Ca_{0.1}Ni_{0.9}Fe_{0.1}O_3$ | −20 | 2.8 | 4 |
| $Sm_{0.9}Ca_{0.1}Ni_{0.9}Co_{0.1}O_3$ | −22 | 3.7 | 4.6 |
| $Sm_{0.9}Ca_{0.1}Ni_{0.9}Cu_{0.1}O_3$ | −20 | 3.4 | 4.2 |
| $Sm_{0.9}Ca_{0.1}Ni_{0.9}Mo_{0.1}O_3$ | −21 | 2.8 | 4.5 |
| $Sm_{0.9}Ca_{0.1}Ni_{0.9}W_{0.1}O_3$ | −23 | 3 | 4.3 |
| $Sm_{0.9}Ca_{0.1}Ni_{0.9}Nb_{0.1}O_3$ | −18 | 2.9 | 4.2 |
| $Sm_{0.9}Ca_{0.1}Ni_{0.9}Ta_{0.1}O_3$ | −28 | 1.8 | 4.1 |
| $Sm_{0.9}Bi_{0.1}Ni_{0.9}Ti_{0.1}O_3$ | −19 | 2.9 | 3.9 |
| $Sm_{0.9}Bi_{0.1}Ni_{0.9}V_{0.1}O_3$ | −24 | 3.1 | 4 |
| $Sm_{0.9}Bi_{0.1}Ni_{0.9}Cr_{0.1}O_3$ | −25 | 2.2 | 3.8 |
| $Sm_{0.9}Bi_{0.1}Ni_{0.9}Mn_{0.1}O_3$ | −16 | 2.1 | 3.7 |
| $Sm_{0.9}Bi_{0.1}Ni_{0.9}Fe_{0.1}O_3$ | −20 | 3 | 4 |
| $Sm_{0.9}Bi_{0.1}Ni_{0.9}Co_{0.1}O_3$ | −22 | 2.8 | 3.9 |
| $Sm_{0.9}Bi_{0.1}Ni_{0.9}Cu_{0.1}O_3$ | −24 | 3.2 | 3.6 |
| $Sm_{0.9}Bi_{0.1}Ni_{0.9}Mo_{0.1}O_3$ | −23 | 3.1 | 4.1 |
| $Sm_{0.9}Bi_{0.1}Ni_{0.9}W_{0.1}O_3$ | −26 | 3 | 3.9 |
| $Sm_{0.9}Bi_{0.1}Ni_{0.9}Nb_{0.1}O_3$ | −28 | 2.4 | 4.6 |
| $Sm_{0.9}Bi_{0.1}Ni_{0.9}Ta_{0.1}O_3$ | −19 | 2.8 | 4.3 |
| $Eu_{0.9}Na_{0.1}Ni_{0.9}Ti_{0.1}O_3$ | −22 | 3 | 4.7 |
| $Eu_{0.9}Na_{0.1}Ni_{0.9}V_{0.1}O_3$ | −24 | 2.8 | 4.2 |
| $Eu_{0.9}Na_{0.1}Ni_{0.9}Cr_{0.1}O_3$ | −21 | 3.5 | 4.3 |
| $Eu_{0.9}Na_{0.1}Ni_{0.9}Mn_{0.1}O_3$ | −29 | 4 | 4.9 |
| $Eu_{0.9}Na_{0.1}Ni_{0.9}Fe_{0.1}O_3$ | −17 | 3.9 | 3.9 |
| $Eu_{0.9}Na_{0.1}Ni_{0.9}Co_{0.1}O_3$ | −18 | 2.1 | 4.2 |
| $Eu_{0.9}Na_{0.1}Ni_{0.9}Cu_{0.1}O_3$ | −24 | 2.6 | 4 |
| $Eu_{0.9}Na_{0.1}Ni_{0.9}Mo_{0.1}O_3$ | −22 | 2.8 | 4.7 |
| $Eu_{0.9}Na_{0.1}Ni_{0.9}W_{0.1}O_3$ | −21 | 2.7 | 4.6 |
| $Eu_{0.9}Na_{0.1}Ni_{0.9}Nb_{0.1}O_3$ | −27 | 3.9 | 4.5 |
| $Eu_{0.9}Na_{0.1}Ni_{0.9}Ta_{0.1}O_3$ | −21 | 3.8 | 4.2 |

TABLE 89

| | | | |
|---|---|---|---|
| $Eu_{0.9}K_{0.1}Ni_{0.9}Ti_{0.1}O_3$ | −19 | 1.9 | 4.8 |
| $Eu_{0.9}K_{0.1}Ni_{0.9}V_{0.1}O_3$ | −23 | 2.8 | 4.1 |
| $Eu_{0.9}K_{0.1}Ni_{0.9}Cr_{0.1}O_3$ | −24 | 3.7 | 3.8 |
| $Eu_{0.9}K_{0.1}Ni_{0.9}Mn_{0.1}O_3$ | −25 | 3.4 | 4.1 |
| $Eu_{0.9}K_{0.1}Ni_{0.9}Fe_{0.1}O_3$ | −16 | 2.8 | 3.9 |
| $Eu_{0.9}K_{0.1}Ni_{0.9}Co_{0.1}O_3$ | −20 | 3 | 4.6 |
| $Eu_{0.9}K_{0.1}Ni_{0.9}Cu_{0.1}O_3$ | −22 | 2.9 | 4.3 |
| $Eu_{0.9}K_{0.1}Ni_{0.9}Mo_{0.1}O_3$ | −29 | 2.2 | 4 |
| $Eu_{0.9}K_{0.1}Ni_{0.9}W_{0.1}O_3$ | −22 | 1.9 | 4.7 |
| $Eu_{0.9}K_{0.1}Ni_{0.9}Nb_{0.1}O_3$ | −19 | 1.8 | 4.2 |
| $Eu_{0.9}K_{0.1}Ni_{0.9}Ta_{0.1}O_3$ | −25 | 2.9 | 4.3 |
| $Eu_{0.9}Sr_{0.1}Ni_{0.9}Ti_{0.1}O_3$ | −28 | 2.2 | 3.9 |
| $Eu_{0.9}Sr_{0.1}Ni_{0.9}V_{0.1}O_3$ | −27 | 2.1 | 4.2 |
| $Eu_{0.9}Sr_{0.1}Ni_{0.9}Cr_{0.1}O_3$ | −25 | 3 | 4 |
| $Eu_{0.9}Sr_{0.1}Ni_{0.9}Mn_{0.1}O_3$ | −18 | 2.8 | 4.7 |
| $Eu_{0.9}Sr_{0.1}Ni_{0.9}Fe_{0.1}O_3$ | −22 | 3.2 | 4.6 |
| $Eu_{0.9}Sr_{0.1}Ni_{0.9}Co_{0.1}O_3$ | −10 | 3.1 | 4.5 |
| $Eu_{0.9}Sr_{0.1}Ni_{0.9}Cu_{0.1}O_3$ | −26 | 3 | 4.2 |
| $Eu_{0.9}Sr_{0.1}Ni_{0.9}Mo_{0.1}O_3$ | −20 | 2.4 | 4.7 |
| $Eu_{0.9}Sr_{0.1}Ni_{0.9}W_{0.1}O_3$ | −19 | 2.8 | 4.8 |
| $Eu_{0.9}Sr_{0.1}Ni_{0.9}Nb_{0.1}O_3$ | −17 | 2.9 | 4.1 |
| $Eu_{0.9}Sr_{0.1}Ni_{0.9}Ta_{0.1}O_3$ | −23 | 3 | 3.8 |
| $Eu_{0.9}Ca_{0.1}Ni_{0.9}Ti_{0.1}O_3$ | −18 | 3.5 | 4.6 |
| $Eu_{0.9}Ca_{0.1}Ni_{0.9}V_{0.1}O_3$ | −20 | 4 | 4.2 |
| $Eu_{0.9}Ca_{0.1}Ni_{0.9}Cr_{0.1}O_3$ | −21 | 3.9 | 4.5 |
| $Eu_{0.9}Ca_{0.1}Ni_{0.9}Mn_{0.1}O_3$ | −21 | 2.1 | 4.3 |
| $Eu_{0.9}Ca_{0.1}Ni_{0.9}Fe_{0.1}O_3$ | −22 | 2.6 | 4.1 |
| $Eu_{0.9}Ca_{0.1}Ni_{0.9}Co_{0.1}O_3$ | −18 | 2.8 | 3.9 |
| $Eu_{0.9}Ca_{0.1}Ni_{0.9}Cu_{0.1}O_3$ | −25 | 2.7 | 4 |
| $Eu_{0.9}Ca_{0.1}Ni_{0.9}Mo_{0.1}O_3$ | −24 | 3.9 | 3.8 |
| $Eu_{0.9}Ca_{0.1}Ni_{0.9}W_{0.1}O_3$ | −28 | 3.8 | 3.7 |
| $Eu_{0.9}Ca_{0.1}Ni_{0.9}Nb_{0.1}O_3$ | −19 | 2.7 | 4 |
| $Eu_{0.9}Ca_{0.1}Ni_{0.9}Ta_{0.1}O_3$ | −20 | 1.9 | 3.9 |
| $Eu_{0.9}Bi_{0.1}Ni_{0.9}Ti_{0.1}O_3$ | −26 | 2.8 | 3.6 |

TABLE 90

| | | | |
|---|---|---|---|
| $Eu_{0.9}Bi_{0.1}Ni_{0.9}V_{0.1}O_3$ | −23 | 3.7 | 4.1 |
| $Eu_{0.9}Bi_{0.1}Ni_{0.9}Cr_{0.1}O_3$ | −22 | 3.4 | 3.9 |
| $Eu_{0.9}Bi_{0.1}Ni_{0.9}Mn_{0.1}O_3$ | −19 | 2.8 | 4.6 |
| $Eu_{0.9}Bi_{0.1}Ni_{0.9}Fe_{0.1}O_3$ | −17 | 3 | 4.3 |
| $Eu_{0.9}Bi_{0.1}Ni_{0.9}Co_{0.1}O_3$ | −20 | 2.9 | 4 |
| $Eu_{0.9}Bi_{0.1}Ni_{0.9}Cu_{0.1}O_3$ | −22 | 1.8 | 4.7 |
| $Eu_{0.9}Bi_{0.1}Ni_{0.9}Mo_{0.1}O_3$ | −20 | 2.9 | 4.2 |
| $Eu_{0.9}Bi_{0.1}Ni_{0.9}W_{0.1}O_3$ | −21 | 3.1 | 4.3 |
| $Eu_{0.9}Bi_{0.1}Ni_{0.9}Nb_{0.1}O_3$ | −23 | 2.2 | 4.9 |
| $Eu_{0.9}Bi_{0.1}Ni_{0.9}Ta_{0.1}O_3$ | −18 | 2.1 | 3.9 |
| $Gd_{0.9}Na_{0.1}Ni_{0.9}Ti_{0.1}O_3$ | −19 | 2.8 | 4 |
| $Gd_{0.9}Na_{0.1}Ni_{0.9}V_{0.1}O_3$ | −24 | 3.2 | 4.7 |
| $Gd_{0.9}Na_{0.1}Ni_{0.9}Cr_{0.1}O_3$ | −25 | 3.1 | 4.6 |
| $Gd_{0.9}Na_{0.1}Ni_{0.9}Mn_{0.1}O_3$ | −16 | 3 | 4.5 |
| $Gd_{0.9}Na_{0.1}Ni_{0.9}Fe_{0.1}O_3$ | −20 | 2.4 | 4.2 |
| $Gd_{0.9}Na_{0.1}Ni_{0.9}Co_{0.1}O_3$ | −22 | 2.8 | 4.7 |
| $Gd_{0.9}Na_{0.1}Ni_{0.9}Cu_{0.1}O_3$ | −24 | 2.9 | 4.8 |
| $Gd_{0.9}Na_{0.1}Ni_{0.9}Mo_{0.1}O_3$ | −23 | 3 | 4.1 |
| $Gd_{0.9}Na_{0.1}Ni_{0.9}W_{0.1}O_3$ | −26 | 2.8 | 3.8 |
| $Gd_{0.9}Na_{0.1}Ni_{0.9}Nb_{0.1}O_3$ | −28 | 3.5 | 4 |
| $Gd_{0.9}Na_{0.1}Ni_{0.9}Ta_{0.1}O_3$ | −19 | 4 | 4.6 |
| $Gd_{0.9}K_{0.1}Ni_{0.9}Ti_{0.1}O_3$ | −22 | 2.1 | 4.5 |
| $Gd_{0.9}K_{0.1}Ni_{0.9}V_{0.1}O_3$ | −24 | 2.6 | 4.3 |
| $Gd_{0.9}K_{0.1}Ni_{0.9}Cr_{0.1}O_3$ | −21 | 2.2 | 4.2 |
| $Gd_{0.9}K_{0.1}Ni_{0.9}Mn_{0.1}O_3$ | −29 | 1.9 | 4.1 |
| $Gd_{0.9}K_{0.1}Ni_{0.9}Fe_{0.1}O_3$ | −17 | 1.8 | 3.9 |
| $Gd_{0.9}K_{0.1}Ni_{0.9}Co_{0.1}O_3$ | −18 | 2.9 | 4 |
| $Gd_{0.9}K_{0.1}Ni_{0.9}Cu_{0.1}O_3$ | −24 | 3.1 | 3.8 |
| $Gd_{0.9}K_{0.1}Ni_{0.9}Mo_{0.1}O_3$ | −22 | 2.2 | 3.7 |
| $Gd_{0.9}K_{0.1}Ni_{0.9}W_{0.1}O_3$ | −21 | 2.1 | 4 |
| $Gd_{0.9}K_{0.1}Ni_{0.9}Nb_{0.1}O_3$ | −27 | 3 | 3.9 |
| $Gd_{0.9}K_{0.1}Ni_{0.9}Ta_{0.1}O_3$ | −25 | 2.8 | 3.6 |
| $Gd_{0.9}Sr_{0.1}Ni_{0.9}Ti_{0.1}O_3$ | −28 | 3.1 | 3.9 |
| $Gd_{0.9}Sr_{0.1}Ni_{0.9}V_{0.1}O_3$ | −27 | 3 | 4.6 |

TABLE 91

| | | | |
|---|---|---|---|
| $Gd_{0.9}Sr_{0.1}Ni_{0.9}Cr_{0.1}O_3$ | −25 | 2.4 | 4.3 |
| $Gd_{0.9}Sr_{0.1}Ni_{0.9}Mn_{0.1}O_3$ | −18 | 2.8 | 4 |
| $Gd_{0.9}Sr_{0.1}Ni_{0.9}Fe_{0.1}O_3$ | −22 | 2.9 | 4.7 |
| $Gd_{0.9}Sr_{0.1}Ni_{0.9}Co_{0.1}O_3$ | −10 | 3 | 4.2 |
| $Gd_{0.9}Sr_{0.1}Ni_{0.9}Cu_{0.1}O_3$ | −26 | 2.8 | 4.3 |
| $Gd_{0.9}Sr_{0.1}Ni_{0.9}Mo_{0.1}O_3$ | −20 | 3.5 | 4.9 |
| $Gd_{0.9}Sr_{0.1}Ni_{0.9}W_{0.1}O_3$ | −19 | 4 | 3.9 |
| $Gd_{0.9}Sr_{0.1}Ni_{0.9}Nb_{0.1}O_3$ | −17 | 3.9 | 4.2 |
| $Gd_{0.9}Sr_{0.1}Ni_{0.9}Ta_{0.1}O_3$ | −23 | 2.1 | 4 |
| $Gd_{0.9}Ca_{0.1}Ni_{0.9}Ti_{0.1}O_3$ | −18 | 2.8 | 4.6 |
| $Gd_{0.9}Ca_{0.1}Ni_{0.9}V_{0.1}O_3$ | −20 | 2.7 | 4.5 |
| $Gd_{0.9}Ca_{0.1}Ni_{0.9}Cr_{0.1}O_3$ | −21 | 3.9 | 4.2 |
| $Gd_{0.9}Ca_{0.1}Ni_{0.9}Mn_{0.1}O_3$ | −21 | 3.8 | 4.7 |
| $Gd_{0.9}Ca_{0.1}Ni_{0.9}Fe_{0.1}O_3$ | −22 | 2.7 | 4.8 |
| $Gd_{0.9}Ca_{0.1}Ni_{0.9}Co_{0.1}O_3$ | −18 | 1.9 | 4.1 |
| $Gd_{0.9}Ca_{0.1}Ni_{0.9}Cu_{0.1}O_3$ | −25 | 2.8 | 3.8 |
| $Gd_{0.9}Ca_{0.1}Ni_{0.9}Mo_{0.1}O_3$ | −24 | 3.7 | 3.9 |
| $Gd_{0.9}Ca_{0.1}Ni_{0.9}W_{0.1}O_3$ | −28 | 3.4 | 4.6 |
| $Gd_{0.9}Ca_{0.1}Ni_{0.9}Nb_{0.1}O_3$ | −19 | 2.8 | 4.3 |
| $Gd_{0.9}Ca_{0.1}Ni_{0.9}Ta_{0.1}O_3$ | −20 | 3 | 4 |
| $Gd_{0.9}Bi_{0.1}Ni_{0.9}Ti_{0.1}O_3$ | −26 | 2.9 | 4.7 |
| $Gd_{0.9}Bi_{0.1}Ni_{0.9}V_{0.1}O_3$ | −23 | 1.8 | 4.2 |
| $Gd_{0.9}Bi_{0.1}Ni_{0.9}Cr_{0.1}O_3$ | −22 | 2.9 | 4.3 |
| $Gd_{0.9}Bi_{0.1}Ni_{0.9}Mn_{0.1}O_3$ | −19 | 3.1 | 4.9 |
| $Gd_{0.9}Bi_{0.1}Ni_{0.9}Fe_{0.1}O_3$ | −17 | 2.2 | 3.9 |
| $Gd_{0.9}Bi_{0.1}Ni_{0.9}Co_{0.1}O_3$ | −20 | 2.1 | 4.2 |
| $Gd_{0.9}Bi_{0.1}Ni_{0.9}Cu_{0.1}O_3$ | −22 | 3 | 4 |
| $Gd_{0.9}Bi_{0.1}Ni_{0.9}Mo_{0.1}O_3$ | −20 | 2.8 | 4.7 |
| $Gd_{0.9}Bi_{0.1}Ni_{0.9}W_{0.1}O_3$ | −21 | 3.2 | 4.6 |
| $Gd_{0.9}Bi_{0.1}Ni_{0.9}Nb_{0.1}O_3$ | −23 | 3.1 | 4.5 |
| $Gd_{0.9}Bi_{0.1}Ni_{0.9}Ta_{0.1}O_3$ | −18 | 3 | 4.2 |
| $Dy_{0.9}Na_{0.1}Ni_{0.9}Ti_{0.1}O_3$ | −19 | 2.8 | 4.8 |
| $Dy_{0.9}Na_{0.1}Ni_{0.9}V_{0.1}O_3$ | −24 | 2.9 | 4.1 |
| $Dy_{0.9}Na_{0.1}Ni_{0.9}Cr_{0.1}O_3$ | −25 | 3 | 3.8 |
| $Dy_{0.9}Na_{0.1}Ni_{0.9}Mn_{0.1}O_3$ | −16 | 2.8 | 4.3 |

TABLE 92

| | | | |
|---|---|---|---|
| $Dy_{0.9}Na_{0.1}Ni_{0.9}Fe_{0.1}O_3$ | −20 | 3.5 | 4 |
| $Dy_{0.9}Na_{0.1}Ni_{0.9}Co_{0.1}O_3$ | −22 | 4 | 4.7 |
| $Dy_{0.9}Na_{0.1}Ni_{0.9}Cu_{0.1}O_3$ | −24 | 3.9 | 4.2 |
| $Dy_{0.9}Na_{0.1}Ni_{0.9}Mo_{0.1}O_3$ | −23 | 2.1 | 4.3 |
| $Dy_{0.9}Na_{0.1}Ni_{0.9}W_{0.1}O_3$ | −26 | 2.6 | 4.9 |
| $Dy_{0.9}Na_{0.1}Ni_{0.9}Nb_{0.1}O_3$ | −28 | 2.8 | 3.9 |
| $Dy_{0.9}Na_{0.1}Ni_{0.9}Ta_{0.1}O_3$ | −19 | 2.7 | 4.2 |
| $Dy_{0.9}K_{0.1}Ni_{0.9}Ti_{0.1}O_3$ | −22 | 2.4 | 4.7 |
| $Dy_{0.9}K_{0.1}Ni_{0.9}V_{0.1}O_3$ | −24 | 2.8 | 4.6 |
| $Dy_{0.9}K_{0.1}Ni_{0.9}Cr_{0.1}O_3$ | −21 | 2.9 | 4.5 |
| $Dy_{0.9}K_{0.1}Ni_{0.9}Mn_{0.1}O_3$ | −29 | 3 | 4.2 |
| $Dy_{0.9}K_{0.1}Ni_{0.9}Fe_{0.1}O_3$ | −17 | 2.8 | 4.7 |
| $Dy_{0.9}K_{0.1}Ni_{0.9}Co_{0.1}O_3$ | −18 | 3.5 | 4.8 |
| $Dy_{0.9}K_{0.1}Ni_{0.9}Cu_{0.1}O_3$ | −24 | 4 | 4.1 |
| $Dy_{0.9}K_{0.1}Ni_{0.9}Mo_{0.1}O_3$ | −22 | 3.9 | 3.8 |
| $Dy_{0.9}K_{0.1}Ni_{0.9}W_{0.1}O_3$ | −21 | 2.1 | 4 |
| $Dy_{0.9}K_{0.1}Ni_{0.9}Nb_{0.1}O_3$ | −27 | 2.6 | 4.6 |
| $Dy_{0.9}K_{0.1}Ni_{0.9}Ta_{0.1}O_3$ | −21 | 2.8 | 4.2 |
| $Dy_{0.9}Sr_{0.1}Ni_{0.9}Ti_{0.1}O_3$ | −19 | 3.9 | 4.3 |
| $Dy_{0.9}Sr_{0.1}Ni_{0.9}V_{0.1}O_3$ | −23 | 1.8 | 4.2 |
| $Dy_{0.9}Sr_{0.1}Ni_{0.9}Cr_{0.1}O_3$ | −24 | 2.9 | 4.1 |
| $Dy_{0.9}Sr_{0.1}Ni_{0.9}Mn_{0.1}O_3$ | −25 | 3.1 | 3.9 |
| $Dy_{0.9}Sr_{0.1}Ni_{0.9}Fe_{0.1}O_3$ | −16 | 2.2 | 4 |
| $Dy_{0.9}Sr_{0.1}Ni_{0.9}Co_{0.1}O_3$ | −21 | 2.1 | 3.8 |
| $Dy_{0.9}Sr_{0.1}Ni_{0.9}Cu_{0.1}O_3$ | −23 | 3 | 3.7 |
| $Dy_{0.9}Sr_{0.1}Ni_{0.9}Mo_{0.1}O_3$ | −19 | 2.8 | 4 |
| $Dy_{0.9}Sr_{0.1}Ni_{0.9}W_{0.1}O_3$ | −23 | 3.2 | 3.9 |
| $Dy_{0.9}Sr_{0.1}Ni_{0.9}Nb_{0.1}O_3$ | −24 | 3.1 | 3.6 |
| $Dy_{0.9}Sr_{0.1}Ni_{0.9}Ta_{0.1}O_3$ | −25 | 3 | 4.1 |
| $Dy_{0.9}Ca_{0.1}Ni_{0.9}Ti_{0.1}O_3$ | −20 | 2.8 | 4.6 |
| $Dy_{0.9}Ca_{0.1}Ni_{0.9}V_{0.1}O_3$ | −22 | 2.9 | 4.3 |
| $Dy_{0.9}Ca_{0.1}Ni_{0.9}Cr_{0.1}O_3$ | −29 | 3 | 4 |
| $Dy_{0.9}Ca_{0.1}Ni_{0.9}Mn_{0.1}O_3$ | −22 | 2.8 | 4.7 |
| $Dy_{0.9}Ca_{0.1}Ni_{0.9}Fe_{0.1}O_3$ | −19 | 3.5 | 4.2 |

TABLE 93

| | | | |
|---|---|---|---|
| $Dy_{0.9}Ca_{0.1}Ni_{0.9}Co_{0.1}O_3$ | −25 | 4.0 | 4.3 |
| $Dy_{0.9}Ca_{0.1}Ni_{0.9}Cu_{0.1}O_3$ | −30 | 3.9 | 4.9 |
| $Dy_{0.9}Ca_{0.1}Ni_{0.9}Mo_{0.1}O_3$ | −28 | 2.1 | 3.9 |
| $Dy_{0.9}Ca_{0.1}Ni_{0.9}W_{0.1}O_3$ | −27 | 2.6 | 4.2 |
| $Dy_{0.9}Ca_{0.1}Ni_{0.9}Nb_{0.1}O_3$ | −25 | 2.8 | 4 |
| $Dy_{0.9}Ca_{0.1}Ni_{0.9}Ta_{0.1}O_3$ | −18 | 2.7 | 4.7 |
| $Dy_{0.9}Bi_{0.1}Ni_{0.9}Ti_{0.1}O_3$ | −22 | 3.9 | 4.6 |
| $Dy_{0.9}Bi_{0.1}Ni_{0.9}V_{0.1}O_3$ | −10 | 3.8 | 4.5 |
| $Dy_{0.9}Bi_{0.1}Ni_{0.9}Cr_{0.1}O_3$ | −26 | 2.7 | 4.2 |
| $Dy_{0.9}Bi_{0.1}Ni_{0.9}Mn_{0.1}O_3$ | −20 | 1.9 | 4.7 |
| $Dy_{0.9}Bi_{0.1}Ni_{0.9}Fe_{0.1}O_3$ | −19 | 2.8 | 4.8 |
| $Dy_{0.9}Bi_{0.1}Ni_{0.9}Co_{0.1}O_3$ | −17 | 3.7 | 4.1 |
| $Dy_{0.9}Bi_{0.1}Ni_{0.9}Cu_{0.1}O_3$ | −23 | 3.4 | 3.8 |
| $Dy_{0.9}Bi_{0.1}Ni_{0.9}Mo_{0.1}O_3$ | −22 | 2.8 | 4.1 |
| $Dy_{0.9}Bi_{0.1}Ni_{0.9}W_{0.1}O_3$ | −18 | 3 | 3.9 |
| $Dy_{0.9}Bi_{0.1}Ni_{0.9}Nb_{0.1}O_3$ | −20 | 2.9 | 4.6 |
| $Dy_{0.9}Bi_{0.1}Ni_{0.9}Ta_{0.1}O_3$ | −21 | 1.8 | 4.3 |
| $Ho_{0.9}Na_{0.1}Ni_{0.9}Ti_{0.1}O_3$ | −22 | 3.1 | 4.7 |
| $Ho_{0.9}Na_{0.1}Ni_{0.9}V_{0.1}O_3$ | −18 | 2.2 | 4.2 |
| $Ho_{0.9}Na_{0.1}Ni_{0.9}Cr_{0.1}O_3$ | −25 | 2.1 | 4.3 |
| $Ho_{0.9}Na_{0.1}Ni_{0.9}Mn_{0.1}O_3$ | −24 | 3 | 4.9 |
| $Ho_{0.9}Na_{0.1}Ni_{0.9}Fe_{0.1}O_3$ | −28 | 2.8 | 3.9 |
| $Ho_{0.9}Na_{0.1}Ni_{0.9}Co_{0.1}O_3$ | −19 | 3.2 | 4.2 |
| $Ho_{0.9}Na_{0.1}Ni_{0.9}Cu_{0.1}O_3$ | −20 | 3.1 | 4 |
| $Ho_{0.9}Na_{0.1}Ni_{0.9}Mo_{0.1}O_3$ | −26 | 3 | 4.7 |
| $Ho_{0.9}Na_{0.1}Ni_{0.9}W_{0.1}O_3$ | −23 | 2.4 | 4.6 |
| $Ho_{0.9}Na_{0.1}Ni_{0.9}Nb_{0.1}O_3$ | −22 | 2.8 | 4.5 |
| $Ho_{0.9}Na_{0.1}Ni_{0.9}Ta_{0.1}O_3$ | −19 | 2.9 | 4.2 |
| $Ho_{0.9}K_{0.1}Ni_{0.9}Ti_{0.1}O_3$ | −20 | 2.8 | 4.8 |
| $Ho_{0.9}K_{0.1}Ni_{0.9}V_{0.1}O_3$ | −22 | 3.5 | 4.1 |
| $Ho_{0.9}K_{0.1}Ni_{0.9}Cr_{0.1}O_3$ | −20 | 4 | 3.8 |
| $Ho_{0.9}K_{0.1}Ni_{0.9}Mn_{0.1}O_3$ | −21 | 3.9 | 4 |
| $Ho_{0.9}K_{0.1}Ni_{0.9}Fe_{0.1}O_3$ | −23 | 2.1 | 4.6 |
| $Ho_{0.9}K_{0.1}Ni_{0.9}Co_{0.1}O_3$ | −18 | 2.6 | 4.2 |
| $Ho_{0.9}K_{0.1}Ni_{0.9}Cu_{0.1}O_3$ | −28 | 2.8 | 4.5 |

TABLE 94

| | | | |
|---|---|---|---|
| $Ho_{0.9}K_{0.1}Ni_{0.9}Mo_{0.1}O_3$ | −19 | 2.7 | 4.3 |
| $Ho_{0.9}K_{0.1}Ni_{0.9}W_{0.1}O_3$ | −24 | 3.9 | 4.1 |
| $Ho_{0.9}K_{0.1}Ni_{0.9}Nb_{0.1}O_3$ | −25 | 3.8 | 3.9 |
| $Ho_{0.9}K_{0.1}Ni_{0.9}Ta_{0.1}O_3$ | −16 | 2.7 | 4 |
| $Ho_{0.9}Sr_{0.1}Ni_{0.9}Ti_{0.1}O_3$ | −22 | 2.8 | 3.7 |
| $Ho_{0.9}Sr_{0.1}Ni_{0.9}V_{0.1}O_3$ | −24 | 3.7 | 4 |
| $Ho_{0.9}Sr_{0.1}Ni_{0.9}Cr_{0.1}O_3$ | −23 | 3.4 | 3.9 |
| $Ho_{0.9}Sr_{0.1}Ni_{0.9}Mn_{0.1}O_3$ | −26 | 2.8 | 3.6 |
| $Ho_{0.9}Sr_{0.1}Ni_{0.9}Fe_{0.1}O_3$ | −28 | 3 | 4.1 |
| $Ho_{0.9}Sr_{0.1}Ni_{0.9}Co_{0.1}O_3$ | −19 | 2.9 | 3.9 |
| $Ho_{0.9}Sr_{0.1}Ni_{0.9}Cu_{0.1}O_3$ | −21 | 2.2 | 4.6 |
| $Ho_{0.9}Sr_{0.1}Ni_{0.9}Mo_{0.1}O_3$ | −22 | 1.9 | 4.3 |
| $Ho_{0.9}Sr_{0.1}Ni_{0.9}W_{0.1}O_3$ | −24 | 1.8 | 4 |
| $Ho_{0.9}Sr_{0.1}Ni_{0.9}Nb_{0.1}O_3$ | −21 | 2.9 | 4.7 |
| $Ho_{0.9}Sr_{0.1}Ni_{0.9}Ta_{0.1}O_3$ | −29 | 3.1 | 4.2 |
| $Ho_{0.9}Ca_{0.1}Ni_{0.9}Ti_{0.1}O_3$ | −18 | 2.1 | 4.9 |
| $Ho_{0.9}Ca_{0.1}Ni_{0.9}V_{0.1}O_3$ | −24 | 3 | 3.9 |
| $Ho_{0.9}Ca_{0.1}Ni_{0.9}Cr_{0.1}O_3$ | −22 | 2.8 | 4.2 |
| $Ho_{0.9}Ca_{0.1}Ni_{0.9}Mn_{0.1}O_3$ | −21 | 3.2 | 4 |
| $Ho_{0.9}Ca_{0.1}Ni_{0.9}Fe_{0.1}O_3$ | −27 | 3.1 | 4.7 |
| $Ho_{0.9}Ca_{0.1}Ni_{0.9}Co_{0.1}O_3$ | −25 | 3 | 4.6 |
| $Ho_{0.9}Ca_{0.1}Ni_{0.9}Cu_{0.1}O_3$ | −30 | 2.4 | 4.5 |
| $Ho_{0.9}Ca_{0.1}Ni_{0.9}Mo_{0.1}O_3$ | −28 | 2.8 | 4.2 |
| $Ho_{0.9}Ca_{0.1}Ni_{0.9}W_{0.1}O_3$ | −27 | 2.9 | 4.7 |
| $Ho_{0.9}Ca_{0.1}Ni_{0.9}Nb_{0.1}O_3$ | −25 | 3 | 4.8 |
| $Ho_{0.9}Ca_{0.1}Ni_{0.9}Ta_{0.1}O_3$ | −18 | 2.8 | 4.1 |
| $Ho_{0.9}Bi_{0.1}Ni_{0.9}Ti_{0.1}O_3$ | −22 | 3.5 | 3.8 |
| $Ho_{0.9}Bi_{0.1}Ni_{0.9}V_{0.1}O_3$ | −10 | 4 | 4 |
| $Ho_{0.9}Bi_{0.1}Ni_{0.9}Cr_{0.1}O_3$ | −26 | 3.9 | 4.6 |
| $Ho_{0.9}Bi_{0.1}Ni_{0.9}Mn_{0.1}O_3$ | −20 | 2.1 | 4.2 |
| $Ho_{0.9}Bi_{0.1}Ni_{0.9}Fe_{0.1}O_3$ | −19 | 2.6 | 4.5 |
| $Ho_{0.9}Bi_{0.1}Ni_{0.9}Co_{0.1}O_3$ | −17 | 2.8 | 4.3 |
| $Ho_{0.9}Bi_{0.1}Ni_{0.9}Cu_{0.1}O_3$ | −23 | 2.7 | 4.2 |
| $Ho_{0.9}Bi_{0.1}Ni_{0.9}Mo_{0.1}O_3$ | −22 | 3.9 | 4.1 |
| $Ho_{0.9}Bi_{0.1}Ni_{0.9}W_{0.1}O_3$ | −18 | 3.8 | 3.9 |
| $Ho_{0.9}Bi_{0.1}Ni_{0.9}Nb_{0.1}O_3$ | −20 | 2.7 | 4 |

TABLE 95

| | | | |
|---|---|---|---|
| $Ho_{0.9}Bi_{0.1}Ni_{0.9}Ta_{0.1}O_3$ | −21 | 1.9 | 3.8 |
| $Er_{0.9}Na_{0.1}Ni_{0.9}Ti_{0.1}O_3$ | −22 | 3.7 | 4 |
| $Er_{0.9}Na_{0.1}Ni_{0.9}V_{0.1}O_3$ | −18 | 3.4 | 3.9 |
| $Er_{0.9}Na_{0.1}Ni_{0.9}Cr_{0.1}O_3$ | −25 | 2.8 | 3.6 |
| $Er_{0.9}Na_{0.1}Ni_{0.9}Mn_{0.1}O_3$ | −24 | 3 | 4.1 |
| $Er_{0.9}Na_{0.1}Ni_{0.9}Fe_{0.1}O_3$ | −28 | 2.9 | 3.9 |
| $Er_{0.9}Na_{0.1}Ni_{0.9}Co_{0.1}O_3$ | −19 | 1.8 | 4.6 |
| $Er_{0.9}Na_{0.1}Ni_{0.9}Cu_{0.1}O_3$ | −20 | 2.9 | 4.3 |
| $Er_{0.9}Na_{0.1}Ni_{0.9}Mo_{0.1}O_3$ | −26 | 3.1 | 4 |
| $Er_{0.9}Na_{0.1}Ni_{0.9}W_{0.1}O_3$ | −23 | 2.2 | 4.7 |
| $Er_{0.9}Na_{0.1}Ni_{0.9}Nb_{0.1}O_3$ | −22 | 2.1 | 4.2 |
| $Er_{0.9}Na_{0.1}Ni_{0.9}Ta_{0.1}O_3$ | −19 | 3 | 4.3 |
| $Er_{0.9}K_{0.1}Ni_{0.9}Ti_{0.1}O_3$ | −20 | 3.2 | 3.9 |
| $Er_{0.9}K_{0.1}Ni_{0.9}V_{0.1}O_3$ | −22 | 3.1 | 4.2 |
| $Er_{0.9}K_{0.1}Ni_{0.9}Cr_{0.1}O_3$ | −20 | 3 | 4 |
| $Er_{0.9}K_{0.1}Ni_{0.9}Mn_{0.1}O_3$ | −21 | 2.4 | 4.7 |
| $Er_{0.9}K_{0.1}Ni_{0.9}Fe_{0.1}O_3$ | −23 | 2.8 | 4.6 |
| $Er_{0.9}K_{0.1}Ni_{0.9}Co_{0.1}O_3$ | −18 | 2.9 | 4.5 |
| $Er_{0.9}K_{0.1}Ni_{0.9}Cu_{0.1}O_3$ | −28 | 3 | 4.2 |
| $Er_{0.9}K_{0.1}Ni_{0.9}Mo_{0.1}O_3$ | −19 | 2.8 | 4.7 |
| $Er_{0.9}K_{0.1}Ni_{0.9}W_{0.1}O_3$ | −24 | 3.5 | 4.8 |
| $Er_{0.9}K_{0.1}Ni_{0.9}Nb_{0.1}O_3$ | −25 | 4 | 4.1 |
| $Er_{0.9}K_{0.1}Ni_{0.9}Ta_{0.1}O_3$ | −16 | 3.9 | 3.8 |
| $Er_{0.9}Sr_{0.1}Ni_{0.9}Ti_{0.1}O_3$ | −22 | 2.6 | 4.7 |
| $Er_{0.9}Sr_{0.1}Ni_{0.9}V_{0.1}O_3$ | −24 | 2.2 | 4.6 |
| $Er_{0.9}Sr_{0.1}Ni_{0.9}Cr_{0.1}O_3$ | −23 | 1.9 | 4.5 |
| $Er_{0.9}Sr_{0.1}Ni_{0.9}Mn_{0.1}O_3$ | −26 | 1.8 | 4.2 |
| $Er_{0.9}Sr_{0.1}Ni_{0.9}Fe_{0.1}O_3$ | −28 | 2.9 | 4.7 |
| $Er_{0.9}Sr_{0.1}Ni_{0.9}Co_{0.1}O_3$ | −19 | 3.1 | 4.8 |
| $Er_{0.9}Sr_{0.1}Ni_{0.9}Cu_{0.1}O_3$ | −21 | 2.2 | 4.1 |
| $Er_{0.9}Sr_{0.1}Ni_{0.9}Mo_{0.1}O_3$ | −22 | 2.1 | 3.8 |
| $Er_{0.9}Sr_{0.1}Ni_{0.9}W_{0.1}O_3$ | −24 | 3 | 4.1 |
| $Er_{0.9}Sr_{0.1}Ni_{0.9}Nb_{0.1}O_3$ | −21 | 2.8 | 3.9 |
| $Er_{0.9}Sr_{0.1}Ni_{0.9}Ta_{0.1}O_3$ | −29 | 3.2 | 4.6 |
| $Er_{0.9}Ca_{0.1}Ni_{0.9}Ti_{0.1}O_3$ | −18 | 3 | 4 |
| $Er_{0.9}Ca_{0.1}Ni_{0.9}V_{0.1}O_3$ | −24 | 2.4 | 4.7 |
| $Er_{0.9}Ca_{0.1}Ni_{0.9}Cr_{0.1}O_3$ | −22 | 2.8 | 4.2 |

TABLE 96

| | | | |
|---|---|---|---|
| $Er_{0.9}Ca_{0.1}Ni_{0.9}Mn_{0.1}O_3$ | −21 | 2.9 | 4.3 |
| $Er_{0.9}Ca_{0.1}Ni_{0.9}Fe_{0.1}O_3$ | −27 | 3 | 4.9 |
| $Er_{0.9}Ca_{0.1}Ni_{0.9}Co_{0.1}O_3$ | −21 | 2.8 | 3.9 |
| $Er_{0.9}Ca_{0.1}Ni_{0.9}Cu_{0.1}O_3$ | −23 | 3.5 | 4.2 |
| $Er_{0.9}Ca_{0.1}Ni_{0.9}Mo_{0.1}O_3$ | −19 | 4 | 4 |
| $Er_{0.9}Ca_{0.1}Ni_{0.9}W_{0.1}O_3$ | −23 | 3.9 | 4.7 |
| $Er_{0.9}Ca_{0.1}Ni_{0.9}Nb_{0.1}O_3$ | −24 | 2.1 | 4.6 |
| $Er_{0.9}Ca_{0.1}Ni_{0.9}Ta_{0.1}O_3$ | −25 | 2.6 | 4.5 |
| $Er_{0.9}Bi_{0.1}Ni_{0.9}Ti_{0.1}O_3$ | −16 | 2.8 | 4.2 |
| $Er_{0.9}Bi_{0.1}Ni_{0.9}V_{0.1}O_3$ | −20 | 2.7 | 4.7 |
| $Er_{0.9}Bi_{0.1}Ni_{0.9}Cr_{0.1}O_3$ | −22 | 3.9 | 4.8 |
| $Er_{0.9}Bi_{0.1}Ni_{0.9}Mn_{0.1}O_3$ | −22 | 3.8 | 4.1 |
| $Er_{0.9}Bi_{0.1}Ni_{0.9}Fe_{0.1}O_3$ | −10 | 2.7 | 3.8 |
| $Er_{0.9}Bi_{0.1}Ni_{0.9}Co_{0.1}O_3$ | −26 | 1.9 | 4 |
| $Er_{0.9}Bi_{0.1}Ni_{0.9}Cu_{0.1}O_3$ | −20 | 2.8 | 4.6 |
| $Er_{0.9}Bi_{0.1}Ni_{0.9}Mo_{0.1}O_3$ | −19 | 3.7 | 4.2 |
| $Er_{0.9}Bi_{0.1}Ni_{0.9}W_{0.1}O_3$ | −17 | 3.4 | 4.5 |
| $Er_{0.9}Bi_{0.1}Ni_{0.9}Nb_{0.1}O_3$ | −23 | 2.8 | 4.3 |
| $Er_{0.9}Bi_{0.1}Ni_{0.9}Ta_{0.1}O_3$ | −22 | 3 | 4.1 |
| $Yb_{0.9}Na_{0.1}Ni_{0.9}Ti_{0.1}O_3$ | −20 | 1.8 | 4 |
| $Yb_{0.9}Na_{0.1}Ni_{0.9}V_{0.1}O_3$ | −21 | 2.9 | 3.8 |
| $Yb_{0.9}Na_{0.1}Ni_{0.9}Cr_{0.1}O_3$ | −21 | 3.1 | 3.7 |
| $Yb_{0.9}Na_{0.1}Ni_{0.9}Mn_{0.1}O_3$ | −22 | 2.2 | 4 |
| $Yb_{0.9}Na_{0.1}Ni_{0.9}Fe_{0.1}O_3$ | −18 | 2.1 | 3.9 |
| $Yb_{0.9}Na_{0.1}Ni_{0.9}Co_{0.1}O_3$ | −25 | 3 | 3.6 |
| $Yb_{0.9}Na_{0.1}Ni_{0.9}Cu_{0.1}O_3$ | −24 | 2.8 | 4.1 |
| $Yb_{0.9}Na_{0.1}Ni_{0.9}Mo_{0.1}O_3$ | −28 | 3.2 | 3.9 |
| $Yb_{0.9}Na_{0.1}Ni_{0.9}W_{0.1}O_3$ | −19 | 3.1 | 4.6 |
| $Yb_{0.9}Na_{0.1}Ni_{0.9}Nb_{0.1}O_3$ | −20 | 3 | 4.3 |
| $Yb_{0.9}Na_{0.1}Ni_{0.9}Ta_{0.1}O_3$ | −26 | 2.4 | 4 |
| $Yb_{0.9}K_{0.1}Ni_{0.9}Ti_{0.1}O_3$ | −22 | 2.9 | 4.2 |
| $Yb_{0.9}K_{0.1}Ni_{0.9}V_{0.1}O_3$ | −19 | 3 | 4.3 |
| $Yb_{0.9}K_{0.1}Ni_{0.9}Cr_{0.1}O_3$ | −17 | 2.8 | 4.9 |
| $Yb_{0.9}K_{0.1}Ni_{0.9}Mn_{0.1}O_3$ | −20 | 3.5 | 3.9 |
| $Yb_{0.9}K_{0.1}Ni_{0.9}Fe_{0.1}O_3$ | −22 | 4 | 4.2 |
| $Yb_{0.9}K_{0.1}Ni_{0.9}Co_{0.1}O_3$ | −20 | 3.9 | 4 |
| $Yb_{0.9}K_{0.1}Ni_{0.9}Cu_{0.1}O_3$ | −21 | 2.1 | 4.7 |

TABLE 97

| | | | |
|---|---|---|---|
| Yb$_{0.9}$K$_{0.1}$Ni$_{0.9}$Mo$_{0.1}$O$_3$ | −23 | 2.6 | 4.6 |
| Yb$_{0.9}$K$_{0.1}$Ni$_{0.9}$W$_{0.1}$O$_3$ | −18 | 2.8 | 4.5 |
| Yb$_{0.9}$K$_{0.1}$Ni$_{0.9}$Nb$_{0.1}$O$_3$ | −28 | 2.7 | 4.2 |
| Yb$_{0.9}$K$_{0.1}$Ni$_{0.9}$Ta$_{0.1}$O$_3$ | −19 | 3.1 | 4.7 |
| Yb$_{0.9}$Sr$_{0.1}$Ni$_{0.9}$Ti$_{0.1}$O$_3$ | −25 | 2.1 | 4.1 |
| Yb$_{0.9}$Sr$_{0.1}$Ni$_{0.9}$V$_{0.1}$O$_3$ | −16 | 3 | 3.8 |
| Yb$_{0.9}$Sr$_{0.1}$Ni$_{0.9}$Cr$_{0.1}$O$_3$ | −20 | 2.8 | 4 |
| Yb$_{0.9}$Sr$_{0.1}$Ni$_{0.9}$Mn$_{0.1}$O$_3$ | −22 | 3.2 | 4.6 |
| Yb$_{0.9}$Sr$_{0.1}$Ni$_{0.9}$Fe$_{0.1}$O$_3$ | −24 | 3.1 | 4.2 |
| Yb$_{0.9}$Sr$_{0.1}$Ni$_{0.9}$Co$_{0.1}$O$_3$ | −23 | 3 | 4.5 |
| Yb$_{0.9}$Sr$_{0.1}$Ni$_{0.9}$Cu$_{0.1}$O$_3$ | −26 | 2.4 | 4.3 |
| Yb$_{0.9}$Sr$_{0.1}$Ni$_{0.9}$Mo$_{0.1}$O$_3$ | −28 | 2.8 | 4.2 |
| Yb$_{0.9}$Sr$_{0.1}$Ni$_{0.9}$W$_{0.1}$O$_3$ | −19 | 2.9 | 4.1 |
| Yb$_{0.9}$Sr$_{0.1}$Ni$_{0.9}$Nb$_{0.1}$O$_3$ | −21 | 3 | 3.9 |
| Yb$_{0.9}$Sr$_{0.1}$Ni$_{0.9}$Ta$_{0.1}$O$_3$ | −22 | 2.8 | 4 |
| Yb$_{0.9}$Ca$_{0.1}$Ni$_{0.9}$Ti$_{0.1}$O$_3$ | −21 | 4 | 3.7 |
| Yb$_{0.9}$Ca$_{0.1}$Ni$_{0.9}$V$_{0.1}$O$_3$ | −29 | 3.9 | 4 |
| Yb$_{0.9}$Ca$_{0.1}$Ni$_{0.9}$Cr$_{0.1}$O$_3$ | −17 | 2.1 | 3.9 |
| Yb$_{0.9}$Ca$_{0.1}$Ni$_{0.9}$Mn$_{0.1}$O$_3$ | −18 | 2.6 | 3.6 |
| Yb$_{0.9}$Ca$_{0.1}$Ni$_{0.9}$Fe$_{0.1}$O$_3$ | −24 | 2.8 | 4.1 |
| Yb$_{0.9}$Ca$_{0.1}$Ni$_{0.9}$Co$_{0.1}$O$_3$ | −22 | 2.7 | 3.9 |
| Yb$_{0.9}$Ca$_{0.1}$Ni$_{0.9}$Cu$_{0.1}$O$_3$ | −21 | 3.9 | 4.6 |
| Yb$_{0.9}$Ca$_{0.1}$Ni$_{0.9}$Mo$_{0.1}$O$_3$ | −27 | 3.8 | 4.3 |
| Yb$_{0.9}$Ca$_{0.1}$Ni$_{0.9}$W$_{0.1}$O$_3$ | −21 | 2.7 | 4 |
| Yb$_{0.9}$Ca$_{0.1}$Ni$_{0.9}$Nb$_{0.1}$O$_3$ | −23 | 1.9 | 4.7 |
| Yb$_{0.9}$Ca$_{0.1}$Ni$_{0.9}$Ta$_{0.1}$O$_3$ | −19 | 2.8 | 4.2 |
| Yb$_{0.9}$Bi$_{0.1}$Ni$_{0.9}$Ti$_{0.1}$O$_3$ | −23 | 3.7 | 4.3 |
| Yb$_{0.9}$Bi$_{0.1}$Ni$_{0.9}$V$_{0.1}$O$_3$ | −24 | 3.4 | 4.9 |
| Yb$_{0.9}$Bi$_{0.1}$Ni$_{0.9}$Cr$_{0.1}$O$_3$ | −25 | 2.8 | 3.9 |
| Yb$_{0.9}$Bi$_{0.1}$Ni$_{0.9}$Mn$_{0.1}$O$_3$ | −16 | 3 | 4.2 |
| Yb$_{0.9}$Bi$_{0.1}$Ni$_{0.9}$Fe$_{0.1}$O$_3$ | −20 | 2.9 | 4 |
| Yb$_{0.9}$Bi$_{0.1}$Ni$_{0.9}$Co$_{0.1}$O$_3$ | −22 | 1.8 | 4.7 |
| Yb$_{0.9}$Bi$_{0.1}$Ni$_{0.9}$Cu$_{0.1}$O$_3$ | −29 | 2.9 | 4.6 |
| Yb$_{0.9}$Bi$_{0.1}$Ni$_{0.9}$Mo$_{0.1}$O$_3$ | −22 | 3.1 | 4.5 |
| Yb$_{0.9}$Bi$_{0.1}$Ni$_{0.9}$W$_{0.1}$O$_3$ | −19 | 2.2 | 4.2 |
| Yb$_{0.9}$Bi$_{0.1}$Ni$_{0.9}$Nb$_{0.1}$O$_3$ | −25 | 2.1 | 4.7 |
| Yb$_{0.9}$Bi$_{0.1}$Ni$_{0.9}$Ta$_{0.1}$O$_3$ | −30 | 3 | 4.8 |

TABLE 98

| Composition (Ln$_s$R$^3_t$)$_2$Ni$_u$R$^4_v$O$_w$ | Seebeck Coefficient μV/K (700° C.) | Electrical Resistivity mΩcm (700° C.) | Thermal Conductivity W/mK (700° C.) |
|---|---|---|---|
| La$_2$NiO$_4$ | −25 | 6.1 | 4.3 |
| Ce$_2$NiO$_4$ | −28 | 5 | 4.2 |
| Pr$_2$NiO$_4$ | −28 | 7 | 4.3 |
| Nd$_2$NiO$_4$ | −22 | 4.9 | 4.5 |
| Sm$_2$NiO$_4$ | −20 | 5 | 4.6 |
| Eu$_2$NiO$_4$ | −25 | 6 | 4.7 |
| Gd$_2$NiO$_4$ | −27 | 5.2 | 4.4 |
| Dy$_2$NiO$_4$ | −30 | 7 | 4.9 |
| Ho$_2$NiO$_4$ | −29 | 8.1 | 4.7 |
| Er$_2$NiO$_4$ | −30 | 6.9 | 4.6 |
| Yb$_2$NiO$_4$ | −28 | 6.7 | 4.6 |
| La$_{1.8}$Na$_{0.2}$NiO$_4$ | −25 | 6.9 | 4.2 |
| La$_{1.8}$K$_{0.2}$NiO$_4$ | −18 | 5.9 | 4.7 |
| La$_{1.8}$Sr$_{0.2}$NiO$_4$ | −22 | 6.3 | 4.8 |
| La$_{1.8}$Ca$_{0.2}$NiO$_4$ | −10 | 7 | 4.1 |
| La$_{1.8}$Bi$_{0.2}$NiO$_4$ | −26 | 7.1 | 3.8 |
| Ce$_{1.8}$Na$_{0.2}$NiO$_4$ | −19 | 7 | 4.6 |
| Ce$_{1.8}$K$_{0.2}$NiO$_4$ | −17 | 6.8 | 4.2 |
| Ce$_{1.8}$Sr$_{0.2}$NiO$_4$ | −23 | 6.9 | 4.5 |
| Ce$_{1.8}$Ca$_{0.2}$NiO$_4$ | −22 | 6.7 | 4.3 |
| Ce$_{1.8}$Bi$_{0.2}$NiO$_4$ | −18 | 7.1 | 4.1 |
| Pr$_{1.8}$Na$_{0.2}$NiO$_4$ | −21 | 6.3 | 4 |
| Pr$_{1.8}$K$_{0.2}$NiO$_4$ | −21 | 7.1 | 3.8 |
| Pr$_{1.8}$Sr$_{0.2}$NiO$_4$ | −22 | 6.4 | 3.7 |
| Pr$_{1.8}$Ca$_{0.2}$NiO$_4$ | −18 | 5.9 | 4 |
| Pr$_{1.8}$Bi$_{0.2}$NiO$_4$ | −25 | 6.4 | 3.9 |
| Nd$_{1.8}$Na$_{0.2}$NiO$_4$ | −28 | 7 | 4.1 |
| Nd$_{1.8}$K$_{0.2}$NiO$_4$ | −19 | 6.8 | 3.9 |
| Nd$_{1.8}$Sr$_{0.2}$NiO$_4$ | −20 | 7.1 | 4.6 |
| Nd$_{1.8}$Ca$_{0.2}$NiO$_4$ | −26 | 6.8 | 4.3 |
| Nd$_{1.8}$Bi$_{0.2}$NiO$_4$ | −23 | 5.9 | 4 |

TABLE 99

| | | | |
|---|---|---|---|
| Sm$_{1.8}$Na$_{0.2}$NiO$_4$ | −19 | 7 | 4.2 |
| Sm$_{1.8}$K$_{0.2}$NiO$_4$ | −17 | 6.8 | 4.3 |
| Sm$_{1.8}$Sr$_{0.2}$NiO$_4$ | −20 | 5 | 4.9 |
| Sm$_{1.8}$Ca$_{0.2}$NiO$_4$ | −22 | 7 | 3.9 |
| Sm$_{1.8}$Bi$_{0.2}$NiO$_4$ | −20 | 4.9 | 4.2 |
| Eu$_{1.8}$Na$_{0.2}$NiO$_4$ | −23 | 6 | 4.7 |
| Eu$_{1.8}$K$_{0.2}$NiO$_4$ | −18 | 5.2 | 4.6 |
| Eu$_{1.8}$Sr$_{0.2}$NiO$_4$ | −28 | 7 | 4.5 |
| Eu$_{1.8}$Ca$_{0.2}$NiO$_4$ | −19 | 8.1 | 4.2 |
| Eu$_{1.8}$Bi$_{0.2}$NiO$_4$ | −24 | 6.9 | 4.7 |
| Gd$_{1.8}$Na$_{0.2}$NiO$_4$ | −16 | 7.2 | 4.1 |
| Gd$_{1.8}$K$_{0.2}$NiO$_4$ | −20 | 6.9 | 3.8 |
| Gd$_{1.8}$Sr$_{0.2}$NiO$_4$ | −22 | 5.9 | 4 |
| Gd$_{1.8}$Ca$_{0.2}$NiO$_4$ | −24 | 6.3 | 4.6 |
| Gd$_{1.8}$Bi$_{0.2}$NiO$_4$ | −23 | 7 | 4.2 |
| Dy$_{1.8}$Na$_{0.2}$NiO$_4$ | −28 | 7.3 | 4.3 |
| Dy$_{1.8}$K$_{0.2}$NiO$_4$ | −19 | 7 | 4.2 |
| Dy$_{1.8}$Sr$_{0.2}$NiO$_4$ | −21 | 6.8 | 4.1 |
| Dy$_{1.8}$Ca$_{0.2}$NiO$_4$ | −22 | 6.9 | 3.9 |
| Dy$_{1.8}$Bi$_{0.2}$NiO$_4$ | −24 | 6.7 | 4 |
| Ho$_{1.8}$Na$_{0.2}$NiO$_4$ | −29 | 5.8 | 3.7 |
| Ho$_{1.8}$K$_{0.2}$NiO$_4$ | −17 | 6.3 | 4 |
| Ho$_{1.8}$Sr$_{0.2}$NiO$_4$ | −18 | 7.1 | 3.9 |
| Ho$_{1.8}$Ca$_{0.2}$NiO$_4$ | −24 | 6.4 | 3.6 |
| Ho$_{1.8}$Bi$_{0.2}$NiO$_4$ | −22 | 5.9 | 4.1 |
| Er$_{1.8}$Na$_{0.2}$NiO$_4$ | −27 | 7.1 | 4.6 |
| Er$_{1.8}$K$_{0.2}$NiO$_4$ | −25 | 7 | 4.3 |
| Er$_{1.8}$Sr$_{0.2}$NiO$_4$ | −30 | 6.8 | 4 |
| Er$_{1.8}$Ca$_{0.2}$NiO$_4$ | −28 | 7.1 | 4.7 |
| Er$_{1.8}$Bi$_{0.2}$NiO$_4$ | −24 | 6.8 | 4.2 |
| Yb$_{1.8}$Na$_{0.2}$NiO$_4$ | −25 | 5.9 | 4.3 |

TABLE 100

| | | | |
|---|---|---|---|
| Yb$_{1.8}$K$_{0.2}$NiO$_4$ | −16 | 6.5 | 4.9 |
| Yb$_{1.8}$Sr$_{0.2}$NiO$_4$ | −20 | 7 | 3.9 |
| Yb$_{1.8}$Ca$_{0.2}$NiO$_4$ | −22 | 6.8 | 4.2 |
| Yb$_{1.8}$Bi$_{0.2}$NiO$_4$ | −24 | 5.8 | 4 |
| La$_2$Ni$_{1.8}$Ti$_{0.2}$O$_4$ | −26 | 7.1 | 4.6 |
| La$_2$Ni$_{1.8}$V$_{0.2}$O$_4$ | −28 | 6.4 | 4.5 |
| La$_2$Ni$_{1.8}$Cr$_{0.2}$O$_4$ | −19 | 5.9 | 4.2 |
| La$_2$Ni$_{1.8}$Mn$_{0.2}$O$_4$ | −21 | 6.4 | 4.7 |
| La$_2$Ni$_{1.8}$Fe$_{0.2}$O$_4$ | −22 | 7.1 | 4.8 |
| La$_2$Ni$_{1.8}$Co$_{0.2}$O$_4$ | −24 | 7 | 4.1 |
| La$_2$Ni$_{1.8}$Cu$_{0.2}$O$_4$ | −21 | 6.8 | 3.8 |
| La$_2$Ni$_{1.8}$Mo$_{0.2}$O$_4$ | −29 | 7.1 | 4 |
| La$_2$Ni$_{1.8}$W$_{0.2}$O$_4$ | −17 | 6.8 | 4.7 |
| La$_2$Ni$_{1.8}$Nb$_{0.2}$O$_4$ | −18 | 5.9 | 4.6 |
| La$_2$Ni$_{1.8}$Ta$_{0.2}$O$_4$ | −24 | 6.5 | 4.5 |
| Ce$_2$Ni$_{0.9}$Ti$_{0.1}$O$_4$ | −21 | 5 | 4.7 |
| Ce$_2$Ni$_{0.9}$V$_{0.1}$O$_4$ | −27 | 7 | 4.8 |
| Ce$_2$Ni$_{0.9}$Cr$_{0.1}$O$_4$ | −25 | 4.9 | 4.1 |
| Ce$_2$Ni$_{0.9}$Mn$_{0.1}$O$_4$ | −30 | 5 | 3.8 |
| Ce$_2$Ni$_{0.9}$Fe$_{0.1}$O$_4$ | −28 | 6 | 4.1 |
| Ce$_2$Ni$_{0.9}$Co$_{0.1}$O$_4$ | −27 | 5.2 | 3.9 |
| Ce$_2$Ni$_{0.9}$Cu$_{0.1}$O$_4$ | −25 | 7 | 4.6 |
| Ce$_2$Ni$_{0.9}$Mo$_{0.1}$O$_4$ | −18 | 8.1 | 4.3 |
| Ce$_2$Ni$_{0.9}$W$_{0.1}$O$_4$ | −22 | 6.9 | 4 |
| Ce$_2$Ni$_{0.9}$Nb$_{0.1}$O$_4$ | −10 | 5.7 | 4.7 |
| Ce$_2$Ni$_{0.9}$Ta$_{0.1}$O$_4$ | −26 | 7.2 | 4.2 |
| Pr$_2$Ni$_{0.9}$Ti$_{0.1}$O$_4$ | −19 | 5.9 | 4.9 |
| Pr$_2$Ni$_{0.9}$V$_{0.1}$O$_4$ | −17 | 6.3 | 3.9 |
| Pr$_2$Ni$_{0.9}$Cr$_{0.1}$O$_4$ | −23 | 7 | 4.2 |
| Pr$_2$Ni$_{0.9}$Mn$_{0.1}$O$_4$ | −22 | 7.1 | 4 |
| Pr$_2$Ni$_{0.9}$Fe$_{0.1}$O$_4$ | −18 | 7.3 | 4.7 |
| Pr$_2$Ni$_{0.9}$Co$_{0.1}$O$_4$ | −20 | 7 | 4.6 |
| Pr$_2$Ni$_{0.9}$Cu$_{0.1}$O$_4$ | −21 | 6.8 | 4.5 |
| Pr$_2$Ni$_{0.9}$Mo$_{0.1}$O$_4$ | −21 | 6.9 | 4.2 |

TABLE 101

| | | | |
|---|---|---|---|
| Pr$_2$Ni$_{0.9}$W$_{0.1}$O$_4$ | −22 | 6.7 | 4.7 |
| Pr$_2$Ni$_{0.9}$Nb$_{0.1}$O$_4$ | −18 | 7.1 | 4.8 |
| Pr$_2$Ni$_{0.9}$Ta$_{0.1}$O$_4$ | −25 | 5.8 | 4.1 |

TABLE 101-continued

| | | | |
|---|---|---|---|
| $Nd_2Ni_{0.9}Ti_{0.1}O_4$ | −28 | 7.1 | 4 |
| $Nd_2Ni_{0.9}V_{0.1}O_4$ | −19 | 6.4 | 4.6 |
| $Nd_2Ni_{0.9}Cr_{0.1}O_4$ | −20 | 5.9 | 4.2 |
| $Nd_2Ni_{0.9}Mn_{0.1}O_4$ | −26 | 6.4 | 4.5 |
| $Nd_2Ni_{0.9}Fe_{0.1}O_4$ | −23 | 7.1 | 4.3 |
| $Nd_2Ni_{0.9}Co_{0.1}O_4$ | −22 | 7 | 4.1 |
| $Nd_2Ni_{0.9}Cu_{0.1}O_4$ | −19 | 6.8 | 3.9 |
| $Nd_2Ni_{0.9}Mo_{0.1}O_4$ | −17 | 7.1 | 4 |
| $Nd_2Ni_{0.9}W_{0.1}O_4$ | −20 | 6.8 | 3.8 |
| $Nd_2Ni_{0.9}Nb_{0.1}O_4$ | −22 | 5.9 | 3.7 |
| $Nd_2Ni_{0.9}Ta_{0.1}O_4$ | −20 | 6.5 | 4 |
| $Sm_2Ni_{0.9}Ti_{0.1}O_4$ | −23 | 6.8 | 3.6 |
| $Sm_2Ni_{0.9}V_{0.1}O_4$ | −18 | 5 | 4.1 |
| $Sm_2Ni_{0.9}Cr_{0.1}O_4$ | −28 | 7 | 3.9 |
| $Sm_2Ni_{0.9}Mn_{0.1}O_4$ | −19 | 4.9 | 4.6 |
| $Sm_2Ni_{0.9}Fe_{0.1}O_4$ | −24 | 5 | 4.3 |
| $Sm_2Ni_{0.9}Co_{0.1}O_4$ | −25 | 6 | 4 |
| $Sm_2Ni_{0.9}Cu_{0.1}O_4$ | −16 | 5.2 | 4.7 |
| $Sm_2Ni_{0.9}Mo_{0.1}O_4$ | −20 | 7 | 4.2 |
| $Sm_2Ni_{0.9}W_{0.1}O_4$ | −22 | 8.1 | 4.3 |
| $Sm_2Ni_{0.9}Nb_{0.1}O_4$ | −24 | 6.9 | 4.9 |
| $Sm_2Ni_{0.9}Ta_{0.1}O_4$ | −23 | 6.7 | 3.9 |
| $Eu_2Ni_{0.9}Ti_{0.1}O_4$ | −26 | 7.2 | 4.2 |
| $Eu_2Ni_{0.9}V_{0.1}O_4$ | −28 | 6.9 | 4 |
| $Eu_2Ni_{0.9}Cr_{0.1}O_4$ | −19 | 5.9 | 4.7 |
| $Eu_2Ni_{0.9}Mn_{0.1}O_4$ | −21 | 6.3 | 4.6 |
| $Eu_2Ni_{0.9}Fe_{0.1}O_4$ | −22 | 7 | 4.5 |
| $Eu_2Ni_{0.9}Co_{0.1}O_4$ | −24 | 7.1 | 4.2 |
| $Eu_2Ni_{0.9}Cu_{0.1}O_4$ | −21 | 7.3 | 4.7 |
| $Eu_2Ni_{0.9}Mo_{0.1}O_4$ | −29 | 7 | 4.8 |
| $Eu_2Ni_{0.9}W_{0.1}O_4$ | −17 | 6.8 | 4.1 |
| $Eu_2Ni_{0.9}Nb_{0.1}O_4$ | −18 | 6.9 | 3.8 |

TABLE 102

| | | | |
|---|---|---|---|
| $Eu_2Ni_{0.9}Ta_{0.1}O_4$ | −24 | 6.7 | 4 |
| $Gd_2Ni_{0.9}Ti_{0.1}O_4$ | −21 | 5.8 | 4.2 |
| $Gd_2Ni_{0.9}V_{0.1}O_4$ | −27 | 6.3 | 4.3 |
| $Gd_2Ni_{0.9}Cr_{0.1}O_4$ | −21 | 7.1 | 4.5 |
| $Gd_2Ni_{0.9}Mn_{0.1}O_4$ | −23 | 6.4 | 4.6 |
| $Gd_2Ni_{0.9}Fe_{0.1}O_4$ | −19 | 5.9 | 4.7 |
| $Gd_2Ni_{0.9}Co_{0.1}O_4$ | −23 | 6.4 | 4.4 |
| $Gd_2Ni_{0.9}Cu_{0.1}O_4$ | −24 | 7.1 | 4.9 |
| $Gd_2Ni_{0.9}Mo_{0.1}O_4$ | −25 | 7 | 4.7 |
| $Gd_2Ni_{0.9}W_{0.1}O_4$ | −16 | 6.8 | 4.6 |
| $Gd_2Ni_{0.9}Nb_{0.1}O_4$ | −20 | 7.1 | 4.6 |
| $Gd_2Ni_{0.9}Ta_{0.1}O_4$ | −22 | 6.8 | 4.5 |
| $Dy_2Ni_{0.9}Ti_{0.1}O_4$ | −10 | 6.5 | 4.7 |
| $Dy_2Ni_{0.9}V_{0.1}O_4$ | −26 | 7 | 4.8 |
| $Dy_2Ni_{0.9}Cr_{0.1}O_4$ | −20 | 6.8 | 4.1 |
| $Dy_2Ni_{0.9}Mn_{0.1}O_4$ | −19 | 5.8 | 3.8 |
| $Dy_2Ni_{0.9}Fe_{0.1}O_4$ | −17 | 6.3 | 4 |
| $Dy_2Ni_{0.9}Co_{0.1}O_4$ | −23 | 7.1 | 4.6 |
| $Dy_2Ni_{0.9}Cu_{0.1}O_4$ | −22 | 6.4 | 4.2 |
| $Dy_2Ni_{0.9}Mo_{0.1}O_4$ | −18 | 5.9 | 4.5 |
| $Dy_2Ni_{0.9}W_{0.1}O_4$ | −20 | 6.4 | 4.3 |
| $Dy_2Ni_{0.9}Nb_{0.1}O_4$ | −21 | 7.1 | 4.1 |
| $Dy_2Ni_{0.9}Ta_{0.1}O_4$ | −21 | 7 | 3.9 |
| $Ho_2Ni_{0.9}Ti_{0.1}O_4$ | −18 | 7.1 | 3.8 |
| $Ho_2Ni_{0.9}V_{0.1}O_4$ | −25 | 6.8 | 3.7 |
| $Ho_2Ni_{0.9}Cr_{0.1}O_4$ | −24 | 5.9 | 4 |
| $Ho_2Ni_{0.9}Mn_{0.1}O_4$ | −28 | 5 | 3.9 |
| $Ho_2Ni_{0.9}Fe_{0.1}O_4$ | −19 | 7 | 3.6 |
| $Ho_2Ni_{0.9}Co_{0.1}O_4$ | −20 | 4.9 | 4.1 |
| $Ho_2Ni_{0.9}Cu_{0.1}O_4$ | −26 | 5 | 3.9 |
| $Ho_2Ni_{0.9}Mo_{0.1}O_4$ | −23 | 6 | 4.6 |
| $Ho_2Ni_{0.9}W_{0.1}O_4$ | −22 | 5.2 | 4.3 |
| $Ho_2Ni_{0.9}Nb_{0.1}O_4$ | −19 | 7 | 4 |
| $Ho_2Ni_{0.9}Ta_{0.1}O_4$ | −17 | 8.1 | 4.7 |

TABLE 103

| | | | |
|---|---|---|---|
| $Er_2Ni_{0.9}Ti_{0.1}O_4$ | −22 | 6.7 | 4.3 |
| $Er_2Ni_{0.9}V_{0.1}O_4$ | −20 | 7.2 | 4.9 |

TABLE 103-continued

| | | | |
|---|---|---|---|
| $Er_2Ni_{0.9}Cr_{0.1}O_4$ | −21 | 6.9 | 3.9 |
| $Er_2Ni_{0.9}Mn_{0.1}O_4$ | −23 | 5.9 | 4.2 |
| $Er_2Ni_{0.9}Fe_{0.1}O_4$ | −18 | 6.3 | 4 |
| $Er_2Ni_{0.9}Co_{0.1}O_4$ | −28 | 7 | 4.7 |
| $Er_2Ni_{0.9}Cu_{0.1}O_4$ | −19 | 7.1 | 4.6 |
| $Er_2Ni_{0.9}Mo_{0.1}O_4$ | −24 | 7.3 | 4.5 |
| $Er_2Ni_{0.9}W_{0.1}O_4$ | −25 | 7 | 4.2 |
| $Er_2Ni_{0.9}Nb_{0.1}O_4$ | −16 | 6.8 | 4.7 |
| $Er_2Ni_{0.9}Ta_{0.1}O_4$ | −20 | 6.9 | 4.8 |
| $Yb_2Ni_{0.9}Ti_{0.1}O_4$ | −24 | 7.1 | 3.8 |
| $Yb_2Ni_{0.9}V_{0.1}O_4$ | −23 | 5.8 | 4 |
| $Yb_2Ni_{0.9}Cr_{0.1}O_4$ | −26 | 6.3 | 4.6 |
| $Yb_2Ni_{0.9}Mn_{0.1}O_4$ | −28 | 7.1 | 4.2 |
| $Yb_2Ni_{0.9}Fe_{0.1}O_4$ | −19 | 6.4 | 4.5 |
| $Yb_2Ni_{0.9}Co_{0.1}O_4$ | −21 | 5.9 | 4.3 |
| $Yb_2Ni_{0.9}Cu_{0.1}O_4$ | −22 | 6.4 | 4.2 |
| $Yb_2Ni_{0.9}Mo_{0.1}O_4$ | −24 | 7.1 | 4.1 |
| $Yb_2Ni_{0.9}W_{0.1}O_4$ | −21 | 7 | 3.9 |
| $Yb_2Ni_{0.9}Nb_{0.1}O_4$ | −29 | 6.8 | 4 |
| $Yb_2Ni_{0.9}Ta_{0.1}O_4$ | −17 | 7.1 | 3.8 |
| $La_{1.8}Na_{0.2}Ni_{0.9}Ti_{0.1}O_4$ | −24 | 5.9 | 4 |
| $La_{1.8}Na_{0.2}Ni_{0.9}V_{0.1}O_4$ | −22 | 6.5 | 3.9 |
| $La_{1.8}Na_{0.2}Ni_{0.9}Cr_{0.1}O_4$ | −21 | 7 | 3.6 |
| $La_{1.8}Na_{0.2}Ni_{0.9}Mn_{0.1}O_4$ | −30 | 6.8 | 4.1 |
| $La_{1.8}Na_{0.2}Ni_{0.9}Fe_{0.1}O_4$ | −29 | 5 | 3.9 |
| $La_{1.8}Na_{0.2}Ni_{0.9}Co_{0.1}O_4$ | −30 | 7 | 4.6 |
| $La_{1.8}Na_{0.2}Ni_{0.9}Cu_{0.1}O_4$ | −28 | 4.9 | 4.3 |
| $La_{1.8}Na_{0.2}Ni_{0.9}Mo_{0.1}O_4$ | −27 | 5 | 4 |
| $La_{1.8}Na_{0.2}Ni_{0.9}W_{0.1}O_4$ | −25 | 6 | 4.7 |
| $La_{1.8}Na_{0.2}Ni_{0.9}Nb_{0.1}O_4$ | −18 | 5.2 | 4.4 |
| $La_{1.8}Na_{0.2}Ni_{0.9}Ta_{0.1}O_4$ | −22 | 7 | 4.9 |

TABLE 104

| | | | |
|---|---|---|---|
| $La_{1.8}K_{0.2}Ni_{0.9}Ti_{0.1}O_4$ | −26 | 6.9 | 4.6 |
| $La_{1.8}K_{0.2}Ni_{0.9}V_{0.1}O_4$ | −20 | 6.7 | 4.6 |
| $La_{1.8}K_{0.2}Ni_{0.9}Cr_{0.1}O_4$ | −19 | 7.2 | 4.5 |
| $La_{1.8}K_{0.2}Ni_{0.9}Mn_{0.1}O_4$ | −17 | 6.9 | 4.2 |
| $La_{1.8}K_{0.2}Ni_{0.9}Fe_{0.1}O_4$ | −23 | 5.9 | 4.7 |
| $La_{1.8}K_{0.2}Ni_{0.9}Co_{0.1}O_4$ | −22 | 6.3 | 4.8 |
| $La_{1.8}K_{0.2}Ni_{0.9}Cu_{0.1}O_4$ | −18 | 7 | 4.1 |
| $La_{1.8}K_{0.2}Ni_{0.9}Mo_{0.1}O_4$ | −20 | 7.1 | 3.8 |
| $La_{1.8}K_{0.2}Ni_{0.9}W_{0.1}O_4$ | −21 | 7.3 | 4 |
| $La_{1.8}K_{0.2}Ni_{0.9}Nb_{0.1}O_4$ | −21 | 7 | 4.6 |
| $La_{1.8}K_{0.2}Ni_{0.9}Ta_{0.1}O_4$ | −22 | 6.8 | 4.2 |
| $La_{1.8}Sr_{0.2}Ni_{0.9}Ti_{0.1}O_4$ | −25 | 6.7 | 4.3 |
| $La_{1.8}Sr_{0.2}Ni_{0.9}V_{0.1}O_4$ | −24 | 7.1 | 4.1 |
| $La_{1.8}Sr_{0.2}Ni_{0.9}Cr_{0.1}O_4$ | −28 | 5.8 | 3.9 |
| $La_{1.8}Sr_{0.2}Ni_{0.9}Mn_{0.1}O_4$ | −19 | 6.3 | 4 |
| $La_{1.8}Sr_{0.2}Ni_{0.9}Fe_{0.1}O_4$ | −20 | 7.1 | 3.8 |
| $La_{1.8}Sr_{0.2}Ni_{0.9}Co_{0.1}O_4$ | −26 | 6.4 | 3.7 |
| $La_{1.8}Sr_{0.2}Ni_{0.9}Cu_{0.1}O_4$ | −23 | 5.9 | 4 |
| $La_{1.8}Sr_{0.2}Ni_{0.9}Mo_{0.1}O_4$ | −22 | 6.4 | 3.9 |
| $La_{1.8}Sr_{0.2}Ni_{0.9}W_{0.1}O_4$ | −19 | 7.1 | 3.6 |
| $La_{1.8}Sr_{0.2}Ni_{0.9}Nb_{0.1}O_4$ | −17 | 7 | 4.1 |
| $La_{1.8}Sr_{0.2}Ni_{0.9}Ta_{0.1}O_4$ | −20 | 6.8 | 3.9 |
| $La_{1.8}Ca_{0.2}Ni_{0.9}Ti_{0.1}O_4$ | −20 | 6.8 | 4.3 |
| $La_{1.8}Ca_{0.2}Ni_{0.9}V_{0.1}O_4$ | −21 | 5.9 | 4 |
| $La_{1.8}Ca_{0.2}Ni_{0.9}Cr_{0.1}O_4$ | −23 | 6.5 | 4.7 |
| $La_{1.8}Ca_{0.2}Ni_{0.9}Mn_{0.1}O_4$ | −18 | 7 | 4.2 |
| $La_{1.8}Ca_{0.2}Ni_{0.9}Fe_{0.1}O_4$ | −28 | 6.8 | 4.3 |
| $La_{1.8}Ca_{0.2}Ni_{0.9}Co_{0.1}O_4$ | −19 | 5.8 | 4.9 |
| $La_{1.8}Ca_{0.2}Ni_{0.9}Cu_{0.1}O_4$ | −24 | 6.3 | 3.9 |
| $La_{1.8}Ca_{0.2}Ni_{0.9}Mo_{0.1}O_4$ | −25 | 7.1 | 4.2 |
| $La_{1.8}Ca_{0.2}Ni_{0.9}W_{0.1}O_4$ | −16 | 6.4 | 4 |
| $La_{1.8}Ca_{0.2}Ni_{0.9}Nb_{0.1}O_4$ | −20 | 5.9 | 4.7 |
| $La_{1.8}Ca_{0.2}Ni_{0.9}Ta_{0.1}O_4$ | −22 | 6.4 | 4.6 |
| $La_{1.8}Bi_{0.2}Ni_{0.9}Ti_{0.1}O_4$ | −23 | 7 | 4.2 |

TABLE 105

| | | | |
|---|---|---|---|
| $La_{1.8}Bi_{0.2}Ni_{0.9}V_{0.1}O_4$ | −26 | 6.8 | 4.7 |
| $La_{1.8}Bi_{0.2}Ni_{0.9}Cr_{0.1}O_4$ | −28 | 7.1 | 4.8 |
| $La_{1.8}Bi_{0.2}Ni_{0.9}Mn_{0.1}O_4$ | −19 | 6.8 | 4.1 |

TABLE 105-continued

| | | | |
|---|---|---|---|
| $La_{1.8}Bi_{0.2}Ni_{0.9}Fe_{0.1}O_4$ | −21 | 5.9 | 3.8 |
| $La_{1.8}Bi_{0.2}Ni_{0.9}Co_{0.1}O_4$ | −22 | 6.5 | 4 |
| $La_{1.8}Bi_{0.2}Ni_{0.9}Cu_{0.1}O_4$ | −24 | 7 | 4.6 |
| $La_{1.8}Bi_{0.2}Ni_{0.9}Mo_{0.1}O_4$ | −21 | 5 | 4.2 |
| $La_{1.8}Bi_{0.2}Ni_{0.9}W_{0.1}O_4$ | −29 | 7 | 4.5 |
| $La_{1.8}Bi_{0.2}Ni_{0.9}Nb_{0.1}O_4$ | −17 | 4.9 | 4.3 |
| $La_{1.8}Bi_{0.2}Ni_{0.9}Ta_{0.1}O_4$ | −18 | 5 | 4.2 |
| $Ce_{1.8}Na_{0.2}Ni_{0.9}Ti_{0.1}O_4$ | −22 | 5.2 | 3.9 |
| $Ce_{1.8}Na_{0.2}Ni_{0.9}V_{0.1}O_4$ | −21 | 7 | 4 |
| $Ce_{1.8}Na_{0.2}Ni_{0.9}Cr_{0.1}O_4$ | −27 | 8.1 | 3.8 |
| $Ce_{1.8}Na_{0.2}Ni_{0.9}Mn_{0.1}O_4$ | −25 | 6.9 | 3.7 |
| $Ce_{1.8}Na_{0.2}Ni_{0.9}Fe_{0.1}O_4$ | −30 | 6.7 | 4 |
| $Ce_{1.8}Na_{0.2}Ni_{0.9}Co_{0.1}O_4$ | −28 | 7.2 | 3.9 |
| $Ce_{1.8}Na_{0.2}Ni_{0.9}Cu_{0.1}O_4$ | −24 | 6.9 | 3.6 |
| $Ce_{1.8}Na_{0.2}Ni_{0.9}Mo_{0.1}O_4$ | −25 | 5.9 | 4.1 |
| $Ce_{1.8}Na_{0.2}Ni_{0.9}W_{0.1}O_4$ | −16 | 6.3 | 3.9 |
| $Ce_{1.8}Na_{0.2}Ni_{0.9}Nb_{0.1}O_4$ | −20 | 7 | 4.6 |
| $Ce_{1.8}Na_{0.2}Ni_{0.9}Ta_{0.1}O_4$ | −22 | 7.1 | 4.3 |
| $Ce_{1.8}K_{0.2}Ni_{0.9}Ti_{0.1}O_4$ | −23 | 7 | 4 |
| $Ce_{1.8}K_{0.2}Ni_{0.9}V_{0.1}O_4$ | −26 | 6.8 | 4.7 |
| $Ce_{1.8}K_{0.2}Ni_{0.9}Cr_{0.1}O_4$ | −28 | 5.2 | 4.2 |
| $Ce_{1.8}K_{0.2}Ni_{0.9}Mn_{0.1}O_4$ | −19 | 7 | 4.3 |
| $Ce_{1.8}K_{0.2}Ni_{0.9}Fe_{0.1}O_4$ | −21 | 8.1 | 4.9 |
| $Ce_{1.8}K_{0.2}Ni_{0.9}Co_{0.1}O_4$ | −22 | 6.9 | 3.9 |
| $Ce_{1.8}K_{0.2}Ni_{0.9}Cu_{0.1}O_4$ | −24 | 6.7 | 4.2 |
| $Ce_{1.8}K_{0.2}Ni_{0.9}Mo_{0.1}O_4$ | −21 | 7.2 | 4 |
| $Ce_{1.8}K_{0.2}Ni_{0.9}W_{0.1}O_4$ | −29 | 6.9 | 4.7 |
| $Ce_{1.8}K_{0.2}Ni_{0.9}Nb_{0.1}O_4$ | −17 | 5.9 | 4.6 |
| $Ce_{1.8}K_{0.2}Ni_{0.9}Ta_{0.1}O_4$ | −18 | 6.3 | 4.5 |
| $Ce_{1.8}Sr_{0.2}Ni_{0.9}Ti_{0.1}O_4$ | −22 | 7.1 | 4.7 |
| $Ce_{1.8}Sr_{0.2}Ni_{0.9}V_{0.1}O_4$ | −21 | 7.3 | 4.8 |

TABLE 106

| | | | |
|---|---|---|---|
| $Ce_{1.8}Sr_{0.2}Ni_{0.9}Cr_{0.1}O_4$ | −27 | 7.0 | 4.1 |
| $Ce_{1.8}Sr_{0.2}Ni_{0.9}Mn_{0.1}O_4$ | −25 | 6.8 | 3.8 |
| $Ce_{1.8}Sr_{0.2}Ni_{0.9}Fe_{0.1}O_4$ | −30 | 6.9 | 4 |
| $Ce_{1.8}Sr_{0.2}Ni_{0.9}Co_{0.1}O_4$ | −28 | 6.7 | 4.6 |
| $Ce_{1.8}Sr_{0.2}Ni_{0.9}Cu_{0.1}O_4$ | −27 | 7.1 | 4.2 |
| $Ce_{1.8}Sr_{0.2}Ni_{0.9}Mo_{0.1}O_4$ | −25 | 5.8 | 4.5 |
| $Ce_{1.8}Sr_{0.2}Ni_{0.9}W_{0.1}O_4$ | −18 | 6.3 | 4.3 |
| $Ce_{1.8}Sr_{0.2}Ni_{0.9}Nb_{0.1}O_4$ | −22 | 7.1 | 4.2 |
| $Ce_{1.8}Sr_{0.2}Ni_{0.9}Ta_{0.1}O_4$ | −10 | 6.4 | 4.1 |
| $Ce_{1.8}Ca_{0.2}Ni_{0.9}Ti_{0.1}O_4$ | −23 | 6.4 | 4 |
| $Ce_{1.8}Ca_{0.2}Ni_{0.9}V_{0.1}O_4$ | −22 | 7.1 | 3.8 |
| $Ce_{1.8}Ca_{0.2}Ni_{0.9}Cr_{0.1}O_4$ | −19 | 7 | 3.7 |
| $Ce_{1.8}Ca_{0.2}Ni_{0.9}Mn_{0.1}O_4$ | −17 | 6.8 | 4 |
| $Ce_{1.8}Ca_{0.2}Ni_{0.9}Fe_{0.1}O_4$ | −20 | 7.1 | 3.9 |
| $Ce_{1.8}Ca_{0.2}Ni_{0.9}Co_{0.1}O_4$ | −22 | 6.8 | 3.6 |
| $Ce_{1.8}Ca_{0.2}Ni_{0.9}Cu_{0.1}O_4$ | −20 | 5.9 | 4.1 |
| $Ce_{1.8}Ca_{0.2}Ni_{0.9}Mo_{0.1}O_4$ | −21 | 6.5 | 4.5 |
| $Ce_{1.8}Ca_{0.2}Ni_{0.9}W_{0.1}O_4$ | −23 | 7 | 4.6 |
| $Ce_{1.8}Ca_{0.2}Ni_{0.9}Nb_{0.1}O_4$ | −18 | 6.8 | 4.3 |
| $Ce_{1.8}Ca_{0.2}Ni_{0.9}Ta_{0.1}O_4$ | −28 | 5 | 4 |
| $Ce_{1.8}Bi_{0.2}Ni_{0.9}Ti_{0.1}O_4$ | −24 | 4.9 | 4.2 |
| $Ce_{1.8}Bi_{0.2}Ni_{0.9}V_{0.1}O_4$ | −25 | 5 | 4.3 |
| $Ce_{1.8}Bi_{0.2}Ni_{0.9}Cr_{0.1}O_4$ | −16 | 6 | 4.9 |
| $Ce_{1.8}Bi_{0.2}Ni_{0.9}Mn_{0.1}O_4$ | −20 | 5.2 | 3.9 |
| $Ce_{1.8}Bi_{0.2}Ni_{0.9}Fe_{0.1}O_4$ | −22 | 7 | 4.2 |
| $Ce_{1.8}Bi_{0.2}Ni_{0.9}Co_{0.1}O_4$ | −24 | 8.1 | 4 |
| $Ce_{1.8}Bi_{0.2}Ni_{0.9}Cu_{0.1}O_4$ | −23 | 6.9 | 4.7 |
| $Ce_{1.8}Bi_{0.2}Ni_{0.9}Mo_{0.1}O_4$ | −26 | 6.7 | 4.6 |
| $Ce_{1.8}Bi_{0.2}Ni_{0.9}W_{0.1}O_4$ | −28 | 7.2 | 4.5 |
| $Ce_{1.8}Bi_{0.2}Ni_{0.9}Nb_{0.1}O_4$ | −19 | 6.9 | 4.2 |
| $Ce_{1.8}Bi_{0.2}Ni_{0.9}Ta_{0.1}O_4$ | −21 | 5.9 | 4.7 |
| $Pr_{1.8}Na_{0.2}Ni_{0.9}Ti_{0.1}O_4$ | −24 | 7 | 4.1 |
| $Pr_{1.8}Na_{0.2}Ni_{0.9}V_{0.1}O_4$ | −21 | 7.1 | 3.8 |
| $Pr_{1.8}Na_{0.2}Ni_{0.9}Cr_{0.1}O_4$ | −29 | 7.3 | 4 |

TABLE 107

| | | | |
|---|---|---|---|
| $Pr_{1.8}Na_{0.2}Ni_{0.9}Mn_{0.1}O_4$ | −17 | 7 | 4.7 |
| $Pr_{1.8}Na_{0.2}Ni_{0.9}Fe_{0.1}O_4$ | −18 | 6.8 | 4.6 |
| $Pr_{1.8}Na_{0.2}Ni_{0.9}Co_{0.1}O_4$ | −24 | 6.9 | 4.5 |

TABLE 107-continued

| | | | |
|---|---|---|---|
| $Pr_{1.8}Na_{0.2}Ni_{0.9}Cu_{0.1}O_4$ | −22 | 6.7 | 4.2 |
| $Pr_{1.8}Na_{0.2}Ni_{0.9}Mo_{0.1}O_4$ | −21 | 7.1 | 4.7 |
| $Pr_{1.8}Na_{0.2}Ni_{0.9}W_{0.1}O_4$ | −27 | 5.8 | 4.8 |
| $Pr_{1.8}Na_{0.2}Ni_{0.9}Nb_{0.1}O_4$ | −25 | 6.3 | 4.1 |
| $Pr_{1.8}Na_{0.2}Ni_{0.9}Ta_{0.1}O_4$ | −30 | 7.1 | 3.8 |
| $Pr_{1.8}K_{0.2}Ni_{0.9}Ti_{0.1}O_4$ | −24 | 5.9 | 3.9 |
| $Pr_{1.8}K_{0.2}Ni_{0.9}V_{0.1}O_4$ | −25 | 6.4 | 4.6 |
| $Pr_{1.8}K_{0.2}Ni_{0.9}Cr_{0.1}O_4$ | −16 | 7.1 | 4.3 |
| $Pr_{1.8}K_{0.2}Ni_{0.9}Mn_{0.1}O_4$ | −20 | 7 | 4 |
| $Pr_{1.8}K_{0.2}Ni_{0.9}Fe_{0.1}O_4$ | −22 | 6.8 | 4.7 |
| $Pr_{1.8}K_{0.2}Ni_{0.9}Co_{0.1}O_4$ | −24 | 7.1 | 4.2 |
| $Pr_{1.8}K_{0.2}Ni_{0.9}Cu_{0.1}O_4$ | −23 | 6.8 | 4.3 |
| $Pr_{1.8}K_{0.2}Ni_{0.9}Mo_{0.1}O_4$ | −26 | 5.9 | 4.9 |
| $Pr_{1.8}K_{0.2}Ni_{0.9}W_{0.1}O_4$ | −28 | 6.5 | 3.9 |
| $Pr_{1.8}K_{0.2}Ni_{0.9}Nb_{0.1}O_4$ | −19 | 7 | 4.2 |
| $Pr_{1.8}K_{0.2}Ni_{0.9}Ta_{0.1}O_4$ | −21 | 6.8 | 4 |
| $Pr_{1.8}Sr_{0.2}Ni_{0.9}Ti_{0.1}O_4$ | −24 | 6.3 | 4.6 |
| $Pr_{1.8}Sr_{0.2}Ni_{0.9}V_{0.1}O_4$ | −21 | 7.1 | 4.5 |
| $Pr_{1.8}Sr_{0.2}Ni_{0.9}Cr_{0.1}O_4$ | −29 | 6.4 | 4.2 |
| $Pr_{1.8}Sr_{0.2}Ni_{0.9}Mn_{0.1}O_4$ | −17 | 5.9 | 4.7 |
| $Pr_{1.8}Sr_{0.2}Ni_{0.9}Fe_{0.1}O_4$ | −18 | 6.4 | 4.8 |
| $Pr_{1.8}Sr_{0.2}Ni_{0.9}Co_{0.1}O_4$ | −24 | 7.1 | 4.1 |
| $Pr_{1.8}Sr_{0.2}Ni_{0.9}Cu_{0.1}O_4$ | −22 | 7 | 3.8 |
| $Pr_{1.8}Sr_{0.2}Ni_{0.9}Mo_{0.1}O_4$ | −21 | 6.8 | 4 |
| $Pr_{1.8}Sr_{0.2}Ni_{0.9}W_{0.1}O_4$ | −27 | 7.1 | 4.6 |
| $Pr_{1.8}Sr_{0.2}Ni_{0.9}Nb_{0.1}O_4$ | −25 | 6.8 | 4.2 |
| $Pr_{1.8}Sr_{0.2}Ni_{0.9}Ta_{0.1}O_4$ | −30 | 5.9 | 4.5 |
| $Pr_{1.8}Ca_{0.2}Ni_{0.9}Ti_{0.1}O_4$ | −27 | 7 | 4.1 |
| $Pr_{1.8}Ca_{0.2}Ni_{0.9}V_{0.1}O_4$ | −25 | 4.9 | 3.9 |
| $Pr_{1.8}Ca_{0.2}Ni_{0.9}Cr_{0.1}O_4$ | −18 | 5.0 | 4 |
| $Pr_{1.8}Ca_{0.2}Ni_{0.9}Mn_{0.1}O_4$ | −22 | 6.0 | 3.8 |

TABLE 108

| | | | |
|---|---|---|---|
| $Pr_{1.8}Ca_{0.2}Ni_{0.9}Fe_{0.1}O_4$ | −10 | 5.2 | 3.7 |
| $Pr_{1.8}Ca_{0.2}Ni_{0.9}Co_{0.1}O_4$ | −26 | 7.0 | 4 |
| $Pr_{1.8}Ca_{0.2}Ni_{0.9}Cu_{0.1}O_4$ | −20 | 8.1 | 3.9 |
| $Pr_{1.8}Ca_{0.2}Ni_{0.9}Mo_{0.1}O_4$ | −19 | 6.9 | 3.6 |
| $Pr_{1.8}Ca_{0.2}Ni_{0.9}W_{0.1}O_4$ | −17 | 6.7 | 4.1 |
| $Pr_{1.8}Ca_{0.2}Ni_{0.9}Nb_{0.1}O_4$ | −23 | 7.2 | 3.9 |
| $Pr_{1.8}Ca_{0.2}Ni_{0.9}Ta_{0.1}O_4$ | −22 | 6.9 | 4.6 |
| $Pr_{1.8}Bi_{0.2}Ni_{0.9}Ti_{0.1}O_4$ | −20 | 6.3 | 4 |
| $Pr_{1.8}Bi_{0.2}Ni_{0.9}V_{0.1}O_4$ | −21 | 7 | 4.7 |
| $Pr_{1.8}Bi_{0.2}Ni_{0.9}Cr_{0.1}O_4$ | −21 | 7.1 | 4.2 |
| $Pr_{1.8}Bi_{0.2}Ni_{0.9}Mn_{0.1}O_4$ | −22 | 7.3 | 4.3 |
| $Pr_{1.8}Bi_{0.2}Ni_{0.9}Fe_{0.1}O_4$ | −18 | 7 | 4.9 |
| $Pr_{1.8}Bi_{0.2}Ni_{0.9}Co_{0.1}O_4$ | −25 | 6.8 | 3.9 |
| $Pr_{1.8}Bi_{0.2}Ni_{0.9}Cu_{0.1}O_4$ | −24 | 6.9 | 4.2 |
| $Pr_{1.8}Bi_{0.2}Ni_{0.9}Mo_{0.1}O_4$ | −28 | 6.7 | 4 |
| $Pr_{1.8}Bi_{0.2}Ni_{0.9}W_{0.1}O_4$ | −19 | 7.1 | 4.7 |
| $Pr_{1.8}Bi_{0.2}Ni_{0.9}Nb_{0.1}O_4$ | −20 | 5.8 | 4.6 |
| $Pr_{1.8}Bi_{0.2}Ni_{0.9}Ta_{0.1}O_4$ | −26 | 6.3 | 4.5 |
| $Nd_{1.8}Na_{0.2}Ni_{0.9}Ti_{0.1}O_4$ | −22 | 6.4 | 4.7 |
| $Nd_{1.8}Na_{0.2}Ni_{0.9}V_{0.1}O_4$ | −19 | 5.9 | 4.8 |
| $Nd_{1.8}Na_{0.2}Ni_{0.9}Cr_{0.1}O_4$ | −17 | 6.4 | 4.1 |
| $Nd_{1.8}Na_{0.2}Ni_{0.9}Mn_{0.1}O_4$ | −20 | 7.1 | 3.8 |
| $Nd_{1.8}Na_{0.2}Ni_{0.9}Fe_{0.1}O_4$ | −22 | 7 | 4 |
| $Nd_{1.8}Na_{0.2}Ni_{0.9}Co_{0.1}O_4$ | −20 | 6.8 | 4.3 |
| $Nd_{1.8}Na_{0.2}Ni_{0.9}Cu_{0.1}O_4$ | −21 | 7.1 | 4.2 |
| $Nd_{1.8}Na_{0.2}Ni_{0.9}Mo_{0.1}O_4$ | −23 | 6.8 | 4.3 |
| $Nd_{1.8}Na_{0.2}Ni_{0.9}W_{0.1}O_4$ | −18 | 5.9 | 4.5 |
| $Nd_{1.8}Na_{0.2}Ni_{0.9}Nb_{0.1}O_4$ | −28 | 6.5 | 4.6 |
| $Nd_{1.8}Na_{0.2}Ni_{0.9}Ta_{0.1}O_4$ | −19 | 7 | 4.7 |
| $Nd_{1.8}K_{0.2}Ni_{0.9}Ti_{0.1}O_4$ | −25 | 5 | 4.9 |
| $Nd_{1.8}K_{0.2}Ni_{0.9}V_{0.1}O_4$ | −16 | 7 | 4.7 |
| $Nd_{1.8}K_{0.2}Ni_{0.9}Cr_{0.1}O_4$ | −20 | 4.9 | 4.6 |
| $Nd_{1.8}K_{0.2}Ni_{0.9}Mn_{0.1}O_4$ | −22 | 5 | 4.6 |
| $Nd_{1.8}K_{0.2}Ni_{0.9}Fe_{0.1}O_4$ | −24 | 6 | 4.5 |

TABLE 109

| | | | |
|---|---|---|---|
| $Nd_{1.8}K_{0.2}Ni_{0.9}Co_{0.1}O_4$ | −23 | 5.2 | 4.2 |
| $Nd_{1.8}K_{0.2}Ni_{0.9}Cu_{0.1}O_4$ | −26 | 7 | 4.7 |
| $Nd_{1.8}K_{0.2}Ni_{0.9}Mo_{0.1}O_4$ | −28 | 8.1 | 4.8 |

TABLE 109-continued

| | | | |
|---|---|---|---|
| $Nd_{1.8}K_{0.2}Ni_{0.9}W_{0.1}O_4$ | −19 | 6.9 | 4.1 |
| $Nd_{1.8}K_{0.2}Ni_{0.9}Nb_{0.1}O_4$ | −21 | 6.7 | 3.8 |
| $Nd_{1.8}K_{0.2}Ni_{0.9}Ta_{0.1}O_4$ | −22 | 7.2 | 4 |
| $Nd_{1.8}Sr_{0.2}Ni_{0.9}Ti_{0.1}O_4$ | −21 | 5.9 | 4.2 |
| $Nd_{1.8}Sr_{0.2}Ni_{0.9}V_{0.1}O_4$ | −29 | 6.3 | 4.5 |
| $Nd_{1.8}Sr_{0.2}Ni_{0.9}Cr_{0.1}O_4$ | −17 | 7 | 4.3 |
| $Nd_{1.8}Sr_{0.2}Ni_{0.9}Mn_{0.1}O_4$ | −18 | 7.1 | 4.1 |
| $Nd_{1.8}Sr_{0.2}Ni_{0.9}Fe_{0.1}O_4$ | −24 | 7.3 | 3.9 |
| $Nd_{1.8}Sr_{0.2}Ni_{0.9}Co_{0.1}O_4$ | −22 | 7 | 4 |
| $Nd_{1.8}Sr_{0.2}Ni_{0.9}Cu_{0.1}O_4$ | −21 | 6.8 | 3.8 |
| $Nd_{1.8}Sr_{0.2}Ni_{0.9}Mo_{0.1}O_4$ | −27 | 6.9 | 3.7 |
| $Nd_{1.8}Sr_{0.2}Ni_{0.9}W_{0.1}O_4$ | −21 | 6.7 | 4 |
| $Nd_{1.8}Sr_{0.2}Ni_{0.9}Nb_{0.1}O_4$ | −23 | 7.1 | 3.9 |
| $Nd_{1.8}Sr_{0.2}Ni_{0.9}Ta_{0.1}O_4$ | −19 | 5.8 | 3.6 |
| $Nd_{1.8}Ca_{0.2}Ni_{0.9}Ti_{0.1}O_4$ | −24 | 7.1 | 3.9 |
| $Nd_{1.8}Ca_{0.2}Ni_{0.9}V_{0.1}O_4$ | −25 | 6.4 | 4.6 |
| $Nd_{1.8}Ca_{0.2}Ni_{0.9}Cr_{0.1}O_4$ | −16 | 5.9 | 4.3 |
| $Nd_{1.8}Ca_{0.2}Ni_{0.9}Mn_{0.1}O_4$ | −20 | 6.4 | 4 |
| $Nd_{1.8}Ca_{0.2}Ni_{0.9}Fe_{0.1}O_4$ | −22 | 7.1 | 4.7 |
| $Nd_{1.8}Ca_{0.2}Ni_{0.9}Co_{0.1}O_4$ | −22 | 7 | 4.2 |
| $Nd_{1.8}Ca_{0.2}Ni_{0.9}Cu_{0.1}O_4$ | −10 | 6.8 | 4.3 |
| $Nd_{1.8}Ca_{0.2}Ni_{0.9}Mo_{0.1}O_4$ | −26 | 7.1 | 4.9 |
| $Nd_{1.8}Ca_{0.2}Ni_{0.9}W_{0.1}O_4$ | −20 | 6.8 | 3.9 |
| $Nd_{1.8}Ca_{0.2}Ni_{0.9}Nb_{0.1}O_4$ | −19 | 5.9 | 4.2 |
| $Nd_{1.8}Ca_{0.2}Ni_{0.9}Ta_{0.1}O_4$ | −17 | 6.5 | 4 |
| $Nd_{1.8}Bi_{0.2}Ni_{0.9}Ti_{0.1}O_4$ | −22 | 6.8 | 4.6 |
| $Nd_{1.8}Bi_{0.2}Ni_{0.9}V_{0.1}O_4$ | −18 | 5.8 | 4.5 |
| $Nd_{1.8}Bi_{0.2}Ni_{0.9}Cr_{0.1}O_4$ | −20 | 6.3 | 4.2 |
| $Nd_{1.8}Bi_{0.2}Ni_{0.9}Mn_{0.1}O_4$ | −21 | 7.1 | 4.7 |
| $Nd_{1.8}Bi_{0.2}Ni_{0.9}Fe_{0.1}O_4$ | −21 | 6.4 | 4.8 |
| $Nd_{1.8}Bi_{0.2}Ni_{0.9}Co_{0.1}O_4$ | −22 | 5.9 | 4.1 |

TABLE 110

| | | | |
|---|---|---|---|
| $Nd_{1.8}Bi_{0.2}Ni_{0.9}Cu_{0.1}O_4$ | −18 | 6.4 | 3.8 |
| $Nd_{1.8}Bi_{0.2}Ni_{0.9}Mo_{0.1}O_4$ | −25 | 7.1 | 4 |
| $Nd_{1.8}Bi_{0.2}Ni_{0.9}W_{0.1}O_4$ | −24 | 7 | 4.6 |
| $Nd_{1.8}Bi_{0.2}Ni_{0.9}Nb_{0.1}O_4$ | −28 | 6.8 | 4.2 |
| $Nd_{1.8}Bi_{0.2}Ni_{0.9}Ta_{0.1}O_4$ | −19 | 7.1 | 4.5 |
| $Sm_{1.8}Na_{0.2}Ni_{0.9}Ti_{0.1}O_4$ | −26 | 5.9 | 4.2 |
| $Sm_{1.8}Na_{0.2}Ni_{0.9}V_{0.1}O_4$ | −23 | 6.5 | 4.1 |
| $Sm_{1.8}Na_{0.2}Ni_{0.9}Cr_{0.1}O_4$ | −22 | 7 | 3.9 |
| $Sm_{1.8}Na_{0.2}Ni_{0.9}Mn_{0.1}O_4$ | −19 | 5 | 4 |
| $Sm_{1.8}Na_{0.2}Ni_{0.9}Fe_{0.1}O_4$ | −17 | 7 | 3.8 |
| $Sm_{1.8}Na_{0.2}Ni_{0.9}Co_{0.1}O_4$ | −20 | 4.9 | 3.7 |
| $Sm_{1.8}Na_{0.2}Ni_{0.9}Cu_{0.1}O_4$ | −22 | 5 | 4 |
| $Sm_{1.8}Na_{0.2}Ni_{0.9}Mo_{0.1}O_4$ | −20 | 6 | 3.9 |
| $Sm_{1.8}Na_{0.2}Ni_{0.9}W_{0.1}O_4$ | −21 | 5.2 | 3.6 |
| $Sm_{1.8}Na_{0.2}Ni_{0.9}Nb_{0.1}O_4$ | −23 | 7 | 4.1 |
| $Sm_{1.8}Na_{0.2}Ni_{0.9}Ta_{0.1}O_4$ | −18 | 8.1 | 3.9 |
| $Sm_{1.8}K_{0.2}Ni_{0.9}Ti_{0.1}O_4$ | −19 | 6.7 | 4.3 |
| $Sm_{1.8}K_{0.2}Ni_{0.9}V_{0.1}O_4$ | −24 | 7.2 | 4 |
| $Sm_{1.8}K_{0.2}Ni_{0.9}Cr_{0.1}O_4$ | −25 | 6.9 | 4.7 |
| $Sm_{1.8}K_{0.2}Ni_{0.9}Mn_{0.1}O_4$ | −16 | 5.9 | 4.4 |
| $Sm_{1.8}K_{0.2}Ni_{0.9}Fe_{0.1}O_4$ | −20 | 6.3 | 4.9 |
| $Sm_{1.8}K_{0.2}Ni_{0.9}Co_{0.1}O_4$ | −22 | 7 | 4.7 |
| $Sm_{1.8}K_{0.2}Ni_{0.9}Cu_{0.1}O_4$ | −24 | 7.1 | 4.6 |
| $Sm_{1.8}K_{0.2}Ni_{0.9}Mo_{0.1}O_4$ | −23 | 7.3 | 4.6 |
| $Sm_{1.8}K_{0.2}Ni_{0.9}W_{0.1}O_4$ | −26 | 7 | 4.5 |
| $Sm_{1.8}K_{0.2}Ni_{0.9}Nb_{0.1}O_4$ | −28 | 7.1 | 4.2 |
| $Sm_{1.8}K_{0.2}Ni_{0.9}Ta_{0.1}O_4$ | −19 | 6.4 | 4.7 |
| $Sm_{1.8}Sr_{0.2}Ni_{0.9}Ti_{0.1}O_4$ | −22 | 6.4 | 4.1 |
| $Sm_{1.8}Sr_{0.2}Ni_{0.9}V_{0.1}O_4$ | −24 | 7.1 | 3.8 |
| $Sm_{1.8}Sr_{0.2}Ni_{0.9}Cr_{0.1}O_4$ | −21 | 7 | 4 |
| $Sm_{1.8}Sr_{0.2}Ni_{0.9}Mn_{0.1}O_4$ | −29 | 6.8 | 4.6 |
| $Sm_{1.8}Sr_{0.2}Ni_{0.9}Fe_{0.1}O_4$ | −17 | 7.1 | 4.2 |
| $Sm_{1.8}Sr_{0.2}Ni_{0.9}Co_{0.1}O_4$ | −18 | 6.8 | 4.5 |
| $Sm_{1.8}Sr_{0.2}Ni_{0.9}Cu_{0.1}O_4$ | −24 | 5.9 | 4.3 |

TABLE 111

| | | | |
|---|---|---|---|
| $Sm_{1.8}Sr_{0.2}Ni_{0.9}Mo_{0.1}O_4$ | −22 | 5.0 | 4.1 |
| $Sm_{1.8}Sr_{0.2}Ni_{0.9}W_{0.1}O_4$ | −21 | 7.0 | 3.9 |
| $Sm_{1.8}Sr_{0.2}Ni_{0.9}Nb_{0.1}O_4$ | −30 | 4.9 | 4 |

TABLE 111-continued

| | | | |
|---|---|---|---|
| $Sm_{1.8}Sr_{0.2}Ni_{0.9}Ta_{0.1}O_4$ | −20 | 5.0 | 3.8 |
| $Sm_{1.8}Ca_{0.2}Ni_{0.9}Ti_{0.1}O_4$ | −20 | 5.2 | 4 |
| $Sm_{1.8}Ca_{0.2}Ni_{0.9}V_{0.1}O_4$ | −21 | 7 | 3.9 |
| $Sm_{1.8}Ca_{0.2}Ni_{0.9}Cr_{0.1}O_4$ | −23 | 8.1 | 3.6 |
| $Sm_{1.8}Ca_{0.2}Ni_{0.9}Mn_{0.1}O_4$ | −18 | 6.9 | 3.8 |
| $Sm_{1.8}Ca_{0.2}Ni_{0.9}Fe_{0.1}O_4$ | −28 | 6.7 | 3.7 |
| $Sm_{1.8}Ca_{0.2}Ni_{0.9}Co_{0.1}O_4$ | −19 | 7.2 | 4 |
| $Sm_{1.8}Ca_{0.2}Ni_{0.9}Cu_{0.1}O_4$ | −24 | 6.9 | 3.9 |
| $Sm_{1.8}Ca_{0.2}Ni_{0.9}Mo_{0.1}O_4$ | −25 | 5.9 | 3.6 |
| $Sm_{1.8}Ca_{0.2}Ni_{0.9}W_{0.1}O_4$ | −16 | 6.3 | 4.1 |
| $Sm_{1.8}Ca_{0.2}Ni_{0.9}Nb_{0.1}O_4$ | −20 | 7 | 3.9 |
| $Sm_{1.8}Ca_{0.2}Ni_{0.9}Ta_{0.1}O_4$ | −22 | 7.1 | 4.6 |
| $Sm_{1.8}Bi_{0.2}Ni_{0.9}Ti_{0.1}O_4$ | −23 | 7 | 4 |
| $Sm_{1.8}Bi_{0.2}Ni_{0.9}V_{0.1}O_4$ | −26 | 6.8 | 4.7 |
| $Sm_{1.8}Bi_{0.2}Ni_{0.9}Cr_{0.1}O_4$ | −28 | 6.9 | 4.2 |
| $Sm_{1.8}Bi_{0.2}Ni_{0.9}Mn_{0.1}O_4$ | −19 | 6.7 | 4.3 |
| $Sm_{1.8}Bi_{0.2}Ni_{0.9}Fe_{0.1}O_4$ | −21 | 7.1 | 4.9 |
| $Sm_{1.8}Bi_{0.2}Ni_{0.9}Co_{0.1}O_4$ | −22 | 5.8 | 3.9 |
| $Sm_{1.8}Bi_{0.2}Ni_{0.9}Cu_{0.1}O_4$ | −24 | 6.3 | 4.2 |
| $Sm_{1.8}Bi_{0.2}Ni_{0.9}Mo_{0.1}O_4$ | −21 | 7.1 | 4 |
| $Sm_{1.8}Bi_{0.2}Ni_{0.9}W_{0.1}O_4$ | −29 | 6.4 | 4.7 |
| $Sm_{1.8}Bi_{0.2}Ni_{0.9}Nb_{0.1}O_4$ | −17 | 5.9 | 4.6 |
| $Sm_{1.8}Bi_{0.2}Ni_{0.9}Ta_{0.1}O_4$ | −18 | 6.4 | 4.5 |
| $Eu_{1.8}Na_{0.2}Ni_{0.9}Ti_{0.1}O_4$ | −22 | 7.0 | 4.7 |
| $Eu_{1.8}Na_{0.2}Ni_{0.9}V_{0.1}O_4$ | −21 | 6.8 | 4.8 |
| $Eu_{1.8}Na_{0.2}Ni_{0.9}Cr_{0.1}O_4$ | −30 | 7.1 | 4.1 |
| $Eu_{1.8}Na_{0.2}Ni_{0.9}Mn_{0.1}O_4$ | −29 | 6.8 | 3.8 |
| $Eu_{1.8}Na_{0.2}Ni_{0.9}Fe_{0.1}O_4$ | −30 | 5.9 | 4 |
| $Eu_{1.8}Na_{0.2}Ni_{0.9}Co_{0.1}O_4$ | −28 | 6.5 | 4.3 |
| $Eu_{1.8}Na_{0.2}Ni_{0.9}Cu_{0.1}O_4$ | −27 | 7.0 | 4.2 |
| $Eu_{1.8}Na_{0.2}Ni_{0.9}Mo_{0.1}O_4$ | −25 | 6.8 | 4.3 |

TABLE 112

| | | | |
|---|---|---|---|
| $Eu_{1.8}Na_{0.2}Ni_{0.9}W_{0.1}O_4$ | −18 | 5.0 | 4.5 |
| $Eu_{1.8}Na_{0.2}Ni_{0.9}Nb_{0.1}O_4$ | −22 | 7.0 | 4.6 |
| $Eu_{1.8}Na_{0.2}Ni_{0.9}Ta_{0.1}O_4$ | −10 | 4.9 | 4.7 |
| $Eu_{1.8}K_{0.2}Ni_{0.9}Ti_{0.1}O_4$ | −20 | 6.0 | 4.9 |
| $Eu_{1.8}K_{0.2}Ni_{0.9}V_{0.1}O_4$ | −19 | 5.2 | 4.7 |
| $Eu_{1.8}K_{0.2}Ni_{0.9}Cr_{0.1}O_4$ | −17 | 7 | 4.6 |
| $Eu_{1.8}K_{0.2}Ni_{0.9}Mn_{0.1}O_4$ | −23 | 8.1 | 4.6 |
| $Eu_{1.8}K_{0.2}Ni_{0.9}Fe_{0.1}O_4$ | −22 | 6.9 | 4.5 |
| $Eu_{1.8}K_{0.2}Ni_{0.9}Co_{0.1}O_4$ | −18 | 6.7 | 4.2 |
| $Eu_{1.8}K_{0.2}Ni_{0.9}Cu_{0.1}O_4$ | −20 | 7.2 | 4.7 |
| $Eu_{1.8}K_{0.2}Ni_{0.9}Mo_{0.1}O_4$ | −21 | 6.9 | 4.8 |
| $Eu_{1.8}K_{0.2}Ni_{0.9}W_{0.1}O_4$ | −21 | 5.9 | 4.1 |
| $Eu_{1.8}K_{0.2}Ni_{0.9}Nb_{0.1}O_4$ | −22 | 6.3 | 3.8 |
| $Eu_{1.8}K_{0.2}Ni_{0.9}Ta_{0.1}O_4$ | −18 | 7 | 4 |
| $Eu_{1.8}Sr_{0.2}Ni_{0.9}Ti_{0.1}O_4$ | −24 | 7.3 | 4.2 |
| $Eu_{1.8}Sr_{0.2}Ni_{0.9}V_{0.1}O_4$ | −28 | 7 | 4.5 |
| $Eu_{1.8}Sr_{0.2}Ni_{0.9}Cr_{0.1}O_4$ | −19 | 6.8 | 4.3 |
| $Eu_{1.8}Sr_{0.2}Ni_{0.9}Mn_{0.1}O_4$ | −20 | 6.9 | 4.1 |
| $Eu_{1.8}Sr_{0.2}Ni_{0.9}Fe_{0.1}O_4$ | −26 | 6.7 | 3.9 |
| $Eu_{1.8}Sr_{0.2}Ni_{0.9}Co_{0.1}O_4$ | −23 | 7.1 | 4 |
| $Eu_{1.8}Sr_{0.2}Ni_{0.9}Cu_{0.1}O_4$ | −22 | 5.8 | 3.8 |
| $Eu_{1.8}Sr_{0.2}Ni_{0.9}Mo_{0.1}O_4$ | −19 | 6.3 | 3.7 |
| $Eu_{1.8}Sr_{0.2}Ni_{0.9}W_{0.1}O_4$ | −17 | 7.1 | 4 |
| $Eu_{1.8}Sr_{0.2}Ni_{0.9}Nb_{0.1}O_4$ | −20 | 6.4 | 3.9 |
| $Eu_{1.8}Sr_{0.2}Ni_{0.9}Ta_{0.1}O_4$ | −22 | 5.9 | 3.6 |
| $Eu_{1.8}Ca_{0.2}Ni_{0.9}Ti_{0.1}O_4$ | −21 | 7.1 | 3.9 |
| $Eu_{1.8}Ca_{0.2}Ni_{0.9}V_{0.1}O_4$ | −23 | 7 | 4.6 |
| $Eu_{1.8}Ca_{0.2}Ni_{0.9}Cr_{0.1}O_4$ | −18 | 6.8 | 4.3 |
| $Eu_{1.8}Ca_{0.2}Ni_{0.9}Mn_{0.1}O_4$ | −28 | 7.1 | 4 |
| $Eu_{1.8}Ca_{0.2}Ni_{0.9}Fe_{0.1}O_4$ | −19 | 6.8 | 4.7 |
| $Eu_{1.8}Ca_{0.2}Ni_{0.9}Co_{0.1}O_4$ | −24 | 5.9 | 4.2 |
| $Eu_{1.8}Ca_{0.2}Ni_{0.9}Cu_{0.1}O_4$ | −25 | 6.5 | 4.3 |
| $Eu_{1.8}Ca_{0.2}Ni_{0.9}Mo_{0.1}O_4$ | −16 | 7 | 4.9 |
| $Eu_{1.8}Ca_{0.2}Ni_{0.9}W_{0.1}O_4$ | −20 | 6.8 | 3.9 |

TABLE 113

| | | | |
|---|---|---|---|
| $Eu_{1.8}Ca_{0.2}Ni_{0.9}Nb_{0.1}O_4$ | −22 | 5.8 | 4.2 |
| $Eu_{1.8}Ca_{0.2}Ni_{0.9}Ta_{0.1}O_4$ | −24 | 6.3 | 4 |
| $Eu_{1.8}Bi_{0.2}Ni_{0.9}Ti_{0.1}O_4$ | −26 | 6.4 | 4.6 |

TABLE 113-continued

| | | | |
|---|---|---|---|
| $Eu_{1.8}Bi_{0.2}Ni_{0.9}V_{0.1}O_4$ | −28 | 5.9 | 4.5 |
| $Eu_{1.8}Bi_{0.2}Ni_{0.9}Cr_{0.1}O_4$ | −19 | 6.4 | 4.2 |
| $Eu_{1.8}Bi_{0.2}Ni_{0.9}Mn_{0.1}O_4$ | −21 | 7.1 | 4.7 |
| $Eu_{1.8}Bi_{0.2}Ni_{0.9}Fe_{0.1}O_4$ | −22 | 7 | 4.8 |
| $Eu_{1.8}Bi_{0.2}Ni_{0.9}Co_{0.1}O_4$ | −24 | 6.8 | 4.1 |
| $Eu_{1.8}Bi_{0.2}Ni_{0.9}Cu_{0.1}O_4$ | −21 | 7.1 | 3.8 |
| $Eu_{1.8}Bi_{0.2}Ni_{0.9}Mo_{0.1}O_4$ | −29 | 6.8 | 4 |
| $Eu_{1.8}Bi_{0.2}Ni_{0.9}W_{0.1}O_4$ | −17 | 5.9 | 4.6 |
| $Eu_{1.8}Bi_{0.2}Ni_{0.9}Nb_{0.1}O_4$ | −18 | 6.5 | 4.2 |
| $Eu_{1.8}Bi_{0.2}Ni_{0.9}Ta_{0.1}O_4$ | −24 | 7 | 4.5 |
| $Gd_{1.8}Na_{0.2}Ni_{0.9}Ti_{0.1}O_4$ | −21 | 7 | 4.2 |
| $Gd_{1.8}Na_{0.2}Ni_{0.9}V_{0.1}O_4$ | −27 | 4.9 | 4.1 |
| $Gd_{1.8}Na_{0.2}Ni_{0.9}Cr_{0.1}O_4$ | −25 | 5 | 3.9 |
| $Gd_{1.8}Na_{0.2}Ni_{0.9}Mn_{0.1}O_4$ | −30 | 6 | 4 |
| $Gd_{1.8}Na_{0.2}Ni_{0.9}Fe_{0.1}O_4$ | −28 | 5.2 | 3.8 |
| $Gd_{1.8}Na_{0.2}Ni_{0.9}Co_{0.1}O_4$ | −24 | 7 | 3.7 |
| $Gd_{1.8}Na_{0.2}Ni_{0.9}Cu_{0.1}O_4$ | −25 | 8.1 | 4 |
| $Gd_{1.8}Na_{0.2}Ni_{0.9}Mo_{0.1}O_4$ | −16 | 6.9 | 3.9 |
| $Gd_{1.8}Na_{0.2}Ni_{0.9}W_{0.1}O_4$ | −20 | 6.7 | 3.6 |
| $Gd_{1.8}Na_{0.2}Ni_{0.9}Nb_{0.1}O_4$ | −22 | 7.2 | 4.1 |
| $Gd_{1.8}Na_{0.2}Ni_{0.9}Ta_{0.1}O_4$ | −24 | 6.9 | 3.9 |
| $Gd_{1.8}K_{0.2}Ni_{0.9}Ti_{0.1}O_4$ | −26 | 6.3 | 4.3 |
| $Gd_{1.8}K_{0.2}Ni_{0.9}V_{0.1}O_4$ | −28 | 7 | 4 |
| $Gd_{1.8}K_{0.2}Ni_{0.9}Cr_{0.1}O_4$ | −19 | 7.1 | 4.7 |
| $Gd_{1.8}K_{0.2}Ni_{0.9}Mn_{0.1}O_4$ | −21 | 7.3 | 4.4 |
| $Gd_{1.8}K_{0.2}Ni_{0.9}Fe_{0.1}O_4$ | −22 | 7 | 4.9 |
| $Gd_{1.8}K_{0.2}Ni_{0.9}Co_{0.1}O_4$ | −24 | 6.8 | 4.7 |
| $Gd_{1.8}K_{0.2}Ni_{0.9}Cu_{0.1}O_4$ | −21 | 5.2 | 4.6 |
| $Gd_{1.8}K_{0.2}Ni_{0.9}Mo_{0.1}O_4$ | −29 | 7 | 4.6 |
| $Gd_{1.8}K_{0.2}Ni_{0.9}W_{0.1}O_4$ | −17 | 8.1 | 4.5 |
| $Gd_{1.8}K_{0.2}Ni_{0.9}Nb_{0.1}O_4$ | −18 | 6.9 | 4.2 |

TABLE 114

| | | | |
|---|---|---|---|
| $Gd_{1.8}K_{0.2}Ni_{0.9}Ta_{0.1}O_4$ | −24 | 6.7 | 4.7 |
| $Gd_{1.8}Sr_{0.2}Ni_{0.9}Ti_{0.1}O_4$ | −21 | 6.9 | 4.1 |
| $Gd_{1.8}Sr_{0.2}Ni_{0.9}V_{0.1}O_4$ | −27 | 5.9 | 3.8 |
| $Gd_{1.8}Sr_{0.2}Ni_{0.9}Cr_{0.1}O_4$ | −25 | 6.3 | 4 |
| $Gd_{1.8}Sr_{0.2}Ni_{0.9}Mn_{0.1}O_4$ | −30 | 7 | 4.6 |
| $Gd_{1.8}Sr_{0.2}Ni_{0.9}Fe_{0.1}O_4$ | −28 | 7.1 | 4.2 |
| $Gd_{1.8}Sr_{0.2}Ni_{0.9}Co_{0.1}O_4$ | −27 | 7.3 | 4.5 |
| $Gd_{1.8}Sr_{0.2}Ni_{0.9}Cu_{0.1}O_4$ | −25 | 7 | 4.3 |
| $Gd_{1.8}Sr_{0.2}Ni_{0.9}Mo_{0.1}O_4$ | −18 | 6.8 | 4.1 |
| $Gd_{1.8}Sr_{0.2}Ni_{0.9}W_{0.1}O_4$ | −22 | 6.9 | 3.9 |
| $Gd_{1.8}Sr_{0.2}Ni_{0.9}Nb_{0.1}O_4$ | −10 | 6.7 | 4 |
| $Gd_{1.8}Sr_{0.2}Ni_{0.9}Ta_{0.1}O_4$ | −26 | 7.1 | 3.8 |
| $Gd_{1.8}Ca_{0.2}Ni_{0.9}Ti_{0.1}O_4$ | −24 | 7.1 | 4 |
| $Gd_{1.8}Ca_{0.2}Ni_{0.9}V_{0.1}O_4$ | −22 | 6.8 | 3.9 |
| $Gd_{1.8}Ca_{0.2}Ni_{0.9}Cr_{0.1}O_4$ | −21 | 5.9 | 4.1 |
| $Gd_{1.8}Ca_{0.2}Ni_{0.9}Mn_{0.1}O_4$ | −27 | 6.5 | 3.8 |
| $Gd_{1.8}Ca_{0.2}Ni_{0.9}Fe_{0.1}O_4$ | −25 | 7 | 4 |
| $Gd_{1.8}Ca_{0.2}Ni_{0.9}Co_{0.1}O_4$ | −30 | 6.8 | 4.6 |
| $Gd_{1.8}Ca_{0.2}Ni_{0.9}Cu_{0.1}O_4$ | −28 | 5 | 4.2 |
| $Gd_{1.8}Ca_{0.2}Ni_{0.9}Mo_{0.1}O_4$ | −27 | 7 | 4.5 |
| $Gd_{1.8}Ca_{0.2}Ni_{0.9}W_{0.1}O_4$ | −25 | 4.9 | 4.3 |
| $Gd_{1.8}Ca_{0.2}Ni_{0.9}Nb_{0.1}O_4$ | −18 | 5 | 4.2 |
| $Gd_{1.8}Ca_{0.2}Ni_{0.9}Ta_{0.1}O_4$ | −22 | 6 | 4.1 |
| $Gd_{1.8}Bi_{0.2}Ni_{0.9}Ti_{0.1}O_4$ | −26 | 7 | 4 |
| $Gd_{1.8}Bi_{0.2}Ni_{0.9}V_{0.1}O_4$ | −20 | 8.1 | 3.8 |
| $Gd_{1.8}Bi_{0.2}Ni_{0.9}Cr_{0.1}O_4$ | −19 | 6.9 | 3.7 |
| $Gd_{1.8}Bi_{0.2}Ni_{0.9}Mn_{0.1}O_4$ | −17 | 6.7 | 4 |
| $Gd_{1.8}Bi_{0.2}Ni_{0.9}Fe_{0.1}O_4$ | −23 | 7.2 | 3.9 |
| $Gd_{1.8}Bi_{0.2}Ni_{0.9}Co_{0.1}O_4$ | −22 | 6.9 | 3.6 |
| $Gd_{1.8}Bi_{0.2}Ni_{0.9}Cu_{0.1}O_4$ | −18 | 5.9 | 4.1 |
| $Gd_{1.8}Bi_{0.2}Ni_{0.9}Mo_{0.1}O_4$ | −20 | 6.3 | 3.9 |
| $Gd_{1.8}Bi_{0.2}Ni_{0.9}W_{0.1}O_4$ | −21 | 7 | 4.6 |
| $Gd_{1.8}Bi_{0.2}Ni_{0.9}Nb_{0.1}O_4$ | −21 | 7.1 | 4.3 |
| $Gd_{1.8}Bi_{0.2}Ni_{0.9}Ta_{0.1}O_4$ | −22 | 7.3 | 4 |

TABLE 115

| | | | |
|---|---|---|---|
| $Dy_{1.8}Na_{0.2}Ni_{0.9}Ti_{0.1}O_4$ | −25 | 6.8 | 4.4 |
| $Dy_{1.8}Na_{0.2}Ni_{0.9}V_{0.1}O_4$ | −24 | 6.9 | 4.9 |
| $Dy_{1.8}Na_{0.2}Ni_{0.9}Cr_{0.1}O_4$ | −28 | 6.7 | 4.7 |

TABLE 115-continued

| | | | |
|---|---|---|---|
| $Dy_{1.8}Na_{0.2}Ni_{0.9}Mn_{0.1}O_4$ | −19 | 7.1 | 4.6 |
| $Dy_{1.8}Na_{0.2}Ni_{0.9}Fe_{0.1}O_4$ | −20 | 5.8 | 4.6 |
| $Dy_{1.8}Na_{0.2}Ni_{0.9}Co_{0.1}O_4$ | −26 | 6.3 | 4.5 |
| $Dy_{1.8}Na_{0.2}Ni_{0.9}Cu_{0.1}O_4$ | −23 | 7.1 | 4.2 |
| $Dy_{1.8}Na_{0.2}Ni_{0.9}Mo_{0.1}O_4$ | −22 | 6.4 | 4.7 |
| $Dy_{1.8}Na_{0.2}Ni_{0.9}W_{0.1}O_4$ | −19 | 5.9 | 4.8 |
| $Dy_{1.8}Na_{0.2}Ni_{0.9}Nb_{0.1}O_4$ | −17 | 6.4 | 4.1 |
| $Dy_{1.8}Na_{0.2}Ni_{0.9}Ta_{0.1}O_4$ | −20 | 7.1 | 3.8 |
| $Dy_{1.8}K_{0.2}Ni_{0.9}Ti_{0.1}O_4$ | −20 | 6.8 | 4.6 |
| $Dy_{1.8}K_{0.2}Ni_{0.9}V_{0.1}O_4$ | −21 | 7.1 | 4.2 |
| $Dy_{1.8}K_{0.2}Ni_{0.9}Cr_{0.1}O_4$ | −23 | 6.8 | 4.5 |
| $Dy_{1.8}K_{0.2}Ni_{0.9}Mn_{0.1}O_4$ | −18 | 5.9 | 4.3 |
| $Dy_{1.8}K_{0.2}Ni_{0.9}Fe_{0.1}O_4$ | −28 | 6.5 | 4.1 |
| $Dy_{1.8}K_{0.2}Ni_{0.9}Co_{0.1}O_4$ | −19 | 7 | 3.9 |
| $Dy_{1.8}K_{0.2}Ni_{0.9}Cu_{0.1}O_4$ | −24 | 6.8 | 4 |
| $Dy_{1.8}K_{0.2}Ni_{0.9}Mo_{0.1}O_4$ | −25 | 5.8 | 3.8 |
| $Dy_{1.8}K_{0.2}Ni_{0.9}W_{0.1}O_4$ | −16 | 6.3 | 3.7 |
| $Dy_{1.8}K_{0.2}Ni_{0.9}Nb_{0.1}O_4$ | −20 | 7.1 | 4 |
| $Dy_{1.8}K_{0.2}Ni_{0.9}Ta_{0.1}O_4$ | −22 | 6.4 | 3.9 |
| $Dy_{1.8}Sr_{0.2}Ni_{0.9}Ti_{0.1}O_4$ | −23 | 6.4 | 3.8 |
| $Dy_{1.8}Sr_{0.2}Ni_{0.9}V_{0.1}O_4$ | −26 | 7.1 | 3.7 |
| $Dy_{1.8}Sr_{0.2}Ni_{0.9}Cr_{0.1}O_4$ | −28 | 7 | 4 |
| $Dy_{1.8}Sr_{0.2}Ni_{0.9}Mn_{0.1}O_4$ | −19 | 6.8 | 3.9 |
| $Dy_{1.8}Sr_{0.2}Ni_{0.9}Fe_{0.1}O_4$ | −21 | 7.1 | 3.6 |
| $Dy_{1.8}Sr_{0.2}Ni_{0.9}Co_{0.1}O_4$ | −22 | 6.8 | 4.1 |
| $Dy_{1.8}Sr_{0.2}Ni_{0.9}Cu_{0.1}O_4$ | −24 | 5.9 | 3.9 |
| $Dy_{1.8}Sr_{0.2}Ni_{0.9}Mo_{0.1}O_4$ | −21 | 6.5 | 4.6 |
| $Dy_{1.8}Sr_{0.2}Ni_{0.9}W_{0.1}O_4$ | −29 | 7.0 | 4.3 |
| $Dy_{1.8}Sr_{0.2}Ni_{0.9}Nb_{0.1}O_4$ | −17 | 5.0 | 4 |
| $Dy_{1.8}Sr_{0.2}Ni_{0.9}Ta_{0.1}O_4$ | −18 | 7.0 | 4.7 |

TABLE 116

| | | | |
|---|---|---|---|
| $Dy_{1.8}Ca_{0.2}Ni_{0.9}Ti_{0.1}O_4$ | −22 | 5.0 | 4.3 |
| $Dy_{1.8}Ca_{0.2}Ni_{0.9}V_{0.1}O_4$ | −21 | 6.0 | 4.9 |
| $Dy_{1.8}Ca_{0.2}Ni_{0.9}Cr_{0.1}O_4$ | −27 | 5.2 | 3.9 |
| $Dy_{1.8}Ca_{0.2}Ni_{0.9}Mn_{0.1}O_4$ | −21 | 7.0 | 4.2 |
| $Dy_{1.8}Ca_{0.2}Ni_{0.9}Fe_{0.1}O_4$ | −23 | 8.1 | 4 |
| $Dy_{1.8}Ca_{0.2}Ni_{0.9}Co_{0.1}O_4$ | −19 | 6.9 | 4.7 |
| $Dy_{1.8}Ca_{0.2}Ni_{0.9}Cu_{0.1}O_4$ | −23 | 6.7 | 4.6 |
| $Dy_{1.8}Ca_{0.2}Ni_{0.9}Mo_{0.1}O_4$ | −24 | 7.2 | 4.5 |
| $Dy_{1.8}Ca_{0.2}Ni_{0.9}W_{0.1}O_4$ | −25 | 6.9 | 4.2 |
| $Dy_{1.8}Ca_{0.2}Ni_{0.9}Nb_{0.1}O_4$ | −16 | 5.9 | 4.7 |
| $Dy_{1.8}Ca_{0.2}Ni_{0.9}Ta_{0.1}O_4$ | −20 | 6.3 | 4.8 |
| $Dy_{1.8}Bi_{0.2}Ni_{0.9}Ti_{0.1}O_4$ | −22 | 7.1 | 3.8 |
| $Dy_{1.8}Bi_{0.2}Ni_{0.9}V_{0.1}O_4$ | −10 | 7.3 | 4 |
| $Dy_{1.8}Bi_{0.2}Ni_{0.9}Cr_{0.1}O_4$ | −26 | 7 | 4.3 |
| $Dy_{1.8}Bi_{0.2}Ni_{0.9}Mn_{0.1}O_4$ | −20 | 7.1 | 4.2 |
| $Dy_{1.8}Bi_{0.2}Ni_{0.9}Fe_{0.1}O_4$ | −19 | 6.4 | 4.3 |
| $Dy_{1.8}Bi_{0.2}Ni_{0.9}Co_{0.1}O_4$ | −17 | 5.9 | 4.5 |
| $Dy_{1.8}Bi_{0.2}Ni_{0.9}Cu_{0.1}O_4$ | −23 | 6.4 | 4.6 |
| $Dy_{1.8}Bi_{0.2}Ni_{0.9}Mo_{0.1}O_4$ | −22 | 7.1 | 4.7 |
| $Dy_{1.8}Bi_{0.2}Ni_{0.9}W_{0.1}O_4$ | −18 | 7 | 4.4 |
| $Dy_{1.8}Bi_{0.2}Ni_{0.9}Nb_{0.1}O_4$ | −20 | 6.8 | 4.9 |
| $Dy_{1.8}Bi_{0.2}Ni_{0.9}Ta_{0.1}O_4$ | −21 | 7.1 | 4.7 |
| $Ho_{1.8}Na_{0.2}Ni_{0.9}Ti_{0.1}O_4$ | −22 | 5.9 | 4.6 |
| $Ho_{1.8}Na_{0.2}Ni_{0.9}V_{0.1}O_4$ | −18 | 5 | 4.5 |
| $Ho_{1.8}Na_{0.2}Ni_{0.9}Cr_{0.1}O_4$ | −25 | 7 | 4.2 |
| $Ho_{1.8}Na_{0.2}Ni_{0.9}Mn_{0.1}O_4$ | −24 | 4.9 | 4.7 |
| $Ho_{1.8}Na_{0.2}Ni_{0.9}Fe_{0.1}O_4$ | −28 | 5 | 4.8 |
| $Ho_{1.8}Na_{0.2}Ni_{0.9}Co_{0.1}O_4$ | −19 | 6 | 4.1 |
| $Ho_{1.8}Na_{0.2}Ni_{0.9}Cu_{0.1}O_4$ | −20 | 5.2 | 3.8 |
| $Ho_{1.8}Na_{0.2}Ni_{0.9}Mo_{0.1}O_4$ | −26 | 7 | 4 |
| $Ho_{1.8}Na_{0.2}Ni_{0.9}W_{0.1}O_4$ | −23 | 8.1 | 4.6 |
| $Ho_{1.8}Na_{0.2}Ni_{0.9}Nb_{0.1}O_4$ | −22 | 6.9 | 4.2 |
| $Ho_{1.8}Na_{0.2}Ni_{0.9}Ta_{0.1}O_4$ | −19 | 6.7 | 4.5 |
| $Ho_{1.8}K_{0.2}Ni_{0.9}Ti_{0.1}O_4$ | −20 | 6.9 | 4.1 |

TABLE 117

| | | | |
|---|---|---|---|
| $Ho_{1.8}K_{0.2}Ni_{0.9}V_{0.1}O_4$ | −22 | 5.9 | 3.9 |
| $Ho_{1.8}K_{0.2}Ni_{0.9}Cr_{0.1}O_4$ | −20 | 6.3 | 4 |
| $Ho_{1.8}K_{0.2}Ni_{0.9}Mn_{0.1}O_4$ | −21 | 7 | 3.8 |
| $Ho_{1.8}K_{0.2}Ni_{0.9}Fe_{0.1}O_4$ | −23 | 7.1 | 3.7 |

TABLE 117-continued

| | | | |
|---|---|---|---|
| $Ho_{1.8}K_{0.2}Ni_{0.9}Co_{0.1}O_4$ | −18 | 7.3 | 4 |
| $Ho_{1.8}K_{0.2}Ni_{0.9}Cu_{0.1}O_4$ | −28 | 7 | 3.9 |
| $Ho_{1.8}K_{0.2}Ni_{0.9}Mo_{0.1}O_4$ | −19 | 6.8 | 3.6 |
| $Ho_{1.8}K_{0.2}Ni_{0.9}W_{0.1}O_4$ | −24 | 6.9 | 4.1 |
| $Ho_{1.8}K_{0.2}Ni_{0.9}Nb_{0.1}O_4$ | −25 | 6.7 | 3.9 |
| $Ho_{1.8}K_{0.2}Ni_{0.9}Ta_{0.1}O_4$ | −16 | 7.1 | 4.6 |
| $Ho_{1.8}Sr_{0.2}Ni_{0.9}Ti_{0.1}O_4$ | −22 | 6.3 | 4 |
| $Ho_{1.8}Sr_{0.2}Ni_{0.9}V_{0.1}O_4$ | −24 | 7.1 | 4.7 |
| $Ho_{1.8}Sr_{0.2}Ni_{0.9}Cr_{0.1}O_4$ | −23 | 6.4 | 4.2 |
| $Ho_{1.8}Sr_{0.2}Ni_{0.9}Mn_{0.1}O_4$ | −26 | 5.9 | 4.3 |
| $Ho_{1.8}Sr_{0.2}Ni_{0.9}Fe_{0.1}O_4$ | −28 | 6.4 | 4.9 |
| $Ho_{1.8}Sr_{0.2}Ni_{0.9}Co_{0.1}O_4$ | −19 | 7.1 | 4 |
| $Ho_{1.8}Sr_{0.2}Ni_{0.9}Cu_{0.1}O_4$ | −21 | 7 | 3.8 |
| $Ho_{1.8}Sr_{0.2}Ni_{0.9}Mo_{0.1}O_4$ | −22 | 6.8 | 3.7 |
| $Ho_{1.8}Sr_{0.2}Ni_{0.9}W_{0.1}O_4$ | −24 | 7.1 | 4 |
| $Ho_{1.8}Sr_{0.2}Ni_{0.9}Nb_{0.1}O_4$ | −21 | 6.8 | 3.9 |
| $Ho_{1.8}Sr_{0.2}Ni_{0.9}Ta_{0.1}O_4$ | −29 | 5.9 | 4.1 |
| $Ho_{1.8}Ca_{0.2}Ni_{0.9}Ti_{0.1}O_4$ | −18 | 7 | 4 |
| $Ho_{1.8}Ca_{0.2}Ni_{0.9}V_{0.1}O_4$ | −24 | 6.8 | 4.6 |
| $Ho_{1.8}Ca_{0.2}Ni_{0.9}Cr_{0.1}O_4$ | −22 | 5 | 4.2 |
| $Ho_{1.8}Ca_{0.2}Ni_{0.9}Mn_{0.1}O_4$ | −21 | 7 | 4.5 |
| $Ho_{1.8}Ca_{0.2}Ni_{0.9}Fe_{0.1}O_4$ | −30 | 4.9 | 4.3 |
| $Ho_{1.8}Ca_{0.2}Ni_{0.9}Co_{0.1}O_4$ | −20 | 5 | 4.2 |
| $Ho_{1.8}Ca_{0.2}Ni_{0.9}Cu_{0.1}O_4$ | −22 | 6 | 4.1 |
| $Ho_{1.8}Ca_{0.2}Ni_{0.9}Mo_{0.1}O_4$ | −20 | 5.2 | 3.9 |
| $Ho_{1.8}Ca_{0.2}Ni_{0.9}W_{0.1}O_4$ | −21 | 7 | 4 |
| $Ho_{1.8}Ca_{0.2}Ni_{0.9}Nb_{0.1}O_4$ | −23 | 8.1 | 3.8 |
| $Ho_{1.8}Ca_{0.2}Ni_{0.9}Ta_{0.1}O_4$ | −18 | 6.9 | 3.7 |
| $Ho_{1.8}Bi_{0.2}Ni_{0.9}Ti_{0.1}O_4$ | −19 | 7.2 | 3.9 |
| $Ho_{1.8}Bi_{0.2}Ni_{0.9}V_{0.1}O_4$ | −24 | 6.9 | 3.6 |

TABLE 118

| | | | |
|---|---|---|---|
| $Ho_{1.8}Bi_{0.2}Ni_{0.9}Cr_{0.1}O_4$ | −25 | 5.9 | 4.1 |
| $Ho_{1.8}Bi_{0.2}Ni_{0.9}Mn_{0.1}O_4$ | −16 | 6.3 | 3.9 |
| $Ho_{1.8}Bi_{0.2}Ni_{0.9}Fe_{0.1}O_4$ | −20 | 7 | 4.6 |
| $Ho_{1.8}Bi_{0.2}Ni_{0.9}Co_{0.1}O_4$ | −22 | 7.1 | 4.3 |
| $Ho_{1.8}Bi_{0.2}Ni_{0.9}Cu_{0.1}O_4$ | −24 | 7.3 | 4 |
| $Ho_{1.8}Bi_{0.2}Ni_{0.9}Mo_{0.1}O_4$ | −23 | 7 | 4.7 |
| $Ho_{1.8}Bi_{0.2}Ni_{0.9}W_{0.1}O_4$ | −26 | 6.8 | 4.4 |
| $Ho_{1.8}Bi_{0.2}Ni_{0.9}Nb_{0.1}O_4$ | −28 | 6.9 | 4.9 |
| $Ho_{1.8}Bi_{0.2}Ni_{0.9}Ta_{0.1}O_4$ | −19 | 6.7 | 4.7 |
| $Er_{1.8}Na_{0.2}Ni_{0.9}Ti_{0.1}O_4$ | −22 | 5.8 | 4.6 |
| $Er_{1.8}Na_{0.2}Ni_{0.9}V_{0.1}O_4$ | −24 | 6.3 | 4.5 |
| $Er_{1.8}Na_{0.2}Ni_{0.9}Cr_{0.1}O_4$ | −21 | 7.1 | 4.2 |
| $Er_{1.8}Na_{0.2}Ni_{0.9}Mn_{0.1}O_4$ | −29 | 6.4 | 4.7 |
| $Er_{1.8}Na_{0.2}Ni_{0.9}Fe_{0.1}O_4$ | −17 | 5.9 | 4.8 |
| $Er_{1.8}Na_{0.2}Ni_{0.9}Co_{0.1}O_4$ | −18 | 6.4 | 4.1 |
| $Er_{1.8}Na_{0.2}Ni_{0.9}Cu_{0.1}O_4$ | −24 | 7.1 | 3.8 |
| $Er_{1.8}Na_{0.2}Ni_{0.9}Mo_{0.1}O_4$ | −22 | 7 | 4 |
| $Er_{1.8}Na_{0.2}Ni_{0.9}W_{0.1}O_4$ | −21 | 6.8 | 4.6 |
| $Er_{1.8}Na_{0.2}Ni_{0.9}Nb_{0.1}O_4$ | −30 | 7.1 | 4.2 |
| $Er_{1.8}Na_{0.2}Ni_{0.9}Ta_{0.1}O_4$ | −29 | 6.8 | 4.5 |
| $Er_{1.8}K_{0.2}Ni_{0.9}Ti_{0.1}O_4$ | −28 | 6.5 | 4.1 |
| $Er_{1.8}K_{0.2}Ni_{0.9}V_{0.1}O_4$ | −27 | 7 | 3.9 |
| $Er_{1.8}K_{0.2}Ni_{0.9}Cr_{0.1}O_4$ | −25 | 6.8 | 4 |
| $Er_{1.8}K_{0.2}Ni_{0.9}Mn_{0.1}O_4$ | −18 | 5.8 | 3.8 |
| $Er_{1.8}K_{0.2}Ni_{0.9}Fe_{0.1}O_4$ | −22 | 6.3 | 3.7 |
| $Er_{1.8}K_{0.2}Ni_{0.9}Co_{0.1}O_4$ | −10 | 7.1 | 4 |
| $Er_{1.8}K_{0.2}Ni_{0.9}Cu_{0.1}O_4$ | −26 | 6.4 | 3.9 |
| $Er_{1.8}K_{0.2}Ni_{0.9}Mo_{0.1}O_4$ | −20 | 5.9 | 3.6 |
| $Er_{1.8}K_{0.2}Ni_{0.9}W_{0.1}O_4$ | −19 | 6.4 | 3.8 |
| $Er_{1.8}K_{0.2}Ni_{0.9}Nb_{0.1}O_4$ | −17 | 7.1 | 3.7 |
| $Er_{1.8}K_{0.2}Ni_{0.9}Ta_{0.1}O_4$ | −23 | 7 | 4 |
| $Er_{1.8}Sr_{0.2}Ni_{0.9}Ti_{0.1}O_4$ | −18 | 7.1 | 3.6 |
| $Er_{1.8}Sr_{0.2}Ni_{0.9}V_{0.1}O_4$ | −20 | 6.8 | 4.1 |
| $Er_{1.8}Sr_{0.2}Ni_{0.9}Cr_{0.1}O_4$ | −21 | 5.9 | 3.9 |

TABLE 119

| | | | |
|---|---|---|---|
| $Er_{1.8}Sr_{0.2}Ni_{0.9}Mn_{0.1}O_4$ | −21 | 6.5 | 4.6 |
| $Er_{1.8}Sr_{0.2}Ni_{0.9}Fe_{0.1}O_4$ | −22 | 7 | 4.3 |
| $Er_{1.8}Sr_{0.2}Ni_{0.9}Co_{0.1}O_4$ | −18 | 5 | 4 |
| $Er_{1.8}Sr_{0.2}Ni_{0.9}Cu_{0.1}O_4$ | −25 | 7 | 4.7 |

TABLE 119-continued

| | | | |
|---|---|---|---|
| $Er_{1.8}Sr_{0.2}Ni_{0.9}Mo_{0.1}O_4$ | −24 | 4.9 | 4.2 |
| $Er_{1.8}Sr_{0.2}Ni_{0.9}W_{0.1}O_4$ | −28 | 5 | 4.3 |
| $Er_{1.8}Sr_{0.2}Ni_{0.9}Nb_{0.1}O_4$ | −19 | 6 | 4.9 |
| $Er_{1.8}Sr_{0.2}Ni_{0.9}Ta_{0.1}O_4$ | −20 | 5.2 | 3.9 |
| $Er_{1.8}Ca_{0.2}Ni_{0.9}Ti_{0.1}O_4$ | −23 | 8.1 | 4 |
| $Er_{1.8}Ca_{0.2}Ni_{0.9}V_{0.1}O_4$ | −22 | 6.9 | 4.7 |
| $Er_{1.8}Ca_{0.2}Ni_{0.9}Cr_{0.1}O_4$ | −19 | 6.7 | 4.6 |
| $Er_{1.8}Ca_{0.2}Ni_{0.9}Mn_{0.1}O_4$ | −17 | 7.2 | 4.5 |
| $Er_{1.8}Ca_{0.2}Ni_{0.9}Fe_{0.1}O_4$ | −20 | 6.9 | 4.2 |
| $Er_{1.8}Ca_{0.2}Ni_{0.9}Co_{0.1}O_4$ | −22 | 5.9 | 4.7 |
| $Er_{1.8}Ca_{0.2}Ni_{0.9}Cu_{0.1}O_4$ | −20 | 6.3 | 4.8 |
| $Er_{1.8}Ca_{0.2}Ni_{0.9}Mo_{0.1}O_4$ | −21 | 7 | 4.1 |
| $Er_{1.8}Ca_{0.2}Ni_{0.9}W_{0.1}O_4$ | −23 | 7.1 | 3.8 |
| $Er_{1.8}Ca_{0.2}Ni_{0.9}Nb_{0.1}O_4$ | −18 | 7.3 | 4 |
| $Er_{1.8}Ca_{0.2}Ni_{0.9}Ta_{0.1}O_4$ | −28 | 7 | 4.3 |
| $Er_{1.8}Bi_{0.2}Ni_{0.9}Ti_{0.1}O_4$ | −24 | 5.2 | 4.3 |
| $Er_{1.8}Bi_{0.2}Ni_{0.9}V_{0.1}O_4$ | −25 | 7 | 4.5 |
| $Er_{1.8}Bi_{0.2}Ni_{0.9}Cr_{0.1}O_4$ | −16 | 8.1 | 4.6 |
| $Er_{1.8}Bi_{0.2}Ni_{0.9}Mn_{0.1}O_4$ | −20 | 6.9 | 4.7 |
| $Er_{1.8}Bi_{0.2}Ni_{0.9}Fe_{0.1}O_4$ | −22 | 6.7 | 4.4 |
| $Er_{1.8}Bi_{0.2}Ni_{0.9}Co_{0.1}O_4$ | −24 | 7.2 | 4.9 |
| $Er_{1.8}Bi_{0.2}Ni_{0.9}Cu_{0.1}O_4$ | −23 | 6.9 | 4.7 |
| $Er_{1.8}Bi_{0.2}Ni_{0.9}Mo_{0.1}O_4$ | −26 | 5.9 | 4.6 |
| $Er_{1.8}Bi_{0.2}Ni_{0.9}W_{0.1}O_4$ | −28 | 6.3 | 4.6 |
| $Er_{1.8}Bi_{0.2}Ni_{0.9}Nb_{0.1}O_4$ | −19 | 7 | 4.5 |
| $Er_{1.8}Bi_{0.2}Ni_{0.9}Ta_{0.1}O_4$ | −21 | 7.1 | 4.2 |
| $Yb_{1.8}Na_{0.2}Ni_{0.9}Ti_{0.1}O_4$ | −24 | 7 | 4.8 |
| $Yb_{1.8}Na_{0.2}Ni_{0.9}V_{0.1}O_4$ | −21 | 6.8 | 4.1 |
| $Yb_{1.8}Na_{0.2}Ni_{0.9}Cr_{0.1}O_4$ | −29 | 6.9 | 3.8 |
| $Yb_{1.8}Na_{0.2}Ni_{0.9}Mn_{0.1}O_4$ | −17 | 6.7 | 4 |

TABLE 120

| | | | |
|---|---|---|---|
| $Yb_{1.8}Na_{0.2}Ni_{0.9}Fe_{0.1}O_4$ | −18 | 7.1 | 4.6 |
| $Yb_{1.8}Na_{0.2}Ni_{0.9}Co_{0.1}O_4$ | −24 | 5.9 | 4.2 |
| $Yb_{1.8}Na_{0.2}Ni_{0.9}Cu_{0.1}O_4$ | −22 | 6.4 | 4.5 |
| $Yb_{1.8}Na_{0.2}Ni_{0.9}Mo_{0.1}O_4$ | −21 | 7.1 | 4.3 |
| $Yb_{1.8}Na_{0.2}Ni_{0.9}W_{0.1}O_4$ | −27 | 7 | 4.1 |
| $Yb_{1.8}Na_{0.2}Ni_{0.9}Nb_{0.1}O_4$ | −25 | 6.8 | 3.9 |
| $Yb_{1.8}Na_{0.2}Ni_{0.9}Ta_{0.1}O_4$ | −30 | 7.1 | 4 |
| $Yb_{1.8}K_{0.2}Ni_{0.9}Ti_{0.1}O_4$ | −24 | 5.9 | 3.7 |
| $Yb_{1.8}K_{0.2}Ni_{0.9}V_{0.1}O_4$ | −25 | 6.5 | 4 |
| $Yb_{1.8}K_{0.2}Ni_{0.9}Cr_{0.1}O_4$ | −16 | 7 | 3.9 |
| $Yb_{1.8}K_{0.2}Ni_{0.9}Mn_{0.1}O_4$ | −20 | 6.8 | 3.6 |
| $Yb_{1.8}K_{0.2}Ni_{0.9}Fe_{0.1}O_4$ | −22 | 5 | 4.1 |
| $Yb_{1.8}K_{0.2}Ni_{0.9}Co_{0.1}O_4$ | −24 | 7 | 3.9 |
| $Yb_{1.8}K_{0.2}Ni_{0.9}Cu_{0.1}O_4$ | −23 | 4.9 | 4.6 |
| $Yb_{1.8}K_{0.2}Ni_{0.9}Mo_{0.1}O_4$ | −26 | 5 | 4.3 |
| $Yb_{1.8}K_{0.2}Ni_{0.9}W_{0.1}O_4$ | −28 | 6 | 4 |
| $Yb_{1.8}K_{0.2}Ni_{0.9}Nb_{0.1}O_4$ | −19 | 5.2 | 4.7 |
| $Yb_{1.8}K_{0.2}Ni_{0.9}Ta_{0.1}O_4$ | −21 | 7 | 4.2 |
| $Yb_{1.8}Sr_{0.2}Ni_{0.9}Ti_{0.1}O_4$ | −24 | 6.9 | 4.6 |
| $Yb_{1.8}Sr_{0.2}Ni_{0.9}V_{0.1}O_4$ | −21 | 6.7 | 4.5 |
| $Yb_{1.8}Sr_{0.2}Ni_{0.9}Cr_{0.1}O_4$ | −29 | 7.2 | 4.2 |
| $Yb_{1.8}Sr_{0.2}Ni_{0.9}Mn_{0.1}O_4$ | −17 | 6.9 | 4.7 |
| $Yb_{1.8}Sr_{0.2}Ni_{0.9}Fe_{0.1}O_4$ | −18 | 5.9 | 4.8 |
| $Yb_{1.8}Sr_{0.2}Ni_{0.9}Co_{0.1}O_4$ | −24 | 6.3 | 4.1 |
| $Yb_{1.8}Sr_{0.2}Ni_{0.9}Cu_{0.1}O_4$ | −22 | 7 | 3.8 |
| $Yb_{1.8}Sr_{0.2}Ni_{0.9}Mo_{0.1}O_4$ | −21 | 7.1 | 4 |
| $Yb_{1.8}Sr_{0.2}Ni_{0.9}W_{0.1}O_4$ | −27 | 7.3 | 4.6 |
| $Yb_{1.8}Sr_{0.2}Ni_{0.9}Nb_{0.1}O_4$ | −25 | 7 | 4.2 |
| $Yb_{1.8}Sr_{0.2}Ni_{0.9}Ta_{0.1}O_4$ | −30 | 6.8 | 4.5 |
| $Yb_{1.8}Ca_{0.2}Ni_{0.9}Ti_{0.1}O_4$ | −27 | 6.7 | 4.1 |
| $Yb_{1.8}Ca_{0.2}Ni_{0.9}V_{0.1}O_4$ | −25 | 7.1 | 3.9 |
| $Yb_{1.8}Ca_{0.2}Ni_{0.9}Cr_{0.1}O_4$ | −18 | 5.8 | 4 |
| $Yb_{1.8}Ca_{0.2}Ni_{0.9}Mn_{0.1}O_4$ | −22 | 6.3 | 3.8 |
| $Yb_{1.8}Ca_{0.2}Ni_{0.9}Fe_{0.1}O_4$ | −10 | 7.1 | 3.7 |

TABLE 121

| | | | |
|---|---|---|---|
| $Yb_{1.8}Ca_{0.2}Ni_{0.9}Co_{0.1}O_4$ | −26 | 6.4 | 4 |
| $Yb_{1.8}Ca_{0.2}Ni_{0.9}Cu_{0.1}O_4$ | −22 | 5.9 | 3.9 |
| $Yb_{1.8}Ca_{0.2}Ni_{0.9}Mo_{0.1}O_4$ | −18 | 6.4 | 3.6 |
| $Yb_{1.8}Ca_{0.2}Ni_{0.9}W_{0.1}O_4$ | −25 | 7.1 | 3.8 |

TABLE 121-continued

| | | |
|---|---|---|
| $Yb_{1.8}Ca_{0.2}Ni_{0.9}Nb_{0.1}O_4$ | −24 | 7 | 3.7 |
| $Yb_{1.8}Ca_{0.2}Ni_{0.9}Ta_{0.1}O_4$ | −28 | 6.8 | 4 |
| $Yb_{1.8}Bi_{0.2}Ni_{0.9}Ti_{0.1}O_4$ | −20 | 6.8 | 3.6 |
| $Yb_{1.8}Bi_{0.2}Ni_{0.9}V_{0.1}O_4$ | −26 | 5.9 | 4.1 |
| $Yb_{1.8}Bi_{0.2}Ni_{0.9}Cr_{0.1}O_4$ | −23 | 6.5 | 3.9 |
| $Yb_{1.8}Bi_{0.2}Ni_{0.9}Mn_{0.1}O_4$ | −22 | 7 | 4.6 |
| $Yb_{1.8}Bi_{0.2}Ni_{0.9}Fe_{0.1}O_4$ | −19 | 6.8 | 4.3 |
| $Yb_{1.8}Bi_{0.2}Ni_{0.9}Co_{0.1}O_4$ | −17 | 5.8 | 4 |
| $Yb_{1.8}Bi_{0.2}Ni_{0.9}Cu_{0.1}O_4$ | −20 | 6.3 | 4.7 |
| $Yb_{1.8}Bi_{0.2}Ni_{0.9}Mo_{0.1}O_4$ | −22 | 7.1 | 4.2 |
| $Yb_{1.8}Bi_{0.2}Ni_{0.9}W_{0.1}O_4$ | −20 | 6.4 | 4.3 |
| $Yb_{1.8}Bi_{0.2}Ni_{0.9}Nb_{0.1}O_4$ | −21 | 5.9 | 4.9 |
| $Yb_{1.8}Bi_{0.2}Ni_{0.9}Ta_{0.1}O_4$ | −23 | 6.4 | 3.9 |

As is clear from the above results, the complex oxides represented by the formulae shown in Tables 75 to 121 exhibit excellent properties as an n-type thermoelectric material and have favorable electrical conductivity. Therefore, the complex oxides can possibly demonstrate excellent thermoelectric generation properties when used in place of the n-type thermoelectric materials of the Examples.

The invention claimed is:

1. A thermoelectric element comprising:
a thin film of p-type thermoelectric material,
a thin film of n-type thermoelectric material, and
the thin film of p-type thermoelectric material and the thin film of n-type thermoelectric material being formed on the electrically insulating substrate and being electrically connected,
(i) the p-type thermoelectric material comprising at least one complex oxide selected from the group consisting of:
complex oxides represented by Formula $Bi_f Pb_g M_h^1 CO_i M_j^2 O_k$, wherein $M^1$ is one or more elements selected from the group consisting of Na, K, Li, Ti, V, Cr, Mn, Fe, Ni, Cu, Zn, Pb, Ca, Sr, Ba, Al, Y, and lanthanoids; $M^2$ is one or more elements selected from the group consisting of Ti, V, Cr, Mn, Fe, Ni, Cu, Ag, Mo, W, Nb, and Ta; $1.8 \leq f \leq 2.20 \leq g \leq 0.4$; $1.8 \leq h \leq 2.2$; $1.6 \leq i \leq 2.2$; $0 \leq j \leq 0.5$; and $8 \leq k \leq 10$; and
(ii) the n-type thermoelectric material comprising at least one complex oxide selected from the group consisting of:
complex oxides represented by the Formula $Ln_x R_y^5 Ni_p R_{q'}^6 O_{r'}$, wherein Ln is lanthanoid; $R^5$ is one or more elements selected from the group consisting of Na, K, Sr, Ca, Bi, and Nd; $R^6$ is one or more elements selected from the group consisting of Ti, V, Cr, and Cu $0.5 \leq x \leq 1.2$; $0 \leq y \leq 0.5$; $0.5 \leq p \leq 1.2$; $0.01 \leq q' \leq 0.5$; and $2.8 \leq r' \leq 3.2$.

2. The thermoelectric element according to claim 1, wherein
the p-type thermoelectric material comprises at least one complex oxide selected from the group consisting of complex oxides represented by the formula: $Bi_f Pb_g M_h^1 CO_2 O_k$, wherein $M^1$ is one or more elements selected from the group consisting of Sr, Ca and Ba; $1.8 \leq f \leq 2.2$; $0 \leq g \leq 0.4$; $1.8 \leq h \leq 2.2$; and $8 \leq k \leq 10$;
the n-type thermoelectric material comprises at least one complex oxide selected from the group consisting of complex oxides represented by the formula: $Ln_x R_y^5 Ni_p R_{q'}^6 O_{r'}$, wherein Ln is lanthanoid; $R^5$ is one or more elements selected from the group consisting of Na, K, Sr, Ca, Bi, and Nd; and $R^6$ is one or more elements selected from the group consisting of Ti, V, Cr, and Cu; $0.5 \leq x \leq 1.2$; $0 \leq y \leq 0.5$; $0.5 \leq p \leq 1.2$; $0.01 \leq q' \leq 0.5$; and $2.8 \leq r' \leq 3.2$.

3. The thermoelectric element according to claim 1, wherein the thin film of p-type thermoelectric material and the thin film of n-type thermoelectric material are electrically connected by one of the following methods:
bringing one end portion of the thin film of p-type thermoelectric material into direct contact with one end portion of the thin film of n-type thermoelectric material;
bringing one end portion of the thin film of p-type thermoelectric material into contact with one end portion of the thin film of n-type thermoelectric material via an electrically conductive material;
bringing one end portion of the thin film of p-type thermoelectric material into direct contact with one end portion of the thin film of n-type thermoelectric material and covering the contact portion with an electrically conductive material.

4. The thermoelectric element according to claim 1, wherein the thin film of p-type thermoelectric material and the thin film of n-type thermoelectric material are formed on the same surface or on different surfaces of the electrically insulating substrate.

5. The thermoelectric element according to claim 1, wherein the electrically insulating substrate is a substrate comprising a plastic material.

6. The thermoelectric element according to claim 1, wherein thermoelectromotive force is at least 60 μV/K in a temperature range of 293 K to 1073K.

7. The thermoelectric element according to claim 1, wherein electrical resistance is 1 KΩ or lower in a temperature range of 293 K to 1073 K.

8. A thermoelectric module comprising a plurality of the thermoelectric elements of claim 1, wherein the thermoelectric elements are electrically connected in series such that an unconnected end portion of a p-type thermoelectric material of one thermoelectric element is electrically connected to an unconnected end portion of an n-type thermoelectric material of another thermoelectric element.

9. A thermoelectric conversion method comprising positioning one end of the thermoelectric module of claim 8 at a high-temperature portion and positioning the other end of the module at a low-temperature portion.

* * * * *